United States Patent [19]

Strubel et al.

[11] 3,969,618
[45] July 13, 1976

[54] ON LINE PROM HANDLING SYSTEM

[75] Inventors: John Michael Strubel, Rancho Palos Verdes; Don Minoru Mizota, Panorama City; Michael Tung, Culver City; Alfred Watson Sanborn, North Hollywood; Richard Dale McNair, Rancho Palos Verdes; Jefferson Frank Forte, Whittier; William Lawrence Scheding, Marvista, all of Calif.

[73] Assignee: Xerox Corporation, Stamford, Conn.

[22] Filed: Nov. 29, 1974

[21] Appl. No.: 528,241

[52] U.S. Cl............................ 235/153 AC; 324/73 R
[51] Int. Cl.²..................... G11C 29/00; G06F 11/04
[58] Field of Search.......... 235/153 AC; 340/172.5, 340/173 SP, 174 TC, 174 SP; 324/73 R, 73 AT; 209/72

[56] References Cited
UNITED STATES PATENTS

| | | | |
|---|---|---|---|
| 3,032,191 | 5/1962 | Clukey | 324/73 AT |
| 3,182,797 | 5/1965 | Palmer | 324/73 AT |
| 3,412,333 | 11/1968 | Frick et al. | 324/73 AT |
| 3,546,582 | 12/1970 | Barnard et al. | 235/153 AC |
| 3,631,229 | 12/1971 | Bens et al. | 235/153 AC |
| 3,633,174 | 1/1972 | Griffin | 340/172.5 |
| 3,716,786 | 2/1973 | Gearin | 324/73 AT |
| 3,751,649 | 8/1973 | Hart, Jr. | 235/153 AC |
| 3,764,995 | 10/1973 | Helf, Jr. | 235/153 AC |
| 3,852,665 | 12/1974 | Bothner | 324/73 AT |
| 3,873,818 | 3/1975 | Barnard | 235/153 AC |

OTHER PUBLICATIONS

Sherman, Scheme for "Blowing" Fusible–Links, IBM Technical Disclosure Bulletin, vol. 14, No. 10, Mar. 1972, pp. 3200–3201.

Fasciano, et al., Computer Aided Test of Sensor Based Systems, IBM Technical Disclosure Bulletin, vol. 14, No. 10, Mar. 1972, pp. 3067–3068.

B394,712, Jan. 1975 Patti 235/153 AC.

*Primary Examiner*—Charles E. Atkinson
*Attorney, Agent, or Firm*—James J. Ralabate; Franklyn C. Weiss; Robert E. Cunha

[57] ABSTRACT

Apparatus for the automatic inspecting, programming and testing of programmable read-only memory (PROM) devices. Under computer control, this PROM Handling System will test a sequence of PROMs against new part specifications, program them in any sequence of bit patterns required by the next piece of machinery on the assembly line, mark the PROM with a four digit part number identifying the bit pattern contained therein, dry the ink in a heated chamber for a fixed amount of time, dynamically test each PROM bit for access time in a hot and cold environment, program and test replacement PROMs for the ones that had failed at any point in the process, sort the PROMs into the correct order as required by the next assembly line machine and output said tested and ordered parts into output sticks for manual delivery or automatically deliver them by a track arrangement to the next machine. The programming apparatus can produce any type of electrical programming pulse and can test the device's access speed through the use of programmable circuitry which can be automatically reconfigured by the computer to accommodate the various vendor specifications.

25 Claims, 106 Drawing Figures

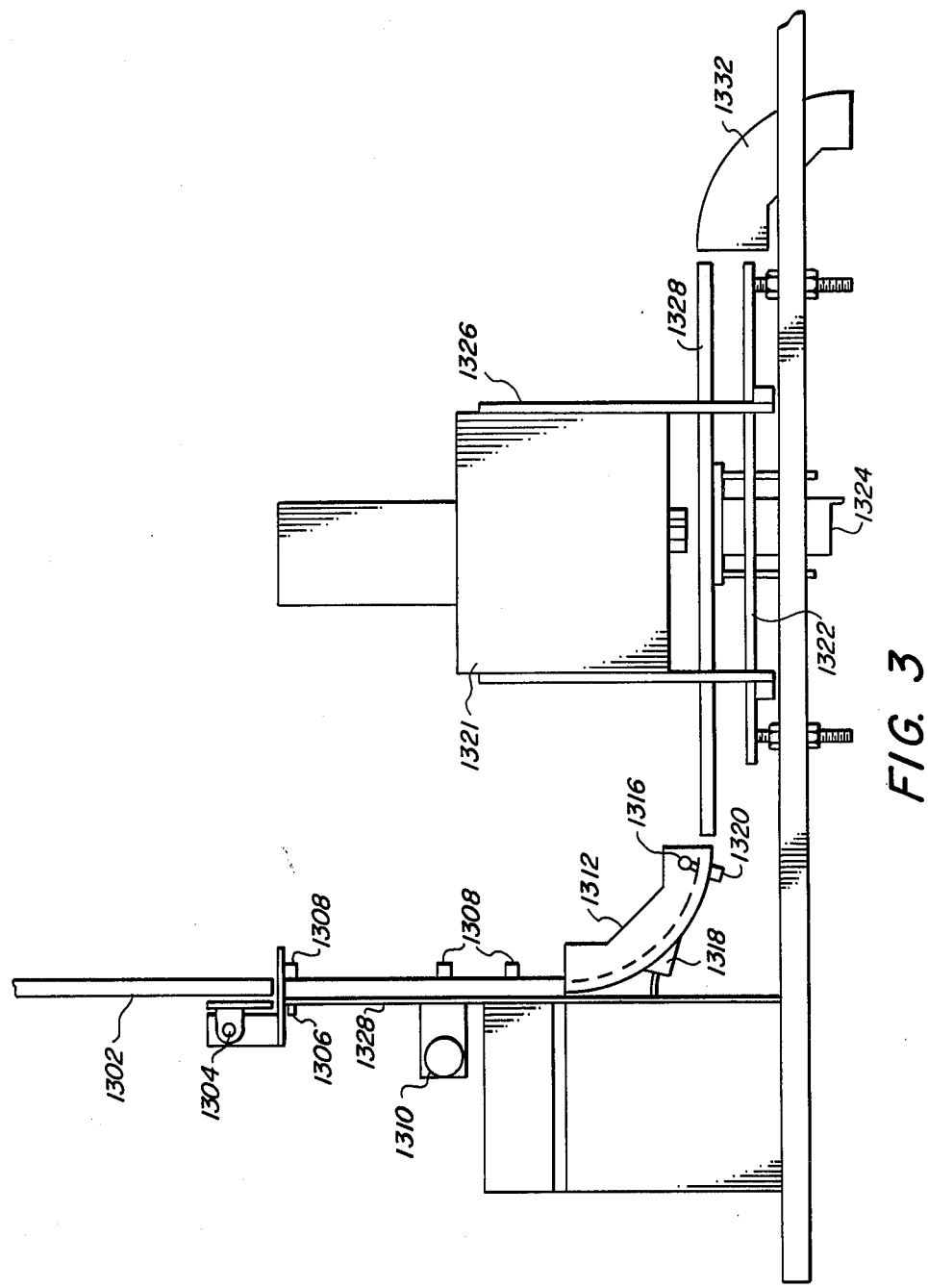

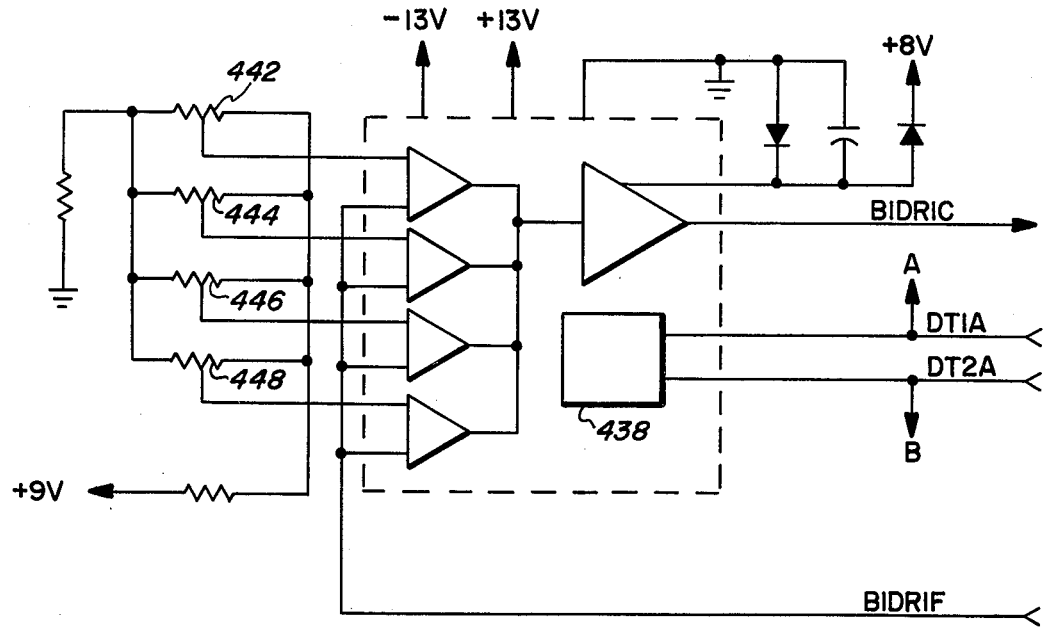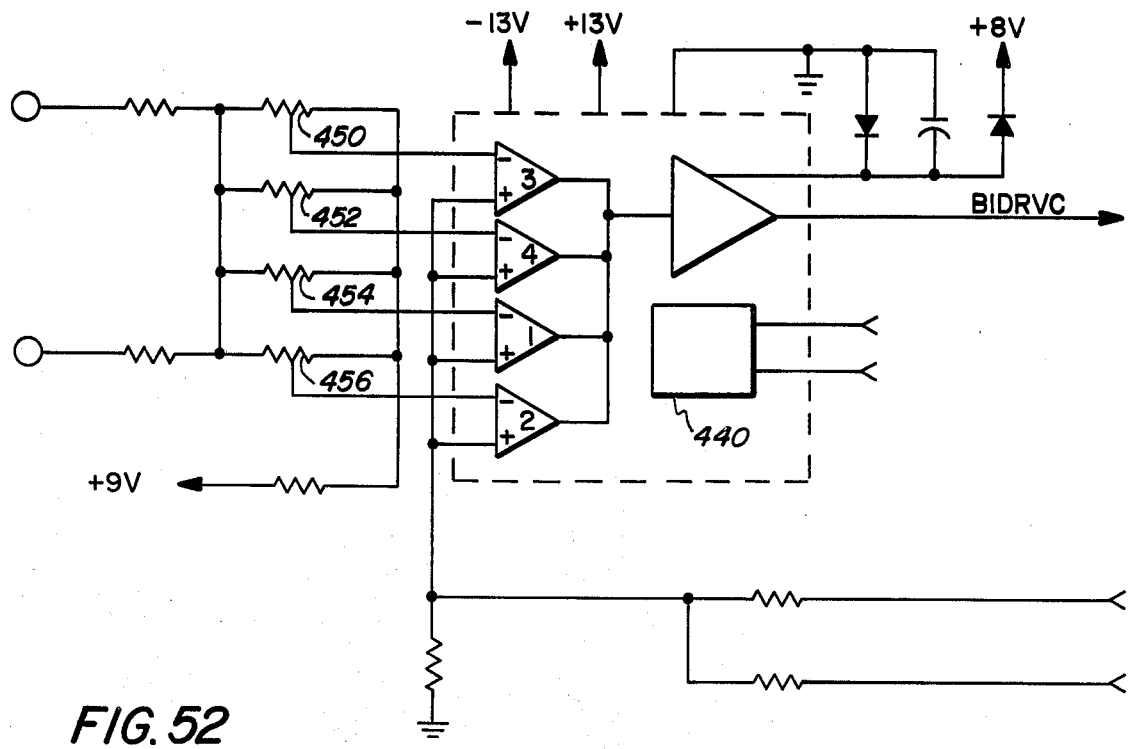
FIG. 52

SEQUENCE STEP

| | PARAMETER CONTROL LINE | | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|---|
| 1 | PAR / ADC1 | | 1 | | | | | | | | 1 | 0 | 0 | 0 | 0 | 1 | 1 | 0 |
| 2 | PAR / ADC2 | | 1 | | | | | | | | 1 | 0 | 0 | 0 | 1 | 1 | 1 | 1 |
| 3 | PAR / ADC3 | OUT | 1 | | | | | | | | | | | | | | | 1 |
| 4 | PAR / SEQ1 | | 0 | | | | | | | | 0 | 1 | 1 | 1 | 0 | 0 | 0 | 0 |
| 5 | PAR / SEQ2 | | 0 | | | | | | | 0 | 1 | 0 | 0 | 0 | 0 | 0 | 1 |
| 6 | PAR / PTE0 | | 1 | | | | | | | | 1 | 0 | 0 | 0 | 1 | 1 | 1 | 1 |
| 7 | PAR / PTE1 | OUT | 1 | | | | | | | | | | | | | | | 1 |
| 8 | PAR / TK0 | OUT | 1 | | | | | | | | | | | | | | | 1 |
| 9 | PAR / TK1 | OUT | 1 | | | | | | | | | | | | | | | 1 |
| 10 | PAR / TK3 | 0 | 0 | | | | | | | | | | | | | | | 0 |
| 11 | PAR / TU0 | OUT | 1 | | | | | | | | | | | | | | | 1 |
| 12 | PAR / TU1 | OUT | 1 | | | | | | | | | | | | | | | 1 |
| 13 | PAR / TU2 | OUT | 1 | | | | | | | | | | | | | | | 1 |
| 14 | PAR / TU3 | OUT | 1 | | | | | | | | | | | | | | | 1 |
| 15 | PAR / TM0 | | 0 | | | | | | | | 0 | 1 | 0 | 0 | 0 | 0 | 0 | 0 |
| 16 | PAR / TM1 | 0 | 0 | | | | | | | | | | | | | | | 0 |
| 17 | PAR / TM2 | 0 | 0 | | | | | | | | | | | | | | | 0 |
| 18 | PAR / ERR1 | | 1 | | | | | | | | | | | 1 | 0 | 1 | 1 | 1 |
| 19 | PAR / ERR2 | | 1 | | | | | | | | 1 | 0 | 1 | 1 | 0 | 1 | 1 | 0 |
| 20 | PAR / ERI0 | OUT | 1 | | | | | | | | | | | | | | | 1 |
| 21 | PAR / ERI1 | OUT | 1 | | | | | | | | | | | | | | | 1 |
| 22 | PAR / ERI2 | OUT | 1 | | | | | | | | | | | | | | | 1 |
| 23 | PAR / ERI3 | OUT | 1 | | | | | | | | | | | | | | | 1 |
| 24 | PAR / ER20 | OUT | 1 | | | | | | | | | | | | | | | 1 |
| 25 | PAR / ER21 | OUT | 1 | | | | | | | | | | | | | | | 1 |
| 26 | PAR / ER22 | OUT | 1 | | | | | | | | | | | | | | | 1 |
| 27 | PAR / ER23 | OUT | 1 | | | | | | | | | | | | | | | 1 |
| 28 | PAR / OUTSTATE | OUT | 1 | | | | | | | | | | | | | | | 1 |
| 29 | PAR / CE1 | OUT | 1 | | | | | | | | | | | | | | | 1 |
| 30 | PAR / CE2 | OUT | 1 | | | | | | | | | | | | | | | 1 |
| 31 | PAR / NATST | OUT | 1 | | | | | | | | | | | | | | | 1 |
| 32 | PAR / BLDR1 | OUT | 1 | | | | | | | | | | | | | | | 1 |
| 33 | PAR / BLDR2 | 0 | 0 | | | | | | | | | | | | | | | 0 |
| 34 | PAR / BLDREN | | 1 | | | | | | | | 1 | 0 | 0 | 0 | 1 | 1 | 1 | 1 |
| 35 | PAR / BIDR1 | 0 | 0 | | | | | | | | | | | | | | | 0 |
| 36 | PAR / BIDR2 | 0 | 0 | | | | | | | | | | | | | | | 0 |
| 37 | PAR / BIDREN | | 1 | | | | | | | | 1 | 0 | 0 | 0 | 1 | 1 | 1 | 1 |
| 38 | PAR / STDR1 | OUT | 1 | | | | | | | | | | | | | | | 1 |
| 39 | PAR / STDR2 | OUT | 1 | | | | | | | | | | | | | | | 1 |
| 40 | PAR / STDREN | OUT | 1 | | | | | | | | | | | | | | | 1 |
| 41 | PAR / BLDRSV | 0 | 0 | | | | | | | | | | | | | | | 0 |
| 42 | PAR / BLDRTR | OUT | 1 | | | | | | | | | | | | | | | 1 |
| 43 | PAR / SPARE07 | OUT | 1 | | | | | | | | | | | | | | | 1 |
| 44 | PAR / SPARE08 | OUT | 1 | | | | | | | | | | | | | | | 1 |
| 45 | PAR / SPARE10 | | 0 | | | | | | | | | | | | | | | 0 |

*FIG. 56*

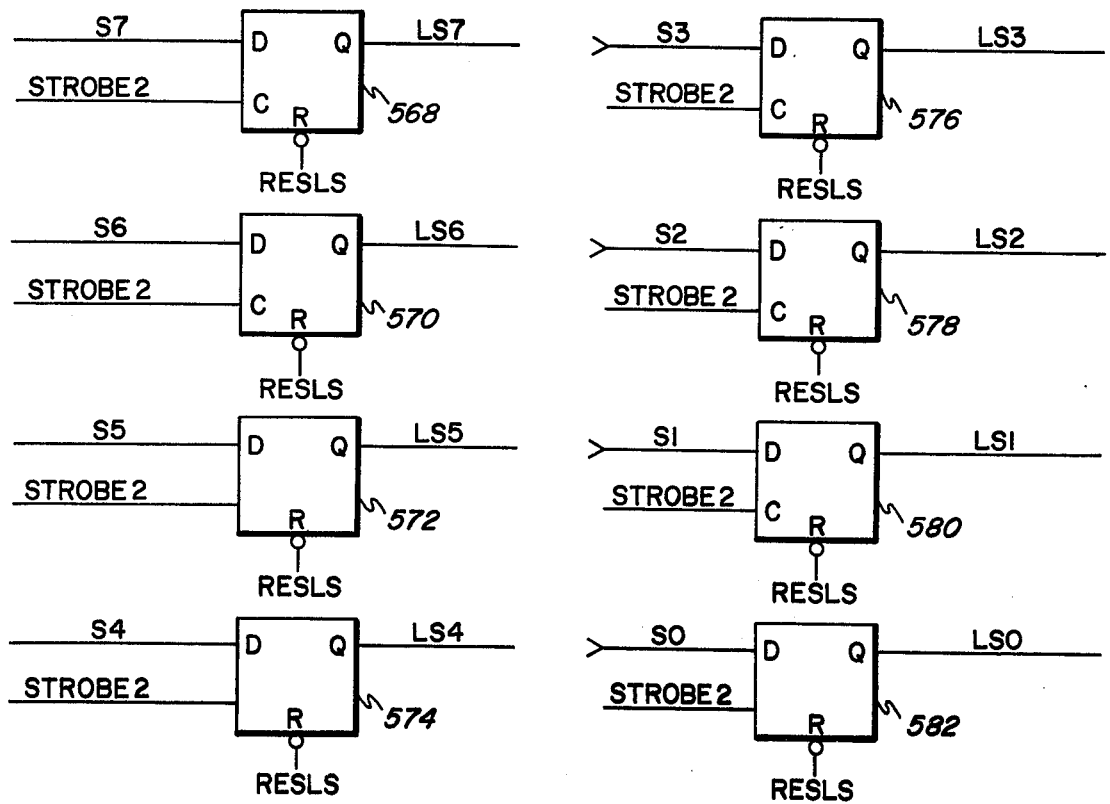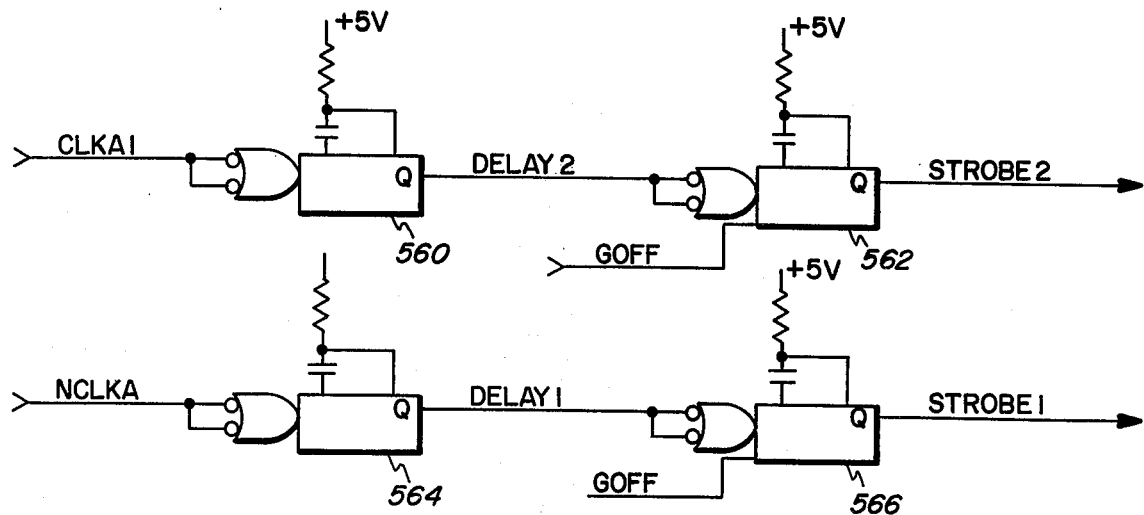
FIG. 59A

Key to Segment Identifiers

| | | | |
|---|---|---|---|
| 0 | – | Root | Temp., stack, labeled common, real-time clock, PHS interrupt handler, EXEC task and service routines. |
| 1 | – | TSC | Labeled common for auto, TSC program and error driver. |
| 10 | – | ERRIO | Error processing and self-test for auto. |
| 11 | – | AUTO | Auto program, sub-sequences, RDWD and related programs. |
| 110 | – | Tasks | Task programs and auto service routines. |
| 2 | – | CCI | Labeled common for CCI and manual, CCI, R1, CHECK, etc. Also, a large segment of the FORTRAN libary routines for WDB RAD I/O. |
| 20 | – | ERRIO | Error processing and self-test for manual. |
| 21 | – | WDB | WDB program and more FORTRAN library routines unique to WDB. |
| 22 | – | | Not defined. |
| 23 | – | MANUAL | Manual control program, labeled common for manual and FORTRAN library routines unique to manual. |
| 231 | – | DEFINE | Define, encode and service routines for define. |
| 232 | – | MACRO | Macro, execute, sub-sequences, RDWD, etc. |
| 233 | – | STORE | ADDREC, DELEREC, READBM, WRITEBM, FINDBM, etc. (used for store). |
| 24 | – | CONTROL | Control program |
| 3 | – | INITIAL | Initial, assign, FORIO, CHECK, etc. |
| 4 | – | UNLOAD | UNLOAD, CHECK, etc. |

*FIG.63*

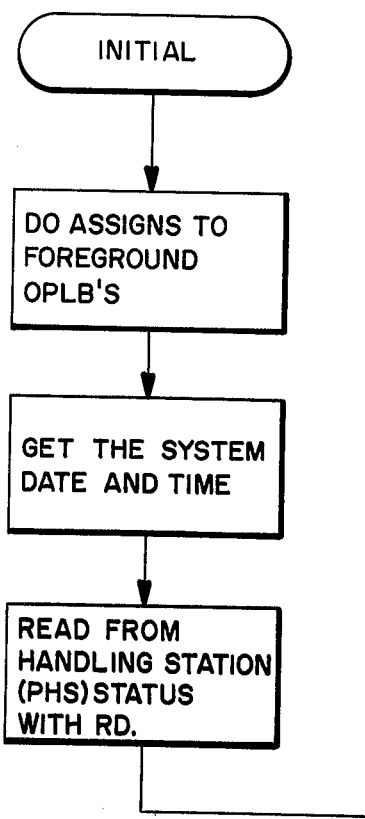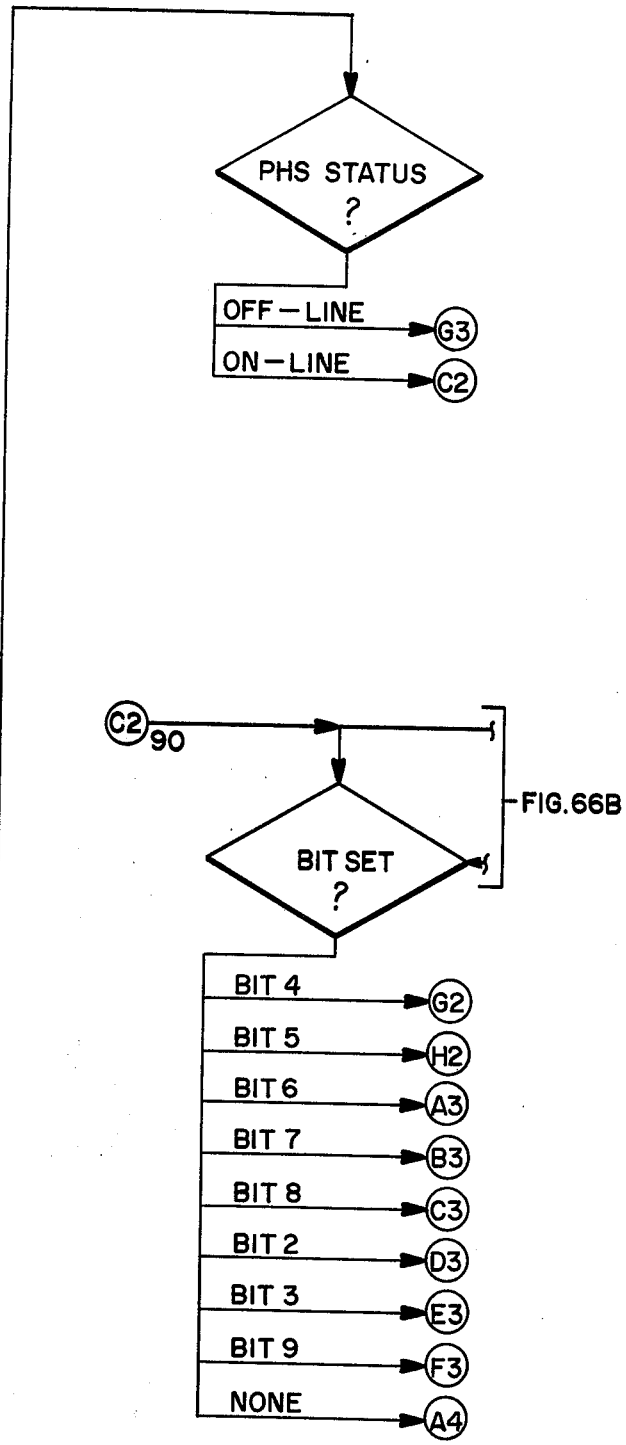
FIG. 66A

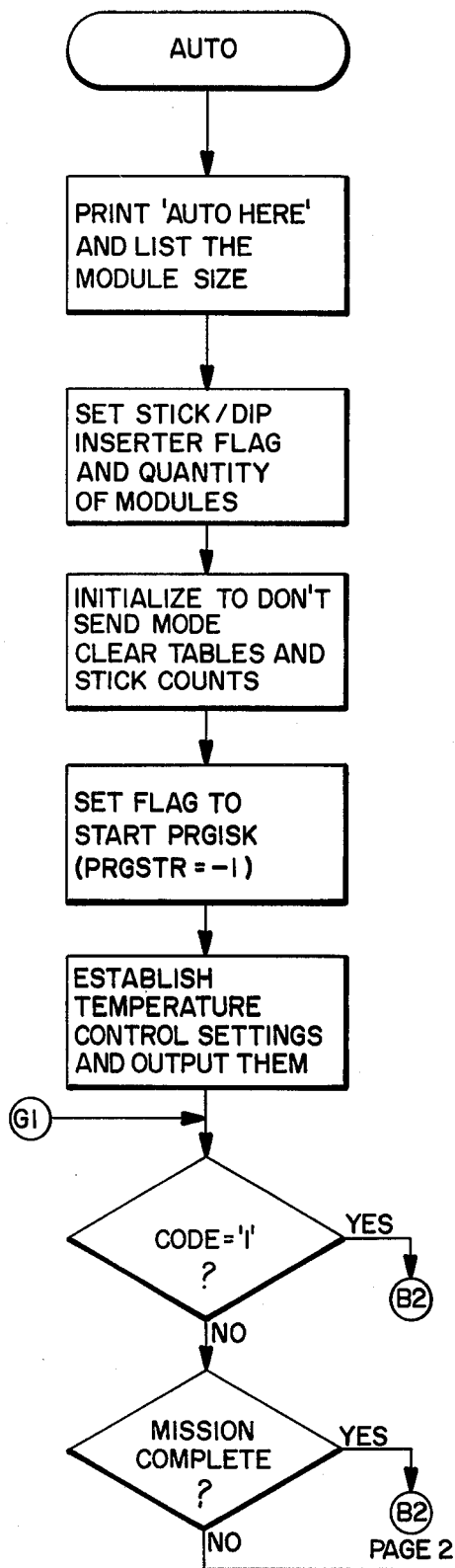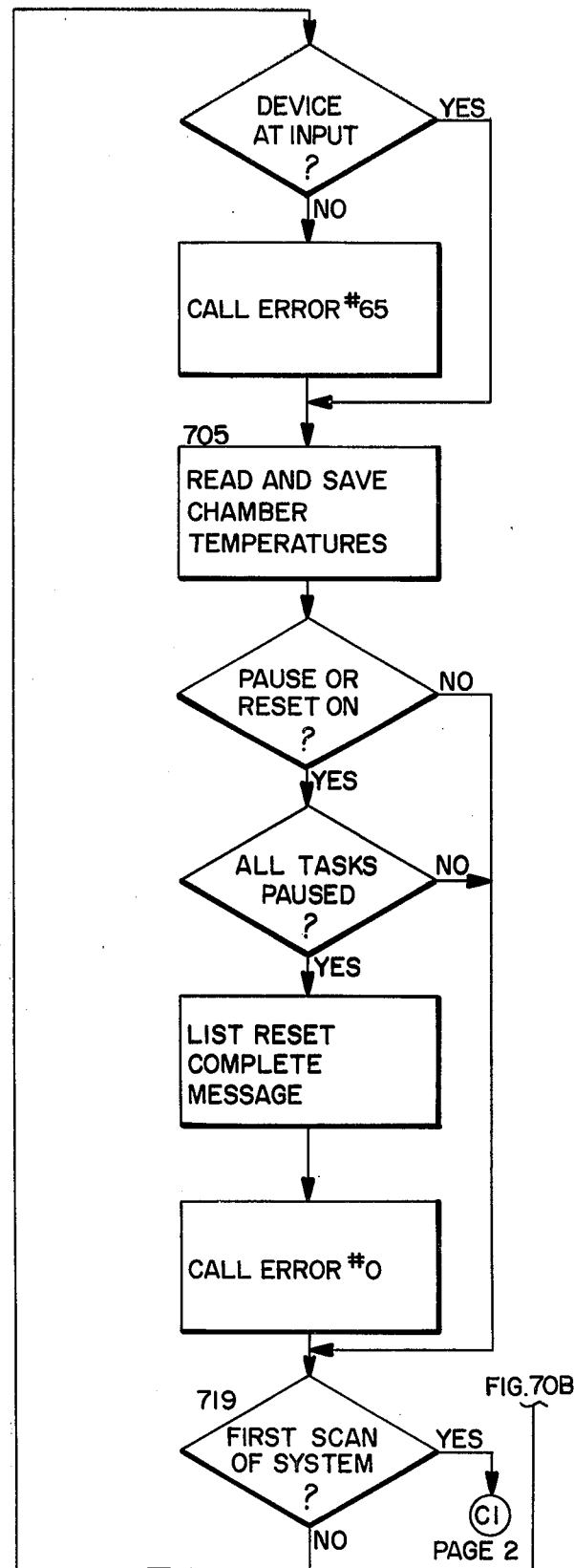
FIG. 70A

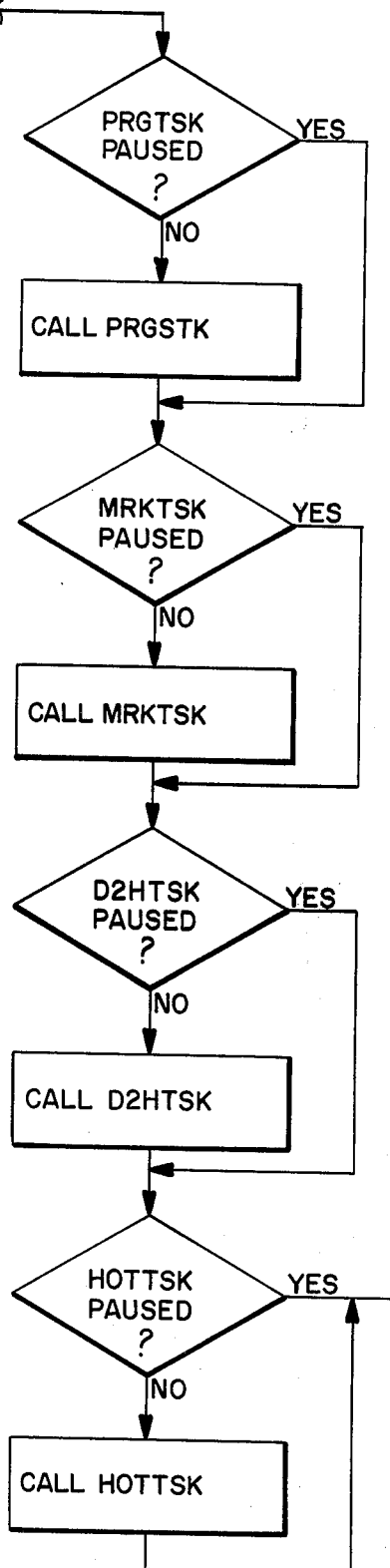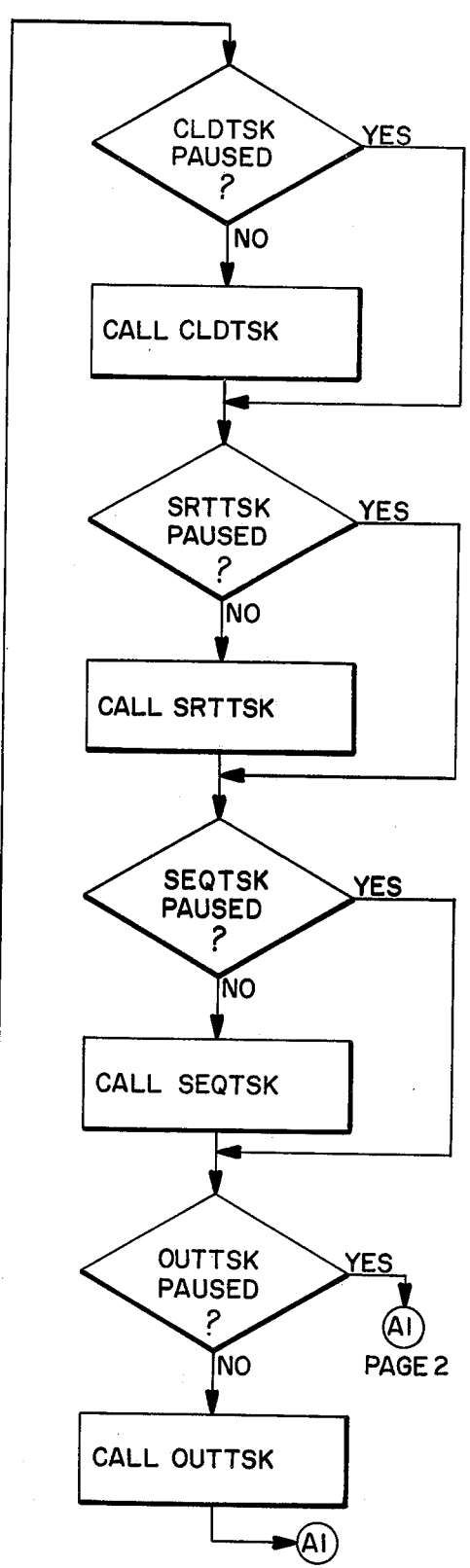
FIG. 70B

ON LINE PROM HANDLING SYSTEM

BACKGROUND OF THE INVENTION

1. Field of the Invention

This invention relates to apparatus for high-speed automatic incoming inspection, programming and dynamic testing of programmable read-only memory (PROM) devices. These devices are widely used in the implementation of digital circuits and, therefore, automatic test equipment for these devices would be of particular importance to a manufacturer of large volume digital electronic systems.

2. Description of the Prior Art

Electronic semiconductor devices are manufactured in large quantities and are preliminarily tested by the vendor according to basic specifications before being sent to the user. However, the user usually has a set of specifications that differ from those used in testing by the vendor, or plans to use the devices in a particular application that was not anticipated by the vendor. In almost all cases, therefore, the devices must be subjected to an incoming inspection consisting of electrical testing to the users specifications prior to assembling these devices into electronic circuits Thus, automatic test equipment of greater sophistication must usually be built by device users or by test equipment vendors who sell this test equipment to users. The electronic circuits themselves may either be single transistors, small scale integrated (SSI) devices or medium scale integrated (MSI) devices, and may come in a variety of packages, examples of which would be the TO-5 can and the sixteen pin dual in-line package (DIP). Automatic test equipment for these devices would consist of one or several test stations connected to a battery of signal generating and signal analysing equipment to provide the proper inputs and analyze the appropriate outputs of the device. Where a plurality of test stations are used, each test station may be specialized to a particular function and a performance board engineered to the particular kind of test to be accomplished would be designed into each test station. For instance, at a test station to measure output power, the performance board may be connected to the device through relay contacts, whereas in a timing test station the performance board would necessarily consist of low-capacitance high-speed test apparatus connected to the device under test through wires kept as short as possible.

Each automatic test system also must have transport apparatus that will move the devices from their original container to each test station in turn, ensure electrical contact at each test station, and ultimately sort the devices based upon the results of the tests. Some examples of automatic test equipment in the prior art are Sahakian, U.S. Pat. No. 3,664,499 and Alford, U.S. Pat. No. 3,418,573.

One particular device that has been manufactured in increasingly large quantities recently is the programmable read-only memory (PROM) device. Modern fabrication techniques have brought the cost of these devices down to the point where they are now being used widely in a variety of applications.

One common use of these devices is in the implementation of the control memory of microprogrammable computers. This type of computer relies on control programs permanently stored in a control memory implemented entirely from programmable read-only memory devies. Since a typical device will have a capacity of 256 words by 4 bits and since a typical microprogrammable computer will have a control memory capacity of several thousand words, each between 50 and 100 bits wide, it can be seen that the rapidly enlarging minicomputer industry is a large user of these devices.

Additionally, the cost of PROMs has now been reduced to the point where they can be used as a substitute for random logic. For instance, a matrix can be programmed to logically reduce any number of input variables into any number of output lines. The simplification of circuitry and reductions of cost when replacing random logic with PROM devices can be substantial. In fact, even specialized devices such as arithmetic logic units may be replaced by PROMs at a reduction in cost.

However, as the cost of PROMs decreases and as the use increases, testing of these devices becomes a major criterion in that the cost of programming and testing can easily be a significant fraction of the cost of the device itself. An economical way of programming large volumes of identical PROMs is to generate a mask which can be used during the manufacturing process. However, there are two problems associated with this method. First, if a mistake is discovered in the programming process, a new mask must be generated at considerable expense to correct the error. Furthermore, it would not be commercially feasible to generate a mask for each particular PROM pattern if the PROMs were used for a wide variety of applications in the manufacturing process.

The other common variety of PROM is one in which each matrix point comprises a fuse which may or may not be blown, thus programming that point. Thus, by either blowing or not blowing the 1024 fuses in a 256 word by four bit PROM, the user may program the devices without the necessity and expense of creating masks. However, there are drawbacks to this method as well. The fuse blowing process recommended by the vendor may be a complicated process involving pulses of specified voltage amplitude, current amplitude, compliance voltage, duty cycle, pulse count and rise and fall time. Additionally, the vendor may specify one set of pulse parameters before the fuse is blown and another set of pulse parameters after the fuse is blown to ensure that the fuse will not "heal", which necessitates that the fuse must be monitored during the programming process. Additionally, each word in the device must be programmed differently from the preceding word, and in the general case, each device must be programmed differently from the device preceding it.

A further complication arises since devices manufactured by different vendors vary in their electrical characteristics. For instance, a virgin device from one manufacturer may output all ones whereas the device of another vendor may output all zeros. Likewise, the programming process, the leads where the programming pulses must be applied, the electrial characteristics and the access time all vary not only from vendor to vendor but from model to model manufactured by the same vendor.

For all of the above reasons it is therefore clear that in order to prevent the incoming inspection, programming and dynamic testing of these devices to incur costs that would prevent the economical use of these devices automatic test apparatus for performing all of the above requirements on an economical cost-per-chip basis is required.

SUMMARY OF THE INVENTION

The test equipment shown and described herein comprises a PROM Handling System for the fully automatic programming and testing of programmable read-only memory devices. The devices are brought to the system in plastic sticks and from there are fed into a programming station which first inspects the device against its new part specifications. The entire PROM Handling System is under control of a computer and will then determine the pattern to be loaded into this particular PROM, load that pattern initially into a random access memory (RAM) located within the programmer test station, program the contents of the RAM into the PROM, and finally verify that the contents of the RAM and PROM are identical. The device is then transported to a marking station where the device will be marked with a four digit part number corresponding to the pattern programmed into it. Finally, the device is sent to a drying chamber where the ink deposited by the marker is dried. Then each device is transported by means of an air blast along a track to the next station.

The devices are now subjected to dynamic timing tests, one set of tests conducted at a high temperature and a second identical set conducted at a low temperature. Again, the data accessed must be identical to that received from the computer and stored within a RAM in the test station.

Finally, the parts that have been properly programmed and successfully tested are arranged in the correct sequence and are transported manually or automatically to the next piece of machinery on the assembly line, such as a DIP insertion machine which will insert the finished parts into their proper positions on a printed circuit board.

This system is flexible in that the programming and test stations may be reconfigured, under computer control, to produce any combination of voltage and current pulses specified by the vendor and may produce finished parts in any order that may be required by the next machine on the assembly line.

BRIEF DESCRIPTION OF THE DRAWINGS

FIG. 3 is a simplified mechanical drawing of the Input and Marking Stations.

FIG. 52 is a schematic of the Blow Pulse Driver Control Electronics.

FIG. 56 is a schematic of a Personality Module Logic Matrix.

FIGS. 59A and 59B are a schematic of the Address Counter.

FIGS. 61A and 61B are a schematic of the Performance Board.

FIG. 63 is a table of program task identifiers.

FIGS. 64 through 81 are program flowcharts.

DETAILED DESCRIPTION OF THE INVENTION

Figure 1:
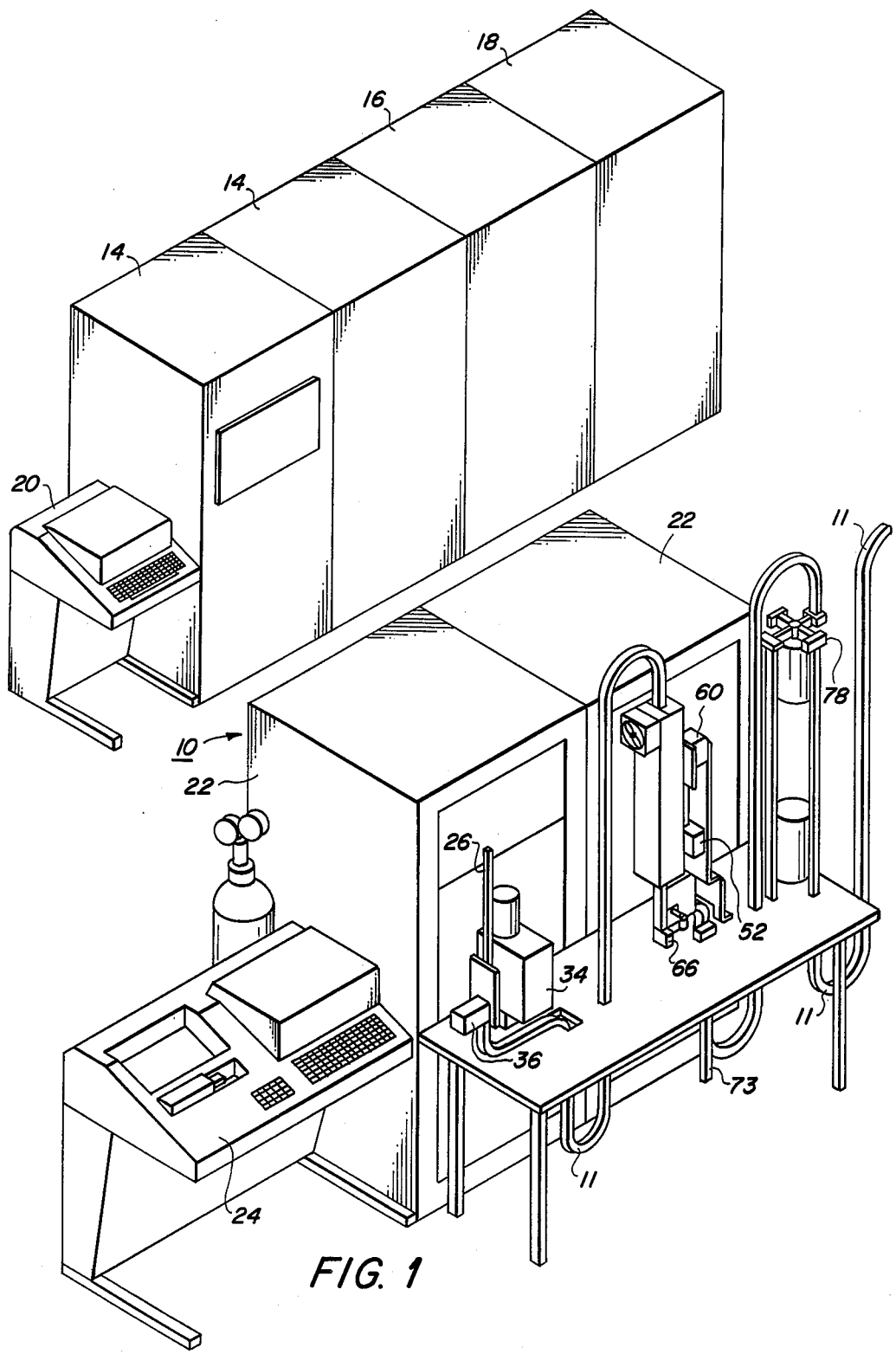
FIG. 1 is a pictorial view of the PROM Handling System.
Figure 2A:
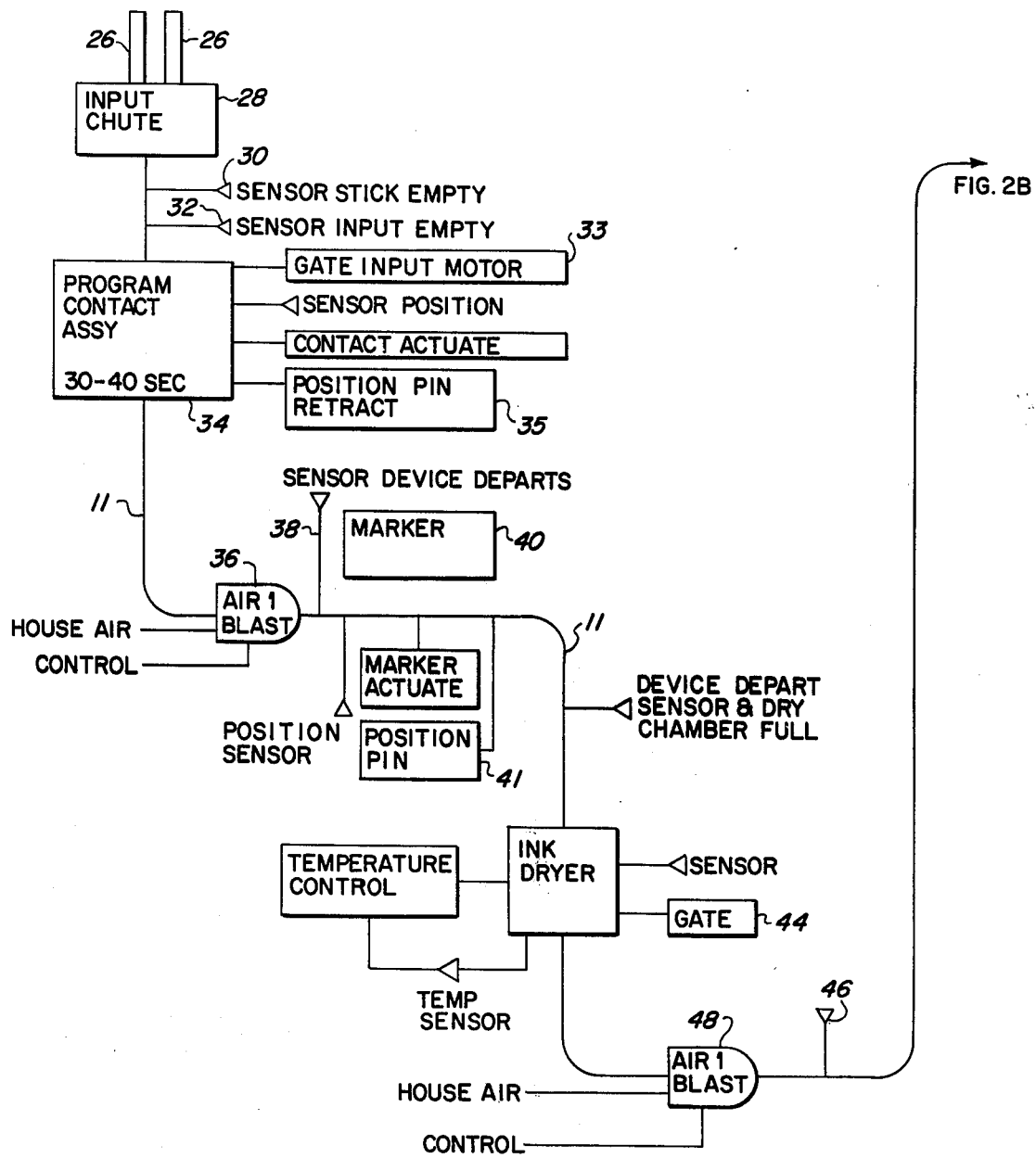
FIGS. 2A, 2B, and 2C are a functional diagram of the PROM Handling System.
Figure 2B:
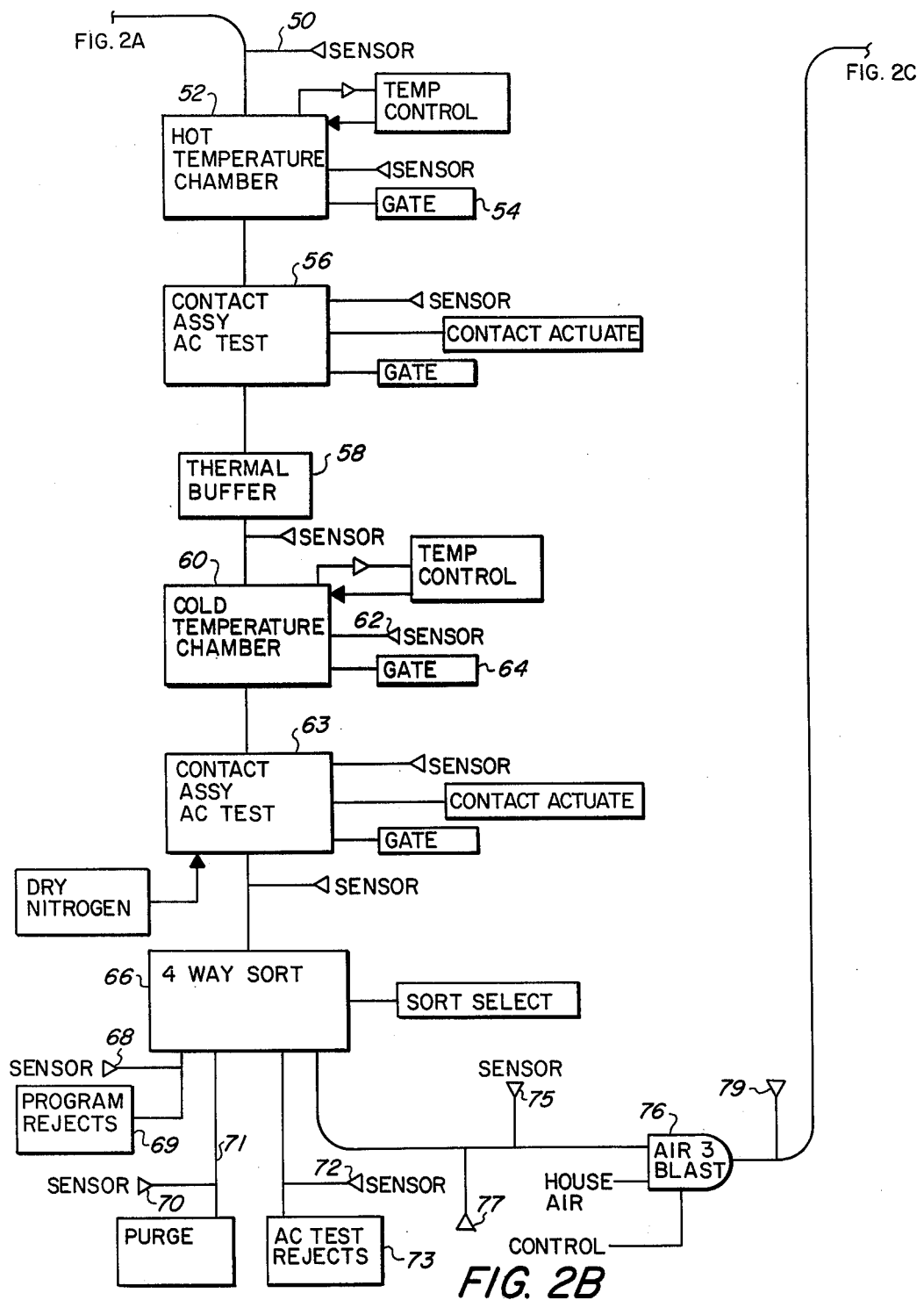
Figure 2C:
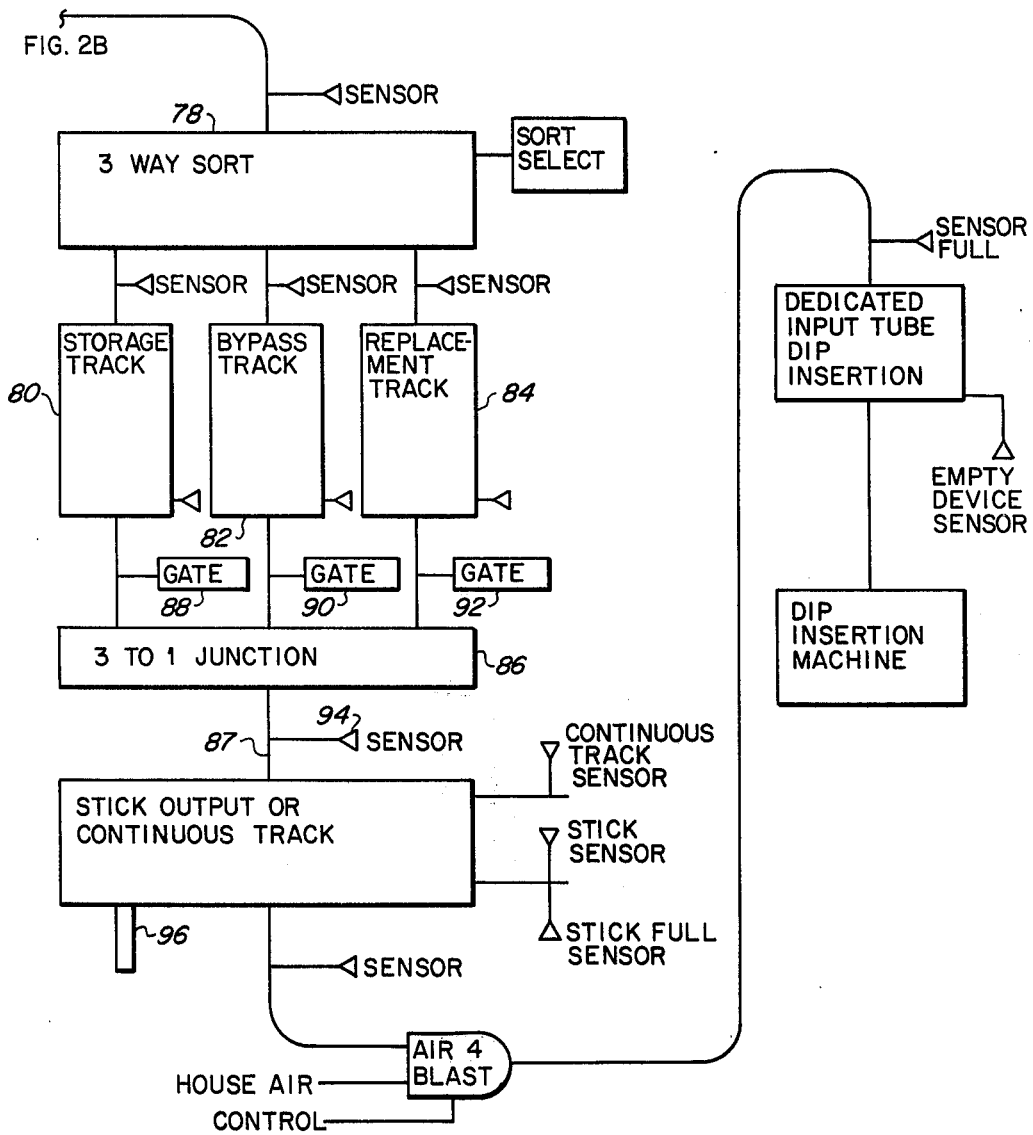

FIG. 1 is a pictorial view of the PROM Handling System 10, and the Computer 14 and its associated equipment. A DIP Insertion Machine, not shown and not part of this invention, automatically inserts PROMs supplied to it into printed circuit boards and is connected to the PROM Handling System 10 through a Track 11 which transports devices that have been programmed and tested from the PROM Handling System 10. The Computer 14 is housed in two cabinets and is associated with a Magnetic Tape Unit 16, a Disc File 18 and a Keyboard Printer 20. The PROM Handling System 10 includes three Electronics Cabinets 22 a Keyboard Printer 24 and the various mechanical fixtures which are attached to the front of the Electronics Cabinets 22 and which will be described in detail below. FIG. 2 is a functional diagram of the mechanical portion of the PROM Handling System 10 and indicates the functional and spatial relationships of these various mechanical fixtures. The following description of the operation of this PROM Handling System is presented in conjunction with both FIGS. 1 and 2.

The Programmable Read Only Memory (PROM) devices are brought to the System in plastic Input Sticks 26, each containing 30 devices. The system is designed so that two Input Sticks can be mounted on the Input Chute 28 at one time. When the Stick feeding devices to the Input Chute becomes depleted, a shuttle mechanism in the Input Chute may be shifted manually to allow the other Stick to supply parts while the empty Stick is replaced. In this way, the operation of the System is not interrupted because of a lack of input parts.

The Input Chute 28 is designed to be able to hold four devices. A photo Sensor 30 is provided in the Input Chute to detect whether four devices are in the Chute. Less than four devices in the Input Chute is usually an indication that the Input Stick 26 is empty and the Keyboard Printer 20 will type out "Input Stick Empty". At this point the operator will push the shuttle to the other side and replace the depleted Stick. A second Sensor 32 detects whether one device is in the Input Chute. If no device is detected, the printout will be "Input Chute Empty" and the System will go into a "pause" condition for lack of parts. If, for instance, the Input Stick is not empty at this time, then the operator will be put on notice that a jam has possibly occurred between the Input Stick 26 and the Input Chute 28. There is also a Metering Gate 33 below the Input Chute that allows devices to drop on Computer command, one at a time, to the next PROM Handling System station, which is the Program Contact Assembly 34.

The PROM falls onto a Positioning Pin 35, and two sets of contacting fingers are then clamped onto the 16 pins of the PROM. One set of 16 contact fingers is required to make electrical contact with the 16 pins on the PROM while the other set of 16 contacting fingers is provided to test whether the first set has made electrical contact. This contact test is accomplished by grounding one set of contacts and testing for ground at the other set. If the second set of contacts is shown to be at ground potential then the first set is proven to be in electrical contact with the pins. If this test is not passed the Program Contact Assembly 34 is cycled repeatedly through its disconnect and reconnect operations until either a full set of contacts is made or a predetermined number of tries have been attempted. If contact cannot be made with all pins the device is considered a reject.

The first step in the programming of the PROM is to load the appropriate pattern into a random access memory (RAM) in the programming circuits of the Electronics Cabinet 22. The programming circuits, by blowing appropriate fuses in the PROM, program the PROM with the pattern that had first been loaded into the RAM. Finally, a test is made to verify that the contents of the RAM and PROM are identical.

The PROM Handling System 10 is generally under control of the Computer 14 but, as to the programming of the PROM, the Computer merely issues a "start programming" command and the entire process of PROM programming is accomplished by the programming circuits of the Electronics Cabinet 22. This is true since, as will be explained in detail later in this specification, the programming sequence requires a set of voltage and current waveshapes that are beyond the capability of the Computer to produce. The Computer only specifies the device vendor, loads the appropriate program from the data base into the RAM and issues the start command. At this point, the programming circuits are automatic in that they will load the program from RAM to PROM by whatever programming procedure is specified by the vendor.

If a PROM cannot be properly contacted, or if the PROM can not be properly programmed, it is considered a rejected part, it will not be marked in the Marker 40 and will be sorted into the Program Reject Stick 68 below the 4 Way Sort 66.

As will become apparent later, there is only one place where bad parts can be ejected from this system and that is at the 4 Way Sort 66, which station separates the devices into those that failed at the Program Contact Assembly 34, those devices that failed the dynamic tests which are performed in the Temperature Chambers, 52 and 60, parts that have been programmed and tested satisfactorily, and purged parts. Purged parts represent parts that may or may not be good because a jam or some other condiion prevented the device from being fully programmed or tested. If the parts in the Purge Stick 71 are not marked, that is an indication that they have not been programmed and may be retested later as new parts. The parts in the Purge Stick 71 that are marked ith a part number are considered parts that have been programmed and may be tested at a later time according to the program associated with that part number. If a part has been properly programmed but has not been marked, then, when the device is retested it will fail the native state test and be considered a reject.

At the beginning of a mission defined as the production of a series of programmed PROMs for one module, the operator will type in through the Keyboard Printer 20 the module assembly number which the computer uses to determine the patterns to be required. Then the PROM Handling System 10, under control of the Computer 14, will program each PROM according to the vendors specifications after inspecting the native state of the PROM, which for some vendors is all one's and for other vendors is all zero's.

A typical fuse blowing procedure consists of selecting a fuse, applying a set of pulses to blow the fuse, and applying a second set of pulses for some predetermined period thereafter. Thus, each blow pulse is followed by a fuse test, up to the point where the fuse is blown. Of course, if a predetermined number of blow pulses does not result in a fuse being blown, then the device is automatically rejected. After the entire PROM is programmed, as a final step the System reads the entire PROM once again to compare the PROM contents and the RAM contents.

At the conclusion of the programming sequence the Position Pin 34 is pulled and the device is allowed to drop down the Track 11, past an Air Blast Inlet 36 and past a Sensor 38. The Sensor 38 is positioned further down the Track than the Air Blast Inlet 36 so that when the Sensor detects the presence of a device, a blast of air at the inlet hole will blow the device into the Marker 40. If the contacts in the Program Contact Assembly 34 release the device but the Sensor 38 does not sense the device a reasonable time thereafter, the Computer is informed that a jam exists. The Computer will then type out a jam message and the operator must clear the System.

If the PROM was not programmed properly, and is therefore a rejected part, the air blast will blow the PROM through the Marker 40 and the part will not be marked with a part number. This part will ultimately be rejected as a program reject at the 4 Way Sort 66.

If the PROM was properly programmed and verified, a Position Pin 41 will obstruct the Track 11, bringing the device to rest at a proper position for marking by the Computer controlled part number Marker 40. The System is designed so that the air blast will continue until the device has been properly positioned and clamped into place under the Marker 40. In the Marker a block will rise forcing the device against a window in the top of the Track. Then the Marker 40, under Computer control, will dial up the appropriate part number and the marking pad will lower down onto the device marking it with an epoxy-based ink. The Marker 40 is then retracted, the block is lowered, the Position Pin 35 is pulled, and a subsequent air blast propels the device into the Ink Dryer 42.

The ink used for marking requires a curing time of 1½ minutes at a temperature of 150°C. The Dryer 42 holds 16 devices and the Computer keeps a running time on each device in the Dryer so that, on a first-in-first-out basis, each device will be released from the Dryer at the appropriate time. A time is not kept on rejected parts, and they are released from the Dryer as soon as they reach the outlet port. As each device is timed out, it is released through a Gate 44 and its departure is sensed by a Sensor 46. An air blast at the bottom of the Dryer 42 will propel the device to the next station.

The device passes Sensor 50 and enters the Hot Temperature Chamber 52 which is kept at 85°C. The Computer notices the passage of the device past Sensor 50 and keeps a running time on the device. The Hot Temperature Chamber 52 holds up to 16° and when the device at the bottom of the Hot Temperature Chamber has been timed out at 2 minutes, a Gate 54 opens, allowing the device to drop into the Contact Assembly 56 which is an internal part of the Hot Temperature Chamber 52. There a Contactor Assembly 56, similar to the one in the Program Contact Assembly 34, contacts the device. A test RAM located in the test station electronics of the Electronic Cabinet 22 is loaded with the appropriate test pattern and the device is compared against the speed parameters which are published in the vendors specifications. A "galloping read" test is used, which is a test at rated speed of the ability of the PROM to produce data from any location immediately followed by the production of data from any other location. In a 256 word device this results in about 64,000 data access and is accomplished by the test station electronics and about a tenth of a second.

In spite of the availability of the Computer, this performance testing is also accomplished completely by a dedicated set of electronics since the Computer is incapable of operating at speeds high enough to test the PROMs dynamically, nor is the Computer capable of generating the complex pulse voltage and current waveshapes required.

By way of contrast, the verify test performed in the Program Contact Assembly 34 was a content test, verifying that the PROM was programmed properly. The test performed in the Hot Temperature Chamber 52 is a dynamic test to determine that the PROM will operate at its rated speed. A performance board is built into the test station to allow this dynamic testing and is specifically designed to accurately measure access time. Finally, the test results are stored away in the Computer for use later in the 4 Way sort 66 operation.

Upon completion of the Hot Temperature Chamber 52 dynamic test, the device passes through a Thermal Buffer 58 into the Cold Temperature Chamber 60. The Thermal Buffer 58 is simply a block of bakelite containing a track to transport the devices from Hot to Cold Chambers while maintaining thermal isolation between the Chambers.

Sensor 62 senses the arrival of the PROM and the Computer keeps track of the time that the PROM has been in the Cold Temperature Chamber 60 which is kept at 10°C. The Cold Chamber 60 was designed to hold 20 devices and as each device is timed at 2 minutes, it is dropped through Gate 64 into the Contact Assembly 63, which is internal to the Cold Temperature Chamber 60, for a dynamic test identical to the test performed in the Hot Temperature Chamber 52. In fact, the same set of electronics is time-shared between both Temperature Chambers. However, since the test time of a tenth of a second is a small fraction of the temperature soak time of 2 minutes, the time-sharing of the electronics does not significantly affect the production rate of this PROM Handling System. Likewise, PROMs that have not been programmed properly and devices that have failed the hot dynamic test are not timed in the Cold Temperture Chamber and are not tested in the Cold Contact Assembly 63.

Dry nitrogen is pumped through the Cold Temperature Chamber 60 to prevent condensation of water on the devices. Thermoelectric devices are used in conjunction with a thermostat to maintain the chamber at 10°C and the dry nitrogen is supplied at a rate slow enough that the temperature of the nitrogen has no effect on the temperature of the Cold Temperature Chamber.

The 4 Way Sort 66 consists of four cups mounted on a carrousel and driven by a step motor such that the carrousel can receive a device in any one of the cups and deliver it to any one of four output positions. The Computer continuously monitors the status of every device, and as each device is dropped into a cup the Computer will decide whether the part is a program reject, a purged part, a test reject or a good part that should be sent on to the next station. As explained above, the purged parts are parts whose status is unknown and must be retested. Purged parts usually are the result of a jam condition where the status of the parts is unknown. Program rejects are parts that could not be programmed properly in the Program Contact Assembly 34. Test rejects are parts that failed the dynamic test in either the Hot or Cold Temperature Chambers. There is a Sensor 68, 60, 72 and 74 above each Stick or Tube to verify that the device delivered to the 4 Way Sorter was in fact put into the appropriate Stick. If, for instance, a device drops out of a cup, the appropriate Sensor will not detect the passage of the device, the operator will be informed through a message typed out on the Keyboard Printer 20 and the operator must take corrective action. In this case, the corrective action would be to place the device in the proper Stick and type a continuation code on the Keyboard Printer 20. Good parts are dropped into the Accept Tube 75 and will proceed past an Air Blast Inlet 76 before being sensed by the Accept Tube Sensor 74. When the Sensor detects that the device is past the Air Blast Inlet, an air blast will blow it to the next station. There is a Device Rotator 77 immediately after the 4 Way Sort on the track to the Air Blast Inlet 76 to rotate the finished parts 180° if the DIP Insertion Machine eventually will require them in that position.

The next station is a 3 Way Sort 78. This mechanism is needed because the output of the devices from this PROM Handling System must be an ordered sequence of parts that may be fed directly into the DIP Insertion Machine whereas if parts fail either a Hot or Cold dynamic test and a replacement part is introduced into the stream of parts at the Program Contact Assembly 34, the parts will be out of order. The parts output from the PROM Handling System may be transported directly to the DIP Insertion Machine or may be stored temporarily in Output Sticks but in either case the proper ordered sequence must be maintained.

If a failure is detected at the Program Contact Assembly 34 there is no sequence problem since that device will be specified as a reject and a fresh device will be immediately programmed. When the rejected device gets to the 4 Way Sort 66, it will be rejected out of the stream of parts and the remaining parts will be in the proper order. However, if a replacement part is for a part that failed in a Temperature Chamber it will be out of sequence. If this is the case, the 3 Way Sort 78 will store the intervening parts in one of two Storage Tubes 80 until the replacement part becomes available at the 3 Way Sort 78. The replacement part will be dropped down a Bypass Tube 82 and in this way will get ahead of the intervening parts. There will be intervening parts since, if a failure is detected at the Cold Temperature Chamber there may be, for instance, 16 parts at that moment in the Hot Temperature Chamber 52 and another 10 parts in the Dryer 42. When these 26 intervening parts get to the 3 Way Sort 78 they will be temporarily stored in one Storage Tube 80 until the replacement part can be dropped into the Bypass Tube 82. Thus, the ultimate stream of parts will consist of good parts, followed by the replacement of the rejected part, followed by the intervening parts.

A complication arises when the replacement part itself is rejected at one of the two Temperature Chambers. At this point, a replacement of the replacement must be programmed. The intervening parts may consist not only of good intervening parts but replacements as well. This second complete set of intervening parts must now be stored in the Storage Tube 80. However, some temporary storage for the intervening replacement parts must be provided and these parts are, in fact, stored in the Replacement Tube 84. At this point, the 3 Way Sort 78 will put good parts in one of two Storage Tubes 80, replacement parts in the Replacement Tube 84 and finally will direct the replacement of the replacement down the Bypass Tube 82. Thereafter, the stream of intervening parts may be directed from the Storage Tube and the Replacement Tube to continue this sequence of ordered parts through the PROM Handling System. However, there is only provided within two Storage Tubes 80 enough space to store two complete sets of devices. Therefore, in order to avoid bringing the System to a complete halt, the System is prevented from programming any new parts until the replacement of the replacement has successfully passed both temperature tests and has in fact been transported through the 3 Way Sort 78 to the Bypass Tube. For this six minute interval no new devices are programmed. Upon the successful passage of the replacement of a replacement through the Bypass Tube 82 the System reverts to its normal operating procedure.

A 3 to 1 Junction 86 funnels devices from all four Tubes into one Track 87. The four inputs to this 3 to 1 Junction 86 are controlled by Metering Gates 88, 90 and 92 which, under control of Computer which has been keeping track of all the devices in the system, will allow the devices to enter the 3 to 1 Junction 86 in the proper order.

The above system will work only if replacement parts themselves are produced in order. Replacement parts could be produced out of order if a failure was detected at the Cold Temperature Chamber 50, a new part were programmed, and then immediately thereafter a failure was detected at the Hot Chamber and another part were programmed at the Program Contact Assembly 34. To prevent this form happening, a decision on whether to program a new device as the result of a dynamic test failure will not be made until the device is presented to the 4 Way Sort 66. In this way all replacement parts will be programmed in sequence.

The successfully programmed, tested and sorted parts may be transported directly to the DIP Insertion Machine or may be stored in Output Sticks 96, There is a Sensor 94 which keeps track of the number of devices input to the Output Stick 96 and when the Output Stick is full, a "change Output Stick" message will be typed out on the Keyboard Printer 20. While the Output Stick is being changed, the System continues to operate, loading up the Bypass Tube 82 with successfully tested devices. Only when the Bypass Tube 82 is full will the System come to a halt for lack of an Output Stick 96. The Bypass Tube 82 may contain up to 56 devices.

A variety of jam conditions may occur in this equipment. It is for this purpose that Sensors have been positioned at all appropriate points of the system. When a device should have passed a Sensor but did not, an appropriate message is typed out on the Keyboard Printer 30 giving the operator an indication of where the problem may be. In any case, the Computer goes into a pause condition until the situation is rectified.

FIG. 3 is a simplified mechanical drawing of the Input and Marking Stations. Two Input Sticks 1302 are connected to the Input Chute 1304. A Light Source 1306 and a Photocell 1308 detect the presence of PROMs in the Track 1328 leading to the Metering Gate 1310. The Contact Assembly 1314 receives PROMs one at a time from the Metering Gate 1310 and contacts all the leads of the PROM prior to programming a bit pattern into that PROM. This Contact 1314 is similar to the ones used in the Hot and Cold Chambers and will be described in more detail below.

PROMs are transported from one station to another by gravity if the PROM is being transported in a downward direction, or by an air blast if the PROM must travel upward or in a horizontal direction. Track 1312 is a vertical to horizontal transition Track and, after programming, the PROM is released and is detected at the Light Source 1316 and Photocell 1320. At this point it is past the Air Blast Inlet 1318. An air blast will result in the PROMs delivery to the Marker Station 1321. The Track 1328 is equipped with a marking Window directly under the Marker 1321. The Marker Mounting Platform 1322 is adjustable so that the Window will be positioned exactly with respect to the Marker wheels so that the marking operation will result in a clearly marked part number. The marking Gate and associated apparatus 1324 will be shown in detail in another figure. A Marker Hinge 1330 in conjunction with Marker Mounting Brackets 1326 allow for rotation of the Marker 1321 for cleaning and maintenance. Horizontal-to-Vertical Transition Track 1322 is used to allow the device to be transported to the next station.

Figure 4:
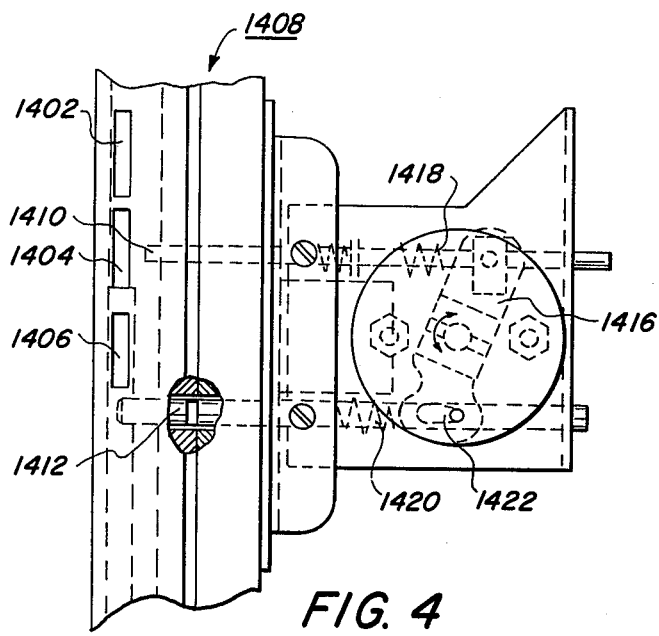
FIG. 4 is a simplified mechanical drawing of the Device Metering Gate.

FIG. 4 is a Device Metering Gate. Two Shafts 1410 and 1412 are connected to a Rocker Arm 1416. The Rocker Arm is connected to the Shafts by internal Springs 1418 and 1420. As shown, three PROMs 1402, 1404 and 1406 which would otherwise fall down through the track 1408 are being held in place by Shaft 1412 which is blocking the Track. When the Gate meters one PROM out, the Cam 1416 will rotate in a counter clockwise direction. Because of the Slot 1422 and the Springs 1418 and 1420, Shaft 1410 will pin PROM 1404 to the track before Shaft 1412 releases PROM 1406 to drop down the track 1408. Likewise, at the end of the cycle a clockwise rotation of the Cam 1416 will result in a blocking of the Track by the lower Shaft 1412 before unlocking a PROM 1414, allowing PROM 1404 and the PROMs above it to fall down against Shaft 1412. Thus, one device at a time can be fed through this Gate.

Figure 5A:
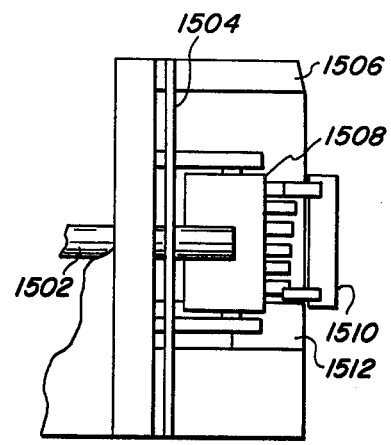
FIGS. 5a and 5b are a simplified mechanical drawing of the Contact Assembly.
Figure 5B:
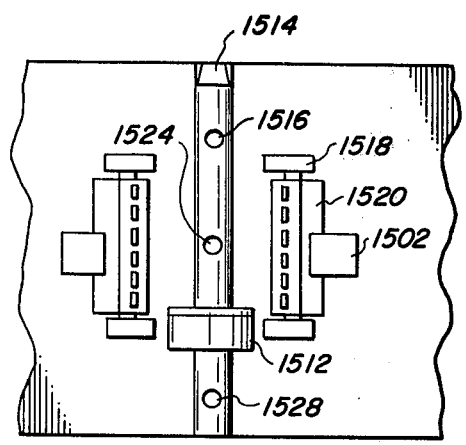

FIGS. 5A and 5B are simplified mechanical diagrams of the Control Assembly. The PROM to be programmed drops down the track onto the lead orienting device Gage 512 which contacts the bottom lead rather than the body of the PROM, this ensuring that the contacts will be aligned properly with the PROM leads in spite of the variations in PROM package dimensions. The device pinning Pin 1516 will catch an extra device if one has been allowed through the previous metering Gate. Thus, only one PROM at a time will be discharged from the contact subassembly, allowing the computer to keep track of each individual PROM. The contact block is a set of eight contacts operated by the actuation yoke arm 1502, one of which is provided on both sides to contact the leads of the PROM. Each contact Block 1520 pivots onto the PROM contacts. The actuation yoke arm 1502 compresses the contacts against the leads of the PROM thus making contact. There are two contacts for each PROM lead. The Photocells 1524 and 1528 monitor the presence and departure of a PROM from this assembly.

Figure 6:
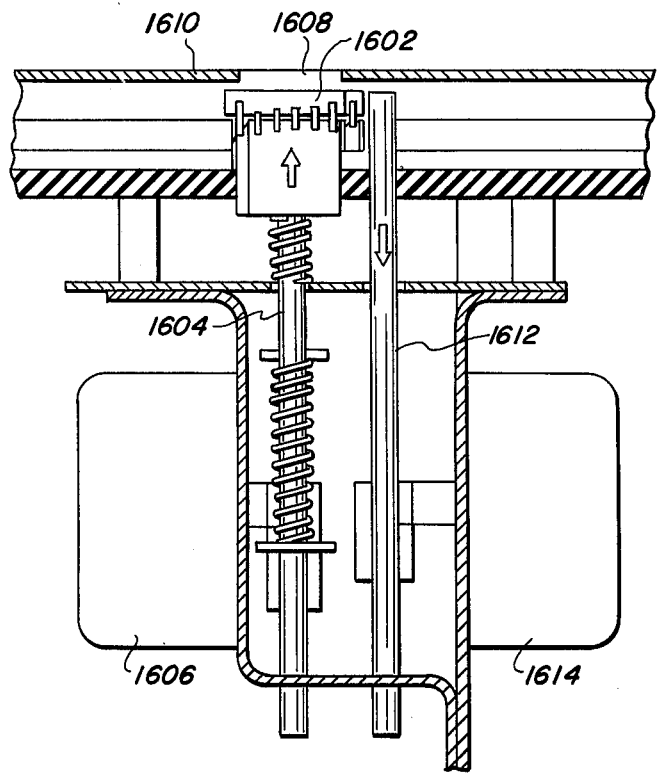
FIG. 6 is a simplified mechanical drawing of the Marking Gate and Device Pinning Mechanism.

FIG. 6 is the Marking Gate and Device Pinning mechanism. This diagram shows the PROM 1602 in position to be marked. The device pinning Solenoid 1606 drives the Shaft 1604 in the direction of the arrow against the PROM, pushing the PROM up against the marking Window 1608. In the Track 1610 the PROM was originally driven to this position by an air blast from left to right and is stopped at the Shaft 1612 of the PROM locating Solenoid 1614. After the PROM 1602 has been marked through the window 1608 the PROM locating Solenoid Shaft 1612 and the PROM pinning Solenoid Shaft 1604 both will be dropped allowing the PROM to be blown out to the next station.

Figure 7A:
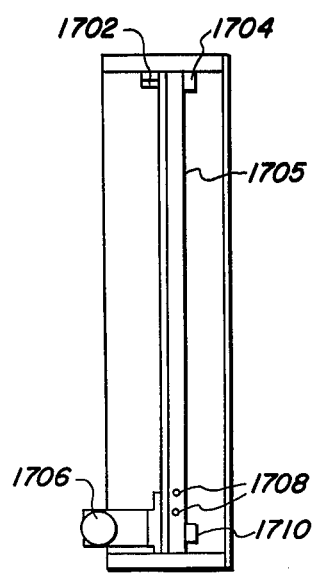
FIGS. 7a and 7b are a simplified mechanical drawing of the Ink Drying Chamber.
Figure 7B:
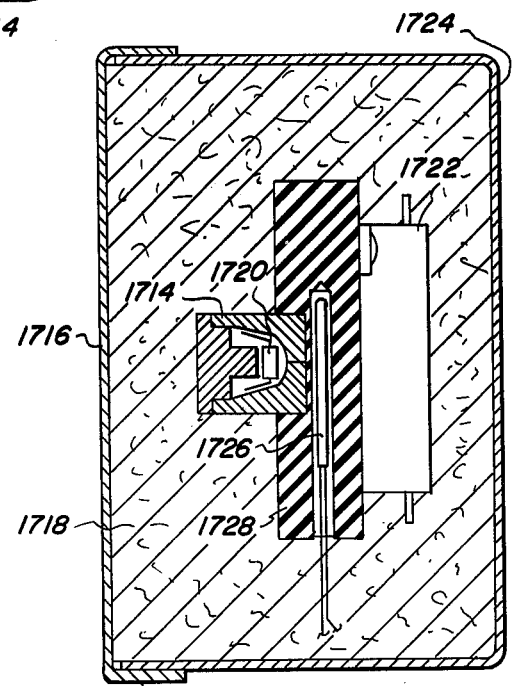

FIGS. 7a and b are two views of the Ink Drying Chamber. The Light Source 1702 and the Photocell 1704 detect each PROM as it comes into the Ink Drying Chamber on the Track 1705. The Temperature Sensor 1708 is located at the bottom of the Ink Drying Chamber and the PROM Metering Gate 1706 allows each PROM to exit from the Ink Drying Chamber at the completion of its drying time. Plastic Ends 1712 provide thermal insulation for this Ink Drying Chamber which is kept at a high temperature. FIG. 7b shows the curved top Track 1704 which is designed so that the numbers marked on the top of PROM 1720 will not be smeared. Sensors 1726 are mounted within the Heat Equalizer Bar 1728 which is heated by series parallel Resistors 1722. The entire mechanism is surrounded by Insulation 1718 and a Housing 1724.

Figure 8:
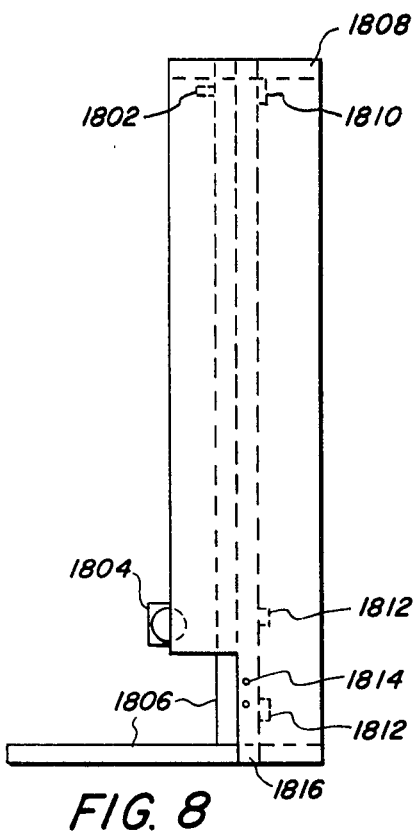
FIG. 8 is a simplified mechanical drawing of the Hot Chamber.
Figure 9B:
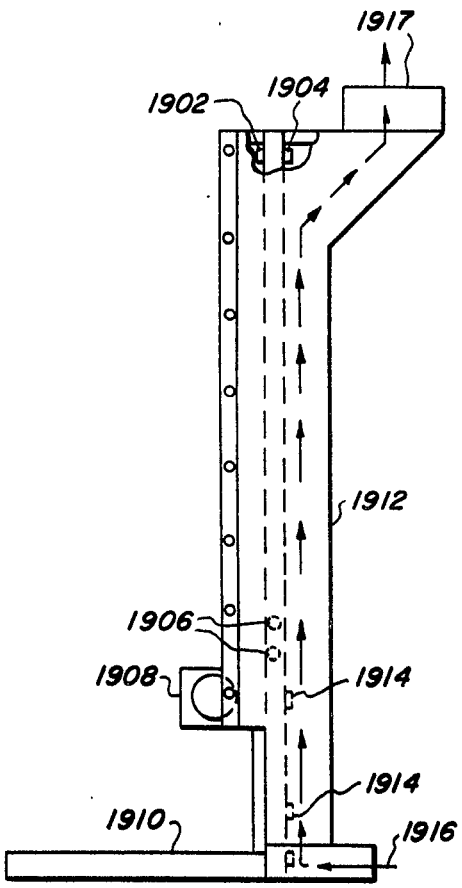
FIGS. 9a and 9b are simplified mechanical drawings of the Cold Chamber.
Figure 9A:
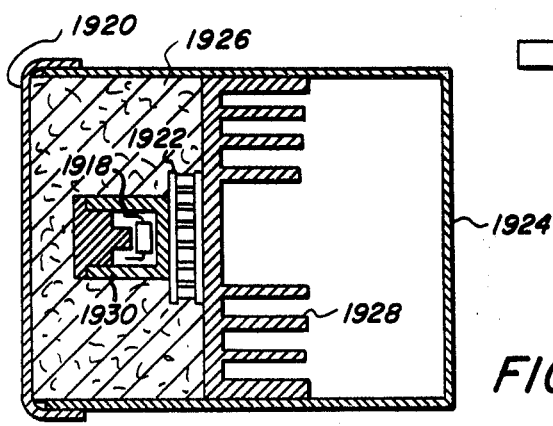

FIG. 8 is a diagram of the Hot Chamber. Light Source 1802 and Photocell 1810 detect a PROM entering the Hot Chamber. End Plate 1808 is a thermal insulator. The Metering Gate 1804 allows each PROM to drop out of the Chamber after it has been in for the required amount of time and has been tested. Photocells 1812 detect the presence of a PROM at the bottom of the Hot Chamber and detect the passage of a PROM out of the Hot Chamber. Guides and Supports 1806 position the Hot Chamber and the Track 1816 in relation to the rest of the apparatus. Sensor 1814 monitors the temperature of the Hot Chamber.

Diagrams 9a and 9b are two views of the Cold Chamber. The air flow 1916 enters at the bottom of the Cold Chamber and flows through in the direction of the arrows out at the Fan 1917 opening. This air flow through Heat Sink 1928 provides a reference temperature for the control of the temperature of the device transfer Track 1930 as controlled by the Thermal Electric Devices 1922. PROMs entering the Cold Chamber are detected by Light Source 1902 and Photocell 1904. After the required amount of time for the temperature to stabilize each PROM is gated past Metering Gate 1908 into a Contact Assembly 1910 which is similar to the one in the Programming Station. At this point, the PROM is tested at a Cold Temperature. The mechanism is surrounded by Insulation 1926, a Cover 1920 and a Housing 1924.

Figure 10:
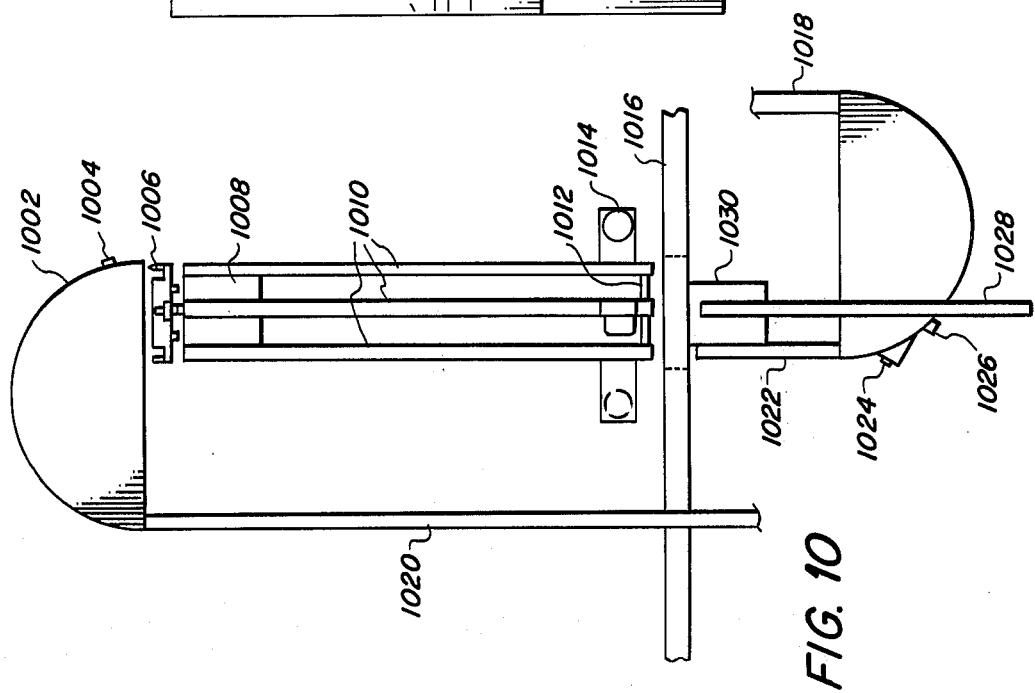
FIG. 10 is a simplified mechanical drawing of the Storage and Output Station.

FIG. 10 shows the Storage and Output Station. PROMs are received from the 4 Way Sort 66 in FIG. 2 through Track 1020 and through Transition Track 1002 and Photocell 1004 to the 3 Way Sort Carousel and the 3-to-1 junction Carousel which are identical. The 3 Way Sort 1006 will deliver the PROMs to either a Storage, a Replacement or a Bypass Tube 110. These Tubes are held in place by a support Bracket 1012, and upon command from the Computer the Metering Gates 1014 will sequentially drop a PROM from the selected Tube down into 3 Way Junction 1030 from which the finished PROMs will either be loaded into the Output Stick 1028 or sent through the Output Tube 1018 to the DIP Insertion Machine.

Figure 11:
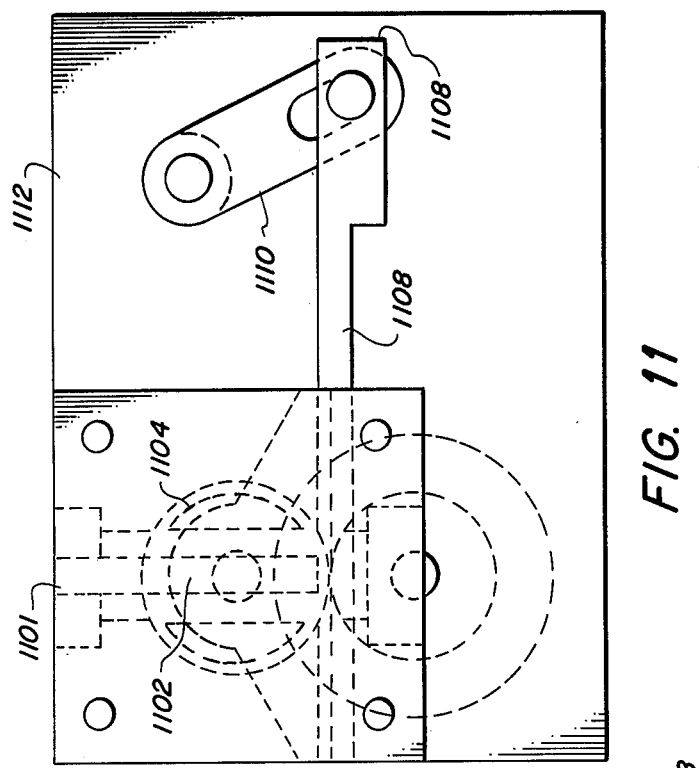
FIG. 11 is a simplified mechanical drawing of the Device Gate Orientation Assembly.

FIG. 11 is the Device Gate Orientation Assembly. This Assembly is located directly below the 4 Way Sort 66 of FIG. 2 and is used when the PROMs must be supplied to the DIP Insertion Machine 180° from the position they are in when being programmed and tested by this PROM Handling System. The PROMs drop into this Assembly through Track 1101 and come to rest at point 1102 inside of the PROM Rotator 1104. If the PROM is not to be rotated the Gate Actuating Arm 1110 and its associated Slide Bar 1108 will be in the position shown, allowing the PROM to continue to fall through this device. If the PROM is to be rotated 180° the Cam Actuation Arm will rotate clockwise driving Slide Bar 1108 across the opening below Point 1102, the PROM Rotator will then rotate 180° and the Slide Bar 1108 will be retracted allowing the rotated PROM to pass on through the System. All of this equipment is mounted on Vacuum Plate 1112.

There are five electronic subsystems within the PROM Handling System; the Programmer Station, the Marker Station; the Test Station; the Device Handling Station; and the DIP Insertion Maching Station. Drawings pertinent to the inventive aspects of this preferred embodiment are included in this application beginning with FIG. 12, and will be discussed below.

The entire PROM Handling System is controlled and connected to a Computer through a cable to a group of IO Interface and Interrupt Interface Modules. The entire Interface consists of sixteen bidirectional data lines, sixteen address lines going from the Computer to the PROM Handling System, two status lines from the System to the Computer indicating various modes of readiness, a function strobe line from the Computer to the System which is used for timing purposes, a function strobe acknowledge from the System back to the Computer indicating that the function strobe is being acted upon, a write direct line which, when high, indicates that the data on the 16 data address lines from the Computer to the System is available and, when low, indicates that the data on the 16 address lines from the System to the Computer is available. There is also a master reset line from the Computer which will reset the PROM Handling System and a 1 megahertz clock from the Computer to the PROM Handling System.

Figure 12:
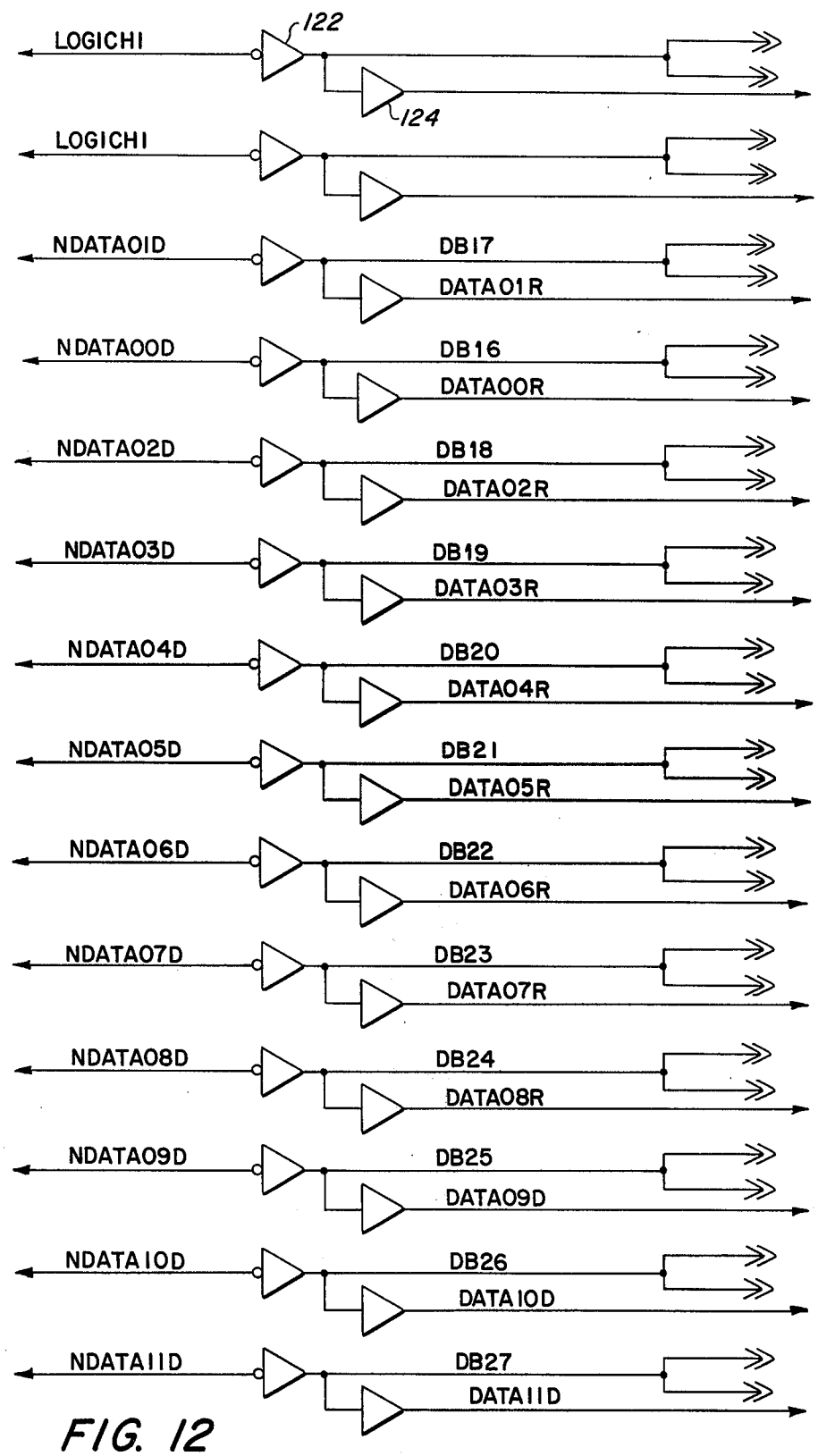
FIG. 12 is a schematic of an IO Interface and Interrupt Interface Module.

The Interrupt Interface consists of an interrupt line from the PROM Handling System to the Computer which, when high, indicates a request for an interrupt by the PROM Handling System and an interrupt response line from the Computer to the PROM Handling System acknowledging the interrupt. An interrupt is used for those functions that cannot be postponed or which are infrequently used. The basic purpose of the Interface Modules is to shift logic levels from the cable impedance which is shown in FIG. 12 as a double headed arrow to TTL logic levels which is shown in FIG. 12 as a single solid arrow. The flow of data in FIG. 12 is either from the cable through Device 124 to the PROM Handling System or from the PROM Handling System through the Device 122 to the cable and thereafter to the Computer. The TTL level signals from and to the Interface Modules are carried on the Interface Bus to the various stations of the PROM Handling System.

One feature of this system is that control can be taken by a Maintenance Panel which can initiate any operation that the Computer can initiate. This is accomplished manually by throwing a switch on the Maintenance Panel. Control information from either the IO Interface Bus or from the Maintenance Panel will be applied to the Master Control Module of the PROM Handling System, a schematic of which is shown in FIG. 13.

The PROM Handling System is composed of five Stations where each station is independently selectable by the Computer and each Station can converse in two way communications with the Computer through Interface Drivers under control the the Interface Control Module and thereafter through the Input/Output Bus. The DIP Insertion Machine will not be discussed since it is not part of the invention. The Device Handling System is all of the mechanical fixtures that control the passage of devices from one station to another.

Figure 13:
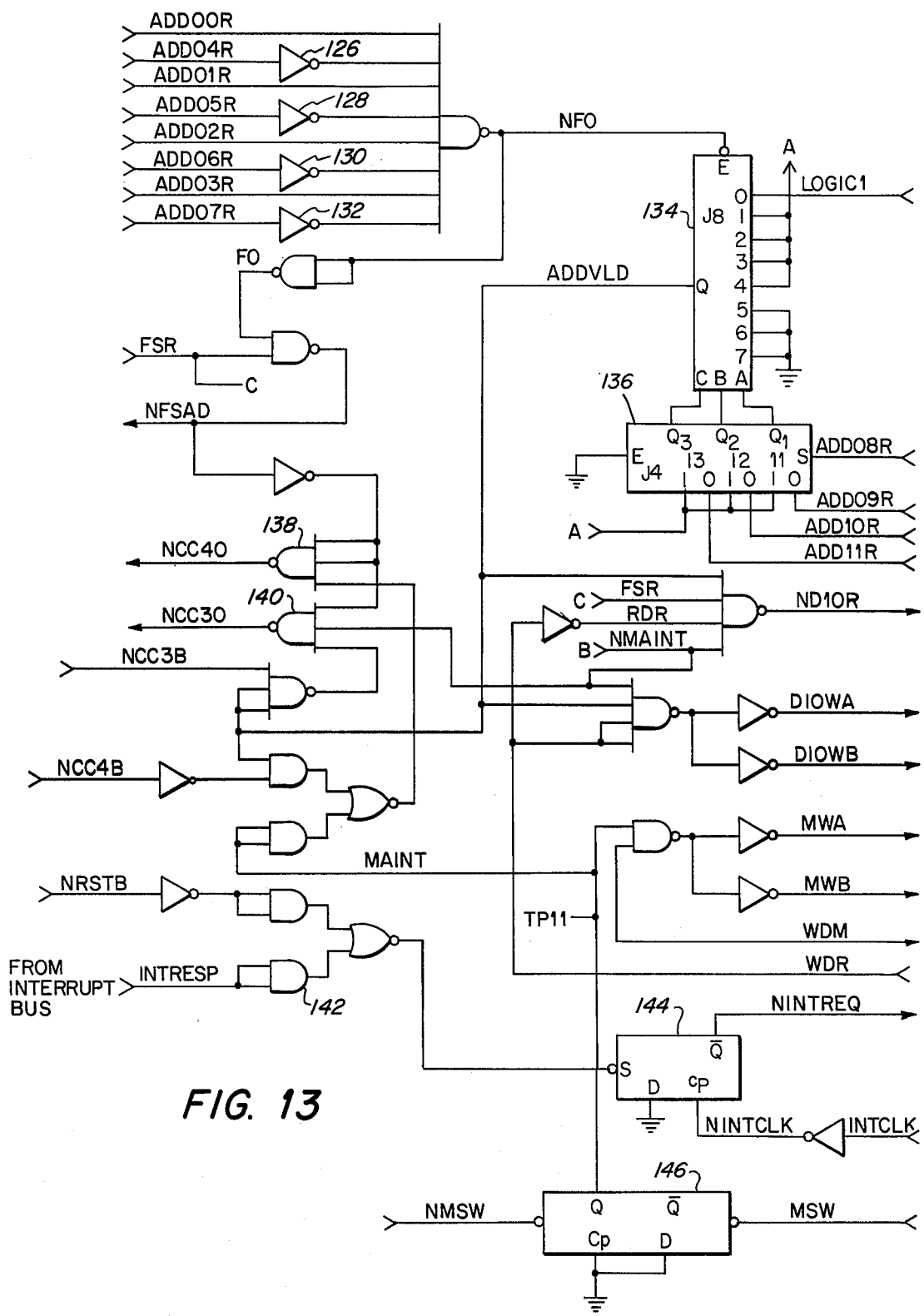
FIG. 13 is a schematic of the Master Control Module.

On the Interface Control Module in FIG. 13, the eight most significant bits of the IO address, which must be hexidecimal "FO" to select the PROM Handling System are shown as inputs to Gates 126, 128, 130 and 132. If these lines do not constitue a hexidecimal "FO" there will be no response whatsoever, whereas if the information does constitute an "FO" Device 134 is enabled. Additionally, the next four address bits are applied to Device 136. This information must constitute a hexidecimal number between 0 to 4 to correspond with one of the five Stations. If address bits 8–11 do not constitute a valid Station number an illegal command signal is generated. If all of the above conditions are satisfied then the module acknowledges that a legal command has been received and the condition codes NCC40 and NCC30 at the outputs of Gates 138 and 140 will be sent back to the Computer acknowledging a proper address. The alternative would be an illegal command and the condition codes would show that the command was refused. The two condition code outputs can also signal a busy condition if a Station which has been commanded is still involved in a previously commanded function. When the PROM Handling System requires an interrupt it will ground the interrupt line at the input of Gate 142 which will result in a Q output from Flip-Flop 144 to the Interrupt Bus and thereafter to the Computer. When the interrupt response line from the Computer goes high it will be fed into the clock pulse input of Flip-Flop 144, thus resetting the flip-flop. Flip-Flop 146 is simply used to debounce the switch on the Maintenance Panel that differentiates between the Maintenance mode and the Computer mode of operation.

Figure 14:
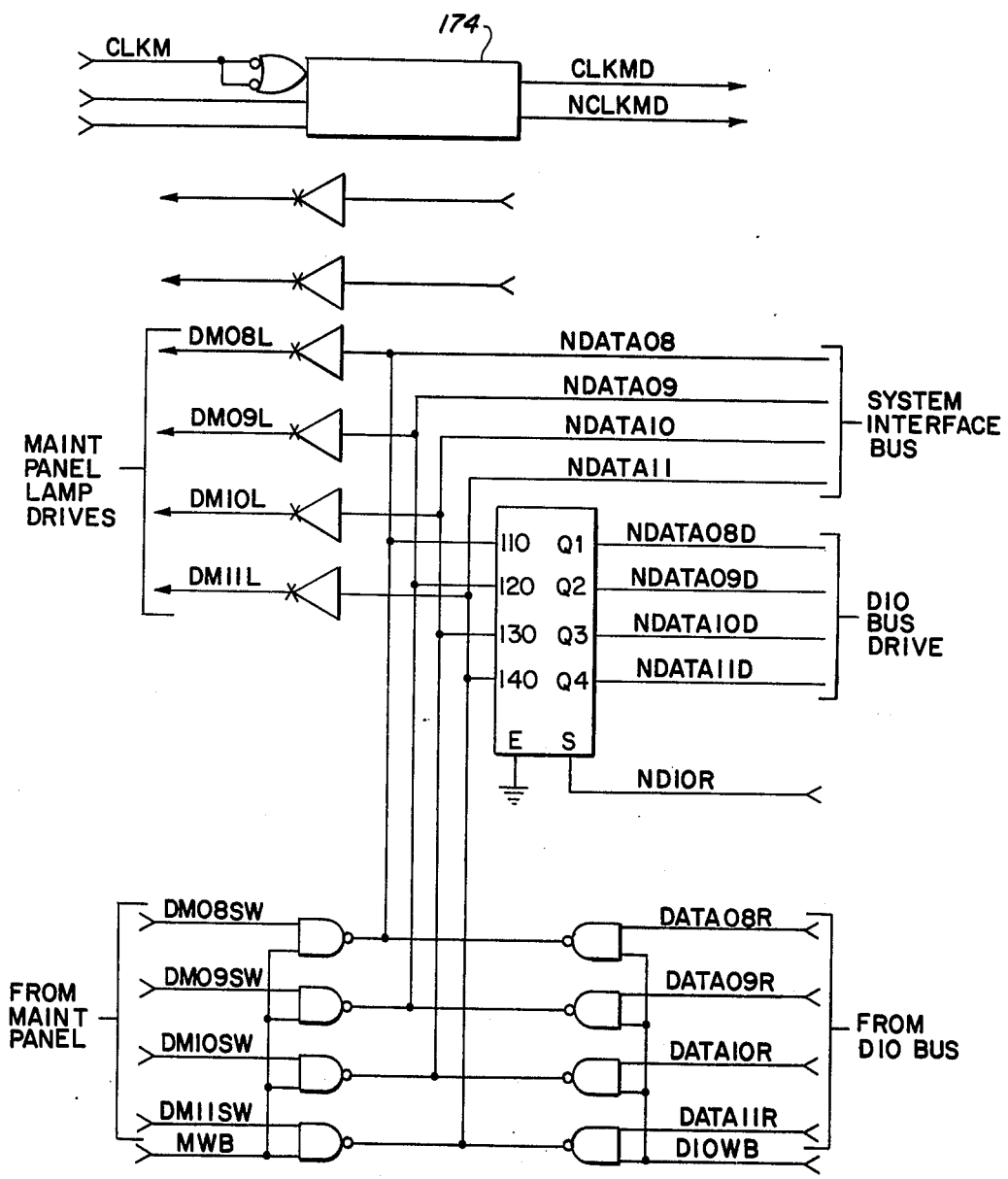
FIG. 14 is a schematic of the Interface Driver Module.

FIG. 14 is one of eight Interface Driver Module which are identical. This module contains controls for four address lines and four data lines. These are system Interface Bus lines at the TTL level and are inverted and are sent to all of the Stations in the PROM Handling System. The Maintenance Panel is also connected to the System Interface Bus through the gates as shown. The Maintenance Panel line MWB will be true if we are selecting the Maintenance Panel and DIOWD will be true if we are receiving information from the IO Bus. In either case the data goes out onto this System Interface Bus as shown if the system is in the write direct mode. In the read mode, data from the bidirectional system interface bus is applied to one set of inputs on the quad two input multiplexer 148 and sent out to the Computer through the DIO Bus Driver. Maintenance Panel lamps are always driven through lamp drivers 150, 152, 154 and 156. The lower circuits 158–172 control the flow of address data from the Maintenance Panel or from the Computer to the System Interface Bus. In this case, the System Interface Bus is unidirectional as compared to the bidirectional System Interface Bus data lines. This module contains a single shot multivibrator 174 which, on one module is used to generate a Maintenance Panel function strobe, and on another panel is used to generate a Maintenance Panel 1 megahertz clock.

Figure 15A:
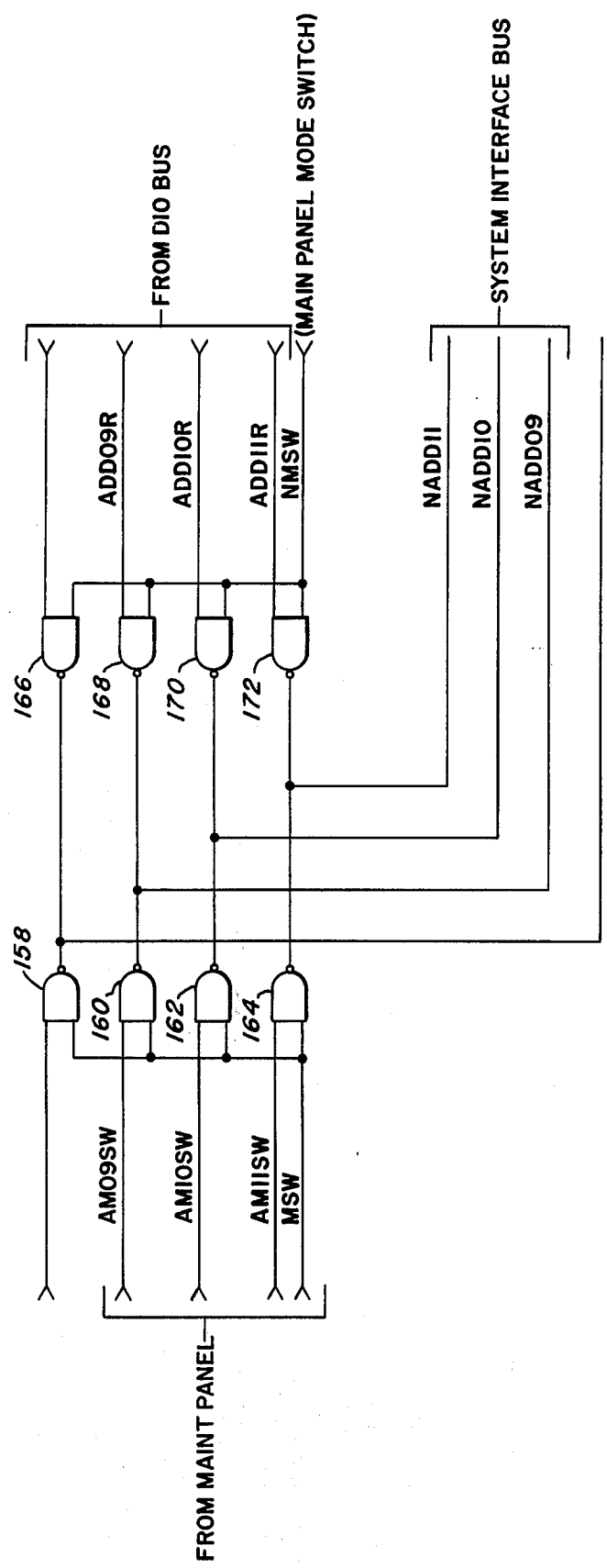
FIG. 15 is a partial schematic of the Station Interface Card.
Figure 15B:
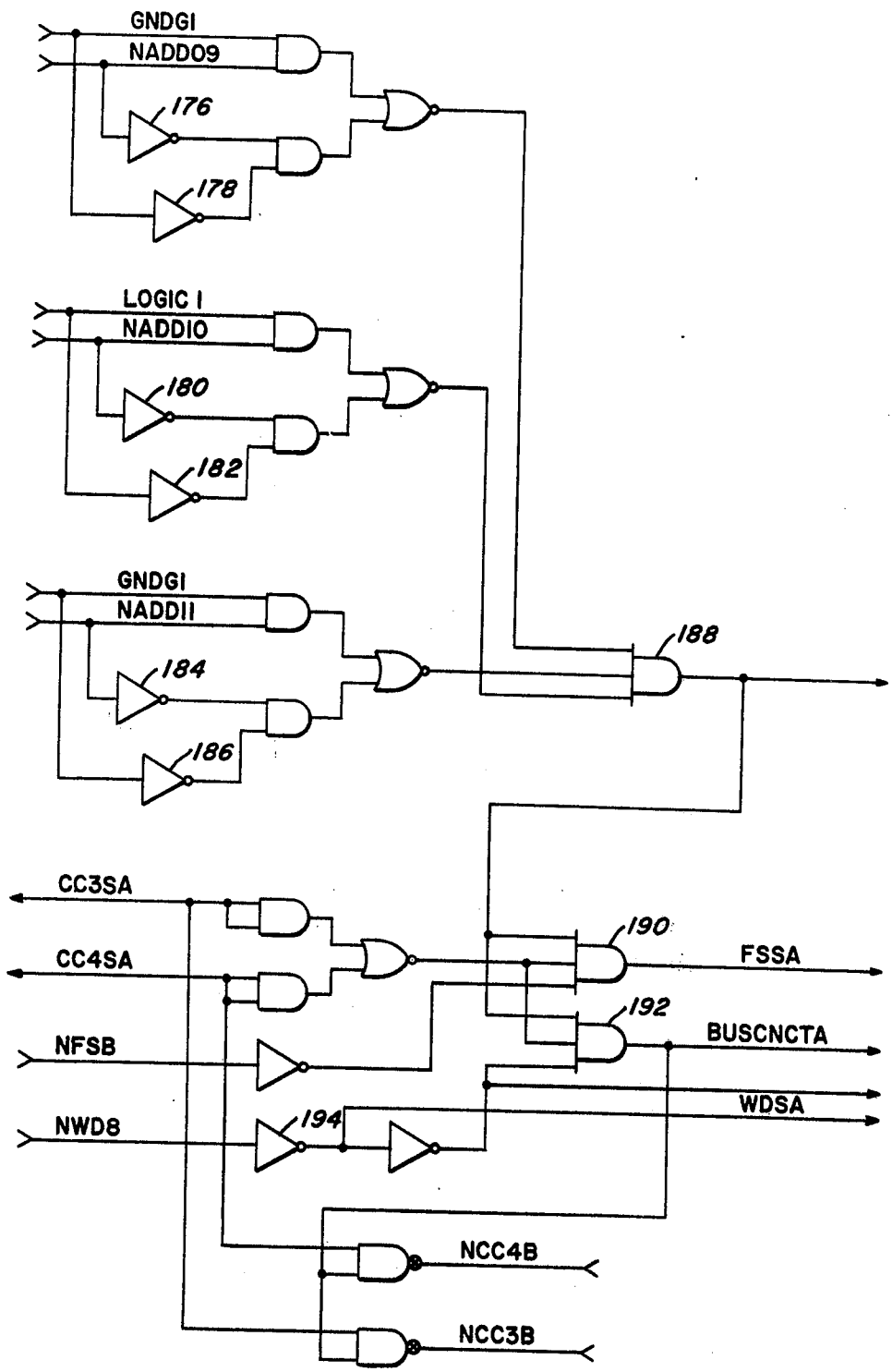
Figure 16:
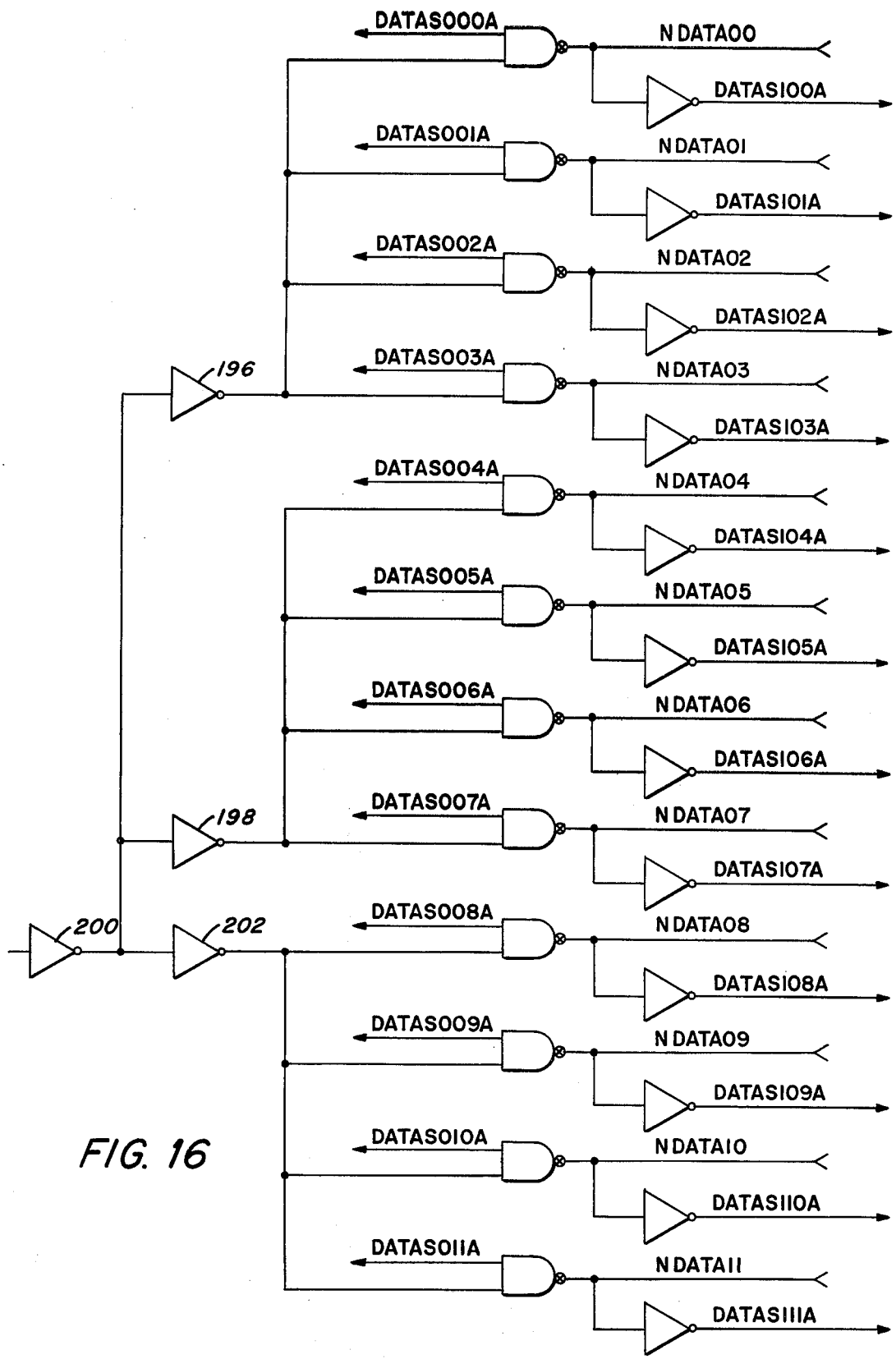
FIG. 16 is a partial schematic of the Station Interface Card.
Figure 17:
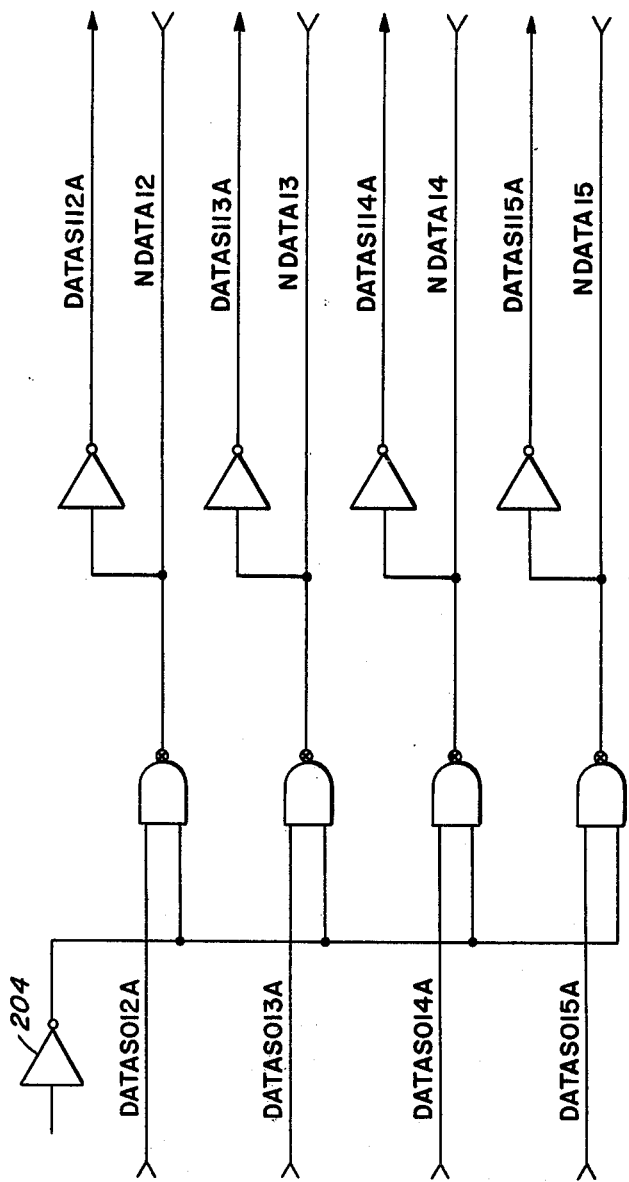
FIG. 17 is a partial schematic of the Station Interface Card.

Each of the five Stations has an identical set of Station Interface Cards as shown on FIGS. 15, 16 and 17 which interface with the Station Interface Bus on one hand and with the Station on the other. The Station number is decoded in the hardwiring on the back plane at the inputs to devices 176 through 186 so that the Station Modules themselves may be interchangeable. The inputs are address lines from the System Interface Bus which specify the Station. Additionally, these address lines differentiate between read and write direct commands. The proper address always results in a true signal output at Gate 188 allowing a function strobe output to the station at the output of Gate 190 and generating a signal to enable the Station to connect signals in from the System Interface Bus as an output of Gate 192. The bus connect signal is applicable only in a read direct mode and therefore receives an input from the write direct line at the input of Gate 194. Thus, unless the Station is selected, the Station Interface Drivers are unable to do anything with the Station Interface lines and the Station Interface Bus lines. The condition code signals from the station, CC3SA and CC4SA must also indicate that the station is operational and not busy in order for these stations to accept the command. Thus, a station can only accept a command when it receives a valid command from the Computer and when the station itself is operational.

The data on the Station Interface Bus comes into the circuits shown in FIG. 16. If the system is in a read direct mode and a Station is selected, a bus connect signal which is buffered through Gates 196, 198, 200, 202 and 204 will enable the remaining circuitry in FIG. 16. This bus connect enable signal allows this information to be copied onto the System Interface Bus and eventually to the Computer or to the Maintenance Panel. Also, data may be copied from the System Interface Bus into the Station. However, in all cases information on the System Interface Bus is always copied into the Test Station whether that Station is being controlled or not, and whether that Station will use the data or not.

Figure 18A:
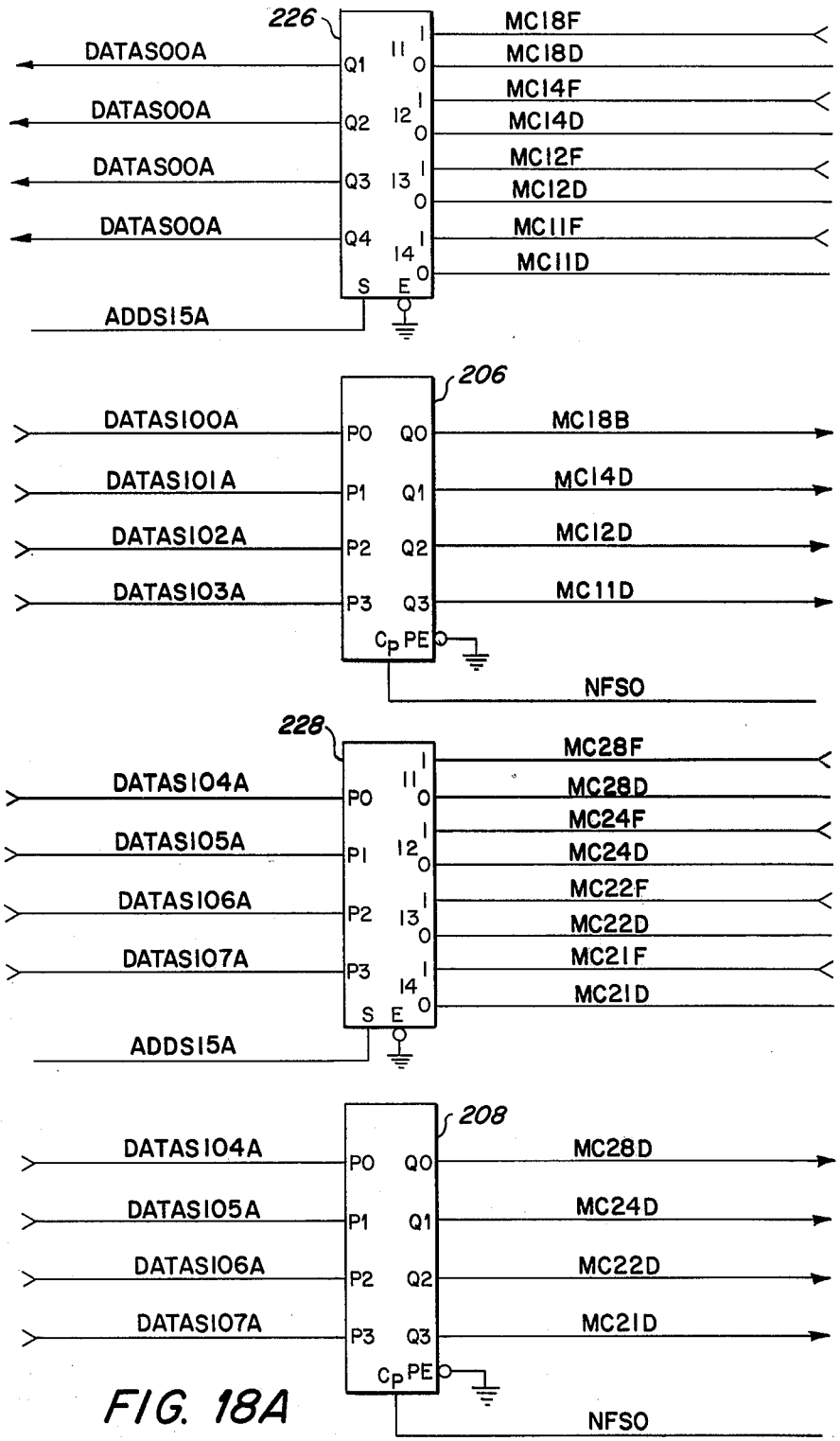
FIGS. 18A and 18B are a schematic of the Marker Station.

FIG. 18 is a schematic of the electronics controlling the four digit marking equipment in the Marker Station. The first two BCD digits are loaded into quad flip-flop devices 206 and 208. Another module handles the other two digits. The output of devices 206 and 208 go to the Marker hardware which is received from the vendor with its own marker programming electronics. Upon receipt of the information stored in Flip-Flop 206 and 208 the Marker will automatically dial up the proper digits for marking onto the PROM.

Figure 18B:
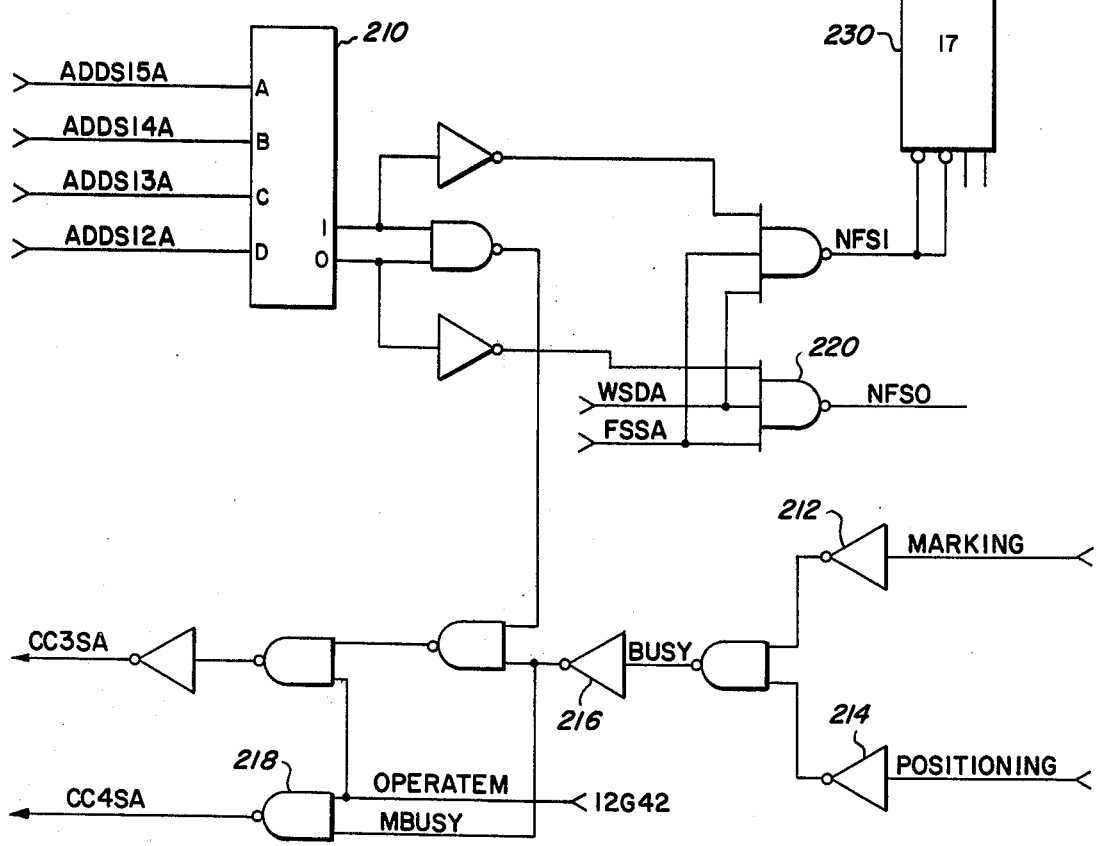

Decoder 210 of FIG. 18B receives the four least significant address bits which must be in the form of a hexidecimal 0 or 1. Any other address would represent an illegal address. Likewise, the inputs to Gates 212 and 214 are the marking and positioning signals from the device, either of which will result in a busy signal input to Gate 216. These bits of error information are decoded and sent out on line CC3SA and CC4SA which are the condition codes sent back to the Computer. Another input to Gate 218 is the OPERATEM signal which is an interlock line verifying that all connectors are plugged into their respective sockets. The normal state of condition codes 3 and 4 are both off. If no error conditions are discerned, the NFSO line output from Gate 220 is sent to Flip-Flops 222 and 224 which enables copying of the data line information onto the Marker electronics Subsystem. As shown at the inputs of Gate 220, this clocking is enabled by a write direct command and a function strobe. Alternatively, if the Computer executes a read direct command Multiplexers 226 and 228 will output to the Computer either information from the Marker verifying that the Marker wheels are in the proper position or will output the information contained in Multiplexers 226 and 228 showing the desired digit. A comparison of these two sets of hexidecimal information is required before marking is allowed. The Single Shot Multivibrator 230 will stay true for an amount of time to allow the print wheels to position themselves according to the information in Flip-Flops 222 and 224 before allowing the Marker to mark the device.

Figure 19:
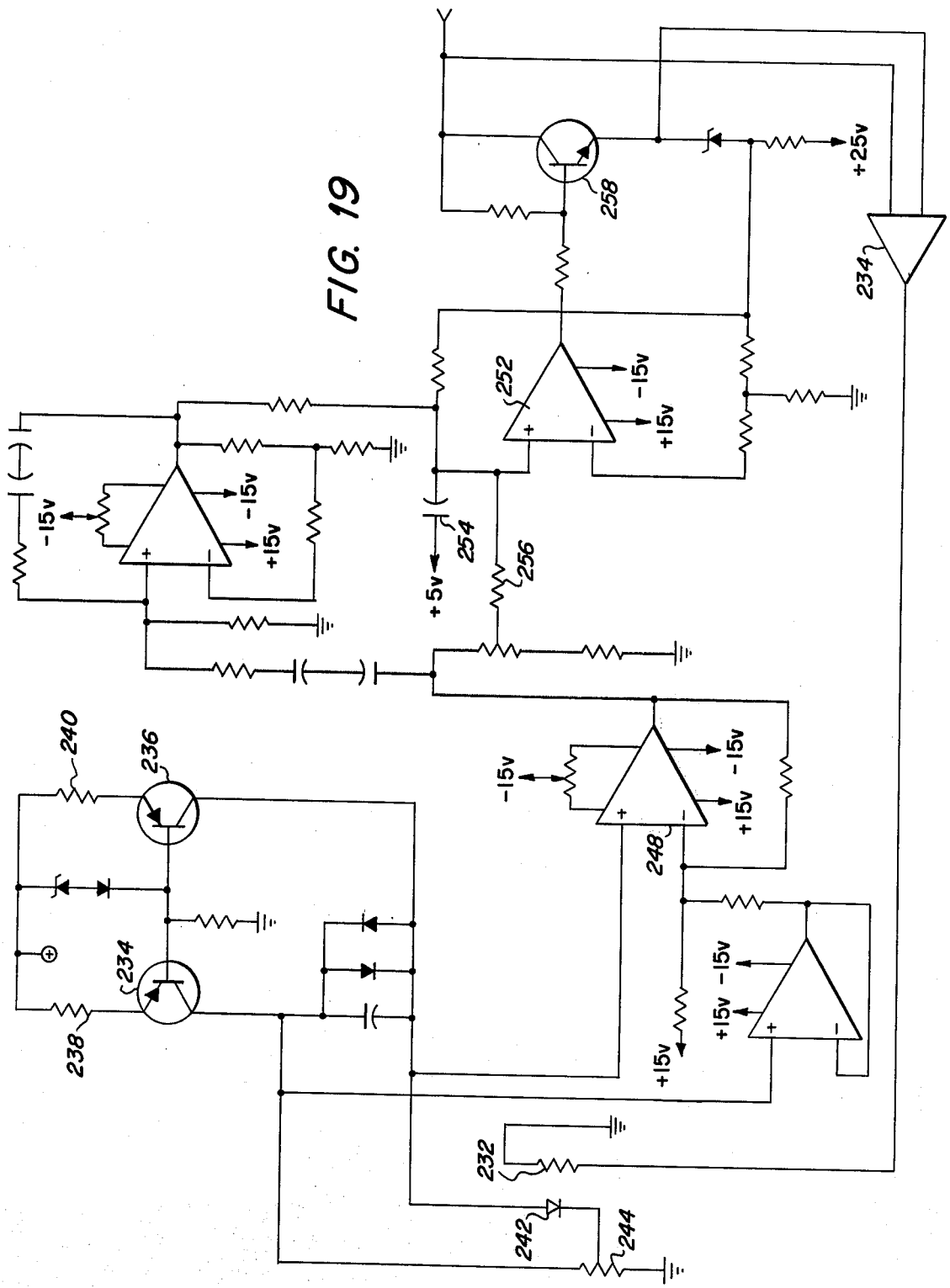
FIG. 19 is a schematic of the Marker Drying Chamber Electronics.

FIG. 19 is the schematic of the control electronics used to control the temperature of the Marker Drying Chamber and the Hot Test Chamber. The control electronics for the Cold Test Chamber is similar except that a thermoelectric device is used in place of the resistive Heater Element 232 to cool instead of warm the chamber. Transistors 234 and 236 constitute a current source since there is a fixed drop across the emitter Resistors 238 and 240 which produce a constant current across Diode 242 located in the temperature chamber. The Diode is connected to Potentiometer 244 and the Potentiometer is set so that at the proper chamber temperature the voltage at the top of the Potentiometer 244 is equal to the voltage at the top of the Diode 242. Since the voltage drop across the Diode is inversely proportional to the temperature, an imbalance in these two voltages will occur when the temperature of the Chamber is too high or too low. The Resistor 232 is attached to the Power Amplifier 234 output and is used to heat the Chamber.

Assuming a case where the equipment was recently turned on, the chamber would be too cold, the Diode 242 drop would be greater than it would be at the higher temperature, and Resistor 244 is set so that, when buffered through Operational Amplifier 246 a highly positive voltage would be felt at the resistive input terminal of Operational Amplifier 248 which has been configured as an X100 amplifier. At this point, Operational Amplifier 250 will not be operational since it has been configured as a differentiator which will come into operation as the temperature of the Chamber approaches its operational range. Operational Amplifier 252 in conjunction with Capacitor 254 and Resistor 256 is implemented as an integrator resulting in a shift, with time, such that the base of Transistor 258 as applied to Power Amplifier 234 will result in a gradually increasing current through Resistor 232 which results in heating the Chamber. The +50 volt line from the collector of Transistor 258 is simply a power source since 25 volts was needed and could be supplied from the Operational Amplifier 234.

As the temperature of the chamber approaches its operating range, the output of Operational Amplifier 248 while still positive, will be approaching zero at a certain rate. The Differentiator 250 sees this rate and produces an output which will result in a negative feedback applied to the Integrator 252. The amount of change produced by Operational Amplifier 248 plus the rate of change output from Operational Amplifier 250 will be summed together at the summing junction, of Operational Amplifier 252 resulting in a temperature that will smoothly approach the desired temperature with a minimum of overshoot.

A thermostat could not have been used in this application since the temperature specification is ± or − 2° and because the off/on switching of power necessary to drive the Resistor 232 in the Chamber would result in electrical noise.

Figure 20:
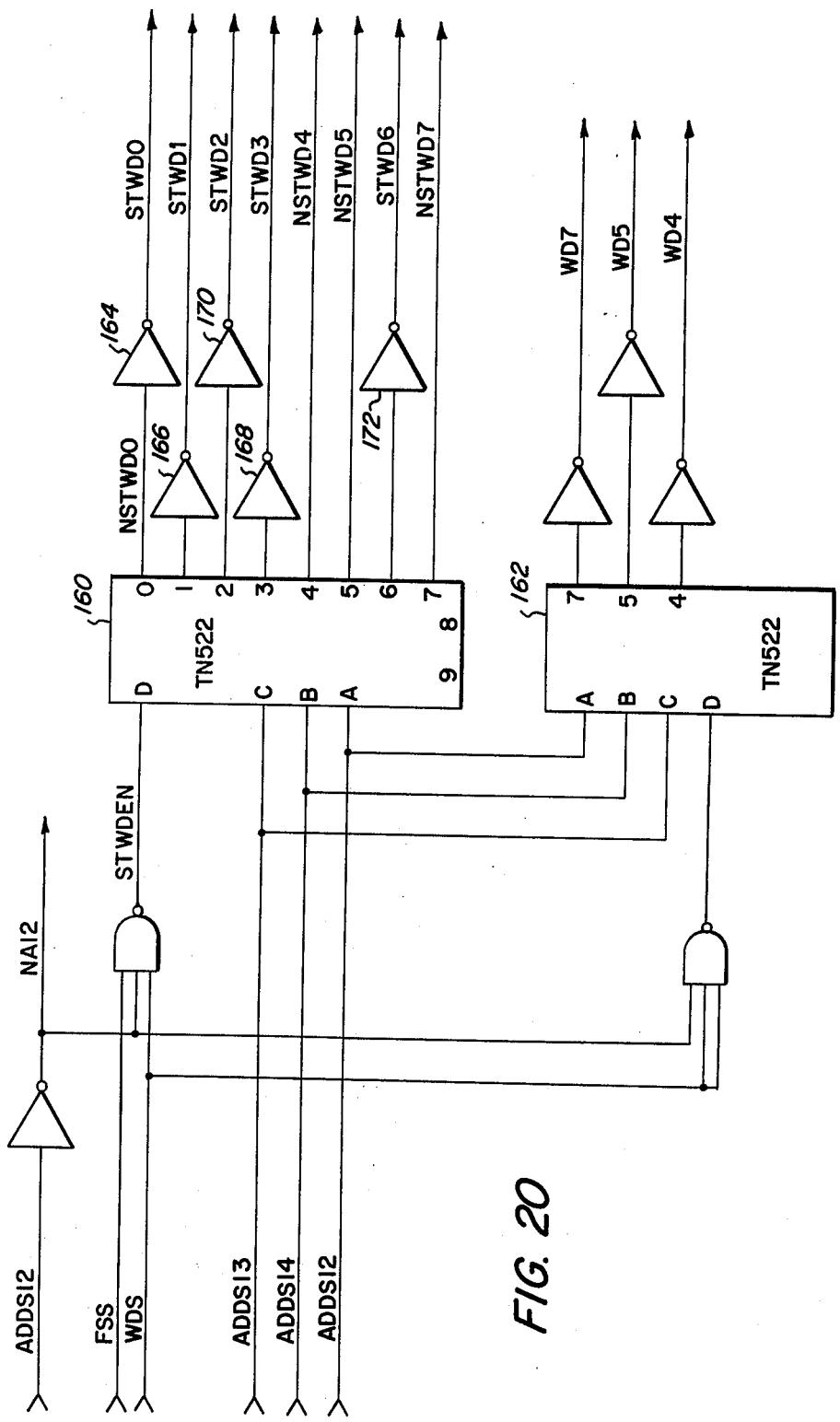
FIG. 20 is a schematic of the Handler Monitor Control Card.

FIG. 20 is a schematic of one of the circuits on the Handler Monitor Control Card which is driven by the Station Interface Card. This Handler Monitor Control Card is a transition for signals between the Station Interface and the electronics of the PROM Handling System. Its function is to decode the interface address lines through the 4 to 10 Decoders 160 and 162. The inputs are address lines ADDS 13, 14 and 15 and only eight outputs are used which may or may not inverted through the output Gates 164 through 172. Decoders 160 and 162 are identical except that the function strobe FSS is ANDed into Decoder 160.

Figure 21:
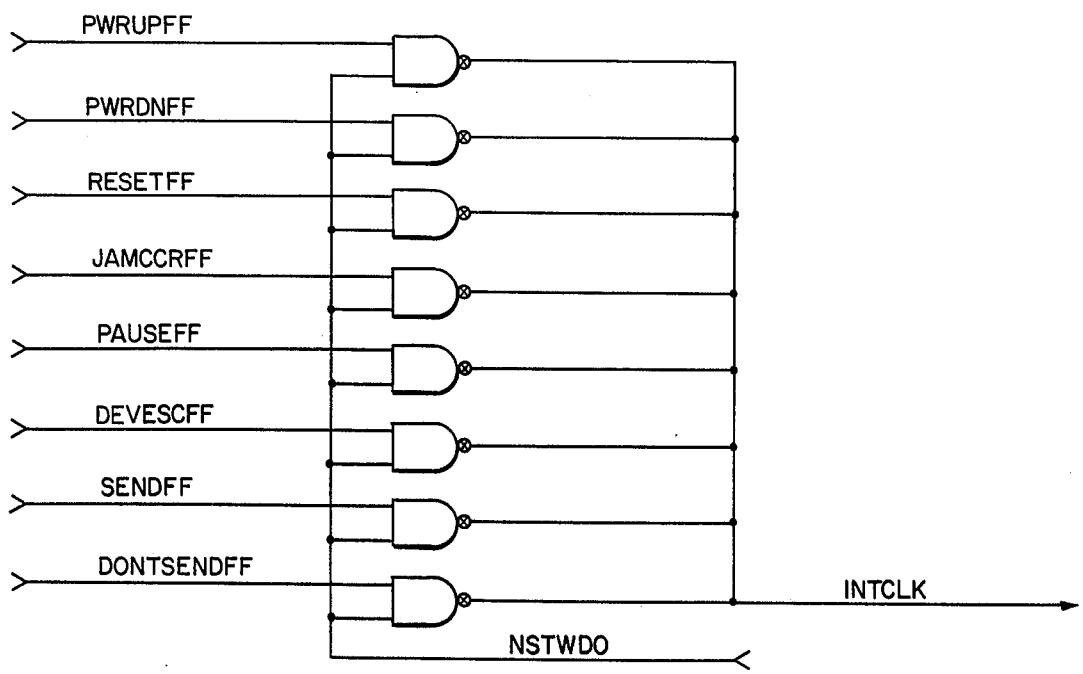
FIG. 21 is a schematic of the Stepper Motor Electronics.

The logic in FIG. 21 is used in conjunction with the Stepper Motor and inhibits those eight functions that would be detrimental to the operation of the Stepper Motor. In any case, chips fed to the Stepper Motor or the Carrousel while either is in motion will result in a jam. To prevent this various lines including a status busy line, an illegal address line and a carrousel busy line are used to generate an interlock signal which will prevent the feeding of PROMs into the Carrousel.

Figure 22A:
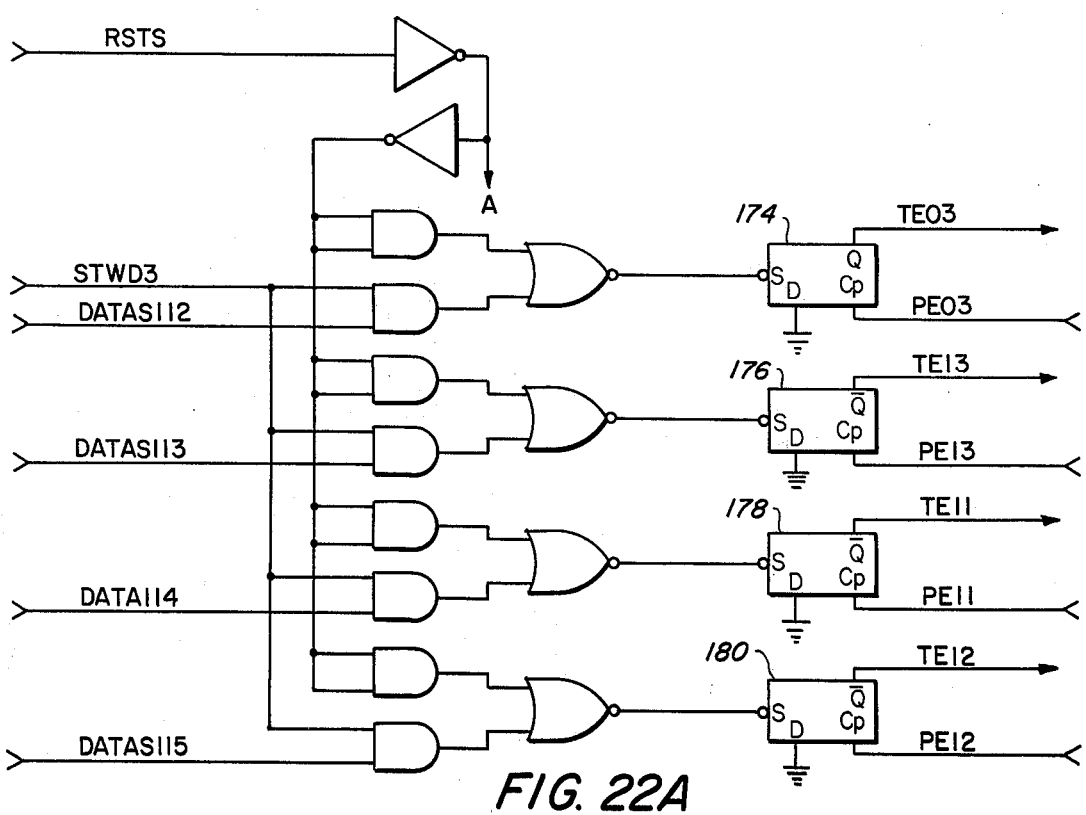
FIGS. 22A and 22B are a schematic of the Latch Multiplexer Module.
Figure 22B:
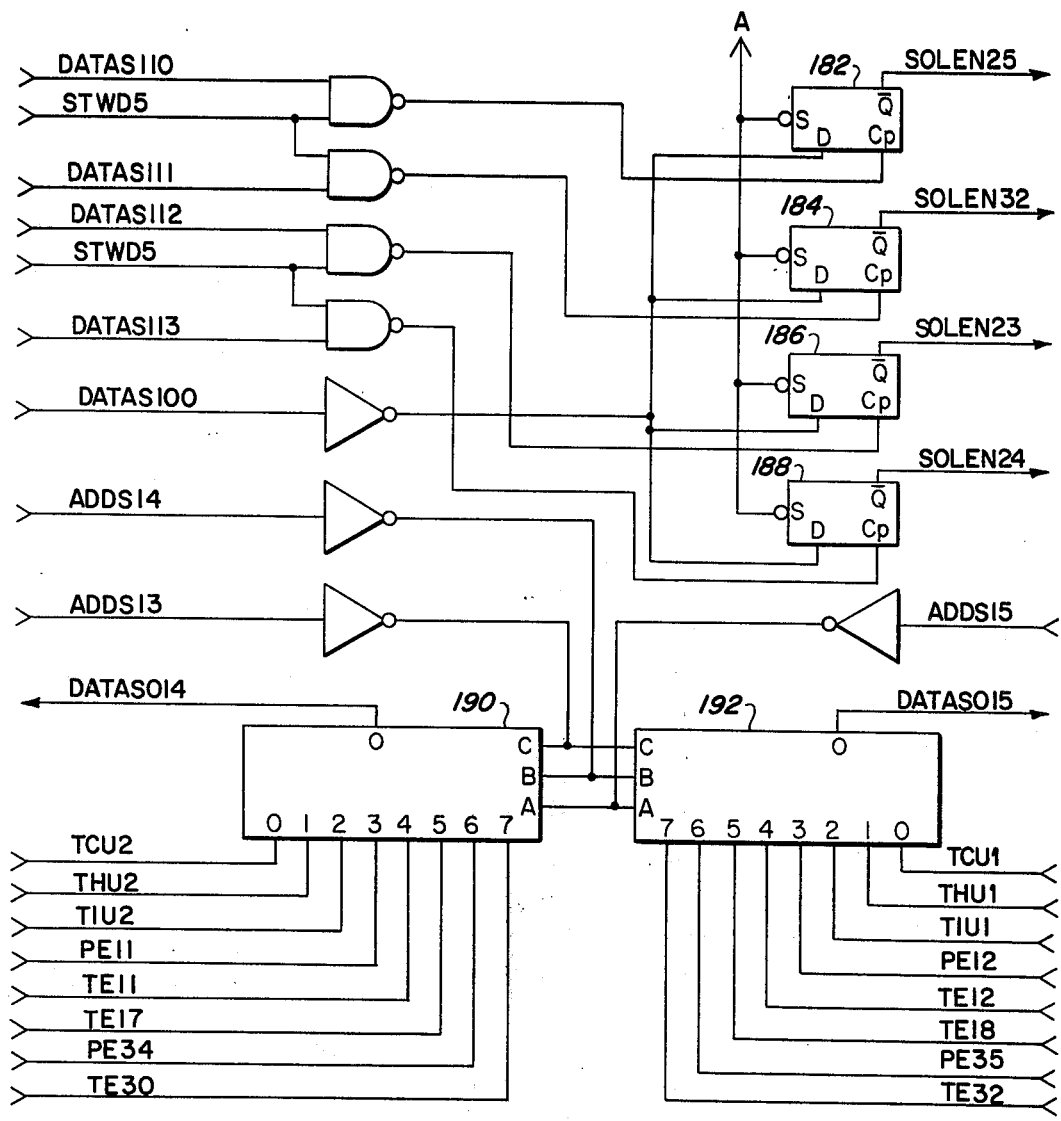

FIG. 22 is one of nine Latch Multiplexer Modules used in this system. Each has four transient event Flip-Flops 174 through 180, four solenoid control Flip-Flops 182 through 188, and two data output Multiplexers 190 and 192 commonly controlled by the least significant address lines ADDS 13, 14 and 15 that come in on the Interface Bus. These three lines represent a choice of one of eight signals that is received from the Monitor Control Station and may be sent out on the data line, as in this case on data lines 14 and 15. Since there are 16 output lines from these Latch/Multiplexer Modules used, a 16 bit word, each bit representing one of eight possible signals may be read out from the system. An example of how these Multiplexers are used would be as follows. If all of the address bits are zero, the first output line would contain data as to whether the system is in operation or not. The next eight bits, bits 2–9, are interrupt identification bits which may be used to inform the Computer as to which interrupt has been received since the last interrogation of this data. At this point the Computer can determine the cause of the interrupt and take whatever action is necessary to relieve the situation, to reset the interrupt bit and to resume normal operation. Additionally, bits 10–15 are outputs from the Latches 174 through 180 which record transient events. These bits are used as follows. If a bit is set when a device leaves the Cold Chamber and, after a reasonable amount of time, no signal has been received that the device has passed the photoelectric cell at the output of the Cold Chamber, then the Computer assumes a jam and types a suitable message out on the Computer Terminal. There are similar controls at the output of the Hot Chamber, the Marker Station, and the Programming Station. These latched events are recorded in Latches 174 through 180 of FIG. 22.

Flip-Flops 182 through 188 are used to drive the Solenoids. The inputs to these signals are a Computer write direct and an appropriate data bit.

Figure 23:
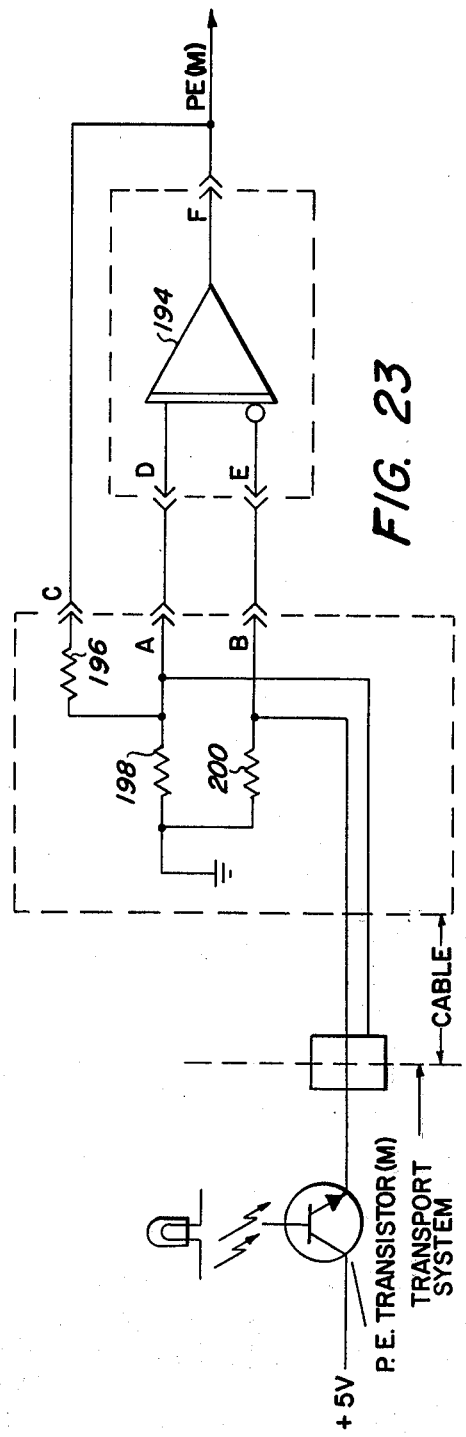
FIG. 23 is a schematic of the Photo Lamp Circuit.

FIG. 23 is the schematic of a Photo Lamp pair circuit. There are thirty six of these in the System. These photoelectric circuits are arranged so that if there is a device in front of the photoelectric cell a signal will be generated. The photoelectric cells are located so that the PROMs should pass briefly in front of them. If something is permanently blocking a photocell the Computer assumes a jam condition. Amplifier 194 is a commercially available HT73 Differential Amplifier. Included in the circuit are resistors 196, 198 and 200 which tend to bias the amplifiers such that if no light or a small amount of light is received the output will be high. Resistor 196 is coupled between the input and the output of Amplifier 194 which gives the Amplifier a latching effect so that there will not be any digital noise. That is, once the Amplifier starts to switch in a particular direction, the regenerative feedback produced by Register 196 will tend to drive the Amplifier further in that direction. Likewise, a decrease in the amount of light received, because of this latching effect, will tend to drive the output completely and quickly to its low state. This resistor 196 has been inserted in the system since noise which results in the generation of more than one output signal would confuse the Computer program into thinking that more than one device had passed the photoelectric cell, thereby rendering the entire System inoperative.

Figure 24:
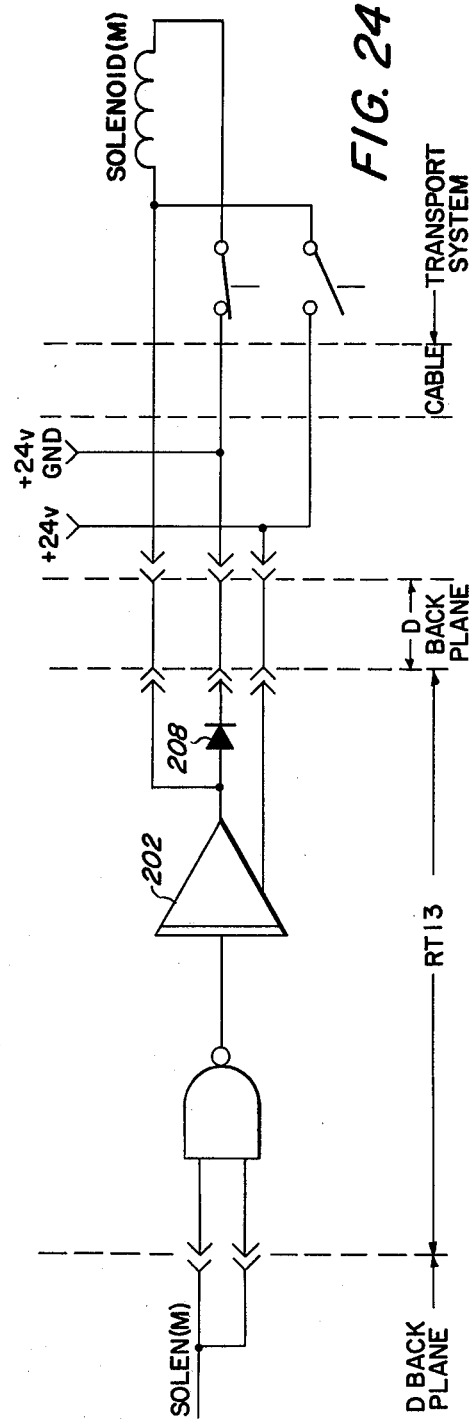
FIG. 24 is a schematic of the Solenoid Driver Circuit.

FIG. 24 is a solenoid driver circuit. When the input to Amplifier 202 is true, it causes current to flow in the load which in this case is a Solenoid. This input is received from the Solenoid logic of FIG. 22. If the Solenoid Flip-Flop in FIG. 22 is producing a true signal, the Solenoid is turned on. These Solenoids are at the various test sites and control device Gates and other mechanical devices. Switches 204 and 206 are put there for the convenience of maintenance personnel to allow the turning off or the turning on of the Solenoid manually. If both Switches are in the center position, Driver 202 controls the Solenoid. These switches have been found to be necessary to clear jam conditions or to get the System back into a synchronized mode of operation. There is a Diode 208 in parallel with each Solenoid coil to prevent inductive kickback.

Figure 25A:
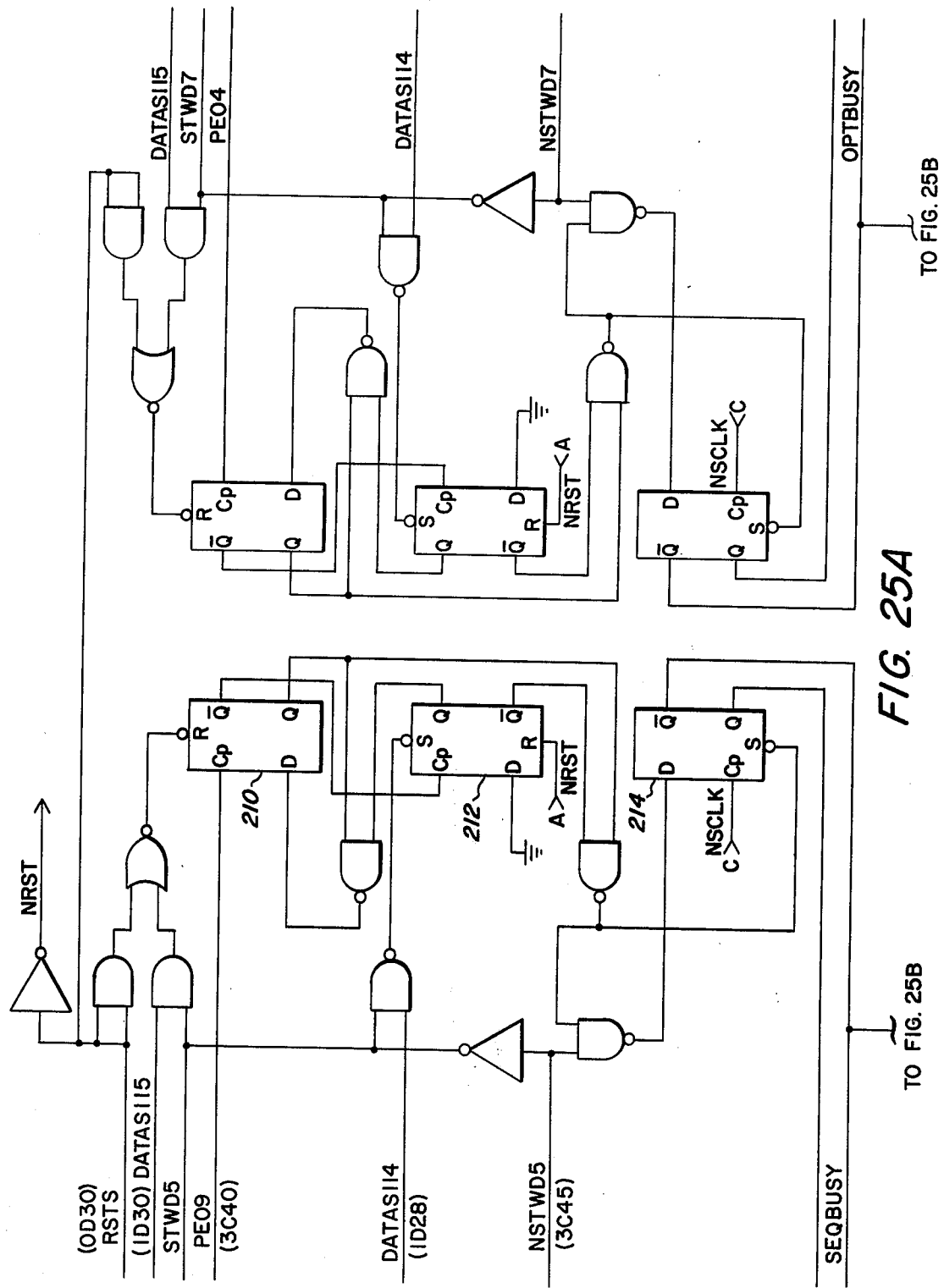
FIGS. 25A and 25B are a schematic of the Stepper Motor Control Circuit.
Figure 25B:
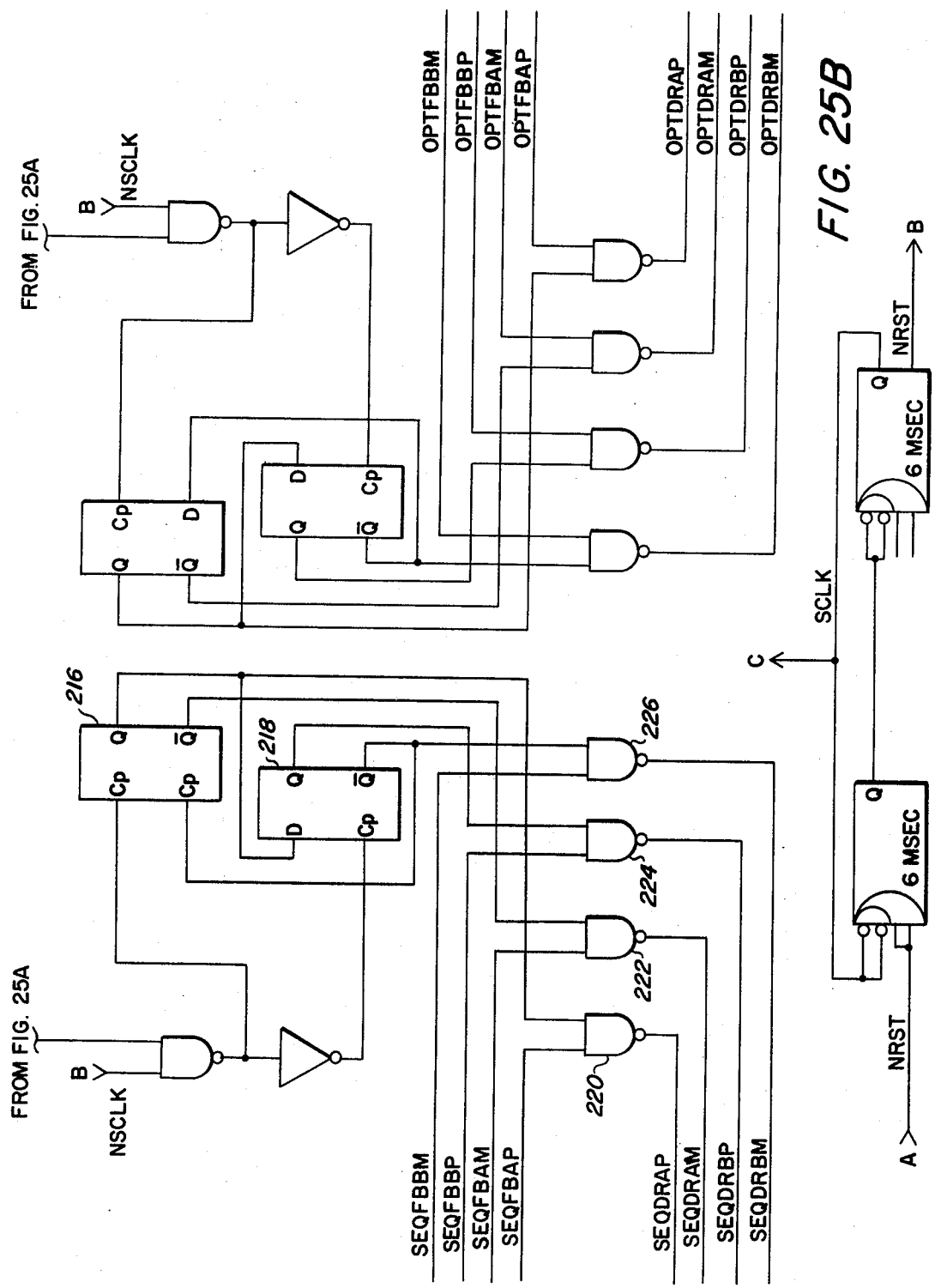

FIG. 25 is the Step Motor Control Circuit. The Step Motor is designed so that it must receive 50 step pulses in order to move through a 90° arc. The logic on this page produces these pulses. These pulses are not counted directly, instead there are three photocells associated with the Carrousel which indicates how many 90° increments the Carrousel has passed through. The photocells do not tell which position the Carrousel is in, and it is up to the Computer to keep track of its position by knowing how many 90° arcs the Carrousel has gone through. Data lines DATASI14 and 15 carry the binary code to command the Carrousel to step through 90°, 180° or 270°. This information is loaded into Flip-Flops 210 and 212 through the set and reset lines. Furthermore, these two Flip-Flops are configured into a two bit counter so that the required number of increments may be counted down through this circuit.

If the write direct command STWD5 is up, and data bits 14 and 15 are both true, then the Flip-Flops 210 and 212 would be set to a 270° increment. The Flip-Flops used in this figure are D Flip-Flops, and have a D input, a clock input, Q and Q outputs and a set and reset input. The set causes Q to turn on and the R input causes Q to turn off, or go false. D will cause Q to turn on with a rising clock input, if D is true. If D is off, a rising clock will turn Q off. If either one of the Flip-Flops 210 or 212 goes true, the output to Flip-Flop 214 will go true. The clock input at Flip-Flop 214 is 6 milliseconds on and 6 milliseconds off which represents a speed slightly less than the maximum speed of the Step Motor. Flip-Flops 216 and 218 generate an out-of-sequence step voltage from the S clock input of Flip-Flop 214 and the true output of either Flip-Flops 210 or 212 if either contains a data bit. These out-of-sequence voltages are then sent to Gates 220 though 226, the outputs of which are sent to the inputs of the Step Motor Drivers. The other inputs to these Gates 220 through 226 come from the Step Motor Drive circuit and will be discussed later. The right half of FIG. 25 is identical to the left half except that the outputs are sent to the other of the two Step Motors used in the System, one of which is located above the Storage Tubes and the other is located below the Cold Chamber.

Figure 26:
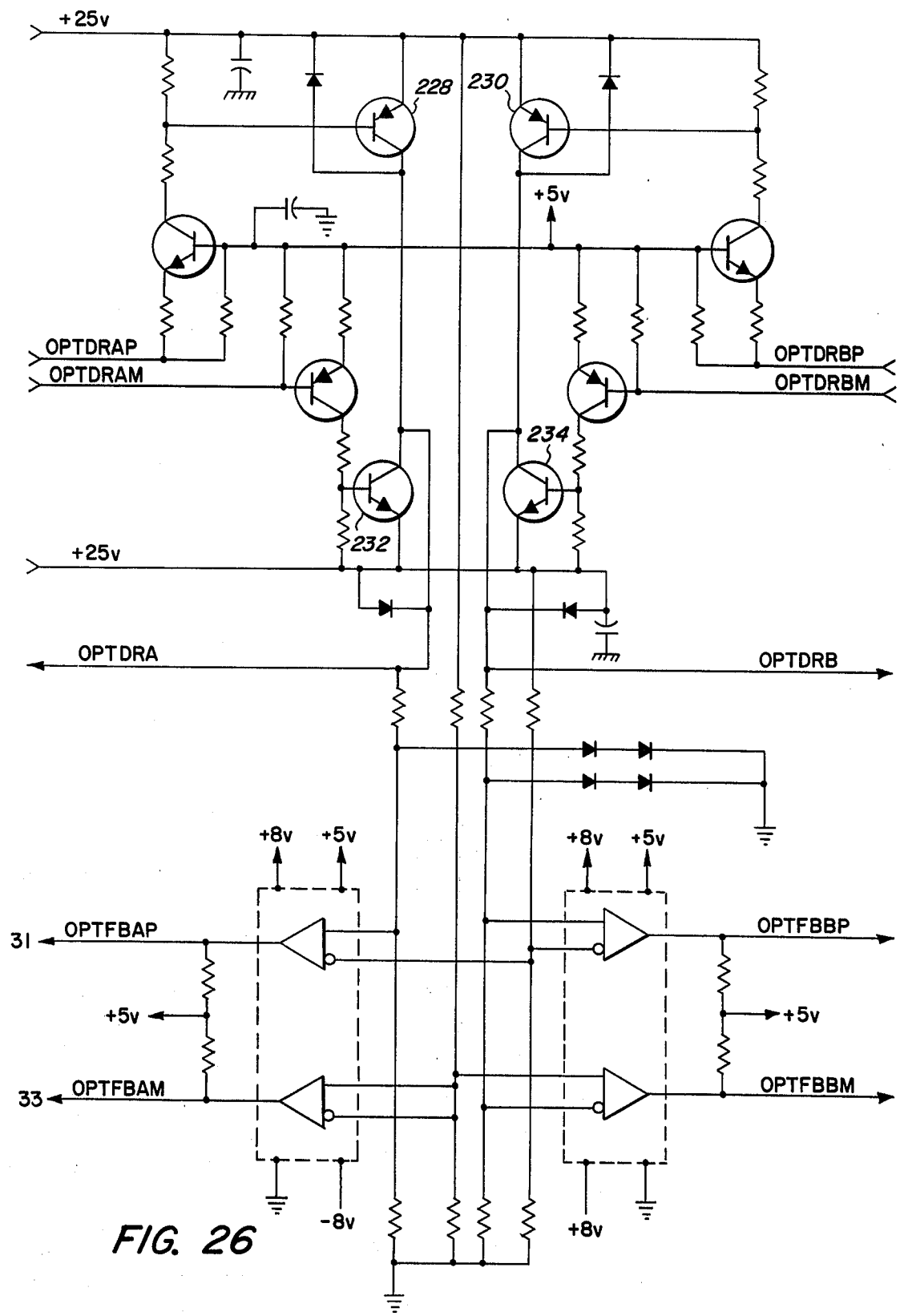
FIG. 26 is a schematic of the Stepper Motor Drive Circuit.

FIG. 26 is the Step Motor Drive circuit. Drive Transistors 228, 230, 232 and 234 are driven hard and are either in saturation or are cut off. Since they are in saturation, when they receive a cut off signal there is a small amount of time, due to storage time, before they actually cut off. During this time, if the Transistor in series were turned on, a disasterous short circuit between −25 volts and +25 volts would result. To make sure that one set of Transistors is not turned on until the other is completely shut off, the circuit at the bottom of the Figure generates a digital signal which waits for one Transistor to shut off before allowing its complementary Transistor to turn on. The Step Motor has two windings, driven by the signal lines OPTRA and OPTDRB.

Figure 27:
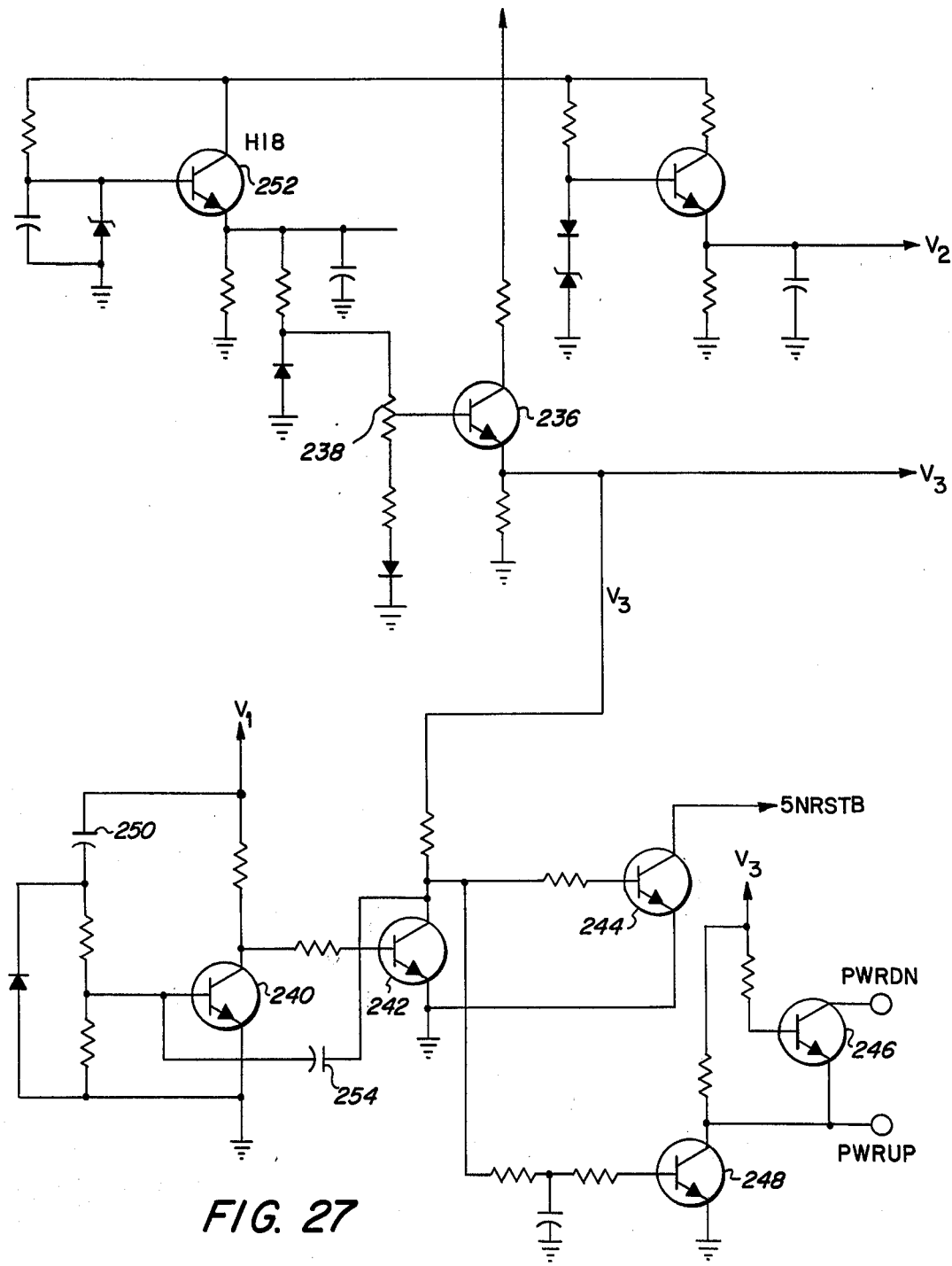
FIG. 27 is a schematic of the Power Monitor Circuit.

The circuit shown in FIG. 27 is the Power Monitor circuit and among other things, developes a precision five volts at the emitter of Transistor 236 which is used to monitor the proper levels of all the other voltages used in the system. The input to this circuit is applied through the resistor connected to the collector of Transistor 236 and in this system is 28 volts. To ensure that the output of Transistor 236 is exactly 5 volts, adjustable Resistor 238 is provided. Output V1 is set to be approximately 13 volts and V2 is approximately 7½ volts. The circuit comprising Transistors 240 through 248 creates a delay based on the charge time of Capacitor 250 to ensure that all of the power supplies are up and working properly before the System begins operation. In operation V1, the output of Transistor 252 comes up first and the Capacitor 250 will transfer this voltage into Transistor 240. The collector of Transistor 240 stays at ground while Capacitor 250 is charging up. Thus, the collector of Transistor 242 raises, Transistor 244 is turned on, and the non-reset line NRSTB is pulled to ground which resets all stations. During this time, the power up and power down signals will both be pulled to ground level. As Capacitor 250 charges, at some point Transistor 240 will start to turn off. Because of Capacitor 254 a regenerative feedback will result in a snap action of Transistors 240 and 242 allowing the NRSTB line to go true. Likewise, a power up interrupt will be generated and the Computer will begin to process system information. The delay caused by Capacitor 250 should be long enough for all the power supplies to establish their proper voltages.

Figure 28:
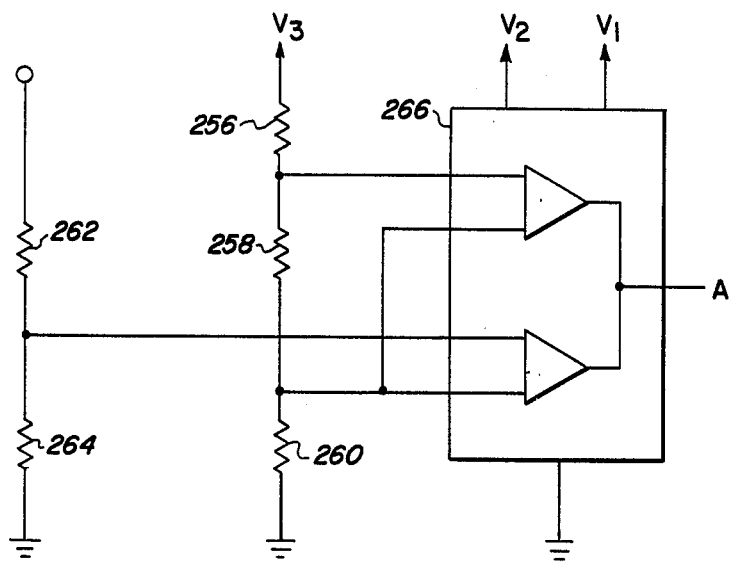
FIG. 28 is a schematic of the Voltage Level Monitoring Circuit.
Figure 29:
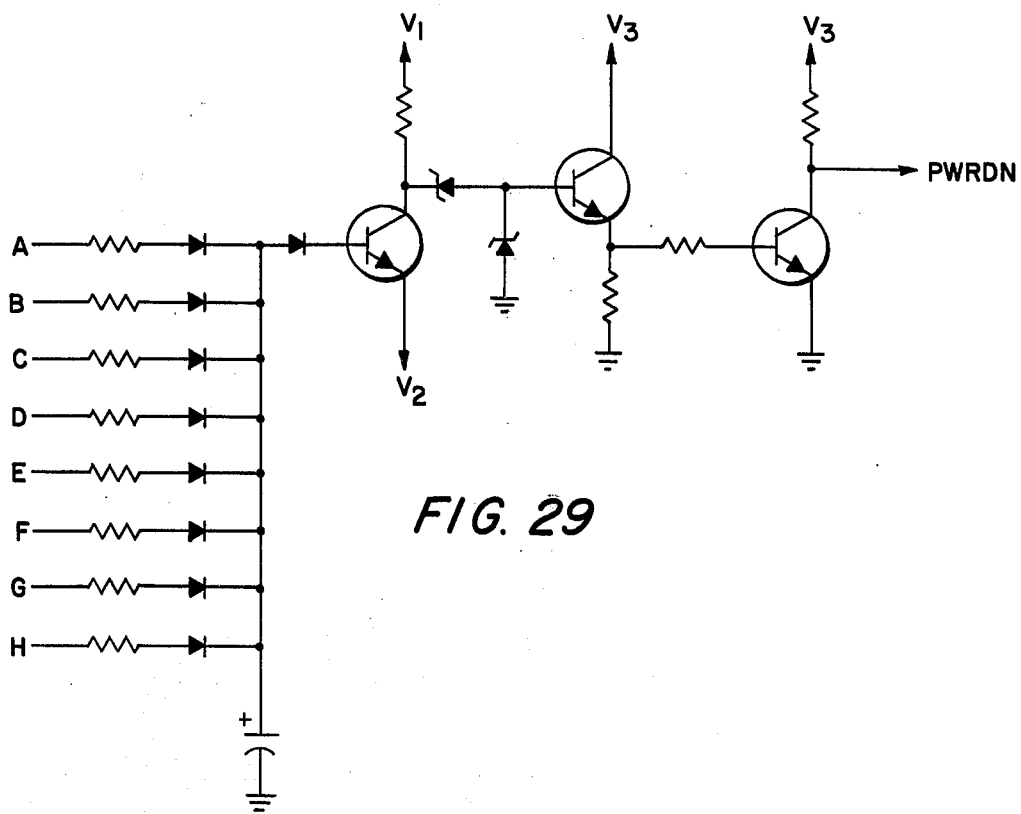
FIG. 29 is a schematic of the Power Interrupt Generator Circuit.

FIG. 28 is a typical voltage level monitoring circuit. Voltage V3 is a precision 5 volts and is supplied through precision Resistors 256, 258, 260, and 264 to Discriminator 266 which consists of two voltage discriminators. One half of Discriminator 266 is set to test for an over voltage and the other is set to test for an under voltage, with all resistance values set for the particular voltage being measured. The voltage to be measured is applied at the top of Resistor 262. The outputs of the eight discriminators used in this system are sent to the circuit in FIG. 29 where a power down interrupt PWRDH will be generated if either an over voltage or an under voltage is detected at any one of the eight voltage monitoring circuits.

The following series of schematics shows the circuits contained within the Programming Station to check that the PROM is in its native state condition and then to program it according to the device manufacturer's specifications. Finally, the Programmer will verify that the program has in fact been programmed into the PROM properly. It should be remembered that this verify operation is not a test of the chip's performance since dynamic testing is done in the Hot and Cold Chambers; it is merely a verification that the desired data pattern has been programmed into the PROM properly. This programmer is complex since each device manufacturer has different specifications defining the pulse voltages and currents necessary for the fuse blowing operation as well as the pulse shape characteristics to be used in that operation. Furthermore, the native state bits of some PROMs are all ones while other PROMs are all zeros, further complicating the circuitry. However, this Programming Station is implemented such that PROMs of any manufacturer may be programmed automatically. This is done by having general purpose circuits for providing any configuration of voltages, currents, addressing information and duty cycles and having a special set of two "Personality Modules" for each vendor type which control the operation of all the functions mentioned above. Flip-flops in the control modules select a set of Personality Modules to identify the vendor as well as the part number if the vendor makes more than one type of PROM. The Personality Module then controls the Programmer.

Generally, the Programmer is controlled by about 50 lines coming from the Personality Modules. These lines are referred to as the Parameter Control Bus (PCB). The Programmer is directed through a sequence of operations by a four bit counter referred to as a Sequence Counter which is under the control the the Personality modules. This four bit counter results in 16 different sequence states, and determines where the programming process is at any particular time. It always starts at zero and counts through every state even if that state is not used for a particular vendor's PROM. An unused state is instantly counted through on order from the Personality Module. There is an address counter under control of the Parameter Control Bus which controls the eight PROM address lines. This is used to determine the eight address bits of the PROM being programmed. There is also a two bit counter to determine which one of four fuses corresponding to the four output bits will be blown by the pulse drivers. This is necessary since, in a PROM, only one fuse at a time can be blown thereby necessitating the selection of one output line at at a time. The blow pulses are provided to the output pins through relays while the address lines are driven by logic. Since the relays are much slower in operation than the addressing logic, the programming sequence can be speeded up considerably by attaching the drive pulses through relays to a single output line and then cycling through the entire 256 word addressing scheme, blowing that particular bit fuse in all words before reconfiguring the relays to the next output bit. The Programmer also contains a nine phase Clock Generator for use by the Blow Timer. This Clock Generator is slaved to a crystal controlled Computer clock. The drive circuits are also counter driven to produce blow pulses from 10 microseconds to 160 milliseconds. This driver/counter may be implemented to produce variable pulse widths and also various rest periods between pulses. The duty cycle resulting from this circuit ranges between one-seventh and almost 1, although the variation can be controlled almost to a duty cycle of zero if required. The program to be written into the PROM is first loaded from the computer into a 256 word by four bit random access memory (RAM). First the data from the RAM is loaded into the PROM. Then the RAM data and the PROM data are compared to verify that the program was loaded into the PROM correctly.

The Programmer also contains a Pin Control Module. This module must control all of the address pins as well as the output pins including the one into which a blow pulse must be diven. Also, the other three output pins must also be controlled since these pins must either be kept floating or must be pulled to ground depending on the vendor. Thus, every pin on the PROM must be controlled during the entire programming cycle, which in turn means that all of the logic and relays must also be controlled. Relay contacts are connected not only to the output pins but also to the address lines of the PROM in case the PROM is equipped with an identifying or quality assurance fuse between two of the address lines. The existence of a quality assurance fuse would ensure that the PROM is still in its native state while the identifying fuse could be used to identify the vendor and part number of the particular PROM. For instance, if identifying fuses were provided, then a mixed assortment of PROMs could be loaded into the system, and the system itself could determine the part number, and program and test the PROM accordingly. As it is, this identifying fuse capability has not been designed into the PROMs and so the PROM type must be specified by the operator through the Keyboard Printer to the Computer prior to any programming or testing. However, the logic is in the System and can be used when PROMs are equipped with these identifying fuses. Of course, these fuses must be blown before programming and the System is set up to do that.

A Blow Timing Generator is provided and is under control of the Personality Modules to supply to the PROM pulses of suitable duration and duty cycle. The Blow Timing Generator is under control of these Personality Modules through the PCB bus. All of these programming circuits will be discussed in detail later in this specification.

Two RAM's are designed into the system, each configured as a 256 word by four bit memory when it is compared with the contents of the PROM or the PROM is being programmed. When the RAM is being loaded from the Computer it is in a 64 word by 16 bit configuration since the computer in this application is a 16 bit word computer. Thus, 64 write directs from the Computer through the IO Interface are required to load the RAM. Then it is switched internally to its 256 word by four bit configuration for use in programming and verifying the contents of the PROM.

The PROM, when inserted into the programming station, is contacted by two sets of contacts per pin, or 32 contacts contacting 16 pins. This is necessary to ensure contact between the programming station and the PROM as follows. One entire set of 16 pins is connected to ground and the other set of contactors is tested for ground. If in fact any one of the 32 pins does not make a good contact, this contact test will be failed. Conversely if the test is passed, then it is assumed that all contacts are in electrical contact with the PROM and the program and verify sequences may begin. All of the programmer circuits mentioned above will now be discussed in detail.

Figure 30A:
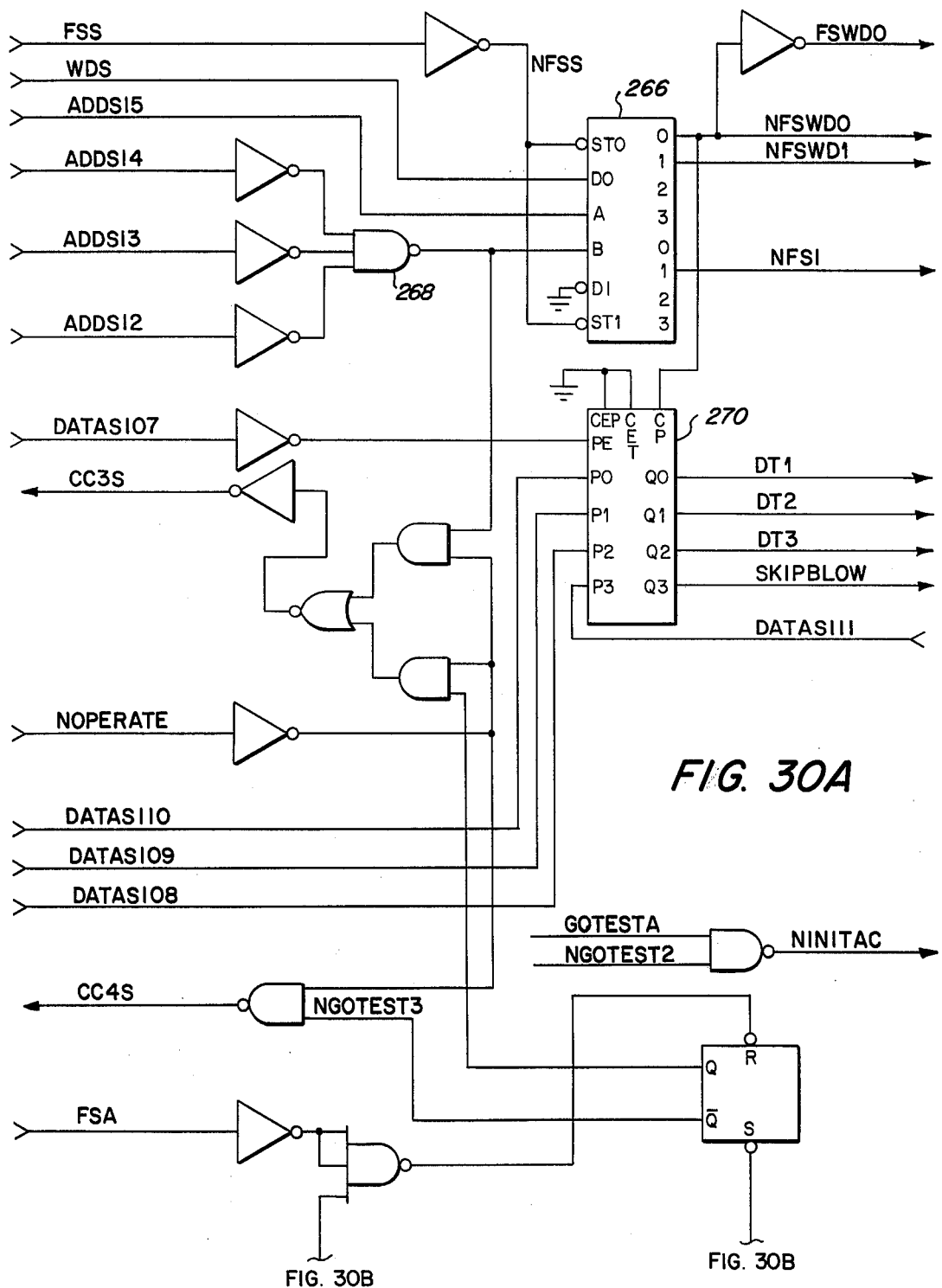
FIGS. 30A and 30B are a schematic of the Program Control Module.
Figure 30B:
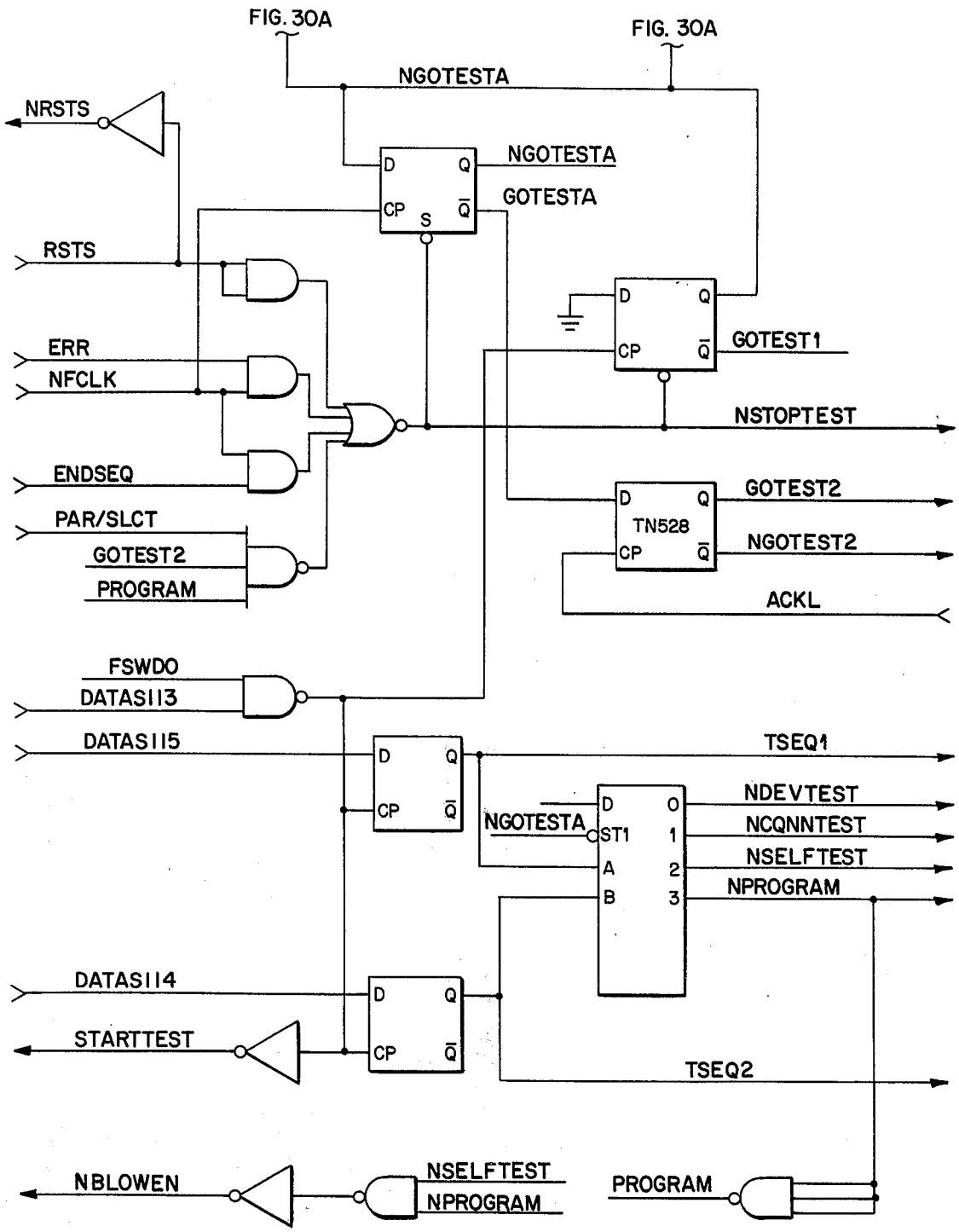

FIG. 30 is the program control module and generates the major control functions. At the top of the schematic, Decoder 266 is a dual-to-four Decoder. In addition to the two sets of two inputs and two sets of four outputs, the device has a strobe input and A and B inputs. Without a strobe input there will be no output. The A and B inputs are the ones that are decoded. They are decoded such that the binary count input will decide which output line is held at ground. Both top and bottom outputs will be a result of the same input but will look to its own enabling signals. The function strobe FSS enables both sections and the write direct enables the top four outputs. Since the bottom enable is tied to ground, it will work for either a read or a write direct. Since the Programmer uses only two read and two write direct commands, zero and one, then this bit 15 which is the least significant bit will specify which of the two commands is being issued. Address lines ADDS 12, 13 and 14 should all be zero and any one of these bits being on constitutes an illegal address. The upper half of Decoder 266 is implemented such that only the zero and one outputs are used, corresponding to the write direct one and zero. The bottom signal represents either a read or a write direct one. The output of Gate 268 is an illegal address signal.

Flip-Flops package 270 contains four flip-flops. During a write direct address zero, if data line 7 is high, data bits 8, 9, 10 and 11 will be copied out. These top three signals are device type identifiers and the fourth signal means "skip the identification fuse blow cycle". The remainder of the flip-flops on this schematic are used to synchronize the Computer with the System Programmer. This is necessary since the function strobe may occur at any phase of the clock generated by the Programmer Clock Generator circuit.

Figure 31A:
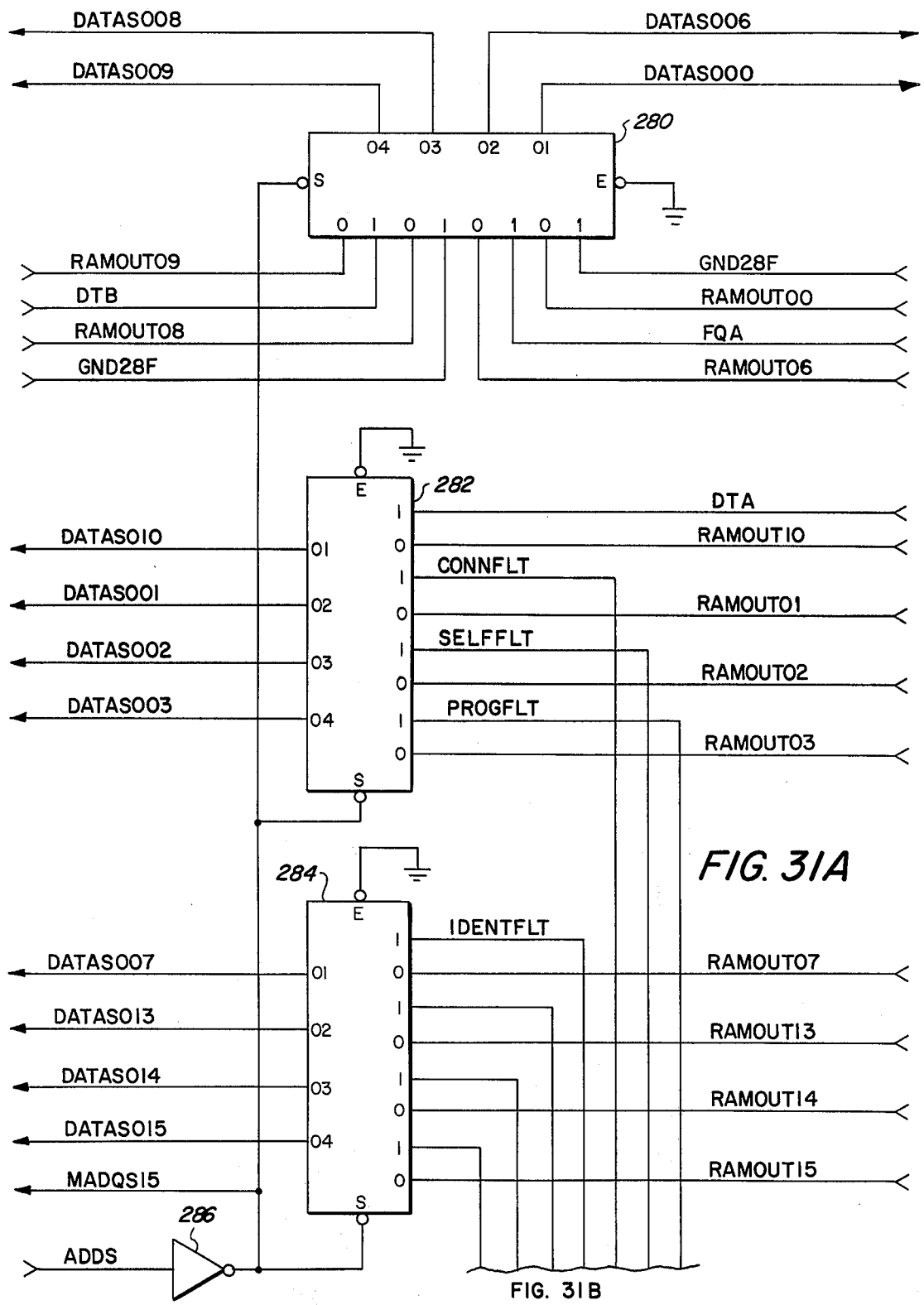
FIGS. 31A and 31B are a schematic of the Program Control Circuit.
Figure 31B:
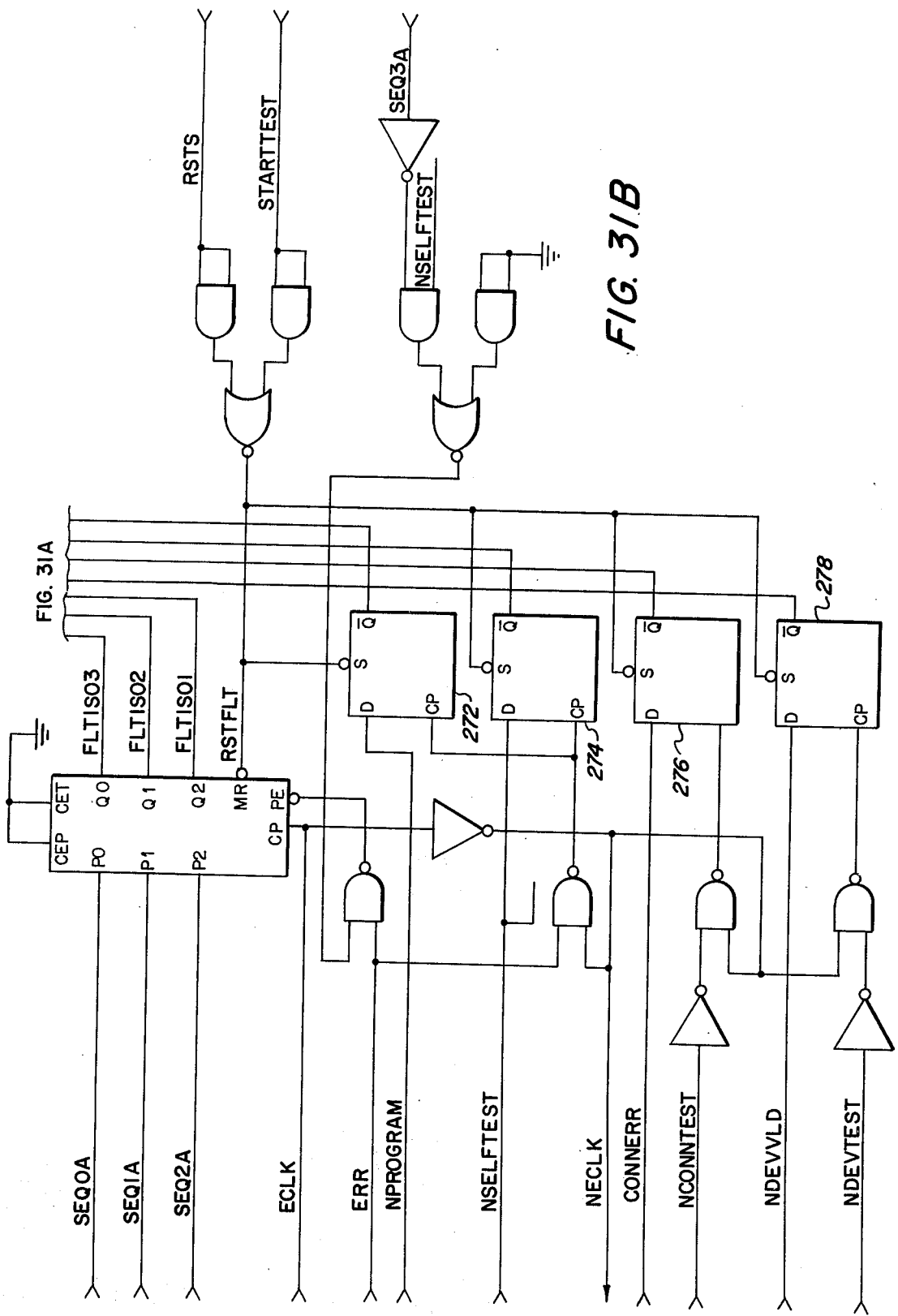

FIG. 31 is the other half of the Programmer Control circuits. The bottom four Flip-Flops 272, 274, 276 and 278 store fault information for later use. Flip-Flop 278 is set if the fuses between the address lines are not appropriate for any vendor. Flip-Flop 276 is set if there is a connector error indicating that the connector should try again to make contact with the PROM. Flip-Flop 274 is set if a self test is in progress and Flip-Flop 272 is set as a program fault when a device cannot be programmed. The outputs of these Flip-Flops may be read out by the Computer. Device 280, 282 and 284 are three quad 2-to-1 Multiplexers which are read out by the Computer during a read direct zero or one.

Whether read direct zero or one information is read out is determined by Gate 286 under control of the least significant address bit. In this case, if the read direct is a one the RAM output will be read. If it is a zero various logic signals will be read out.

Figure 32A:
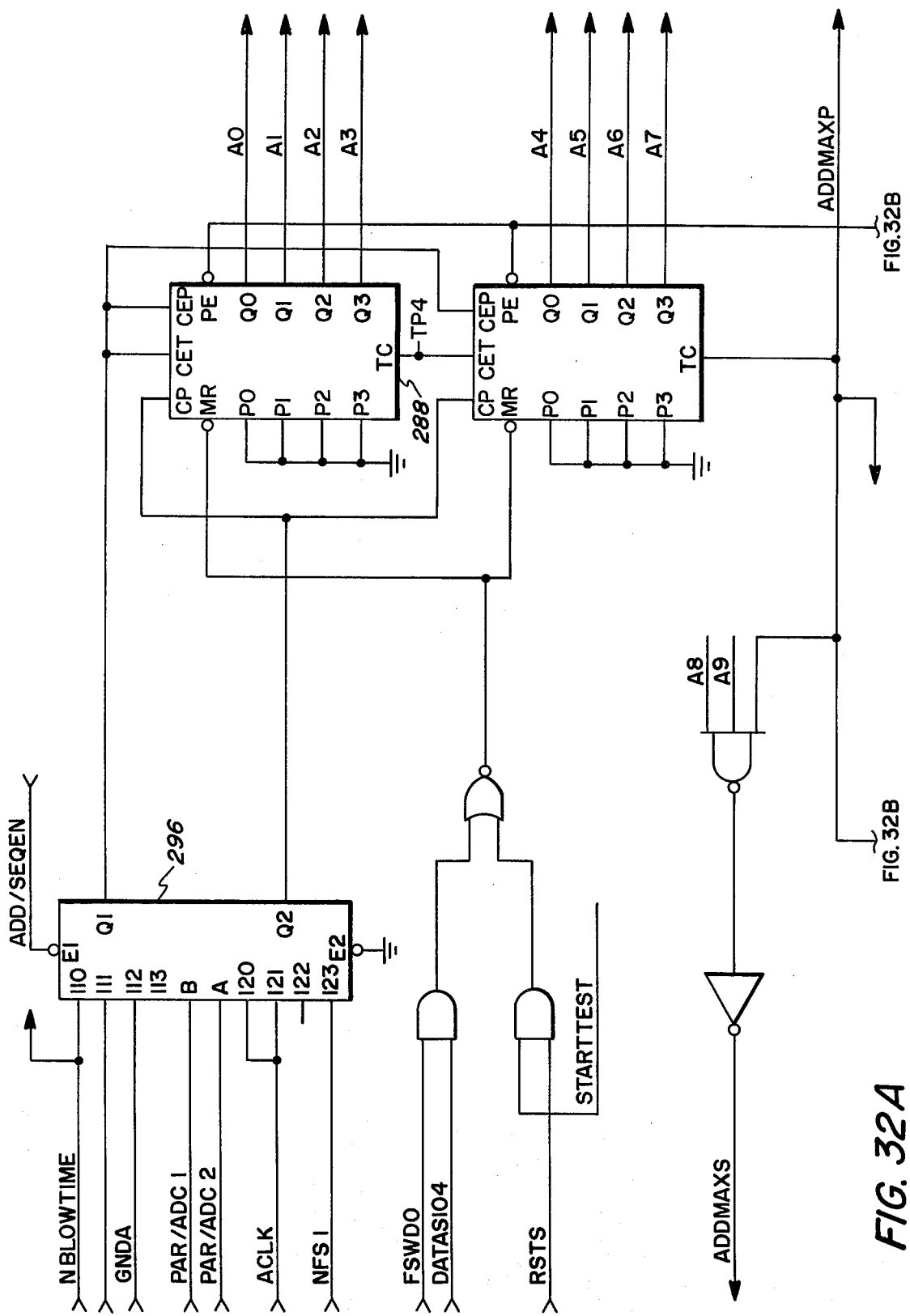
FIGS. 32A and 32B are a schematic of the Addressing and Sequencing Circuits.
Figure 32B:
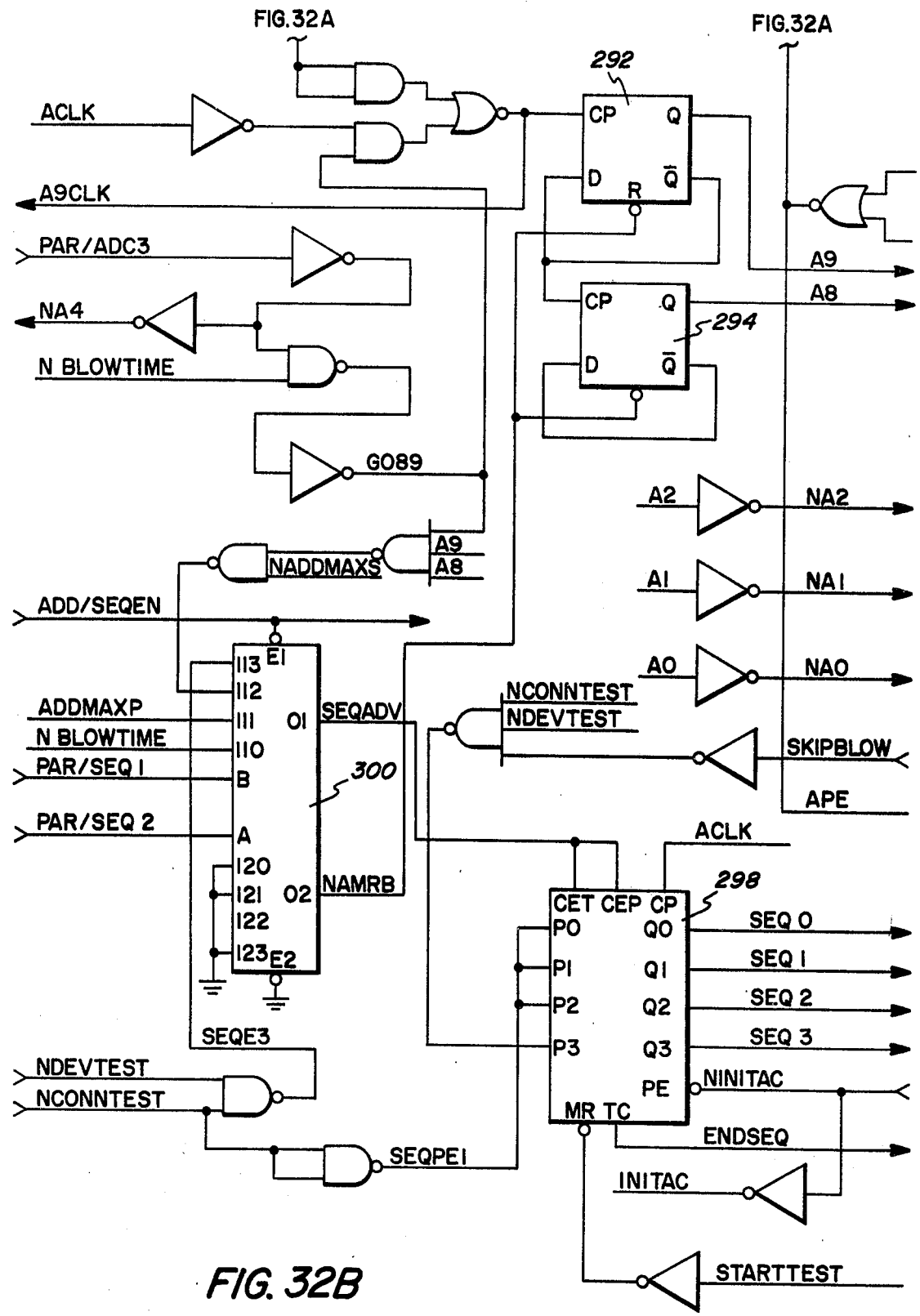

FIG. 32 contains the addressing and sequencing circuits. Devices 288 and 290 are four bit binary Counters and Flip-Flops 292 and 294 are two Flip-Flops configured as a two bit counter. Signals A0 through A7, the output of the two four bit counters are the address lines to the eight address inputs of the PROM being programmed. A8 and A9, the outputs of the two bit counter are the signals which control the relays contacting the four output pins of the PROM. Device 288 and 290 are allowed to count if they receive a clock pulse at the clock pulse input and also if they are enabled by enabling lines from device 296 which is a dual four bit Multiplexer. When the reset inputs to 288 and 290 are pulled to ground, there is a parallel load operation and since all of the parallel load inputs are grounded, the counters are reset to zero. When the reset line goes high, the circuits go back to counting as driven by the A clock input from Multiplexer 296. Multiplexer 296 is controlled by the A and B inputs from the Personality Modules. The top half of Multiplexer 296 is used to control the count enable lines while the bottom half supplies the clock pulse.

The Counter 298 controls the entire operation of the Programmer. This device is a four bit binary counter clocked by the A clock and generates 16 separate sequence steps which control the Programmer. Since a failure at any point in the programming operation aborts the rest of the test, if the Sequencer runs through its entire count then, by definition, the programming and verify operation has been successfully completed. The Counter 298 is enabled by the top half of dual four-input Multiplexer 300. The bottom half of Multiplexer 300 is used to decide whether the two bit counter producing A8 and A9 will be allowed to count. In fact only during sequence 2, the programming sequence, will they be enabled. Otherwise, these signals are not used.

As shown in the schematic, the A clock is always supplied to Sequence Counter 298 which will count only if the output from Multiplexer 300 allows it to do so. One of the inputs to Multiplexer 300 is the signal ADDMAXP corresponding to a maximum count in the Address Counter. Another is a signal NBLOWTIME to show whether a blow pulse is being generated. The purpose of these two signals is not to allow the sequence number to change while a blow pulse is being generated, since the relay contacts are not capable of handling large amounts of current while making or breaking contact. Also, the Sequence Timer is inhibited from counting during the connector test. Otherwise the counter is advanced on every A clock pulse. Which of the four input lines will be multiplexed to the Sequence Timer 298 is determined by two control lines PAR/SEQ1 and 2 from the Personality Modules. This is necessary since not all sequences are used. For instance, to test a PROM that has already been programmed, the blow sequence will be skipped.

Multiplexer 296 is controlled similarly in that it receives its A and B inputs from the Personality Modules and the output of Multiplexer 296 determines whether Counters 288 and 290 will count. Multiplexer 296 will also decide which clock will be used in the counting process. For instance, the function strobe is used as a clock while loading the RAM from the computer while the regular programming clock is used for other purposes. As a specific example, if Multiplexer 296 inputs A and B are both high, imput 113, which is unconnected, will be high enabling Counter 288 to count, while in the bottom half of Multiplexer 296 the function strobe will be used as a clock input to Counter 288 and 290. This is the situation when the RAM is being loaded or unloaded from the Computer and the function strobe is being used as a clock pulse. Data bit 4 which is received from the Computer is applied to the reset lines of Counters 288 and 290 and since the parallel load lines are all grounded, this signal serves to reset the address count to zero. Thereafter, as the Computer loads data into the RAM, it must count the number of words loaded so that it will know independently when 64 words have been loaded. This is necessary since there is no logic in the address counters to indicate an overflow. Thus, after initializing the counter, the Computer will always load 64 words into the random access memory. This is done by loading the 16 bits onto the IO bus and then initiating a write direct one and a function strobe. In this case the trailing edge of the function strobe acts as a clock so that the address will not change until the data has been loaded. The leading edge of the function strobe leads the data and the falling edge of the function strobe clocks the address line, thereby ensuring the address lines will be stable during data load. To read data from the RAM back into the Computer the same procedure is followed except a read direct is used instead of a write direct. A circuit for comparing the RAM output with the PROM output will be discussed later. Immediately upon loading 64 words into the RAM, the words are immediately read back to ensure a proper load.

Multiplexer 296 will be configured so that the A clock is used to drive the Counters 288 and 290 during the verification of the native state of the PROM outputs. This native state test, comparing the output of the PROM with either all one's or all zero's can be accomplished very quickly and therefore the 100 kilohertz A clock will be used. A "two" input to Multiplexer 296 is used in the freeze situation where, in the upper part of Multiplexer 296 a grounding signal will disable the Counter 288 while in the lower half no clock pulse will be supplied to the Counter 288.

The two bit Counter 292 and 294 is driven by the carry output of Counter 290 and thus counts once for every overflow of the eight bit Counters 288 and 290. Alternatively, the bottom two Flip-Flops 292 and 294 can be counted regardless of the Address Counter with the proper logic input levels. However, at present this capability is not used.

Figure 33A:
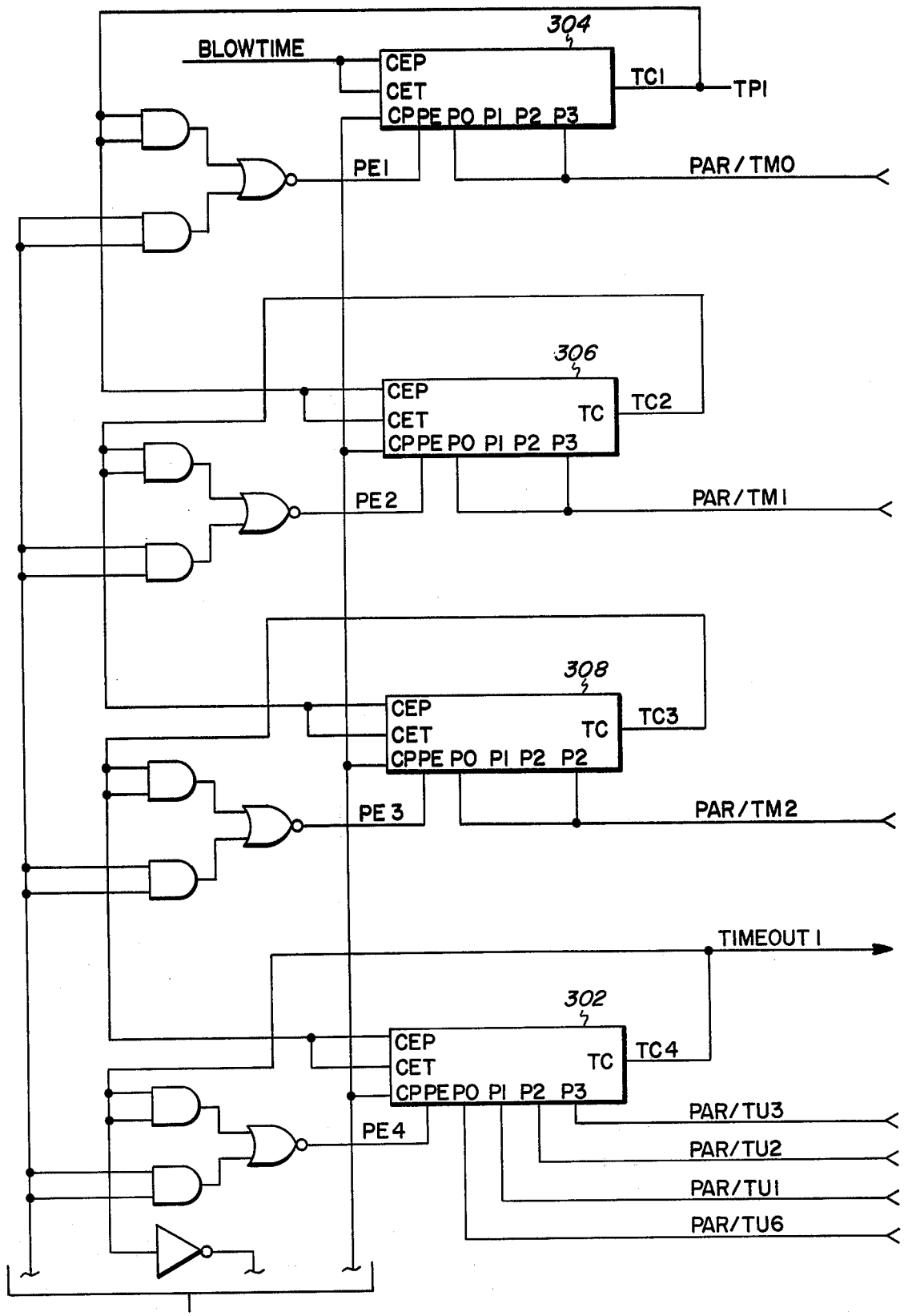
FIGS. 33A and 33B are a schematic of the Blow Timing Circuits.
Figure 33B:
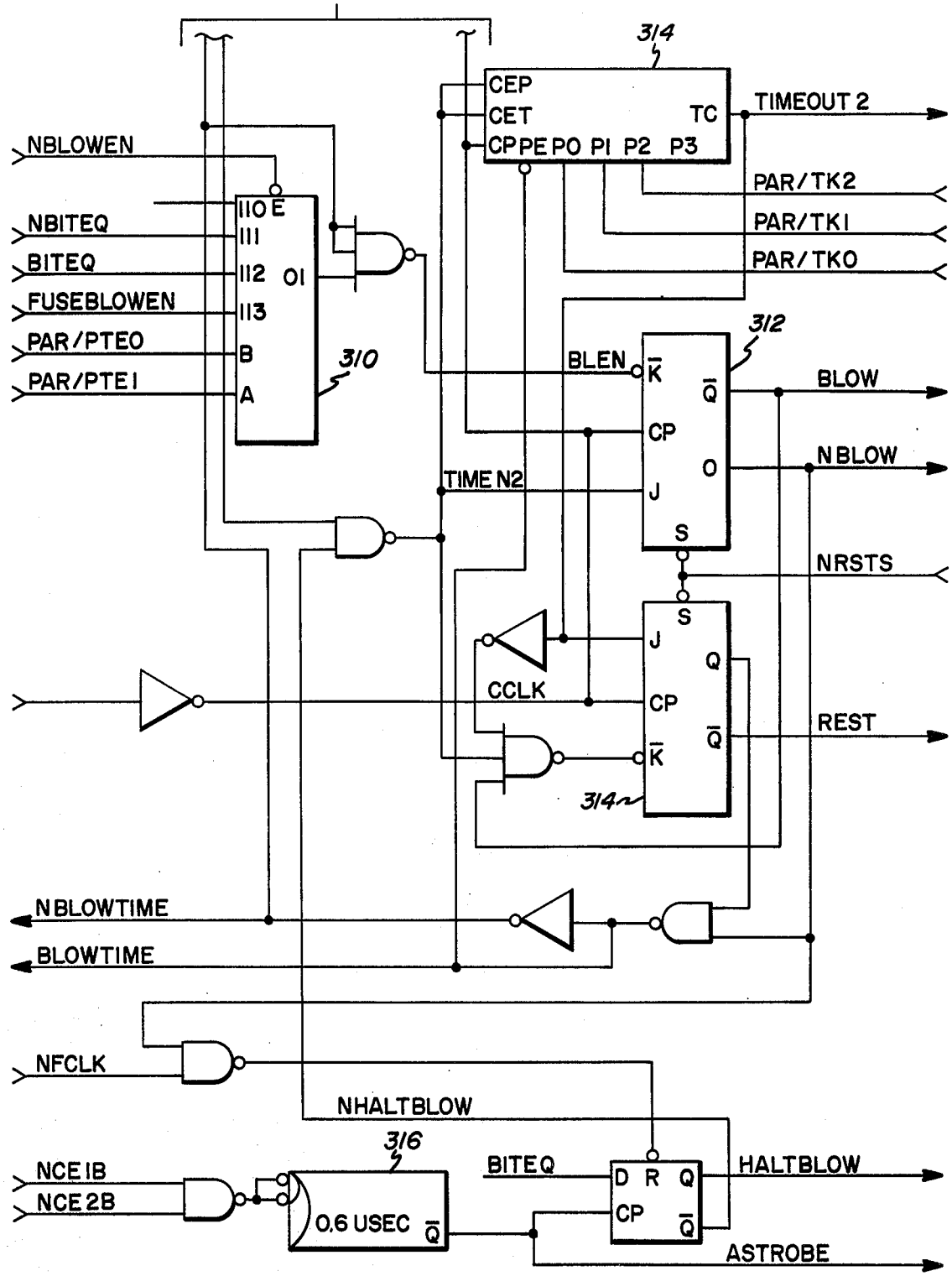

FIG. 33 is a schematic of the circuits required to generate the blow pulse timing. Device 302 is a Counter which determines how many 10 microsecond intervals will be used for the blow pulse, and therefore can generate a blow pulse between 10 and 160 microseconds. Counters 304, 306 and 308 will be multiplied by 10, 100 or 1000. Thus, a maximum timing pulse of 160 milliseconds may be produced.

Devices 304, 306 and 308 are supplied by a C clock which runs at a frequency of 100 kilohertz. Device 304 is enabled by blow time signal and upon a blow time command may be parallel loaded through the PAR/TMO line from the Personality Module. If the PAR/TMO line is high, then the Counter will be parallel loaded to an all one's condition so that the first clock it receives will reset it to all zeros. Under these conditions a clock pulse will be generated at the carry output line and will be felt at the count enable input of Counter 306. In this condition it can be seen that Counter 304 will output a clock pulse for every clock pulse it receives and, in this case, there is no multiplication by a factor of 10. On the other hand if the PAR/TMO line is low, and the parallel load enable line is enabled then the Counter 304 will be preset to 6 in that P1 and P2 are high while P0 and P3 are low. Therefore, it will take 10 clock pulses before a clock will be generated on the carry line and transmitted to the count enable inputs of Counter 306. Therefore, Counter 304 will generate a 100 microsecond delay in that it will count up to 10 using the 10 microsecond C clock. Counters 306 and 308 are similarly implemented so that each one will either count to 1 or 10 depending on the PAR/TM1 and TM2 lines. In this way Counters 304, 306 and 308 each can multiply the time duration by 10.

The carry output from Counter 308 is used as a count enable in Counters 302, a four bit Counter which is also clocked by the C clock. This unit may be parallel loaded through four lines from the Personality Module and therefore may be preset to any number from 0 to 15. However, since the count enable is activated by the carry line from Counter 308 it will only count once for each carry imput Counter from Counter 308. Thus, it will count once for each 10, 100 of 1000 C clocks. Further, the number that it will count up to is determined by the Personality Module output lines. Therefore, any blow pulse time from 10 microseconds to 60 milliseconds is possible through the use of these four Counters. Various conditions under which a blow pulse should be intiated are represented as inputs to the 4-to-1 Multiplexer 310 which is under control of two lines to the A and B inputs from the Personality Modules. The output of Multiplexer 310 goes to JK Flip-Flop 312 which initiates a blow pulse. Finally, when the time developed in Counters 302 through 308 has elapsed, the signal developed at TIME OUT1 will terminate the blow pulse. This time out pulse also is applied to the parallel enable line of Counter 302 to once again reinitialize the counter according to the parallel load line inputs.

Counter 314 determines the duty cycle in that it may be preloaded by the Personality Modules to any number and is enabled to count only once for each complete timing of the cycle through Counters 302 through 308. In other words, as an example, if the Counters are set to count 1 millisecond by preloading a 4, the blow timer can be programmed to rest for 4 milliseconds between each 1 millisecond blow pulse. The Rest JK Flip-Flop 314 is driven by the Duty Cycle Counter 314. A six tenths of a microsecond delay Timer 316 is used to ensure that the outputs from the RAM and PROM have a chance to settle before being compared during the verify process. If the results are not the same an additional blow pulse can be generated. This is an iterative process continuing until either a maximum member of blow pulses having been applied or the contents of the RAM and PROM bit are equal.

After the fuse is blown, the Personality Modules will see the blow time signal go to ground and will instruct the address counter to cycle to the next PROM address. Thereafter, if any of the condition inputs to Multiplexer 310 are true, and that input is selected by the PAR/PTI lines, the next blow pulse will be initiated. Both Flip-Flops 312 and 314 are turned off by the reset line ZRSTS so that when power is applied the blow pulses will be off.

Figure 34:
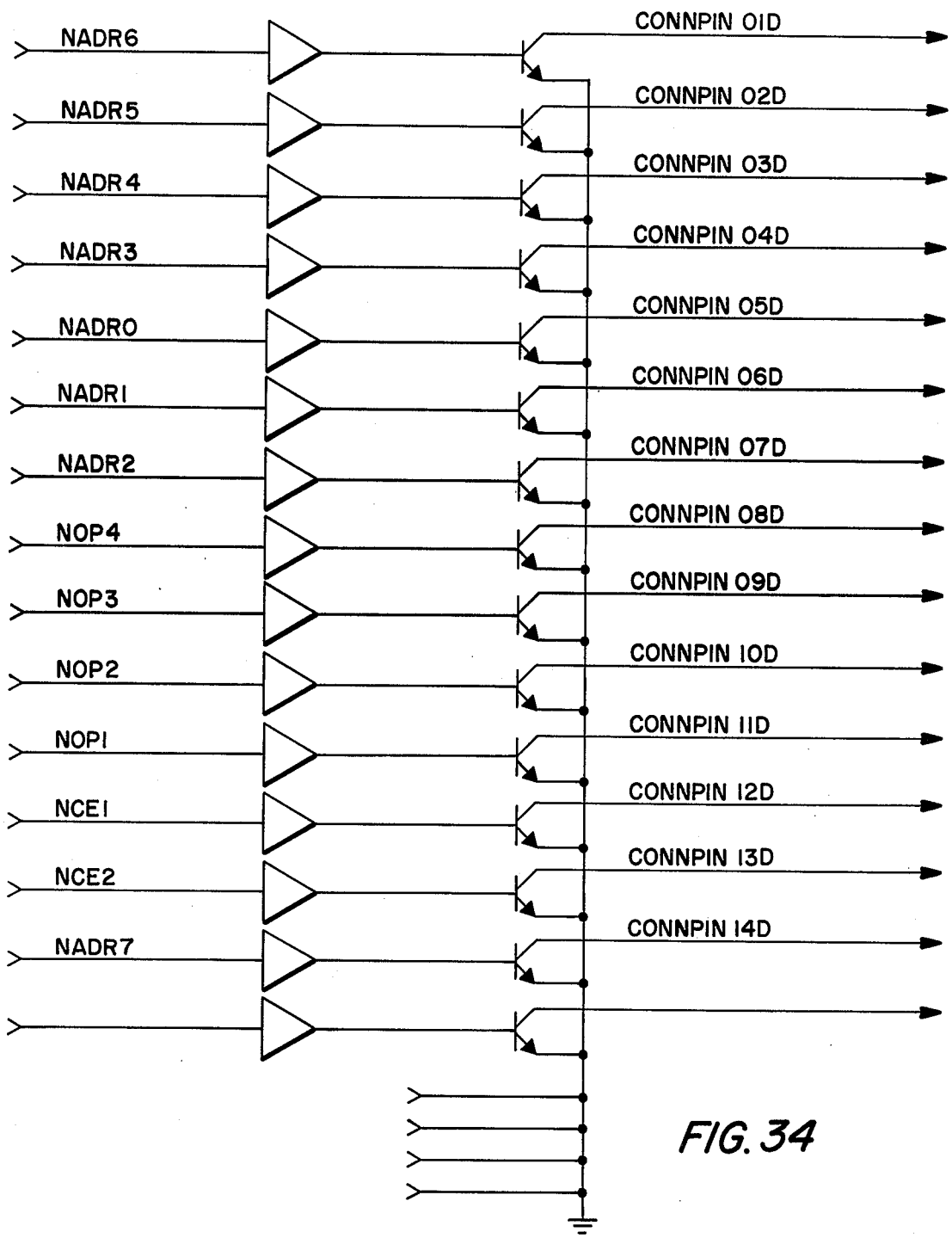
FIG. 34 is a schematic of the Pin Drivers.
Figure 35:
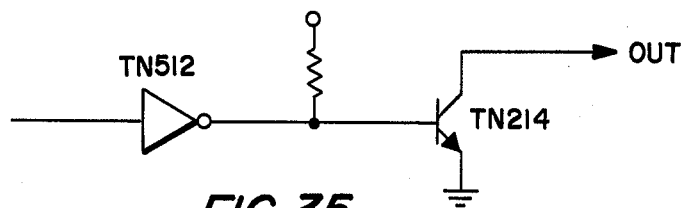
FIG. 35 is a schematic of the Output Drivers.
Figure 36:
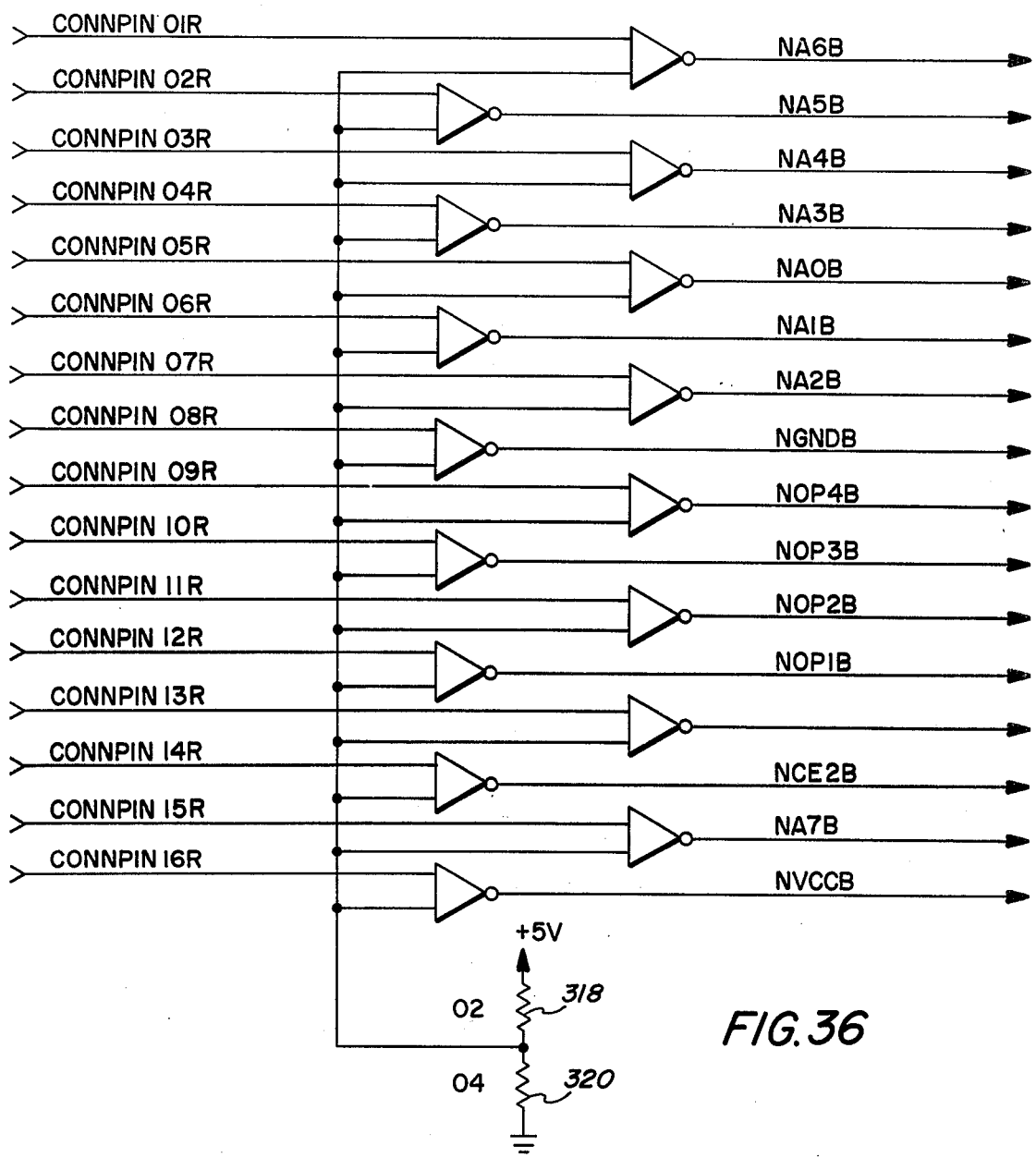
FIG. 36 is a schematic of the Receiver Input Circuits.
Figure 37:
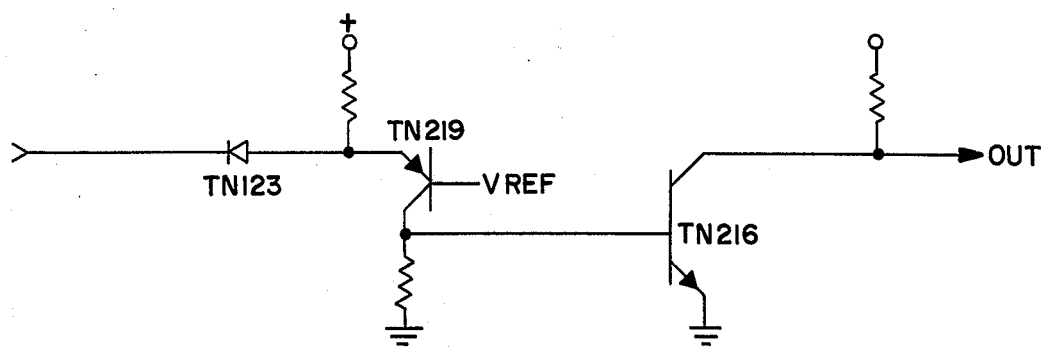
FIG. 37 is a schematic of the Input Circuits.

FIG. 34 is a simplified schematic showing fifteen Pin Drivers and FIG. 35 is a schematic of the actual Output Driver circuit. FIG. 36 is a simplified schematic of 16 pin receivers and FIG. 37 is a schematic of each individual input circuit. IN FIG. 35 the driver outputs go to 15 of the pin contactors and in FIG. 36 the receiver inputs come from a second set of contactors. FIG. 34 only has 15 output lines since the sixteenth pin on the PROM is always grounded. In FIG. 36 the resistor network consists of a resistive voltage divider to set a level above and below which the zero and one levels are defined. A set of sixteen relays also contact the PROM and these relays are used to connect the Pulse Drivers to the PROM pins for use in the programming sequence. The logic is implemented so that a Pulse Driver and a Pin Driver are never on at the same time, which would result in damage to the equipment.

While programming fuses are blown between the Pulse Driver and ground, the address fuses are blown between the Pulse Driver and the Pin Driver, and therefore each Pin Driver output circuit, as shown in FIG. 35, is designed to sink 200 milliamperes which is enough to blow an address fuse. These fuses are blown by attaching a relay to one pin and a Pin Driver to the other.

All information received from the PROM is received at the input pins of the pin receiver as shown in FIG. 36. In a mode where the outputs must be read, the Pin Drivers are turned off and the PROM outputs to the Pin-Receiver are inspected. The information received from the PROM may either be its regular memory output or a resistance level indication of an address fuse. The fuse resistance may be as high as 1000 ohms. Therefore, the Pin Receiver has a voltage divider Resistors 318 and 320 set up to detect the difference between this resistance and an open circuit. The test consists of grounding one pin that the address fuse may be connected to and looking at the other pin that the fuse may be connected to. If the other line remains high, there is no fuse.

Figure 38:
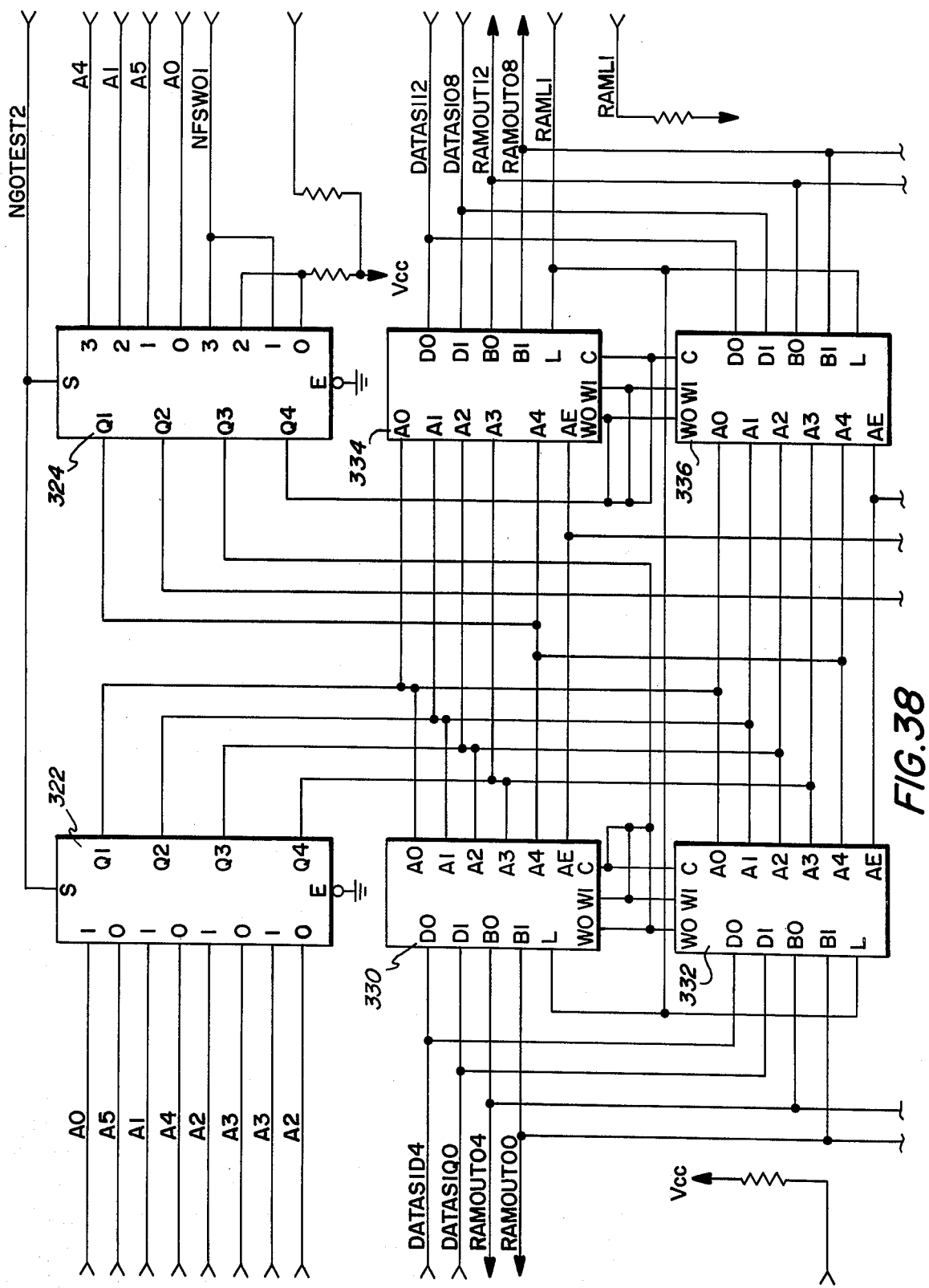
FIG. 38 is a schematic of the Random Access Memory.

FIG. 38 is the schematic of a portion of the random access memory, one of which is contained in the Programming Station and another of which is contained in the Test Station. They are identical. One total RAM is located on four cards, each of which contains four RAM devices 330 through 336 implemented as a 32 word by two bit random access memory with five address inputs, two data inputs, two data outputs and write and clear controls. The devices are arranged so that those devices appearing above and below each other have parallel inputs and outputs. Therefore, FIG. 38 actually shows two sets of 64 word by two bit memories, or one 64 word by four bit memory. Since four cards comprise a complete RAM, therefore we have the choice of either 64 words by 15 bits or 256 words by four bits. The 64 by 16 configuration is used when the RAM is being loaded from the Computer since the Computer is a 16 bit machine. On the other hand, the RAM will be configured as a 256 by four memory when it is being used to program and verify the contents of the PROM which is also a 256 by four bit device. A multiplexer not shown, commonly drives either one set of RAMs or the other, thus selecting one output at a time if desired. There are five address lines coming from Multiplexers 322 and 324 plus a sixth line which controls the other Multiplexer, not shown, which is used to select the desired output. There are also two lines which select one of four cards making a total of eight address lines. In this way up to 256 words may be addressed.

Devices 326 and 328 determine whether the memory will be configured as a 64 or 256 word memory. Data is received from the computer through the Data Interface and the outputs are sent to a multiplexer which chooses between the output from this RAM or from the PROM being programmed.

Figure 39:
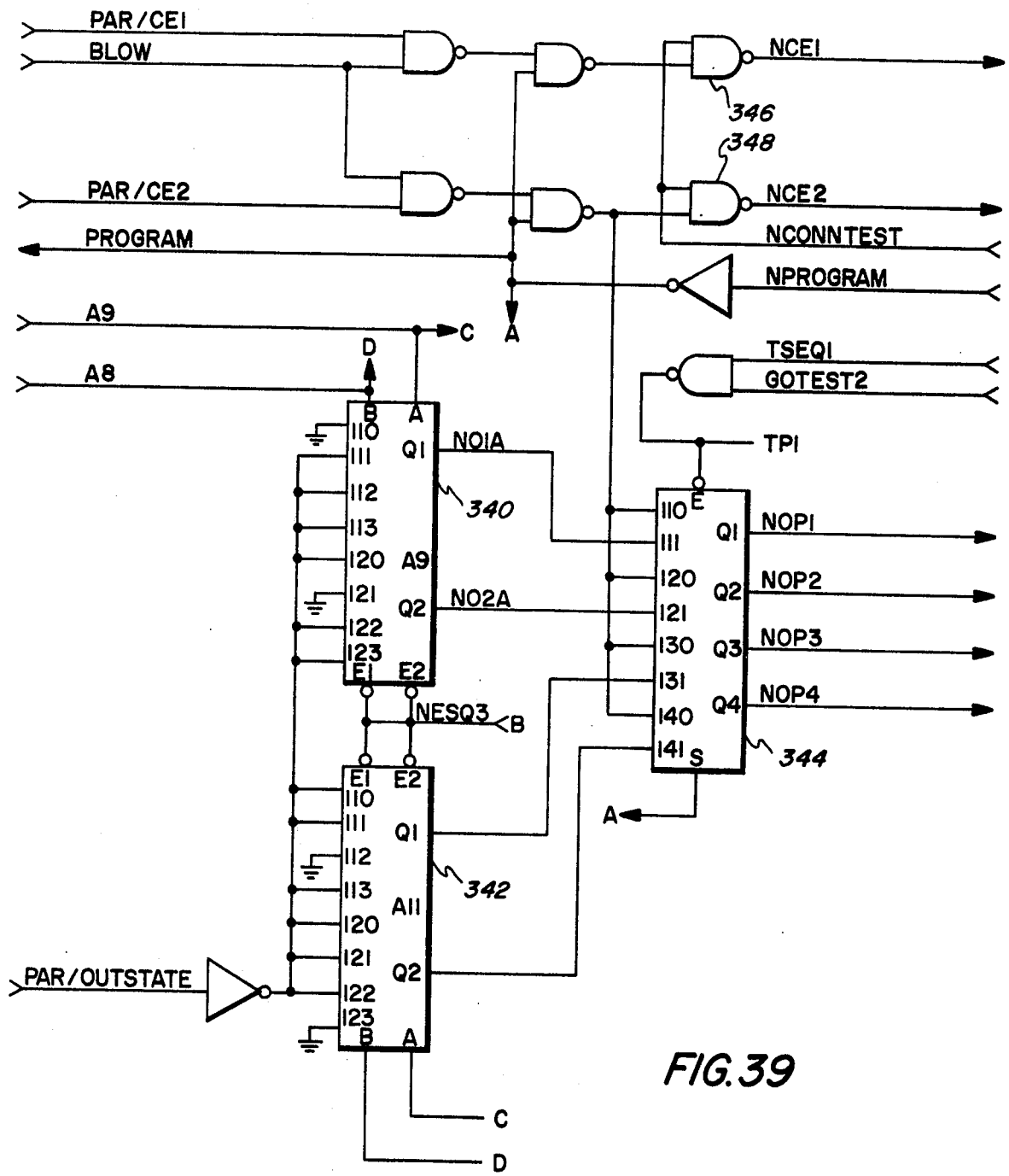
FIGS. 39, 40 and 41A are schematics of the Pin Control Module.
Figure 40:
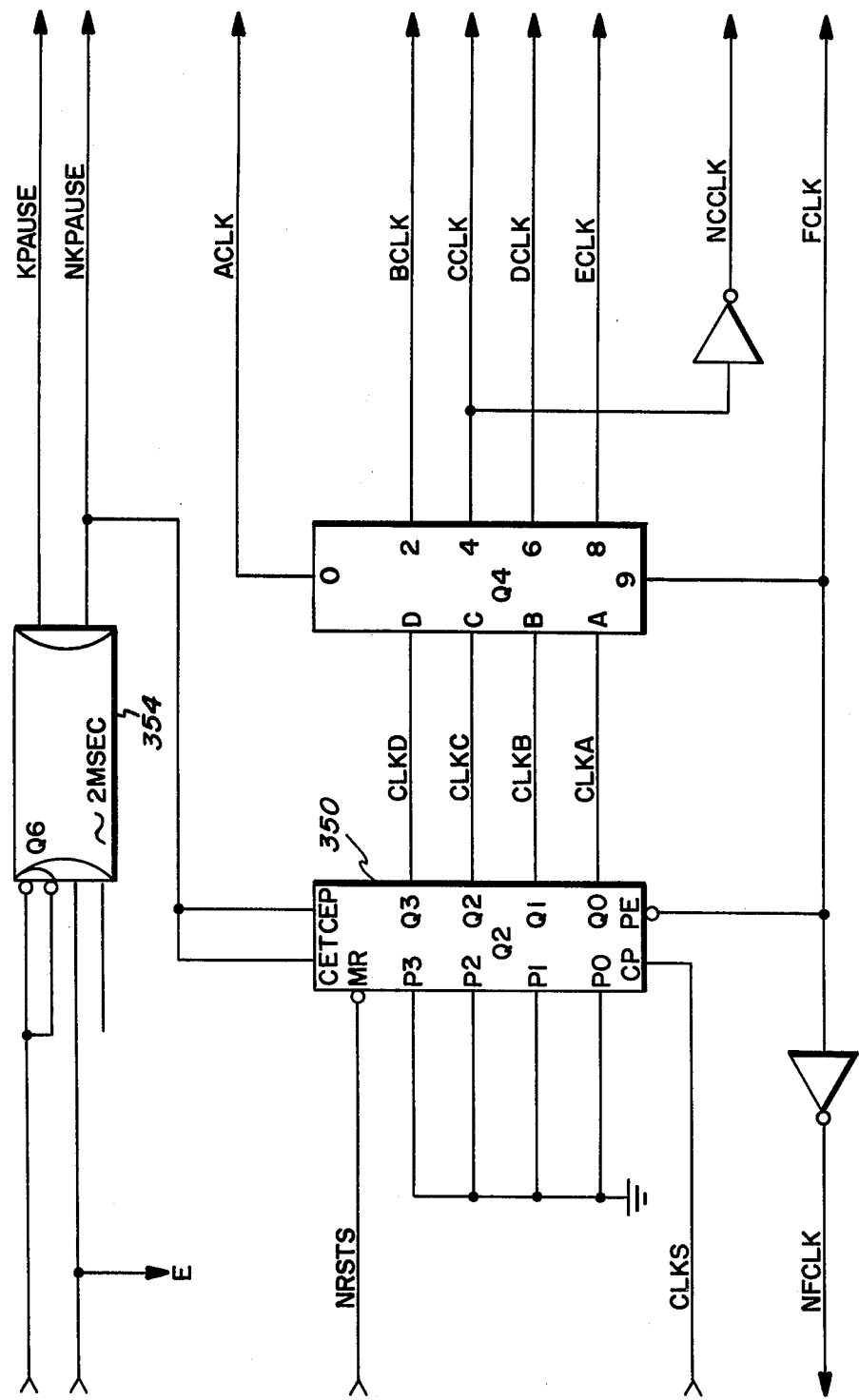
Figure 41A:
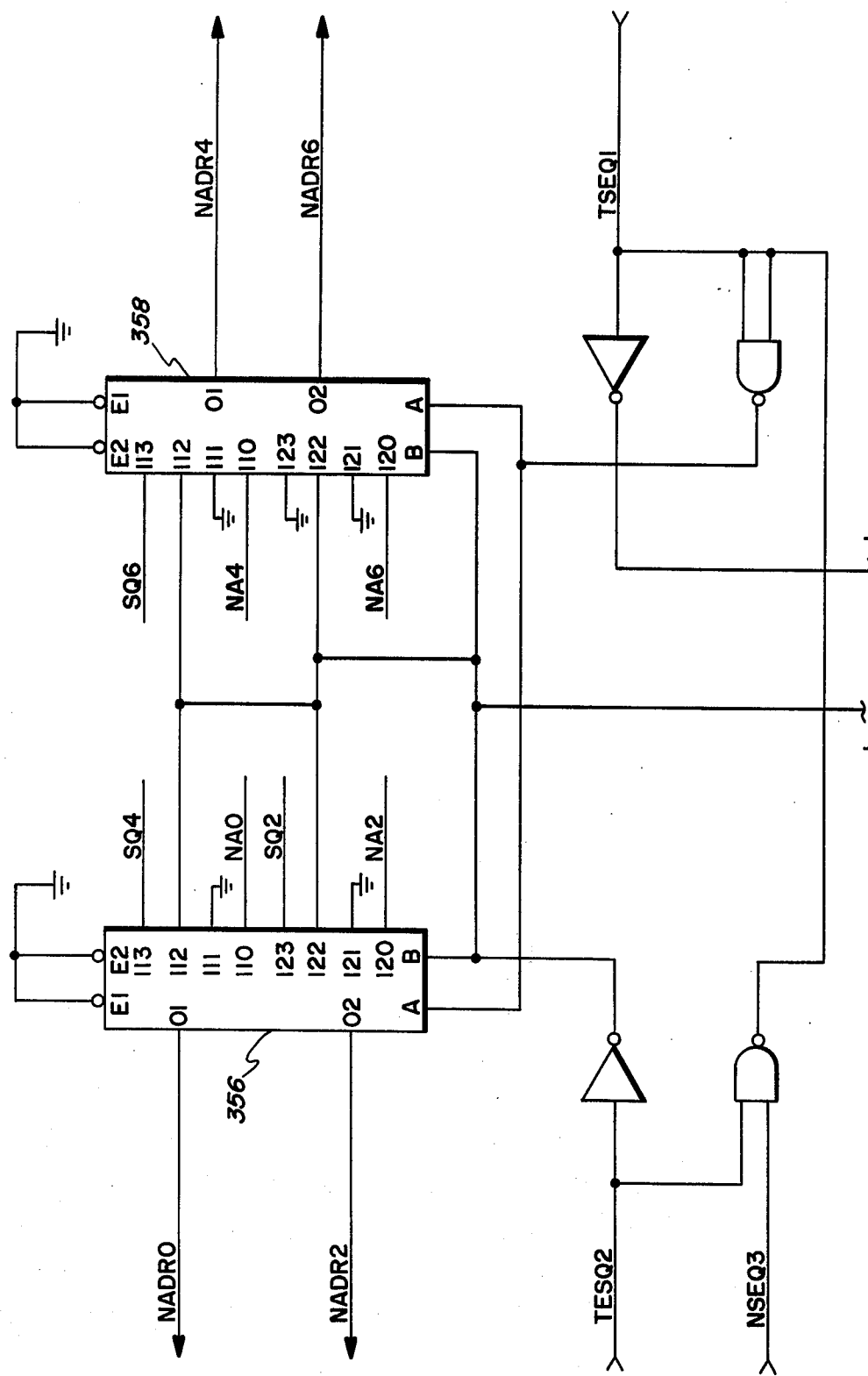
Figure 41A:
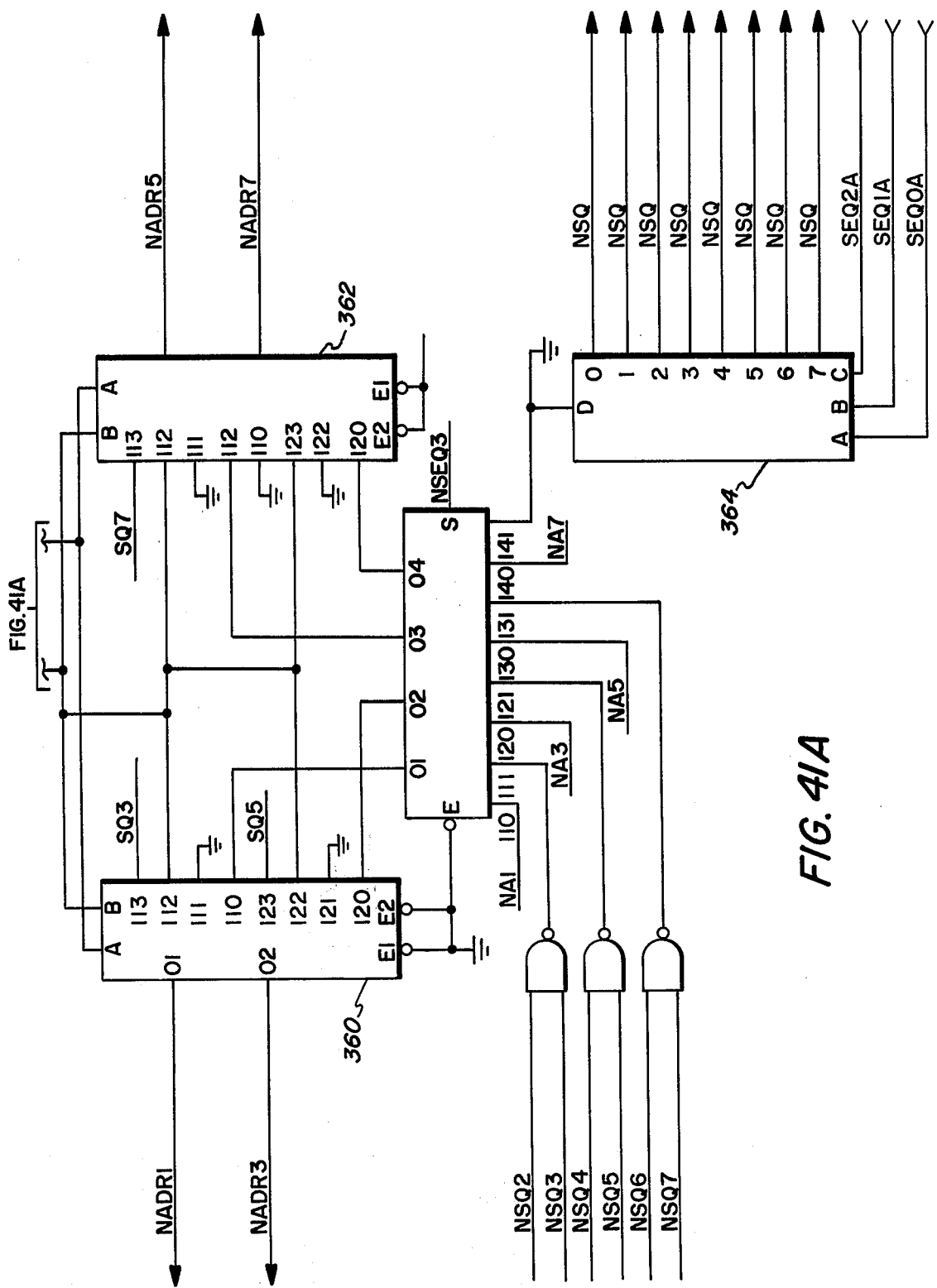

FIGS. 39, 40 and 41 are schematics of the Pin Control Modules. One of the functions of the Pin Control Module is to provide a clock for the Programmer. This clock, in six phases, is produced by four bit Counters 350 and 4-to-10 decoder 352 in FIG. 40. The four bit Counter 350 is driven by the 1 megahertz system clock. The four bit output is used as inputs to the Decoder 352 which results in outputs from Decoder 352 which are spaced apart from each other by 2 microseconds. That is, if A clock is produced at a time zero B clock will be produced at time equals 2 microseconds, C clock will be produced at time equals 4 microseconds, etc. The result is a series of phased clock pulses at a 100 kilohertz rate. The sixth output, FCLK, is used to reset the Counter 350 so that the process will be repeated every 10 microseconds. The A clock output is used to drive the Sequence Counter while the C clock is used to drive the Blow Timer. Thus, the address lines have 4 microseconds to settle before a blow pulse is initiated. Single Shot Multivibrator 354 is used to disable the clock in that if an event occurs, such as a relay closure, that requires an additional amount of time, then this Single Shot Multivibrator 354 is triggered, producing a 2 millisecond signal which will inhibit the clock from counting. One of the logical inputs to this Single Shot Multivibrator is the A clock and the reaction time is fast enough so that the B clock will not be produced until after the 2 millisecond time out.

FIG. 39 is a schematic of the circuits that control the other three output pins of the PROM when the fourth pin is being programmed. The decoding inputs at Pins A and B of four-to-one Multiplexers 340 and 342 are the A9 and A8 signals which are the address lines for determining which one of the four output lines is being programmed. The input corresponding to the selected PROM output is grounded in all cases. The other pins will either be set high or low depending on the PAR/-OUTSTATE line coming from the Personality Module. Thus, under control of the Personality Module, the remaining three lines will be set either high or low depending on the vendor. These four output lines go to a quad two input Multiplexer 344 which selects either the outputs of Multiplexer 340 and 342 or a logic state selected by the Personality Module. The outputs NOP1 through NOP4 go to the inputs of the Pin Driver shown on FIG. 34. If the not program signal NPROGRAM is true, then all the outputs are low so that we can read the outputs of the PROM, enabling these to be compared with the outputs of the RAM. When input levels at the A8 and A9 lines change, the ground outputs at NOP1 through NOP4 follow, thereby ensuring that the output transistors at the Pin Driver will not be ruined by the programming pulse.

The two chip enable signals for the PROM are generated in Gates 346 and 348. These must be held to ground to enable the PROM to read out data. However, a particular vendor may use these chip enable inputs as the insertion point for a programming pulse. In that case these lines must be left to float so that the drive pulse can be applied at the chip enable input. Otherwise, the chip enable is set so that the outputs of the PROM can be produced.

FIG. 41 is a continuation of the Pin Control circuits. This logic detects whether there are identification fuses between address lines on the PROM. The first three sequence lines SEQOA, 1A and 2A are brought into this circuit and are used to control the four Multiplexers 356, 358, 360 and 362. The outputs of this circuit NADR0 through NADR7 correspond to the eight address line outputs of the PROM. By grounding the appropriate inputs to the Multiplexers and, under control of sequence lines 1 through 3, a ground may be applied to any or all of the address inputs. For a connector test all of the output lines, which are applied to the Pin Driver, are taken to ground, and a ground at the Pin Receiver indicates that good contacts have been made. Alternatively, during the device identify cycle, grounds are established on the address lines one at a time and the next high address line is inspected for ground. For example, pin one is grounded and pin two is inspected for a ground potential. If in fact pin two is grounded, that indicates an identification fuse between pins one and two. This detection takes place in a circuit which is described below. Continuing with the identification fuse sequence, pin 2 is grounded and pin 3 is tested. This procedure is followed until all eight address lines have been inspected for identification fuses. During an identification cycle, if a fuse is detected, this information is sent to the Computer. If one is found, the first programming step will be to blow the identification fuse.

To blow this fuse, a similar procedure is used in that a blow pulse is applied to PROM pin 2 while pin 1 is grounded, thereby blowing the fuse. These seven steps, the interrogation of eight address lines, represents the first seven steps on the Sequence Timer 298, that is, steps 0 through 6. Device 364 is a three-to-eight Decoder to provide the logic signals necessary for the operation of this circuit. Notice that Decoder 364 counts from 0 to 7 twice while the Sequencer itself counts from 0 to 15 once because the most significant bit, SEQ3A is not applied to Decoder 364. Thus, the interrogation sequence, sequence 0 through 6 and the blow indentification fuse sequence, sequence 8 through 14 result in similar operation of this circuit.

Figure 42:
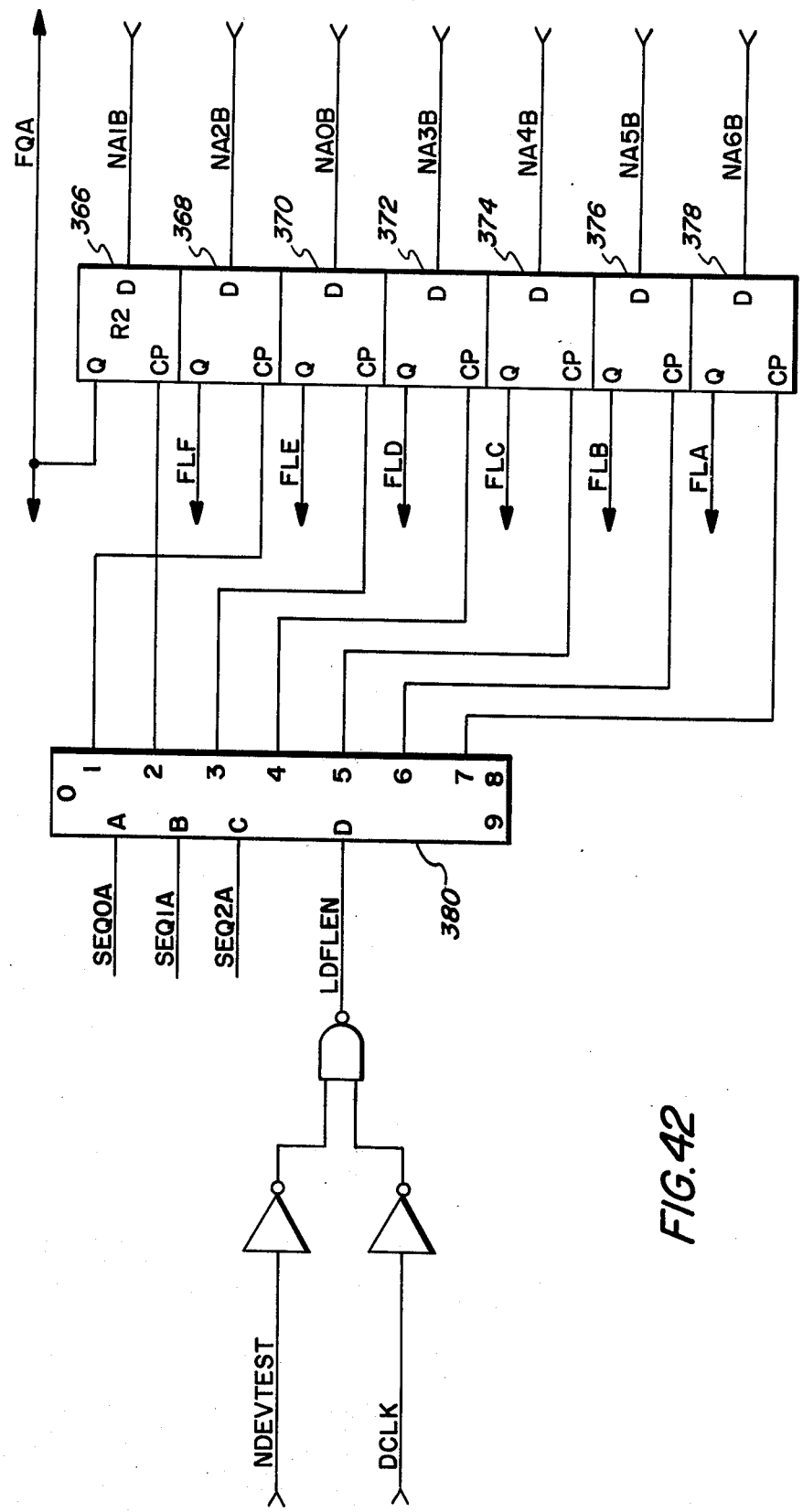
FIGS. 42, 43 and 44 are schematics of the Device Identity Circuit.
Figure 44:
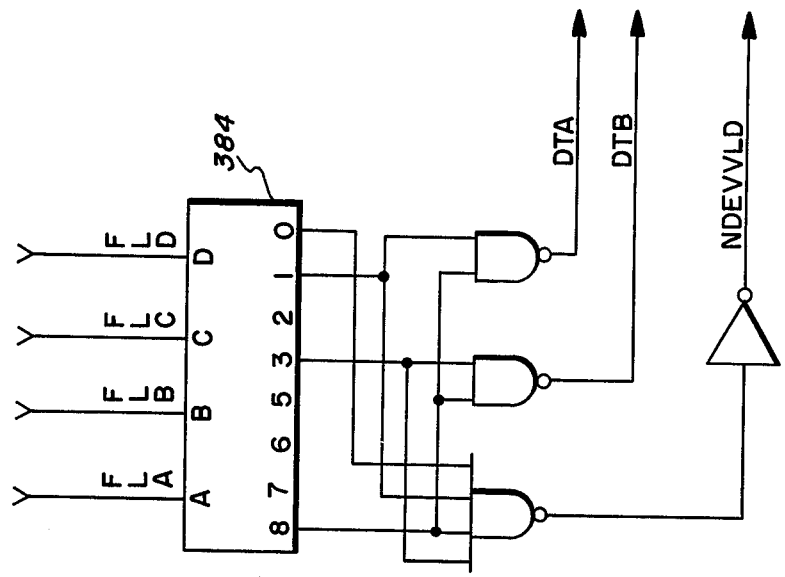
Figure 43:
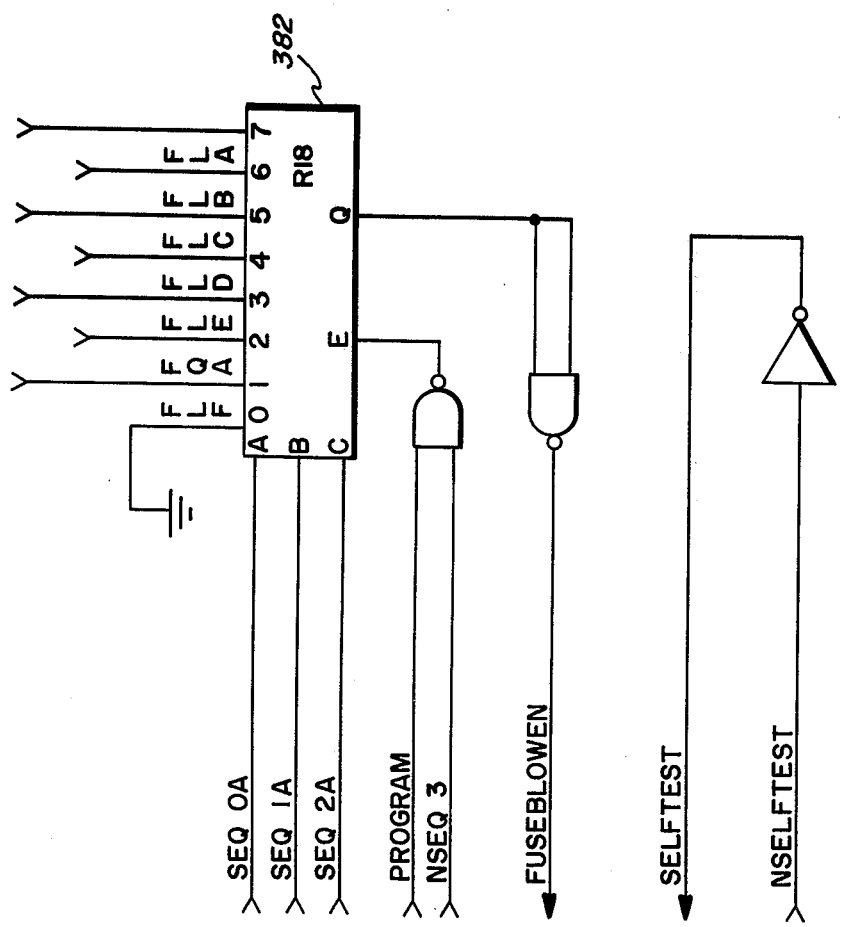

FIGS. 42, 43 and 44 comprise a schematic of the device identity circuit which enables the Programmer to identify the PROM vendor through their possible identifying fuses. As the Pin Control circuit goes through the PROM, address line by address line, interrogating for possible fuses, this information is found, is loaded into one of Latches 366 through 378 in FIG. 42. Here the D clock and the device test signal are used as inputs to a 4 to 10 Decoder 380. The first three sequence lines determine which output will be used and the fuse information is loaded into the appropriate Latch through its clock input. The Pin Receiver output is an output to the Latches so that if there is a fuse the Latch will be clocked at D clock time. The sequencer will initiate a sequence of grounds rippling down through this set of address lines and set each Latch corresponding to each fuse found. When the test is over, the Computer will read out the contents of these Latches to determine whether to blow a fuse or not. For each set Latch there will be one fuse blown. There is also the possibility that a vendor will supply a PROM with a quality assurance fuse to show that it has never been programmed before. This fuse must also be blown and its presence will be signified by a set Latch at the appropriate inputs to the 8-to-1 multiplexer 382 in FIG. 43, which, according to the sequence imput signals, determines which latch output is to be inspected at the moment. The first four latch outputs are sent to the 4-to-10 Decoder 384 in FIG. 44 which uses output logic to determine whether the fuse location was a valid one, and if so, which vendor has been identified. The output of the Multiplexer 382 in FIG. 43 is a fuse blow enable signal. Thus, if a fuse were found the first time through, it will be blown the second time through.

Figure 45:
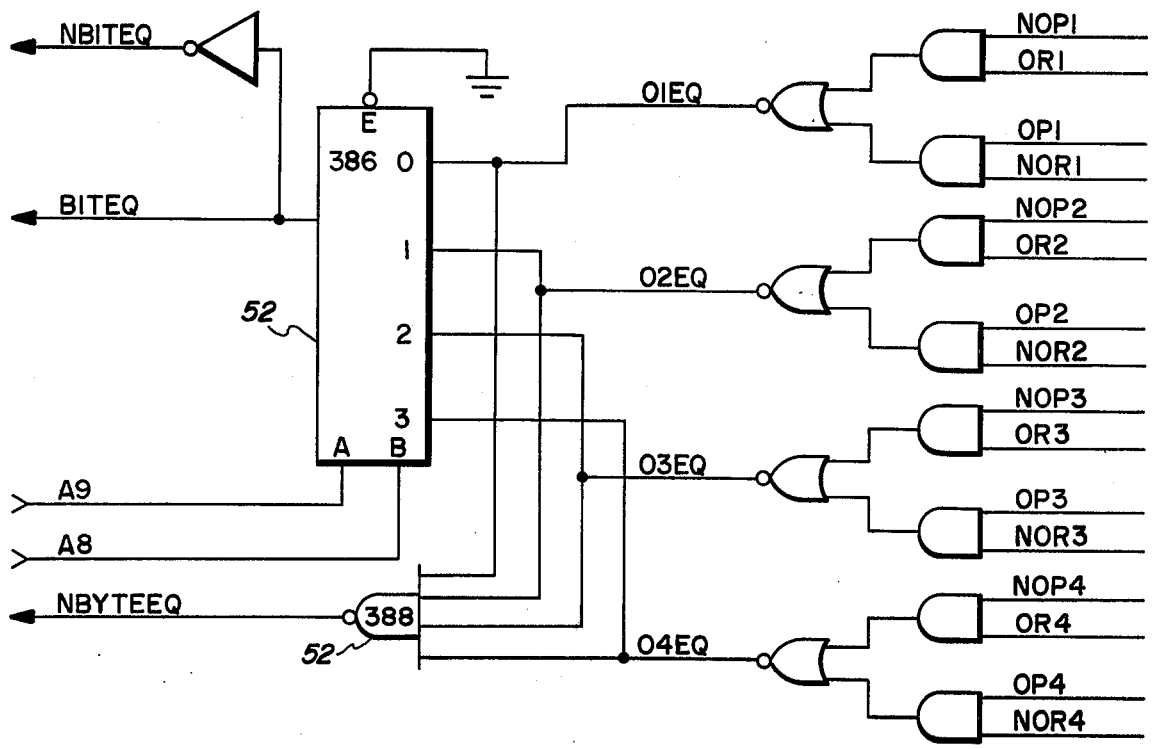
FIG. 45 is a schematic of the Error Detection Circuit.

FIG. 45 is the error detection circuit. The RAM and PROM outputs are compared in this circuit which is wired as an equality gate. Input addressing lines A8 and A9 are used by Multiplexer 386 to interrogate the output bit being programmed at the moment. In the byte mode, Gate 388 looks at all four lines simultaneously to verify the entire output word of the PROM as opposed to Multiplexer 386 which verifies one bit line at a time. The BITEQ output of Multiplexer 386 is used to indicate that the fuse has been blown properly.

Figure 46:
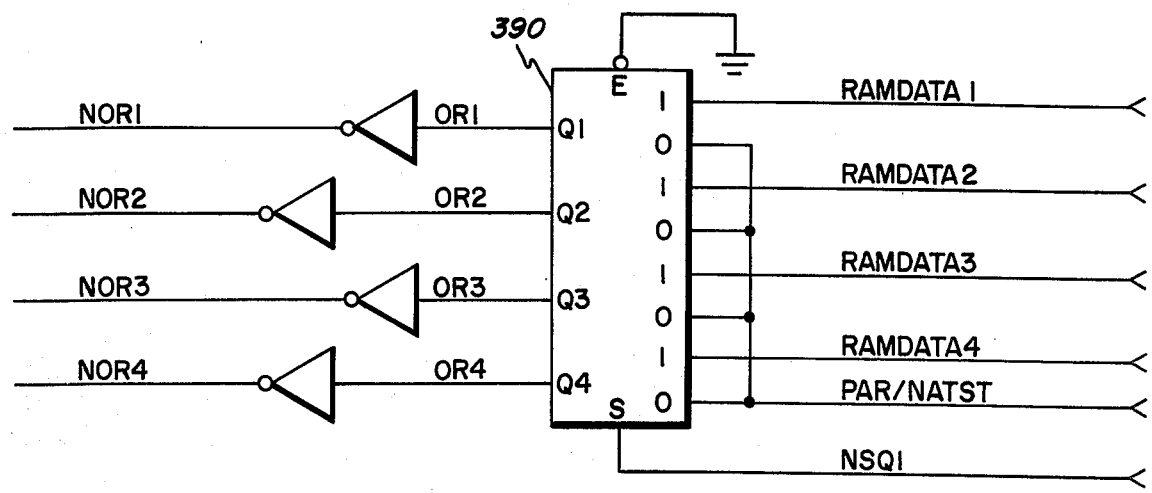
FIG. 46 is a schematic of the Native State Test Circuit.

The circuit in FIG. 46 is used to test the native state of the PROM output. The native state may be either all ones or all zeros. Therefore, the PAR/NATST line coming from the Personality Module will be set either high or low depending on what the native state should be. Alternatively, the input to this quad two input Multiplexer 390 may be the data stored in the RAM which will be the data intended to be programmed. In either case, the output from the Multiplexer is sent to the input of the equality gates shown in FIG. 45. In this case, the NSQI line will determine whether the Sequencer 298 of FIG. 32 is in the native state portion of its cycle or in the programming portion of its cycle and select an input accordingly.

Figure 47:
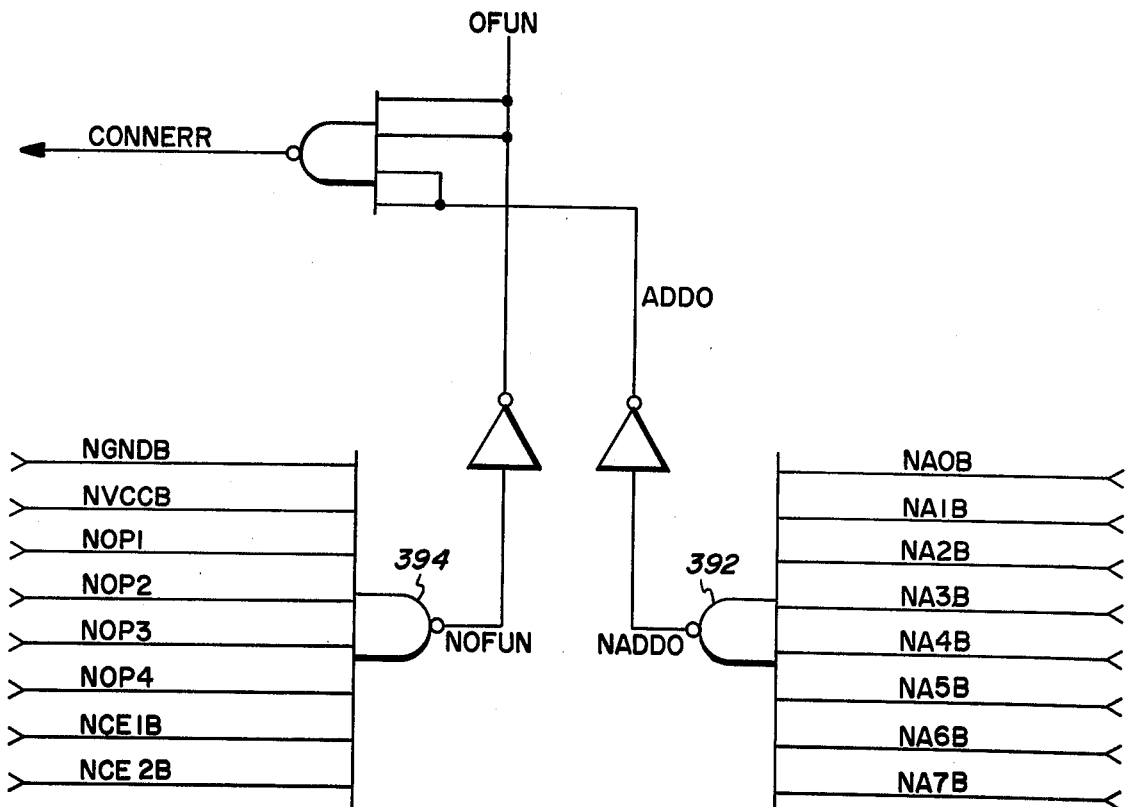
FIG. 47 is a schematic of the Connector Test Circuit.

The two eight input nand Gates 392 and 394 in FIG. 47 are used for the connector test. In that test all of the pin driver outputs are grounded and applied to one set of connectors. The other set of connectors, if all connectors are making contact, should also be at ground. This is tested at the eight input Gates 392 and 394 where, if any one is not grounded an error will be indicated.

Figure 48:
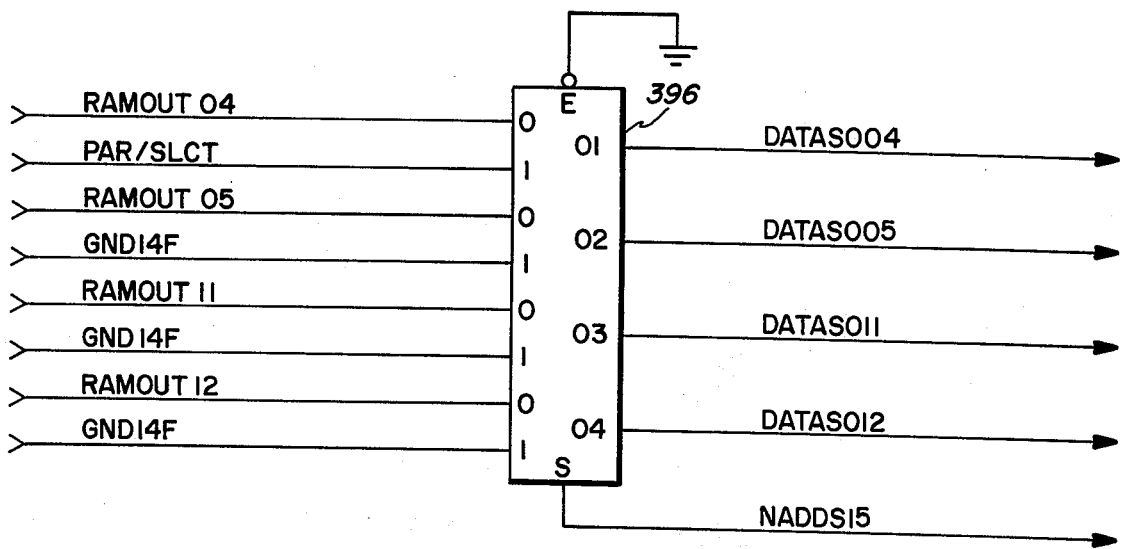
FIG. 48 is a schematic of the Data Output Multiplexers.
Figure 49:
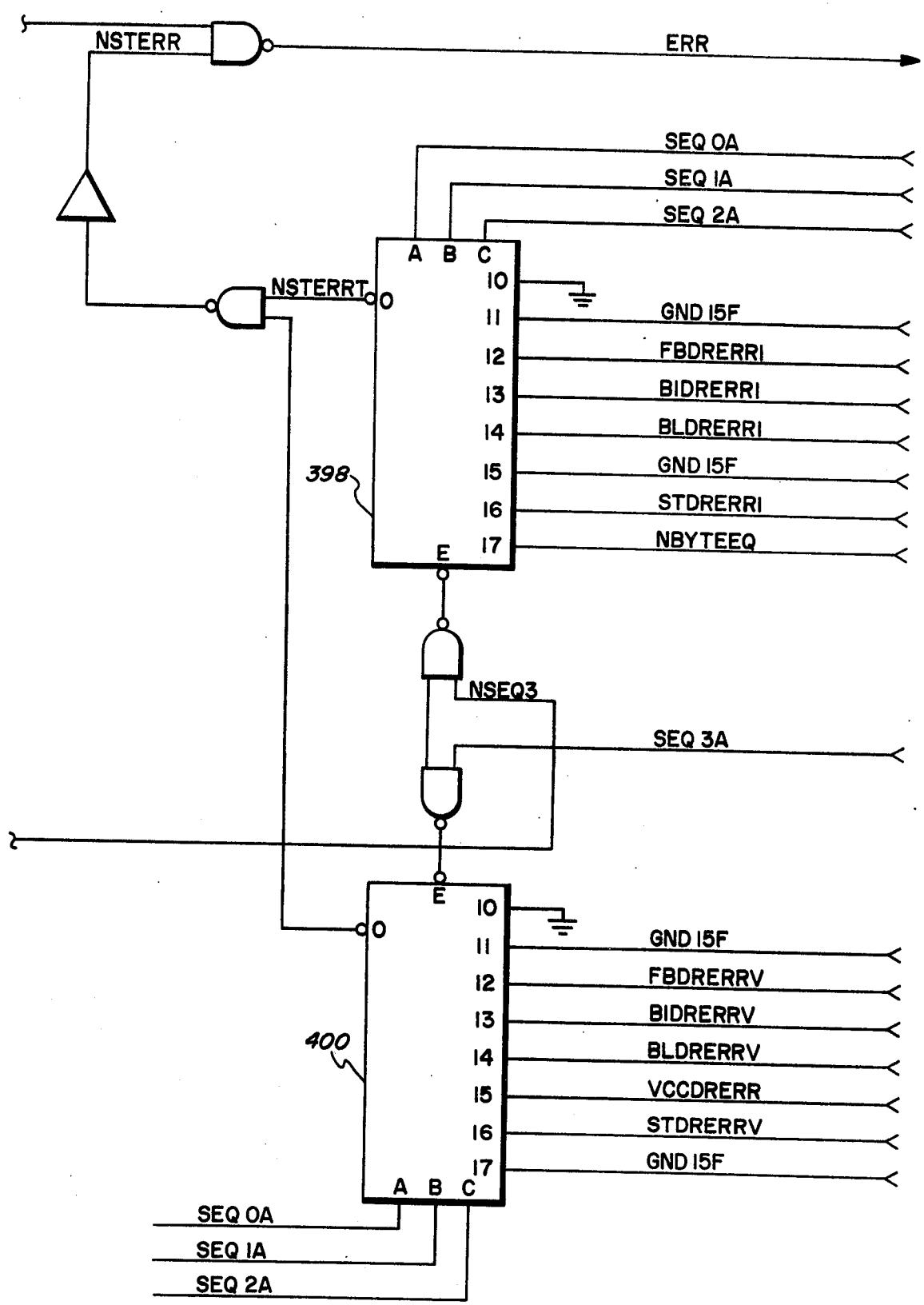
FIG. 49 is a schematic of the Error Decoder Module.

FIG. 48 is a schematic of one of four Multiplexers 396 which determine what kind of data will be sent to the Computer during a read direct instruction. There are two kinds of read direct instructions having an address of either zero or one corresponding to the signal on the NADDS15 line, which is used to select the inputs to this quad 2-to-1 Multiplexer 396. This Multiplexer will select either the RAM output or various logic signals to be output to the Computer.

FIG. W is the Error Decode Module schematic which shows how the self tests are monitored. During a self test the sequence monitor Multiplexers 398 and 400 are cycled through each step where the first eight positions represent tests of the driver voltages and the second eight positions represent tests of the driver current capability. If any of the voltage or current levels is out of tolerance an error signal will be generated, terminating the self test program.

Figure 50:
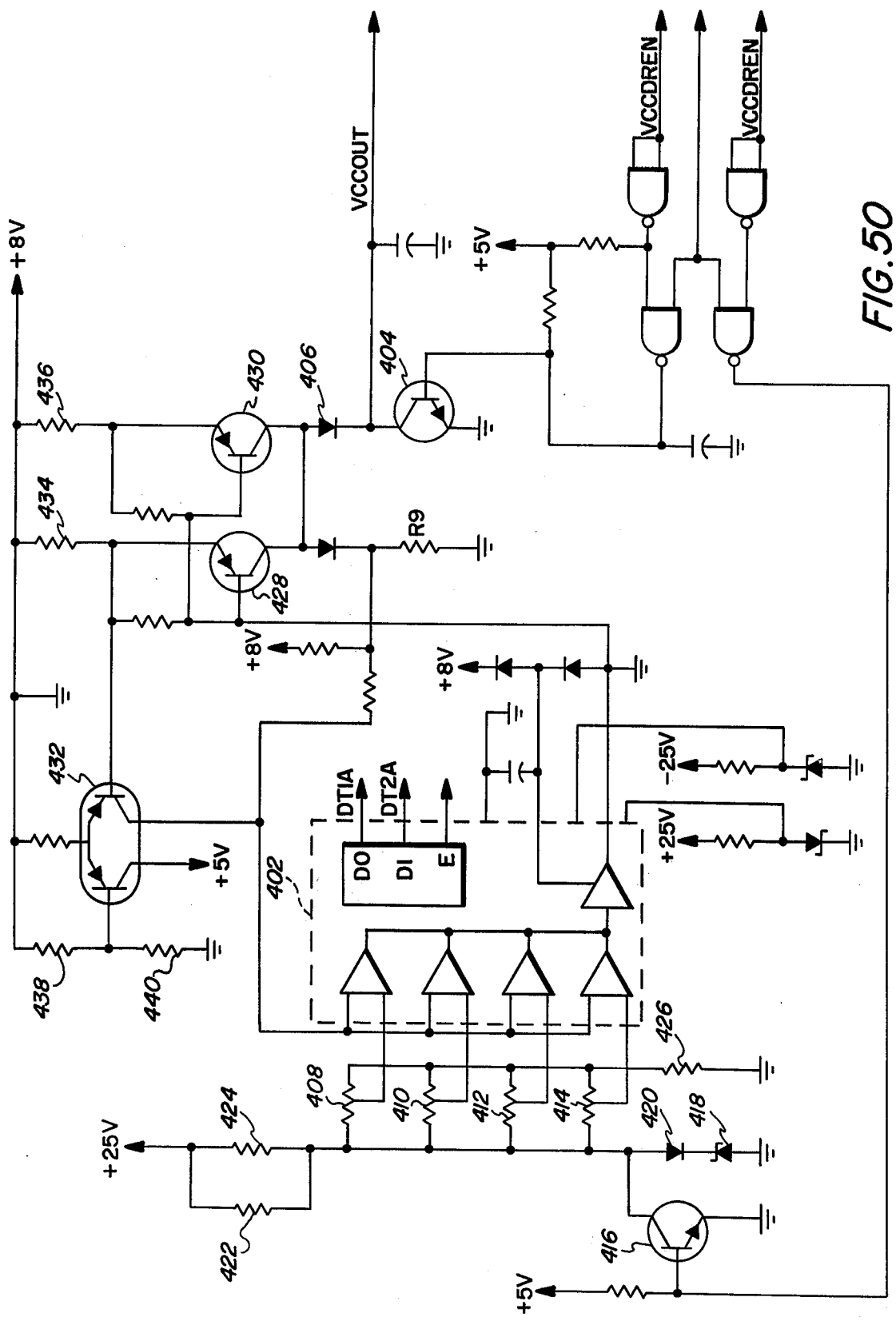
FIG. 50 is a schematic of the Device Input Power Circuit.

FIG. 50 is a schematic of the circuit that supplies input power to the device under test. Programmable Operational Amplifier 402 receives two input lines DT1A and DT2A to determine which of four preamplifiers will be used in conjunction with the Operational Amplifier output section to constitute a complete Operational Amplifier circuit which will regulate the voltage output from the junction between Transistor 404 and Diode 406. The DT1A and DT2A control lines originate in device flip-flops and identify which of a maximum of four different types of PROMs are being tested. Each input preamplifier is programmed by a variable Resistor 408 through 414 corresponding to an output voltage. When the VCCDREN voltage output enable line is pulled to ground, this power supply is enabled. The Test Station Control Electronics is the source of this driver enable signal. When the enable signal goes to ground, Transistor 416 is turned off which allows a precision voltage source comprising Zener Diode 418, a Diode 420 and Resistors 422 and 424 along with variable resistors 408 through 414 and Resistor 426 to provide a unique input voltage for each of the four Operational Amplifier 402 preamplifiers. The selected input preamplifier in conjunction with the output amplifier controls a current Driver 428 and 430 and receives its feedback through a differential Transistor Pair 432 to the other input of each preamplifier. The result is that the output voltage at the collector of Transistors 428 and 430 will be held to a constant value dependent upon the selected variable Resistors 408 through 414. However, if a predetermined current limit is exceeded, the output voltage will drop to limit the current accordingly. This effect is produced by differential Transistor Pair 432 since if the current through Transistors 428 through 430 exceed a predetermined value the voltage at the bottom of Resistors 434 and 436 will become more negative than the voltage at the junction of Resistors 438 and 440, resulting in a feedback to the Op Amp 402 preamplifier inputs to limit the voltage output. When the VCCDREN enable logic line goes high, the output of this circuit is grounded through Transistors 404 and Transistor 416 clamps off the Operational Amplifier 402 so that the output of this circuit will return to ground. An identical Power Supply is used in the test station.

Figure 51:
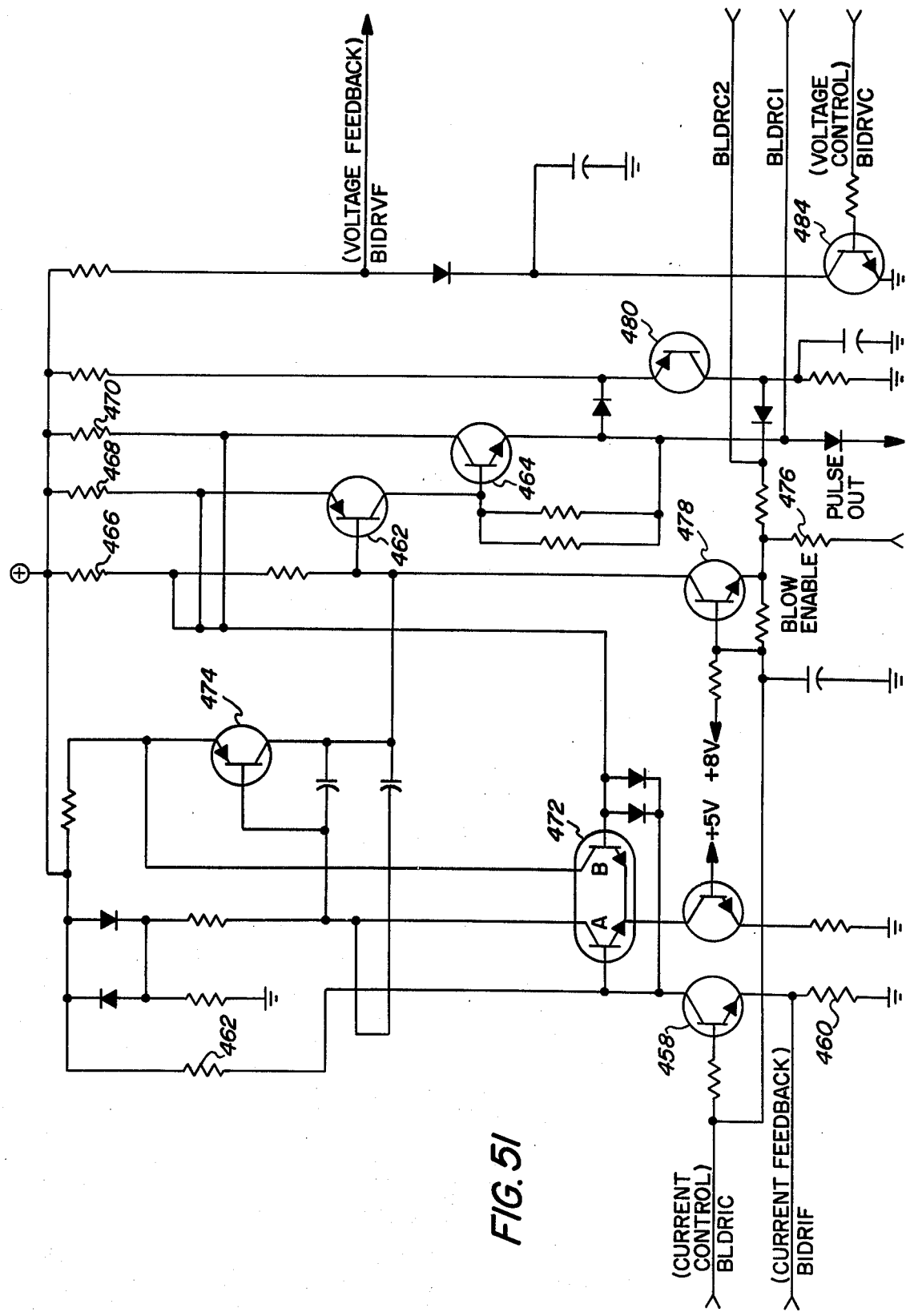
FIG. 51 is a schematic of the Blow Pulse Driver.

FIG. 51 is the Blow Pulse Driver schematic and FIG. 52 is a schematic of the electronics that controls this Driver. This circuit uses two programmable Operational Amplifiers 438 and 440, each connected to a set of four variable Resistors 442 through 456 which are connected to a nine volt power supply. This voltage is produced by a zener diode, not shown. The zener diode is temperature calibrated and provides an accurate 9 volts. Two Operational Amplifiers are needed to control one Blow Pulse driver since both the current and the voltage of this Blow Pulse Driver are regulated. Up to a predetermined level, the Blow Pulse Driver will act as a constant current source. However, if the voltage, called the compliance voltage, exceeds a predetermined value, then control of the Blow Pulse Driver will shift to the other control Operational Amplifier 440 and the Blow Pulse Driver from that point on will act in a voltage regulated mode. As in the Power Supply discussed previously, the device identifier lines DT1A and DT1B determine which of the four preamplifiers will be used in each of the Operational Amplifiers 438 and 440.

When the Blow Pulse Driver is acting in a current limited mode, the output of Op Amp 438 will be connected to the current control input B1DRIF which is in turn connected to the base of Transistor 458 of FIG. 51. The feedback for this amplifier comes from the emitter of Transistor 458 and the voltage developed across Resistor 460 is fed to the other of the two inputs of each preamplifier. This controls the voltage across Resistor 460 which therefore controls the current through Transistor 458. In the collector circuit of Transistor 458 is another Resistor 462 with a resistance exactly twice that of Resistor 460, therefore the voltage drop across Resistor 462 is likewise a function of the current of Transistor 458. At the same time output Transistors 462 and 464, which develop the current at the pulse output, receive current through Resistor 466, 468 and 470, the voltage across these resistors also being proportional to the voltage through them. The output current and the control current can thereby be compared at Differential Amplifier Transistor 472. A pulse output current that is either too high or too low will be reflected through Transistor 472 and through Transistor 474 back to the Current Drivers 462 and 464 thus regulating the current through Transistors 462 and 464 to the current dictated by the current through Transistor 458. A blow enable line coming into this circuit at the bottom of Resistor 476 controls Transistor 478 and will enable the circuit to operate in the manner discussed above provided that a blow pulse enable signal is received. Otherwise, Transistors 462 and 464 will be shut off by Transistor 478 thus disabling the Blow Pulse Driver. This blow pulse enable line is ANDed with the blow pulse timing signal so that if the blow pulse enabling signal is high, the output of the Blow Pulse Driver will be controlled and therefore timed by the blow pulse timing circuits.

If the impedance encountered at the pulse output pin is too high, the compliance voltage may be exceeded. The output voltage is regulated by Transistors 480 and 482 in conjunction with Op Amp 440 in FIG. 53. The output of the Operational Amplifier 440 drives Transistor 484 and feedback to the Operational Amplifier 440 is taken from the collector circuit Transistor 484.

Figure 53:
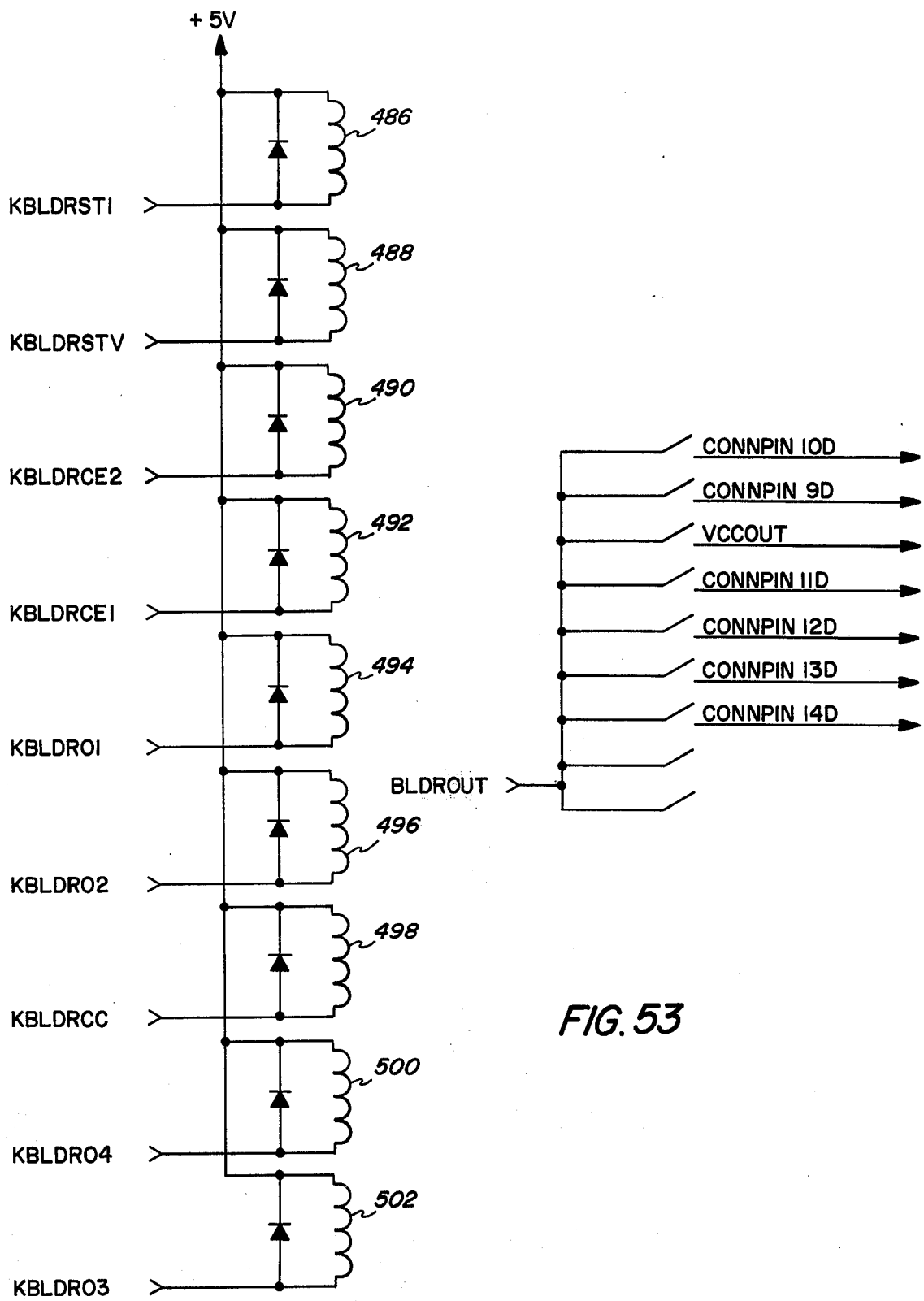
FIG. 53 is a schematic of the Pulse Voltage Regulator.

FIG. 53 contains the Relays 486 through 502 that control the destination of the drive pulses. All drivers are controlled by an associated Steering Relay Drive Module. Under control of that module, one of nine Relays may be selected, steering the pulse driver output to the proper pin and blowing the appropriate fuse on the PROM. Drive pulses may be applied to the PROM at its output pins 9, 10, 11 and 12, at the VCC input pin or at the two chip enable pins. The remaining two Relay switches are used in conjunction with the self test circuits which will not be described. Thus, the pulse will come in to FIG. 53 at the BLDROUT line and will be applied to the PROM at one of the seven outputs shown.

Figure 54:
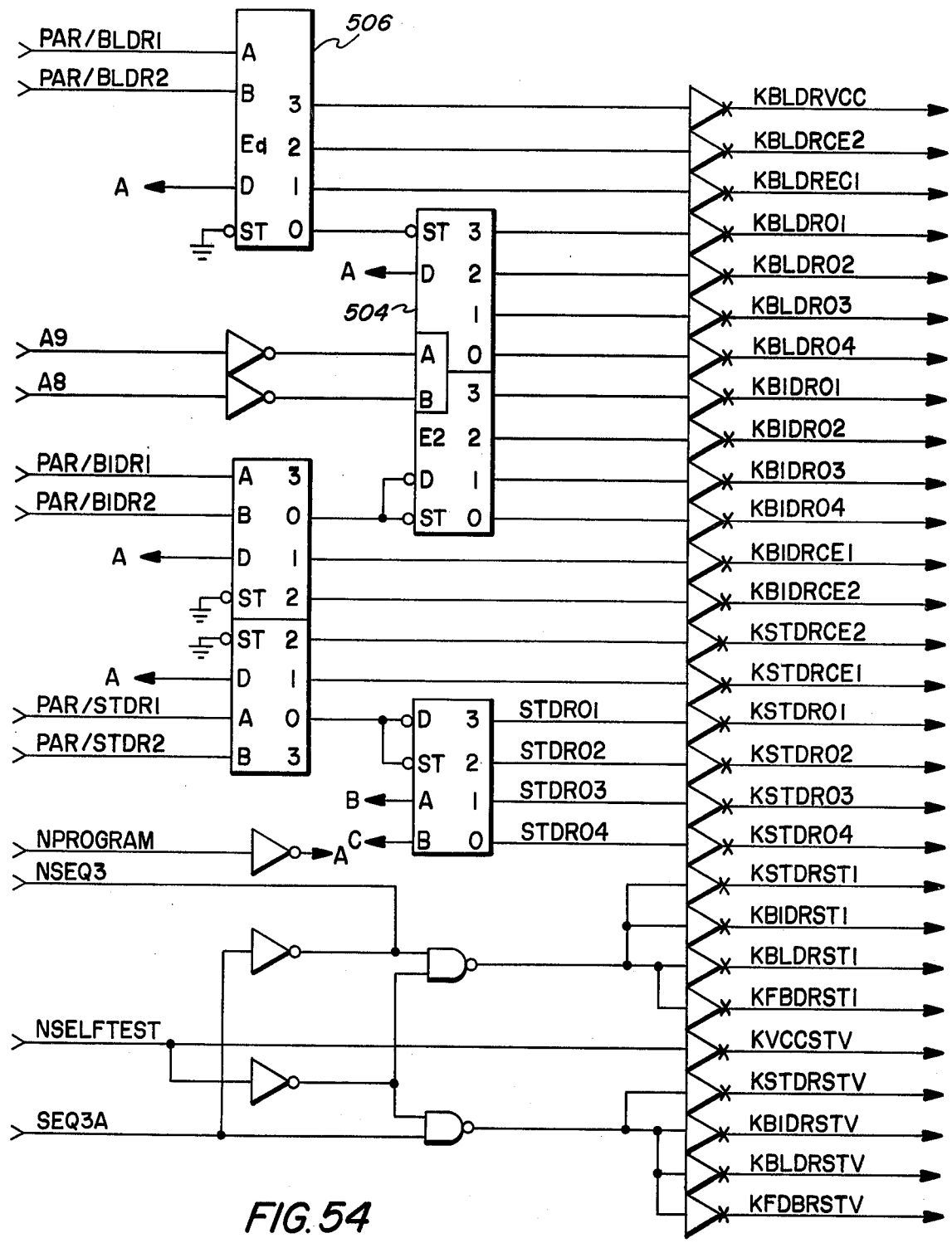
FIG. 54 is a schematic of the Steering Relay Drive Module.

FIG. 54 is a schematic of the Steering Relay Drive Module which is the logic used to generate the Relay steering logic applied to the relays in FIG. 53. The A and B inputs to the dual 2-to-4 Decoder 504 are the two device output addressing lines. The A and B inputs to Decoder 506 are control lines from the Personality Module. If the test at the moment requires that a blow pulse be applied to the VCC input of the PROM or to one of the two chip enable lines, this information will be brought in to Decoder 506 through the two Personality Module control lines, an output from Decoder 506 will be selected accordingly, and an output on one of the top three lines will be sent to the Relay Module. If, however, both personality control lines are low, then Decoder 504 will be enabled allowing the output of the top half of Decoder 504 to supply a pulse signal to one of the four PROM output lines. One of the seven Module output blow lines will be pulled to ground if the enable line tied to the D input of Decoder 506 is true. This input line comes from the progammer so that if the system is in the programming mode, one of these output lines will be enabled. The other sections of this schematic work similarly except that the pulse outputs are used to drive self test pulse generators. This completes the discussion of the programmer station electronics.

Figure 55A:
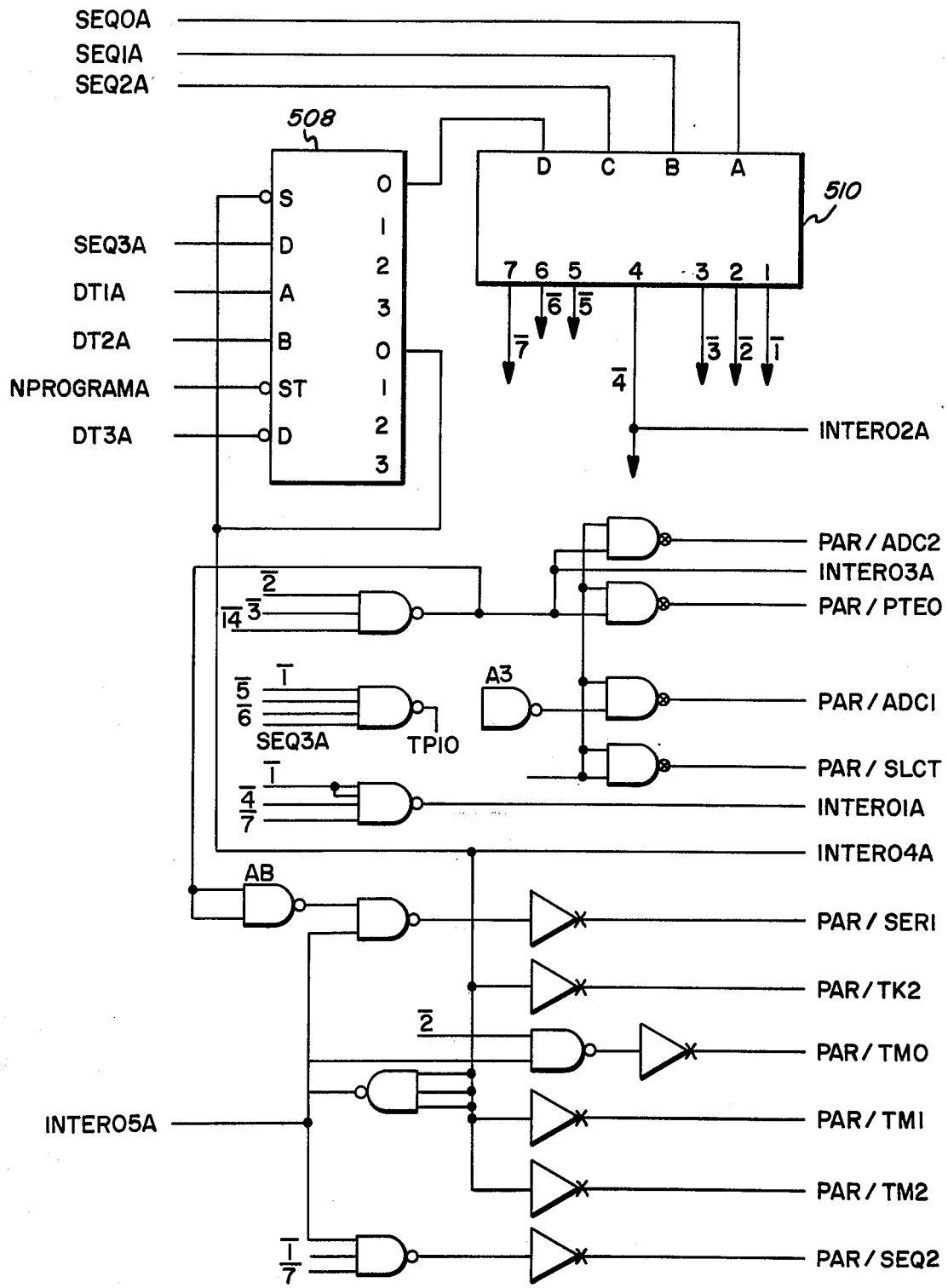
FIGS. 55A and 55B are a schematic of the Personality Module.
Figure 55B:
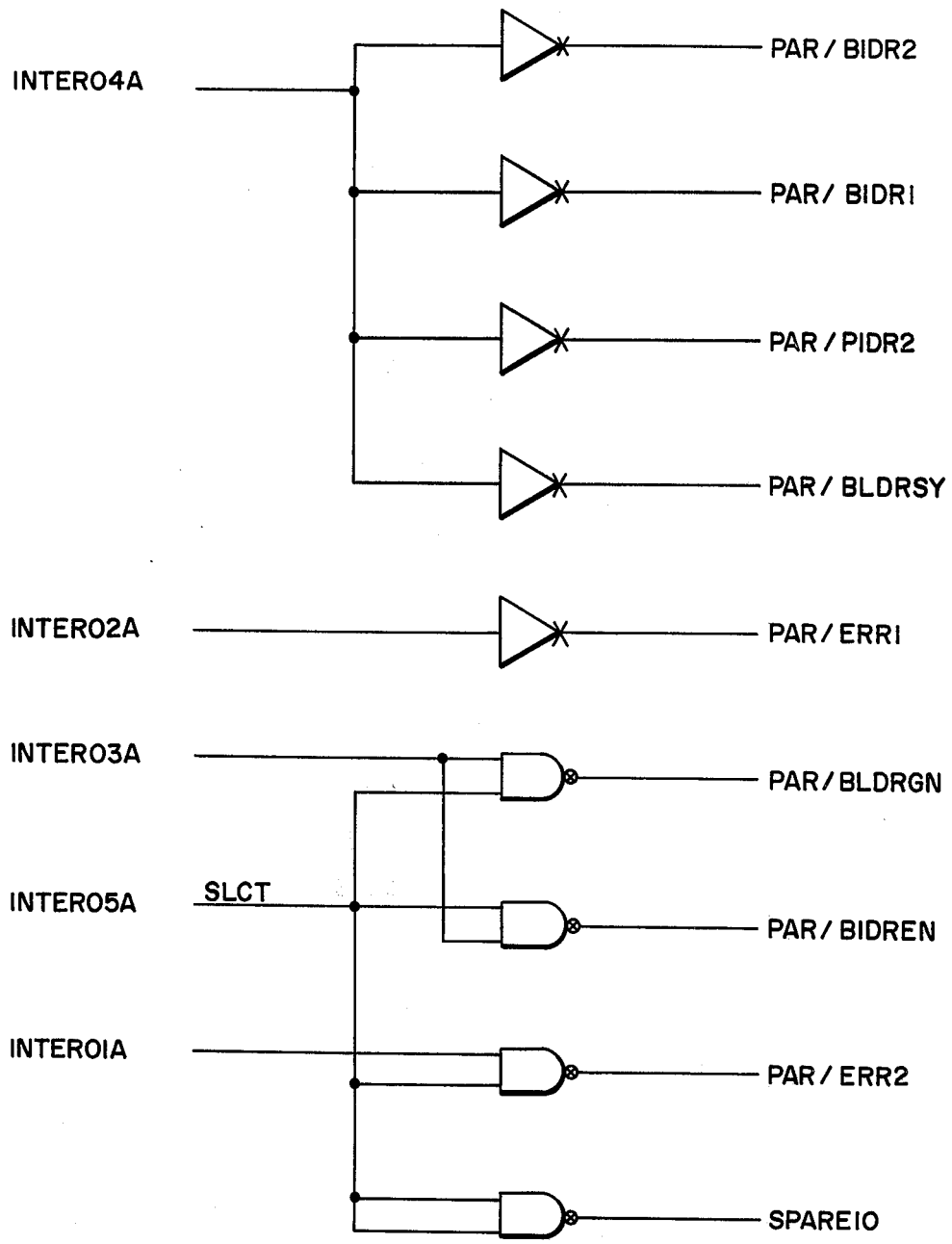

FIG. 55 comprises a schematic of the Personality Module corresponding to the Harris PROM Model NO. TN465. The inputs to this Module are four sequence lines, three device type lines and a programming command line. The Personality Module receives the device information on lines DT1A, 2A and 3A from the Computer while receiving the sequence information SEQOA through SEQ3A from the Sequence Timer 298 described above. If the Computer initiates a program signal and device lines DT1A and DT2A are low, signifying a Harris 465 device, then the lower 0 output line will be pulled to ground enabling some logic in the lower half of the schematic and also enabling the upper half of Decoder 508. Furthermore, the SEQ3A line is high, signifying that the Sequence Timer 298 is in its programming mode of operation, then Decoder 510 will be enabled. Decoder 510 is a 3-to-8 decoder which decodes the sequence lines and sends its logical outputs to the remainder of the circuitry on the Personality Module, thus determining eventually which operations will be performed for each sequence stage. Through the use of this logic the various Personality module output lines are pulled to ground, the function of each of which has been described with the circuit where it is used.

FIG. 56 is a logical description of the Harris Personality Module in matrix form. This matrix is the analog of the schematics shown in FIG. 55, and shows which control lines are grounded in relationship to the various sequence steps.

There is one set of test station electronics which is timed shared between the two temperature chambers. The tests performed in the test chambers are dynamic as compared to the test in the programmer which is a static verify test. Therefore, while generous settling times were allowed in the Programmer before the contents of a particular PROM memory word were read out; in the test chamber, through the use of a high Performance Board and its associated circuitry, the exact amount of access time specified by the vendor will be used as the pass/fail criterion. Furthermore, a "galloping read" test will be used which measures the access time of any PROM cell preceeded by the access of any other cell. The circuits for accomplishing this testing are described below.

Figure 57:
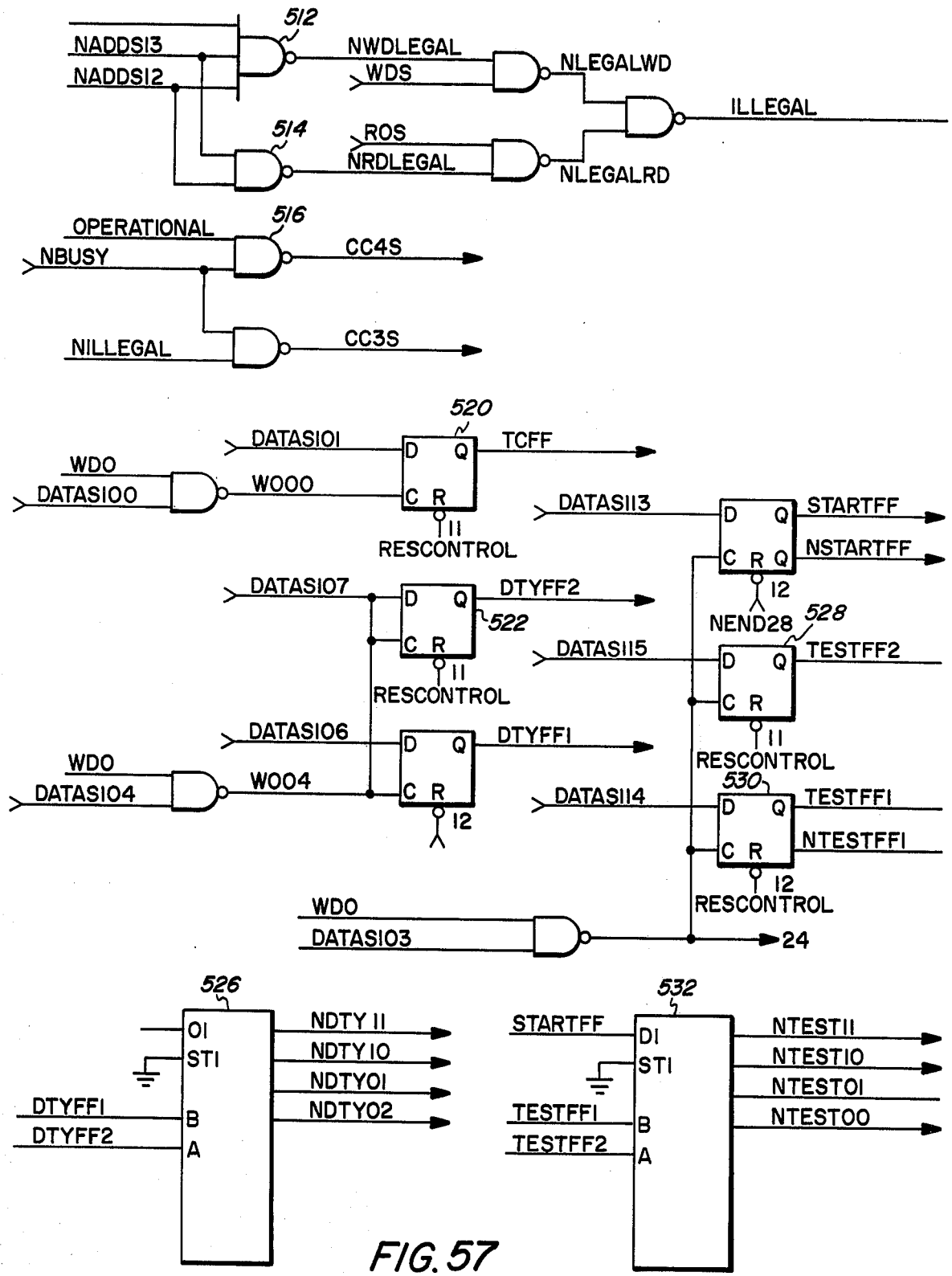
FIG. 57 is a schematic of the Test Control Module.

FIG. 57 is a schematic of the Test Control Module which transfers information between the System Interface Bus and the Test Station Electronics. Gates 512 and 514 test the 12th and 13th bits of the address for zero and generate an illegal command signal for the Test Station if this condition is not met. Gates 516 and 518 receive an operational signal from the Test Station signifying that the equipment is operational, a busy signal and an illegal command signal and from these generates the condition codes which are sent back to the Computer. Flip-Flop 520 receives data information from the Computer specifying which of the two test chambers is being used and developes an enabling signal, TCFF, in either case. A differentiation between the two stations is handled elsewhere. The outputs of Flip-Flops 522 and 524, DTYFF1 and 2, are device identifier bits decoded from the data word received from the Computer. These two data lines are then decoded in Decoder 526 to one of four output lines NDTYO, 1, 10 or 11. Likewise, test information received on data lines 14 and 15 are clocked through Flip-Flops 528 and 530 and are used in Decoder 532 to specify one of three tests which may be a connector test, a self test or a device test. This device information is enabled by the start test signal at the enabling input of Decoder 530.

Figure 58A:
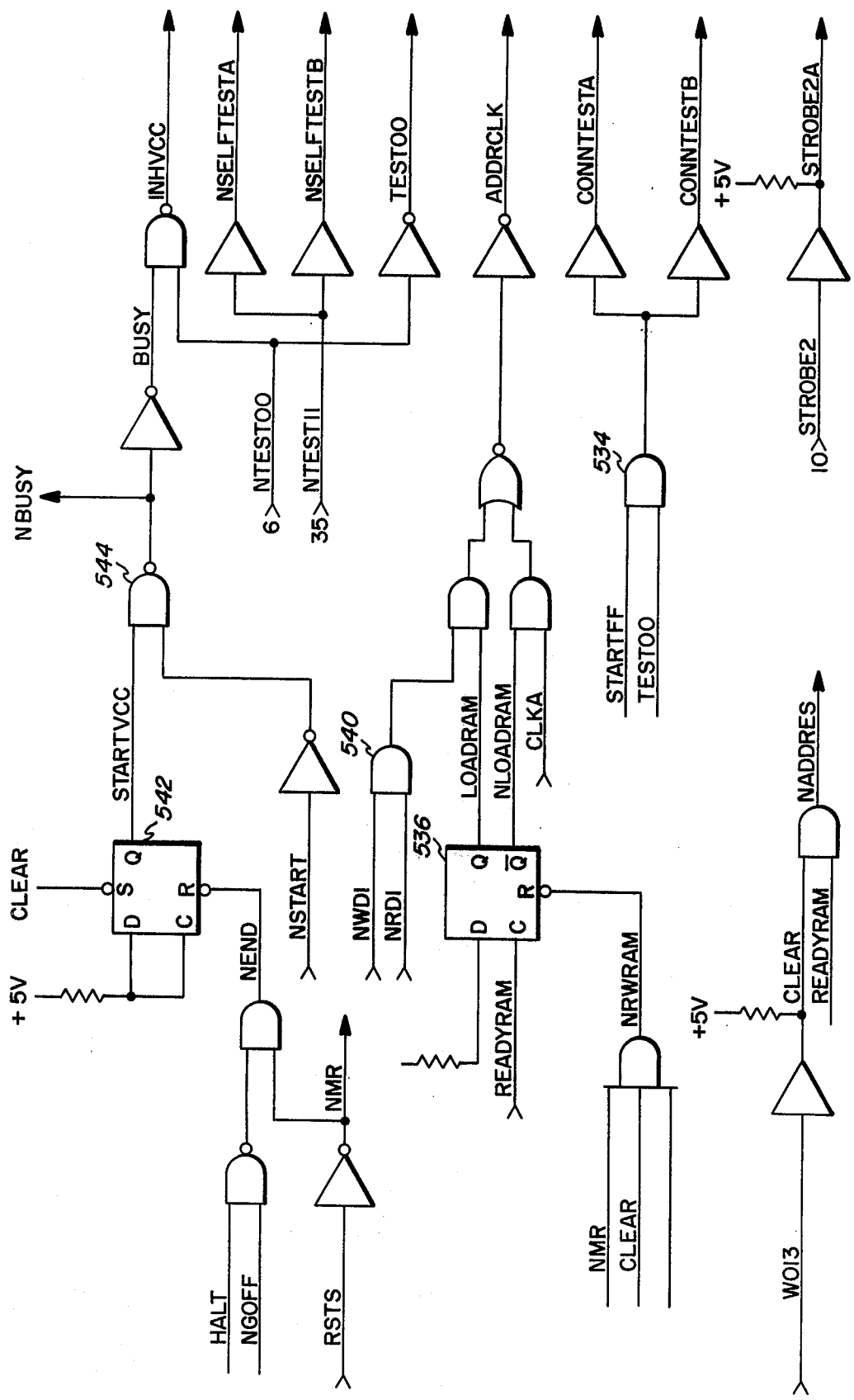
FIGS. 58A and 58B are a schematic of the Test Station Control Logic.
Figure 58B:
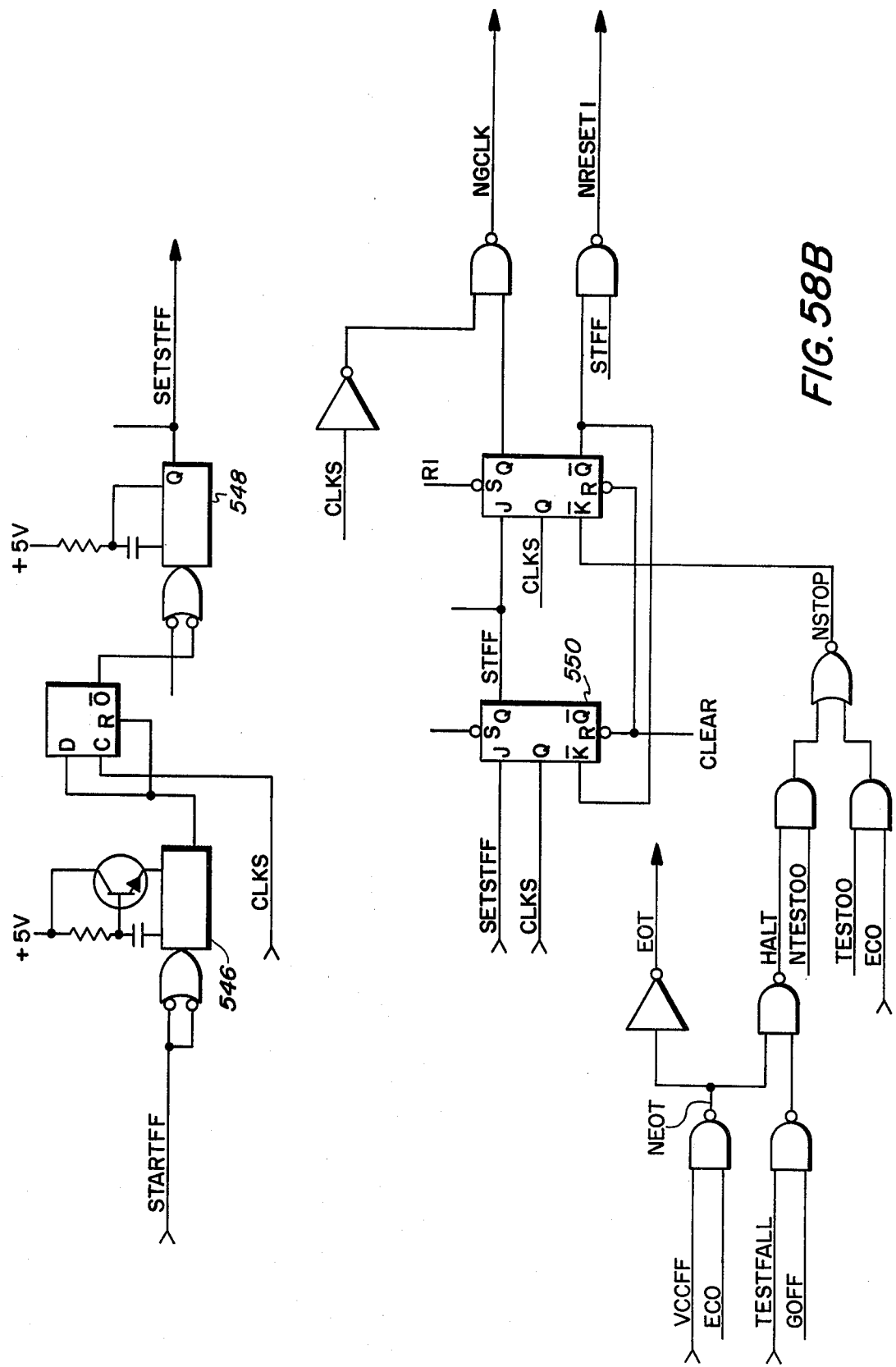

FIG. 58 is a continuation of the test station control logic. Gate 534 receives the start test command and immediately generates a connector test signal. This connector test is performed at the Performance Board and is the first action to be taken by the Test Station. In this test, one set of connectors is grounded and ground is tested for at the other end of at the other set of connectors to ensure electrical connection to all device leads. Upon successful completion of the connector test, the Test Station will load the test RAM. When the RAM is ready to be loaded the write direct command at the input to the Flip-Flop 526 will be used as a clock pulse for the RAM and is produced at the output of Gate 538 on the ADDRCLK line. After loading, the read direct command will be used at the input of Gate 540 to generate the clock during RAM content verification. If the loading of the RAM is successfully completed, then the logic associated with Flip-Flop 542 and Gate 544 will generate a station busy signal and will simultaneously turn on the VCC to the device by a signal through enabling line INHVCC. The VCC power to the PROM is not turned on until the test is ready to start since the internal heat dissipated by the power being applied too soon before the test would result in a PROM temperature higher than that specified by the vendor. In fact, the VCC is applied to the PROM exactly half a second before the test is to begin. This half second delay circuit is implemented from one Shot Multivibrators 546 and 548, the first generating the half second delay time and the second generating a start test pulse. The SETSTFF input to Flip-Flop 550 is received at the start of the test sequence and is used to reset all of the error circuits prior to testing.

The timing of the PROM is tested in what is called a galloping read test where the access time for every location is measured a specified number of nanoseconds after a previous access from any other location. Hence, two counters are needed, one to count through all possible prior access addresses and one counter to count through all subsequent access addresses. These address counters are shown as Counters 552 through 558 of FIG. 59 and constitute a sixteen bit counter separated into a left half, the outputs of which are prefixed by the letter S, and the right half, the outputs of which are prefixed by the letter H. By allowing the entire counting arrangement to count from 0 to a full count of 16 bits, the complete addressing scheme will be exercised. In a comparison between a PROM output and a RAM output, it is necessary to let the RAM output settle completely before comparing it with the PROM output which is tested at a time of between 40 to 100nanoseconds after its access. To generate this delay, one Shot Multivibrator 560 through 566 are used where 560 and 564 are set up to provide the window width. It is during this window that the actual comparison between RAM and PROM outputs will take place. These stroke signals are also used to strobe the S address information into Latches 568 through 582. This is necessary since the S address information from the Counters change at a rapid rate and, because of the time required to generate error signals, the information would be lost if it were not temporarily held in temporary storage Latches. Multiplexers 592 through 598 of FIG. 60 are used to determine which set of eight address bits will be applied to the PROM and which set will be used to address the RAM. Similarly, the other set of multiplexers 584 through 590 are used to decide whether the output from the PROM or RAM will be read out of the Test Station and into the Computer for comparision tests.

Figure 59B:
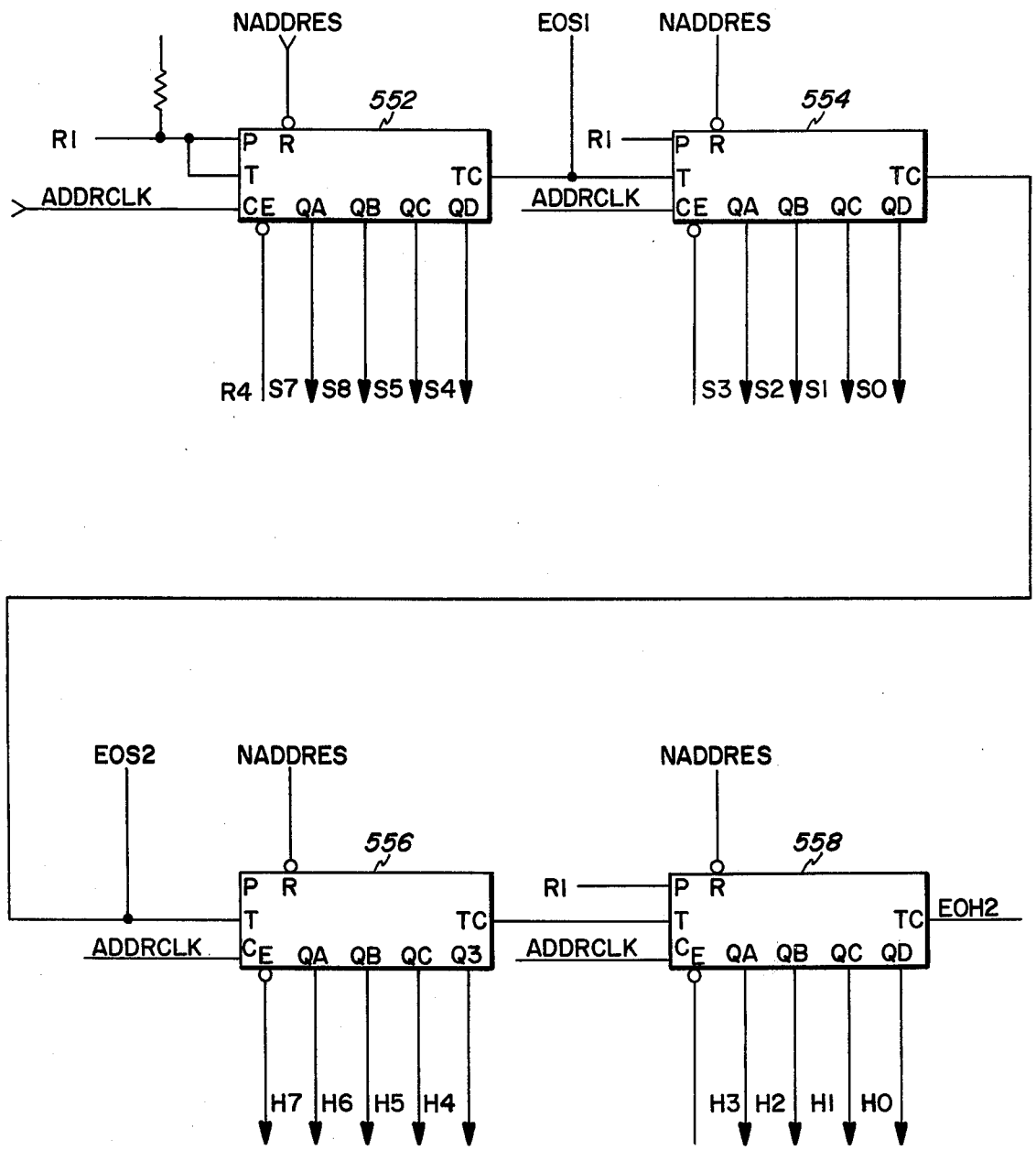
Figure 60A:
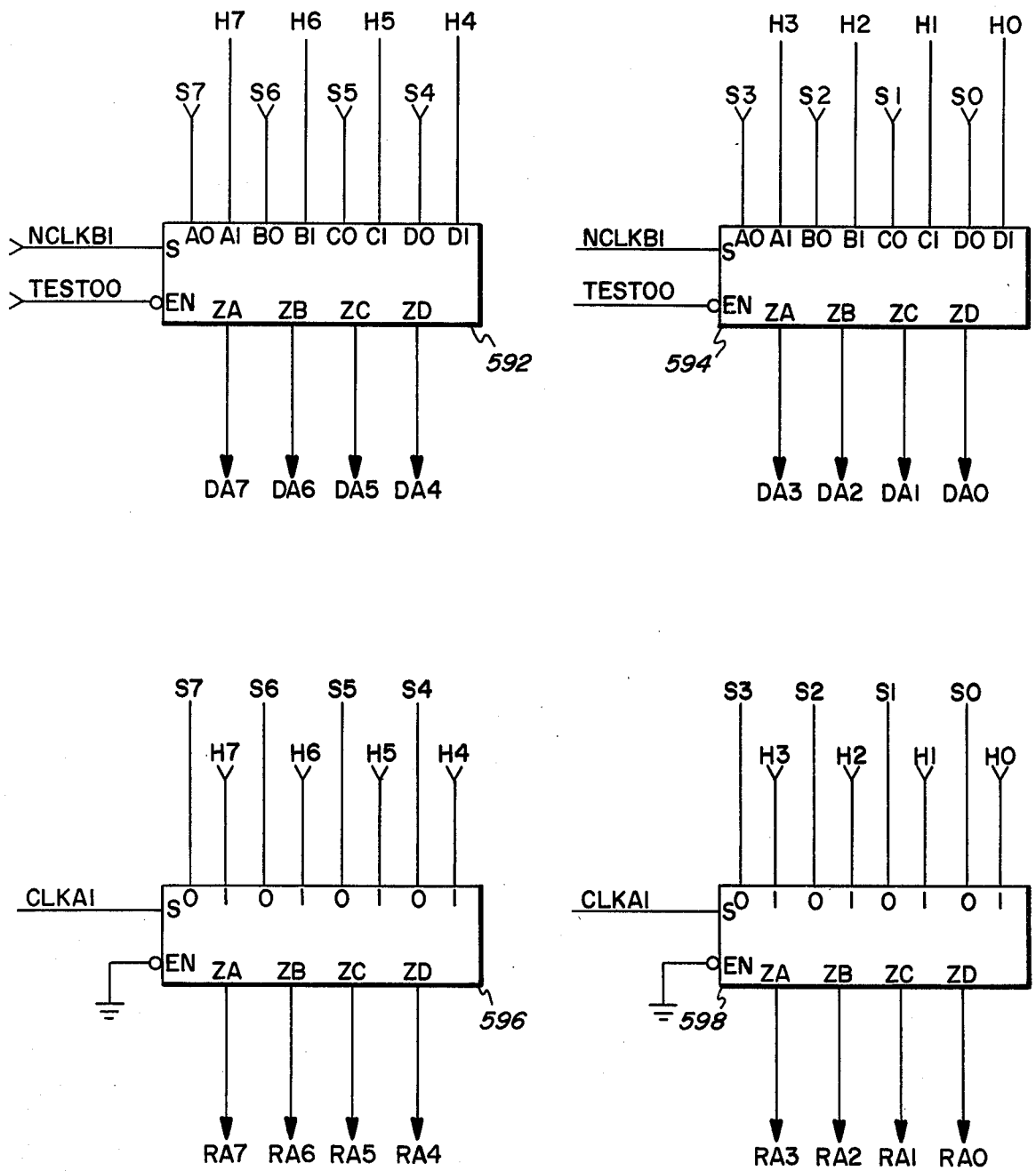
FIGS. 60A and 60B are a schematic of the Addressing Multiplexers.
Figure 60B:
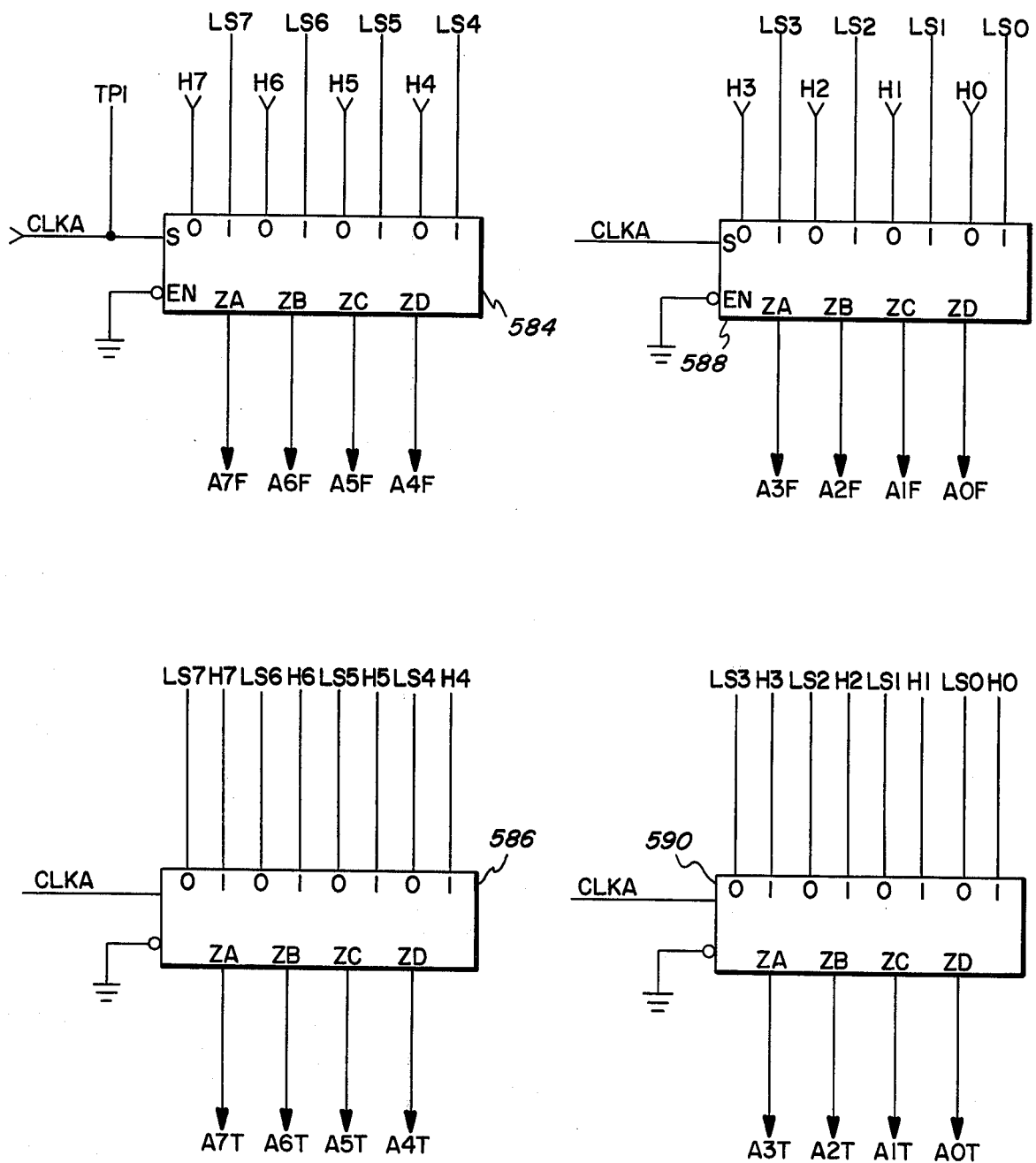

A set of eight flip-flops similar to those shown in FIG. 59 are used to store the data in the RAM of the test just executed. This is necessary since as described above, the data in the RAM must be preloaded into the RAM to allow for complete settling before the test. Therefore, immediately after the test, a new RAM output word is loaded and if an error has occured, the previous RAM data will be lost. These Latches 59 are used to store this data in case a Computer readout is required subsequent to the detection of an error.

Figure 61A:
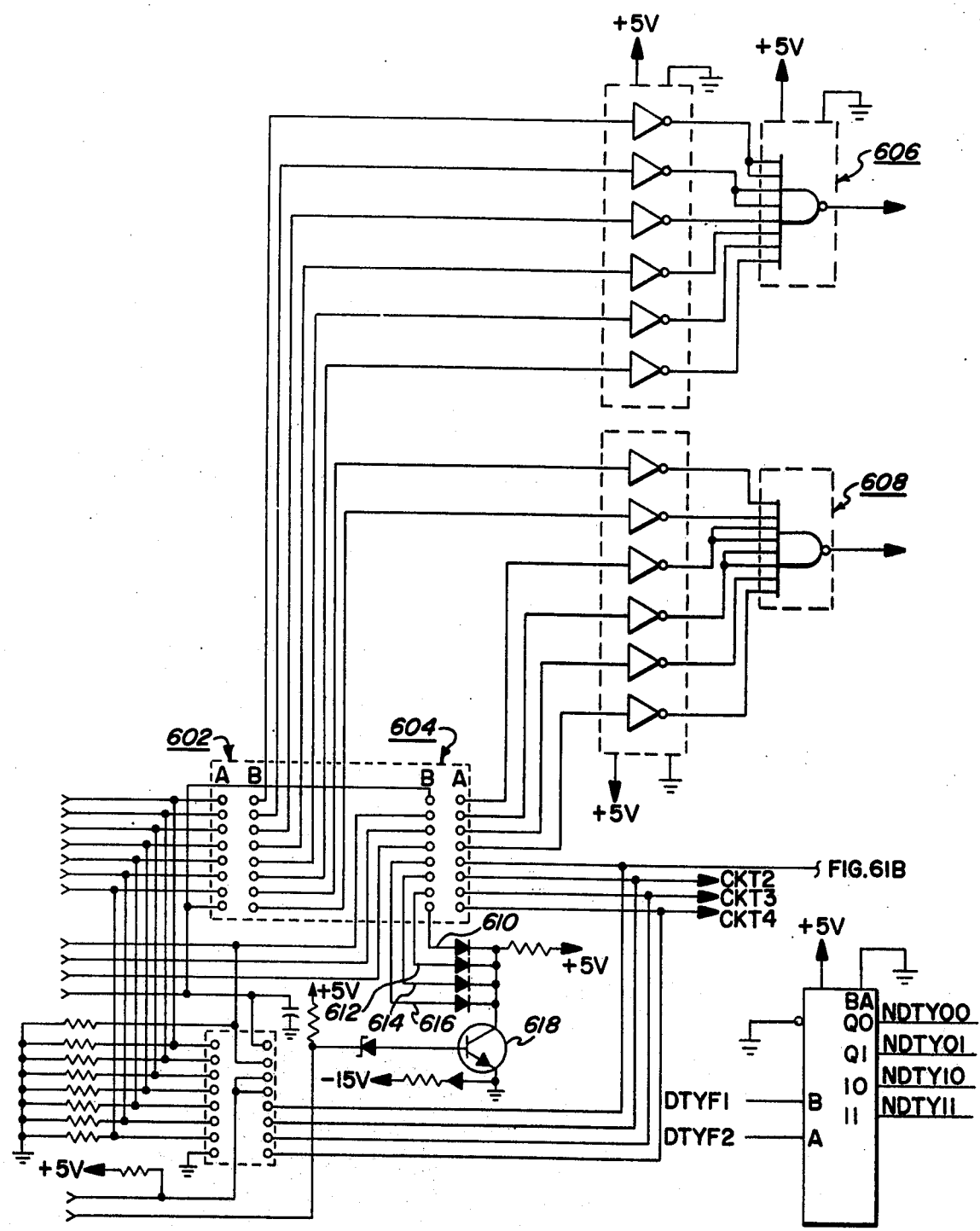
Figure 6I:
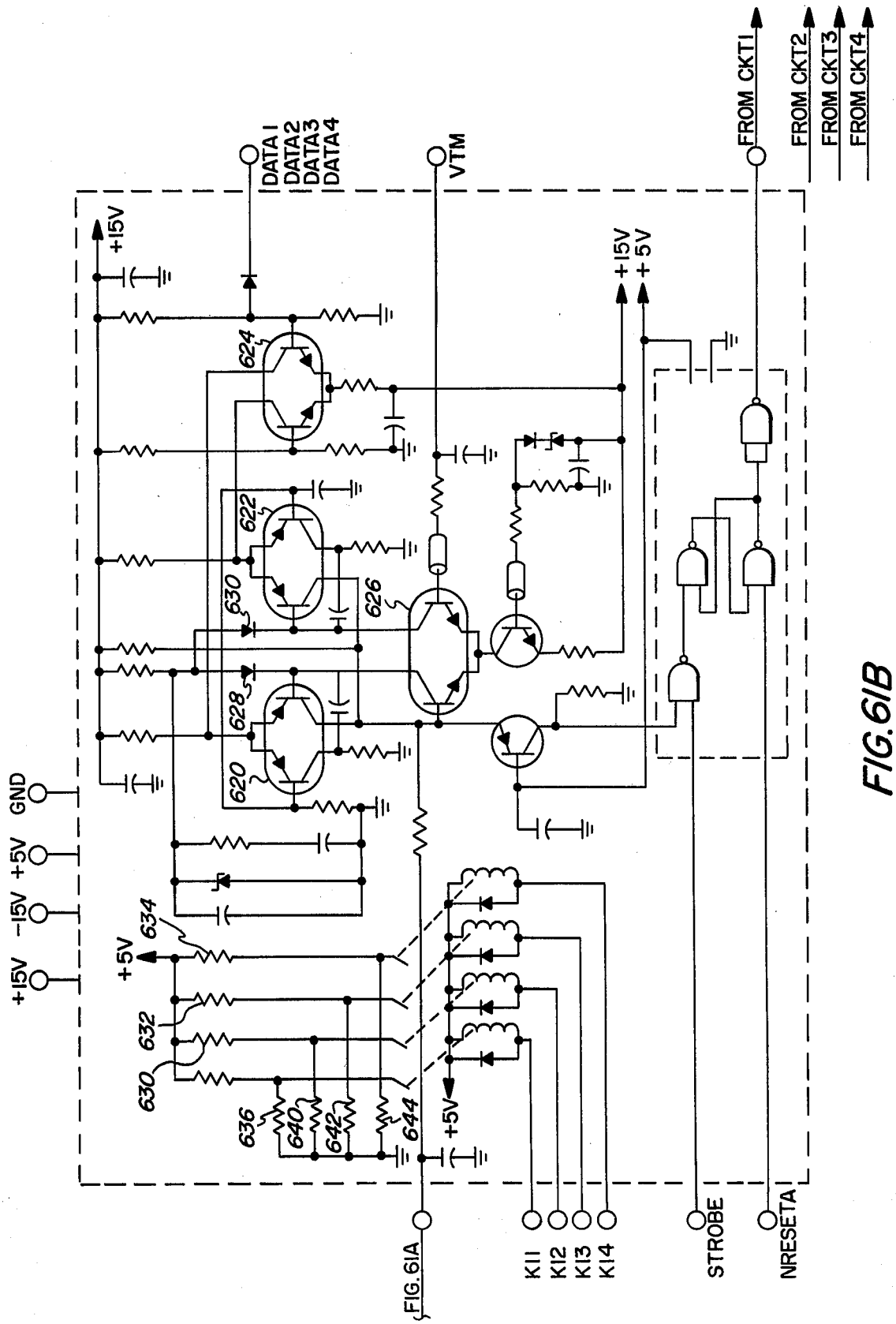

FIG. 61 is a schematic of the Performance Board, one of which is located as close as possible to the connector in each test chamber. The first test to be performed is a connector test which the left hand set of Contacts 602 are grounded through logic inputs and the right hand set of Contacts 607 are tested for ground through Gates 606 and 608. If any one connector contact is not grounded a failure signal will be generated. The four lines corresponding to the PROM outputs, Contacts number 9, 10, 11 and 12 are grounded with a special set of Diodes 610 through 616 and Transistor 618. This is necessary since the dynamic characteristics of the output lines are measured and therefore the capacitance of the circuits connected to these four leads must be kept as low as possible, in this case with low capacitance diodes, a low capacitance transistor and short lead lengths. The output of each connector pin goes to a separate discriminator circuit which is implemented from fast Transistor Pairs 620 through 626 and Tunnel Diodes 628 and 630 to discriminate not only the state of the output but also the presence of noise or latch problems. The logical reset NRESETA is issued before the test to reset all circuits and logic before testing. Each different PROM has different output impedance capabilities and Resistors 628 through 644 at the input to each Discriminator were chosen to match these specifications.

Figure 62:
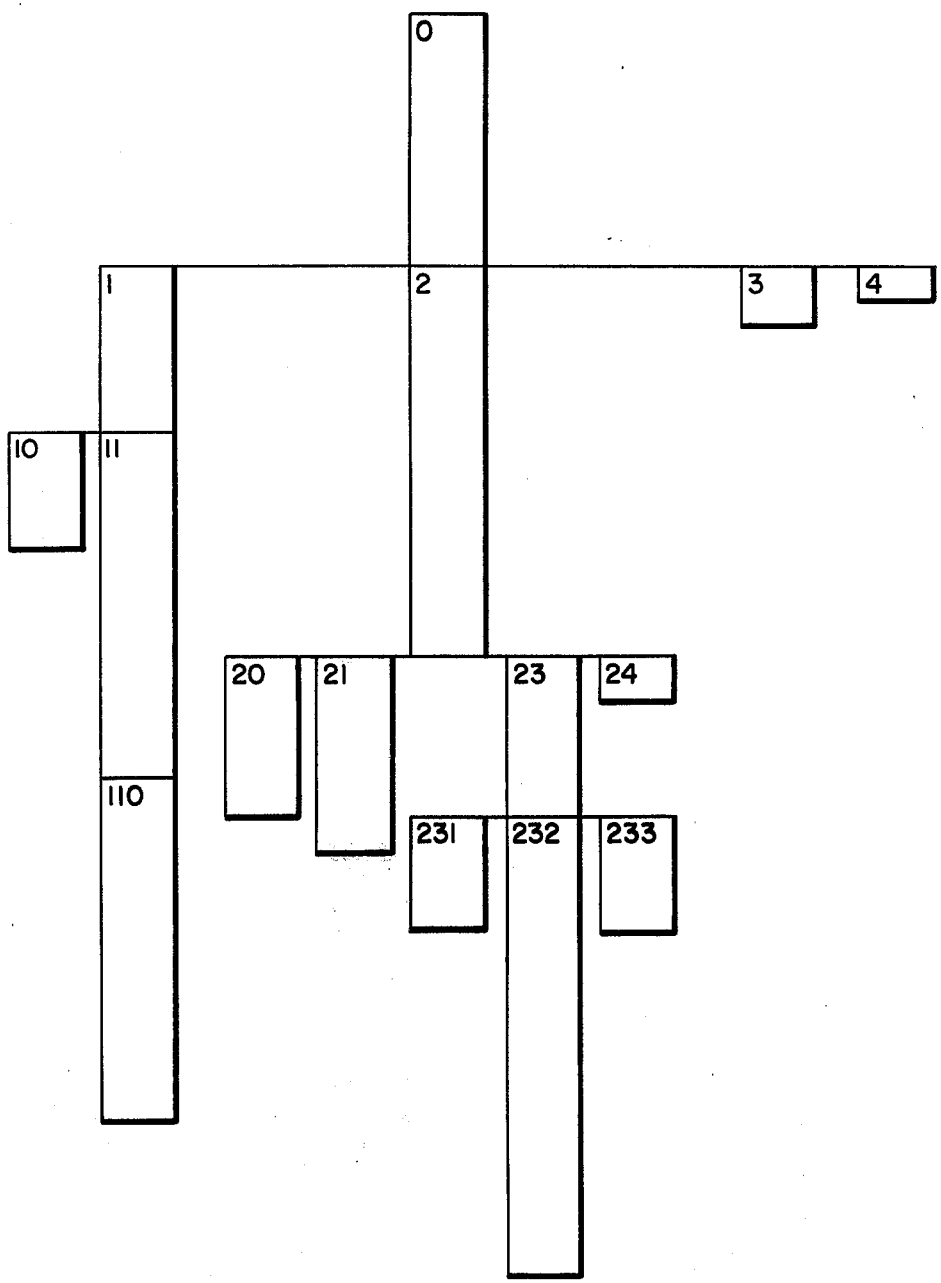
FIG. 62 is a diagram of the Computer Memory Map.

During system operation there are three programs contained within the Computer memory, the operating system, the executive program, and the data base. Using hexadecimal notation, the operating system is contained in memory location 0000 through 1A00 while the executive or data base programs are contained in locations 1A00 through 6000. FIG. 62 is a memory map showing how the executive program is loaded into memory. The data base program has a similar load map. Each program segment or task is identified by a number which in turn is described by function in FIG. 63. FIG. 62 indicates that the root segment is always contained in location 1A00 through 2800. However, from location 2800 there is a choice of which segment may be loaded into memory. For instance, the AUTO segment 11 may be loaded into memory starting at location 3200 but if an error is found, the error segment 10 will overlay the same area of memory for the duration of the error processing. When error processing is finished, the AUTO segment 11 will be called back into memory for further processing in the automatic mode.

Figure 64:
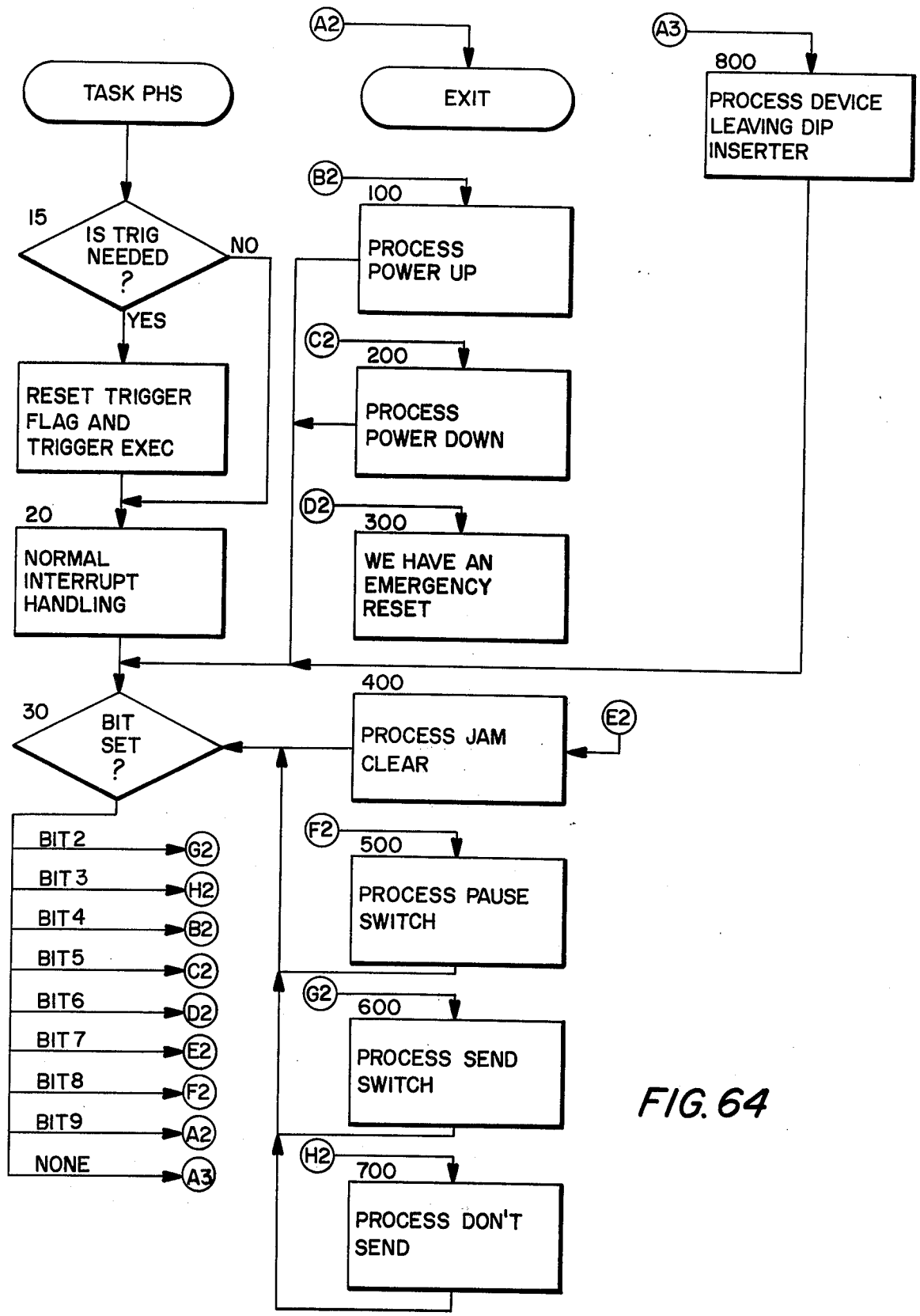
Figure 65:
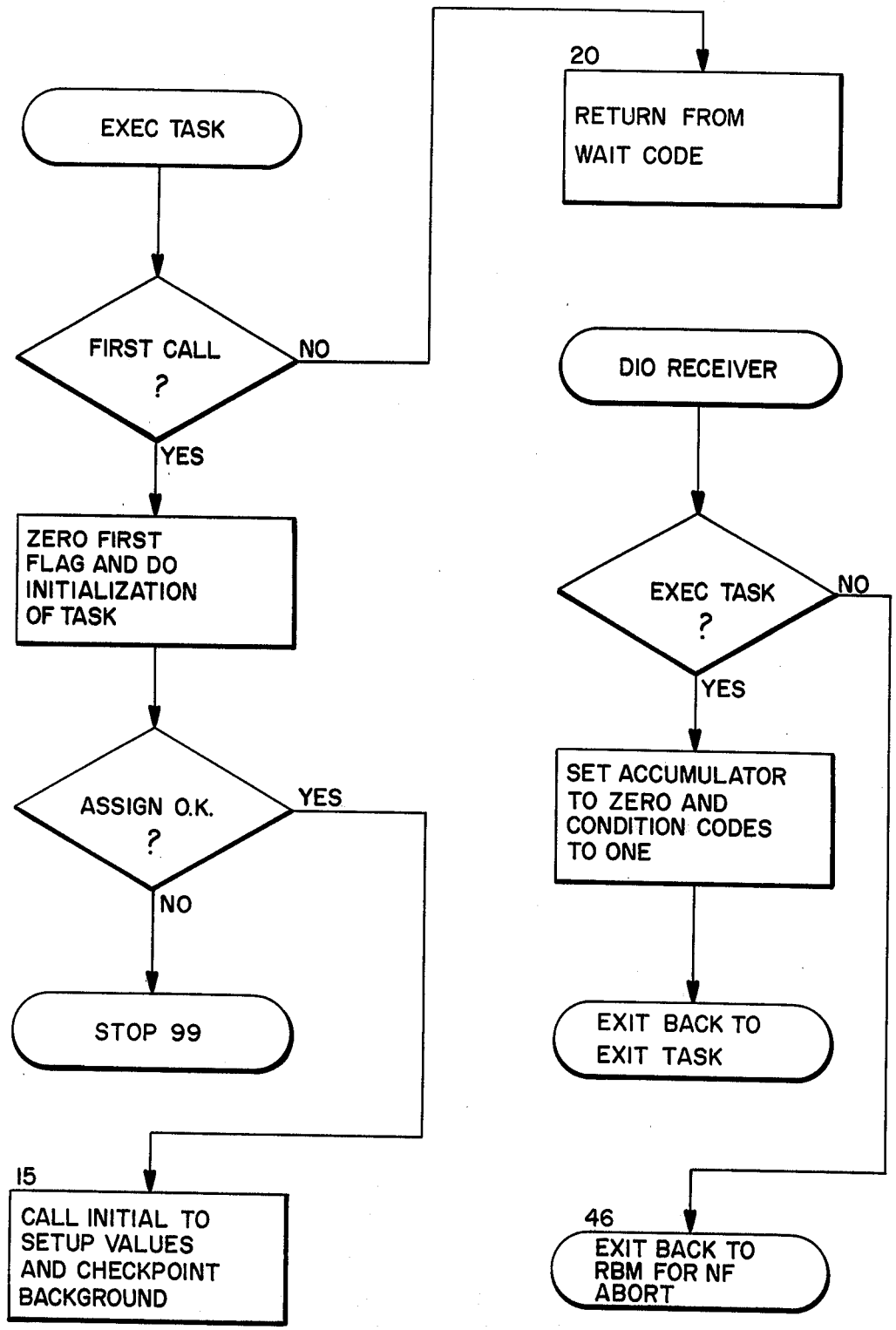

The executive program starts at the point labeled TASK PHS in FIG. 64. If this is the first time through this task, the program will reset the executive task flag and then check to see what the status of the PROM Handler is by interrogating the interrupt bits through nine. If any interrupt bit is set, the program will branch to an appropriate entry point where a corresponding flag will be set signifying that the Computer has recognized the presence of the interrupt bit.

The TASK CLOCK of FIG. 64 is activated whenever the system receives a clock 2 interrupt. This task is always resident while the PROM Handling System is on line and will set one of the interrupt bits two through nine in accordance with the interrupt received. Upon completion, this task will exit back to the interrupt task. After setting all necessary interrupt flags, the program will exit to EXEC TASK on FIG. D.

Figure 66B:
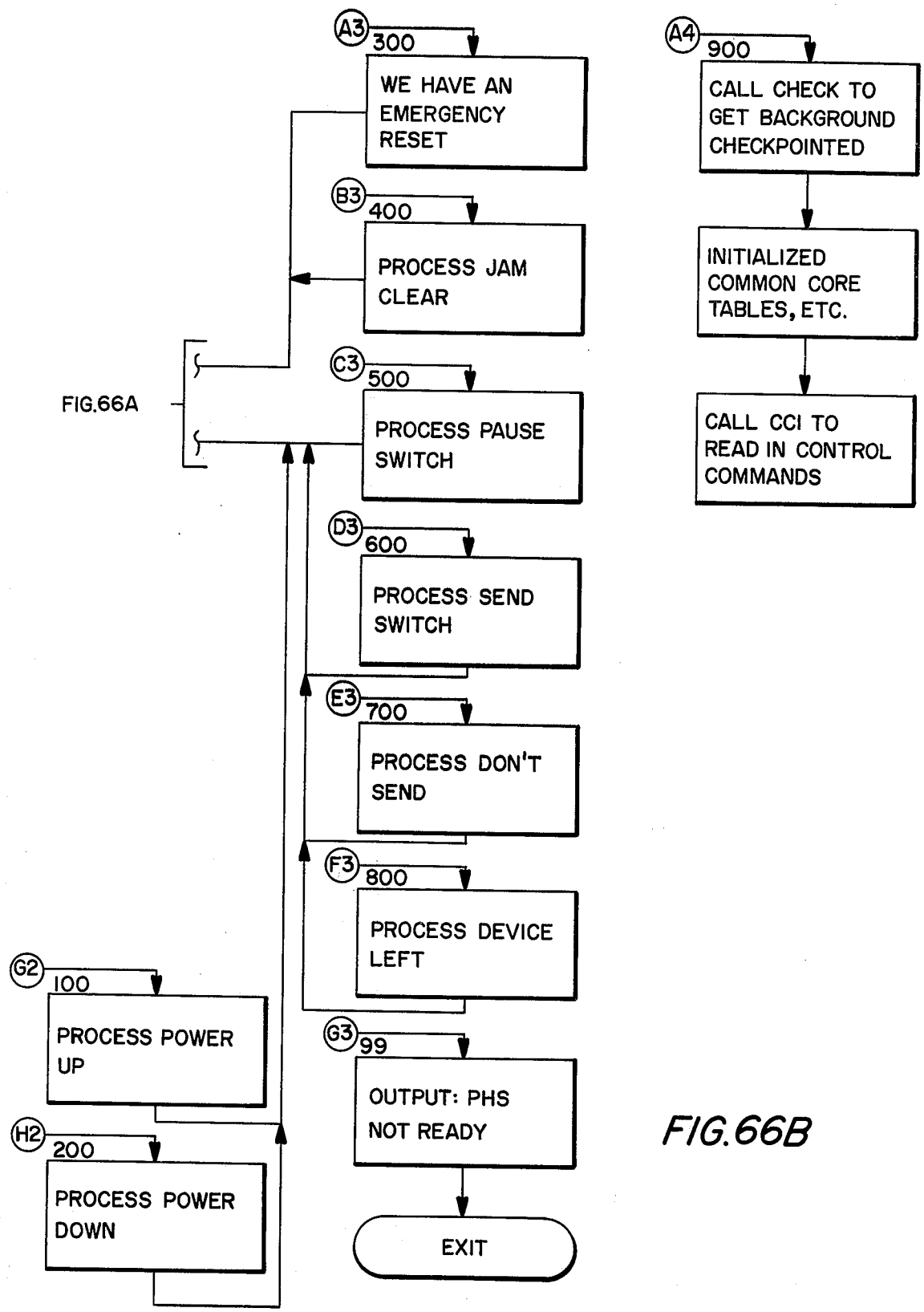

If this is the first call, the program will call the INITIAL task of FIG. 66 and set a flag to avoid taking this path again.

In this first call, the INITIAL task of FIG. 66 includes an initial set-up of various flags and a recording of the time of day. There is also a check to see if the PROM Handling System is on-line, that is, connected to the controllling Computer. The PROM Handler can be controlled either automatically by the Computer or manually by maintenance personnel from a Hardware Control Panel. If the PROM Handling System is being controlled from the Control Panel, the Computer will disregard the rest of the initialization and call the CII segment.

If the system is on line the interrupts will be examined. This code is similar to that of FIG. 64 in that the interrupt bits are once again interrogated and flags set if necessary. Finally, the INITIAL segment calls the CII segment on FIG. 67.

Figure 67:
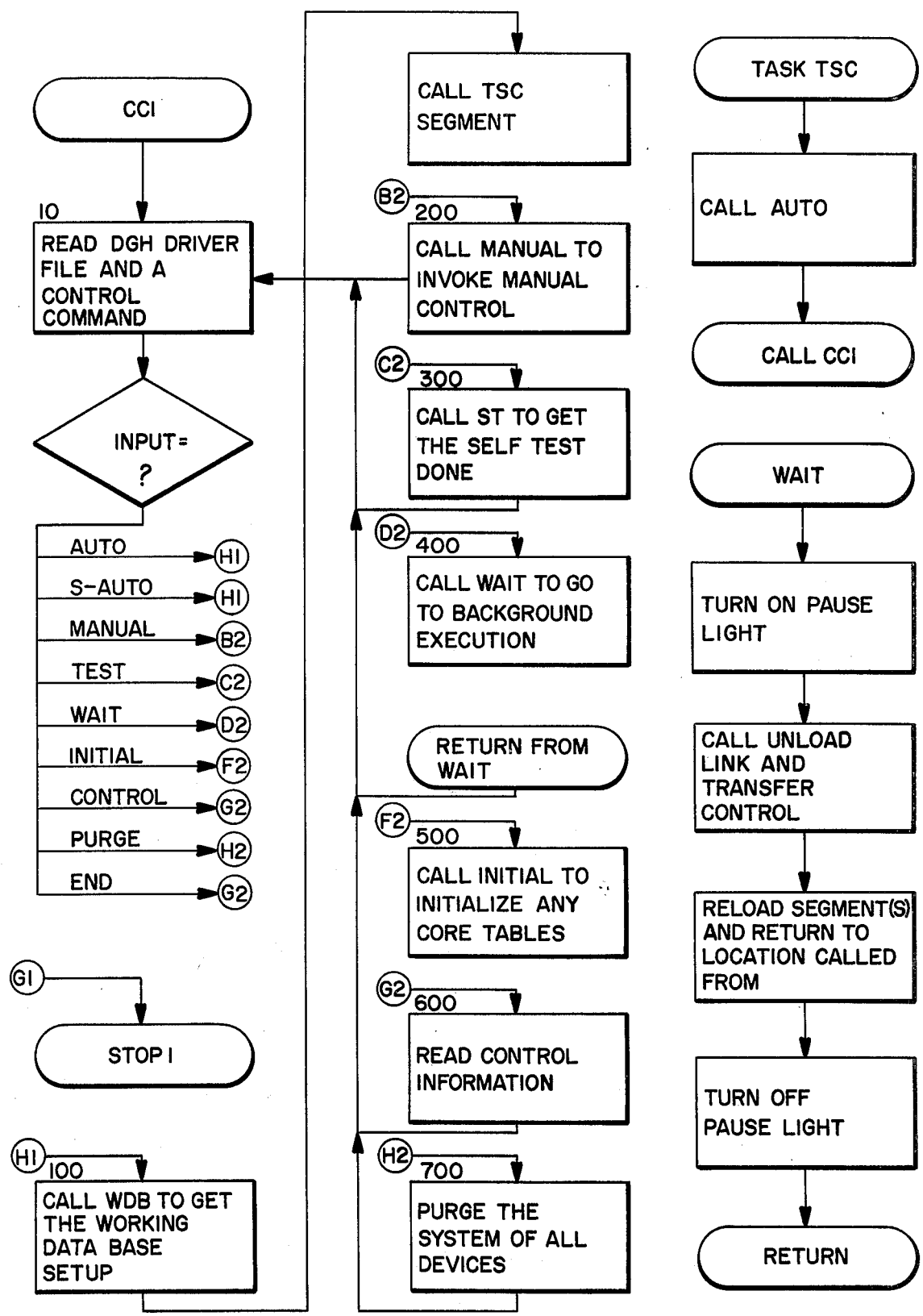
Figure 68A:
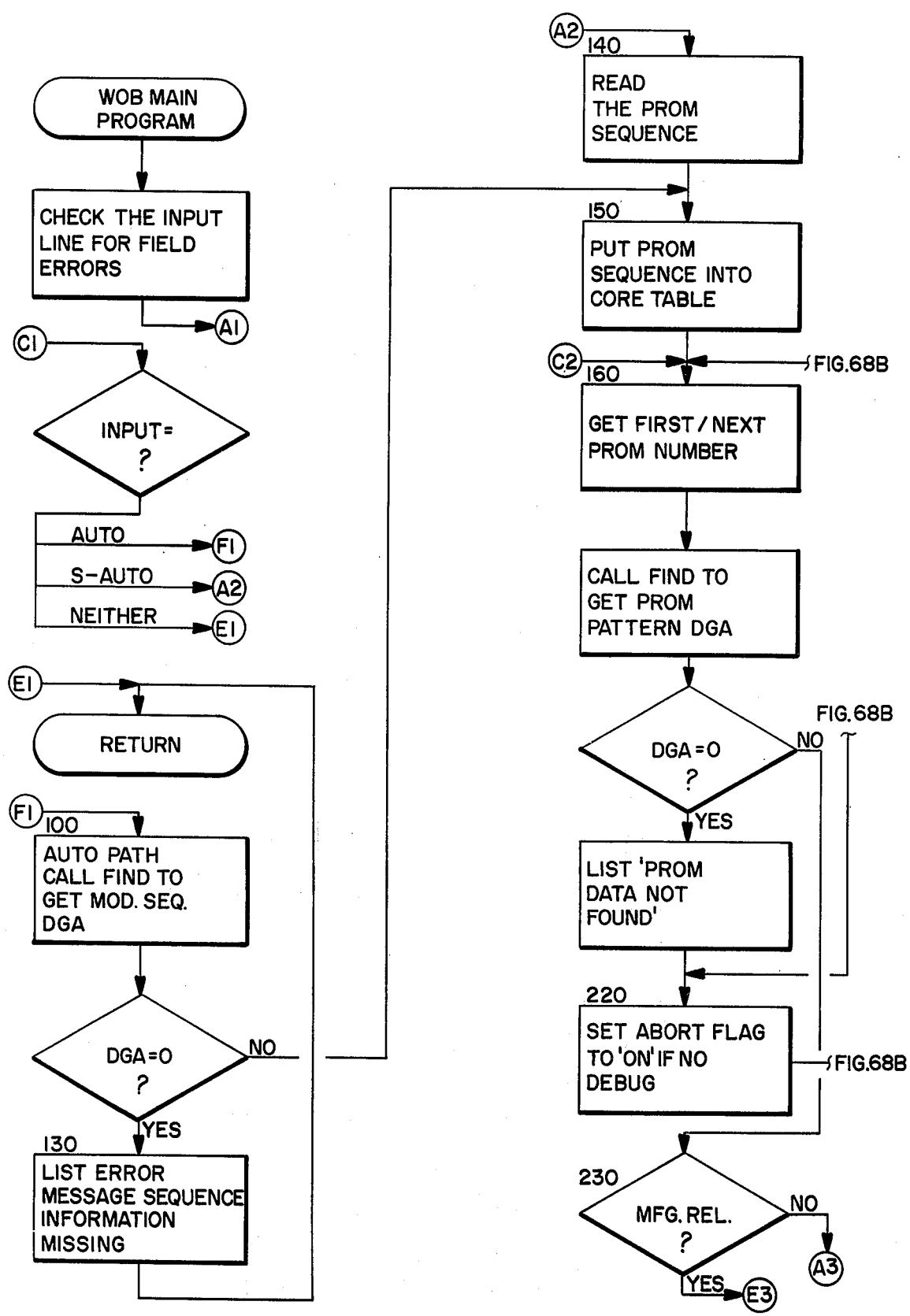
Figure 68B:
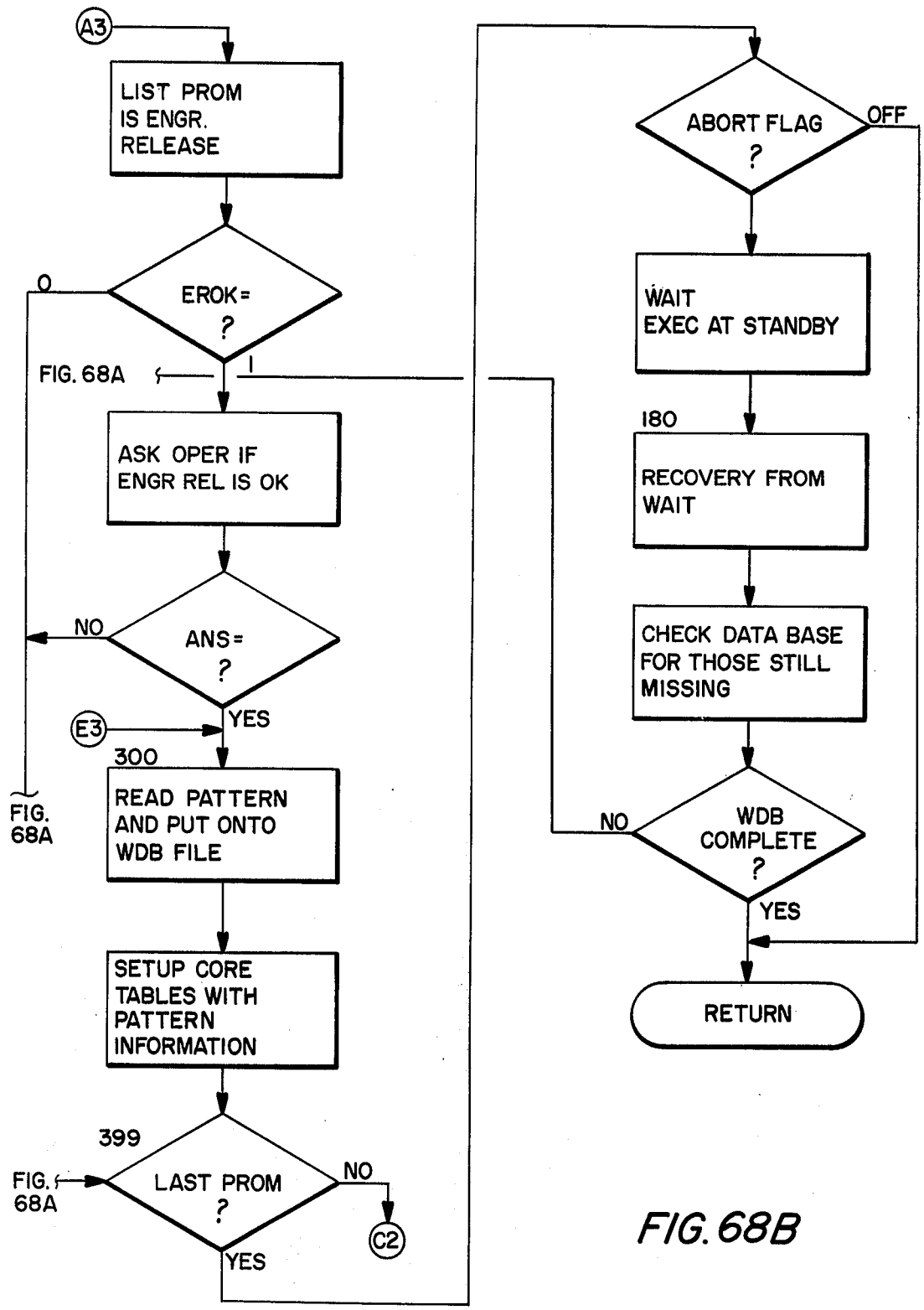
Figure 69:
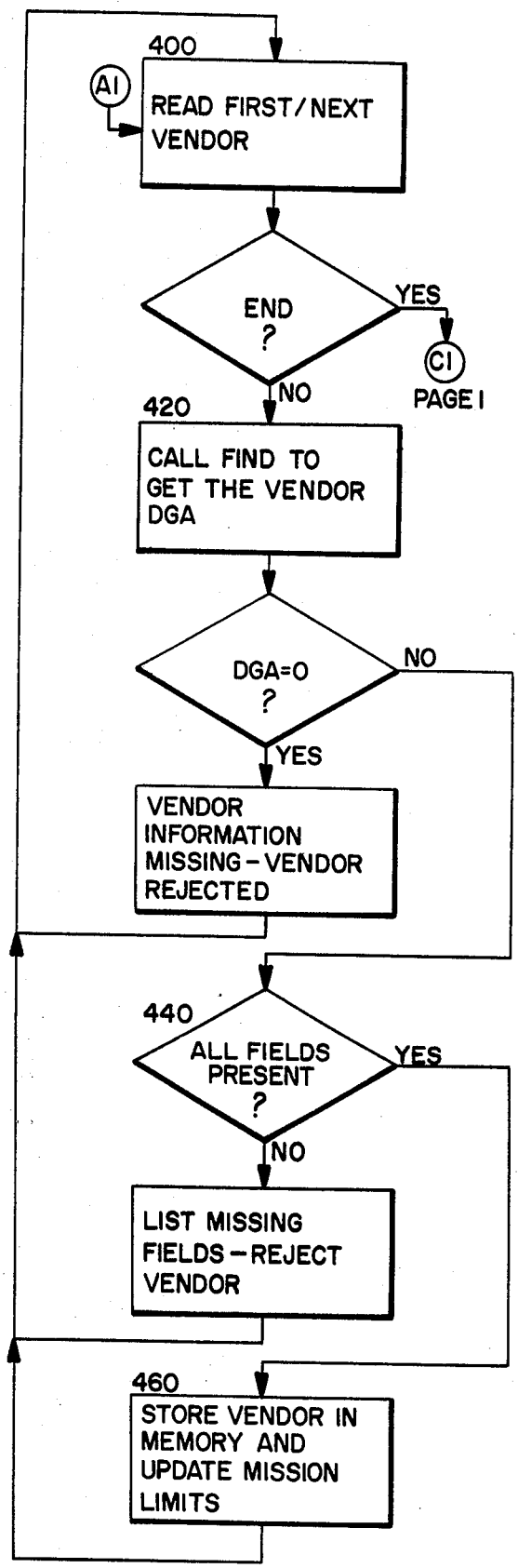

The CII program shown in FIG. 67 looks for a mode command usually an auto or semi-auto command There is no real difference between the two except that in the semi-auto mode, the operator specifies the PROM order, while in automatic this order is specified from information received from the disk. The PROM order corresponds to the order in which the finished PROMs must be delivered to the DIP Insertion Machine or loaded into the output stick. The differences between these two modes of operation at the flowchart level are not significant. If this is the start of a mission, where a mission is defined as the processing of a number of complete sets of PROMs to be used on a given module, then a data base consisting of the patterns to be used in these PROMs must be taken from the disk and loaded into a working data base. The flowcharts corresponding to this loading program are shown in FIGS. 68 and 69. The PROM sequence is the sequence in which the PROMs will be programmed, and the data patterns comprise 64 words, each of 16 bits will be loaded into the random access memory of the programmer and test stations.

The remaining options in the flowchart of FIG. 67 are features which are useful for checking out the program and are not particularly relevant to the PROM Handling System. The receipt of an AUTO command will result in a branch to the TSC segment which merely calls AUTO and returns. The calling of AUTO, as shown in FIG. 62, represents a calling in from the disk of the next level of program. Depending on the mode of operation, any one of the nine operations shown in FIG. 17 may be pulled into memory from the disk.

Figure 71:
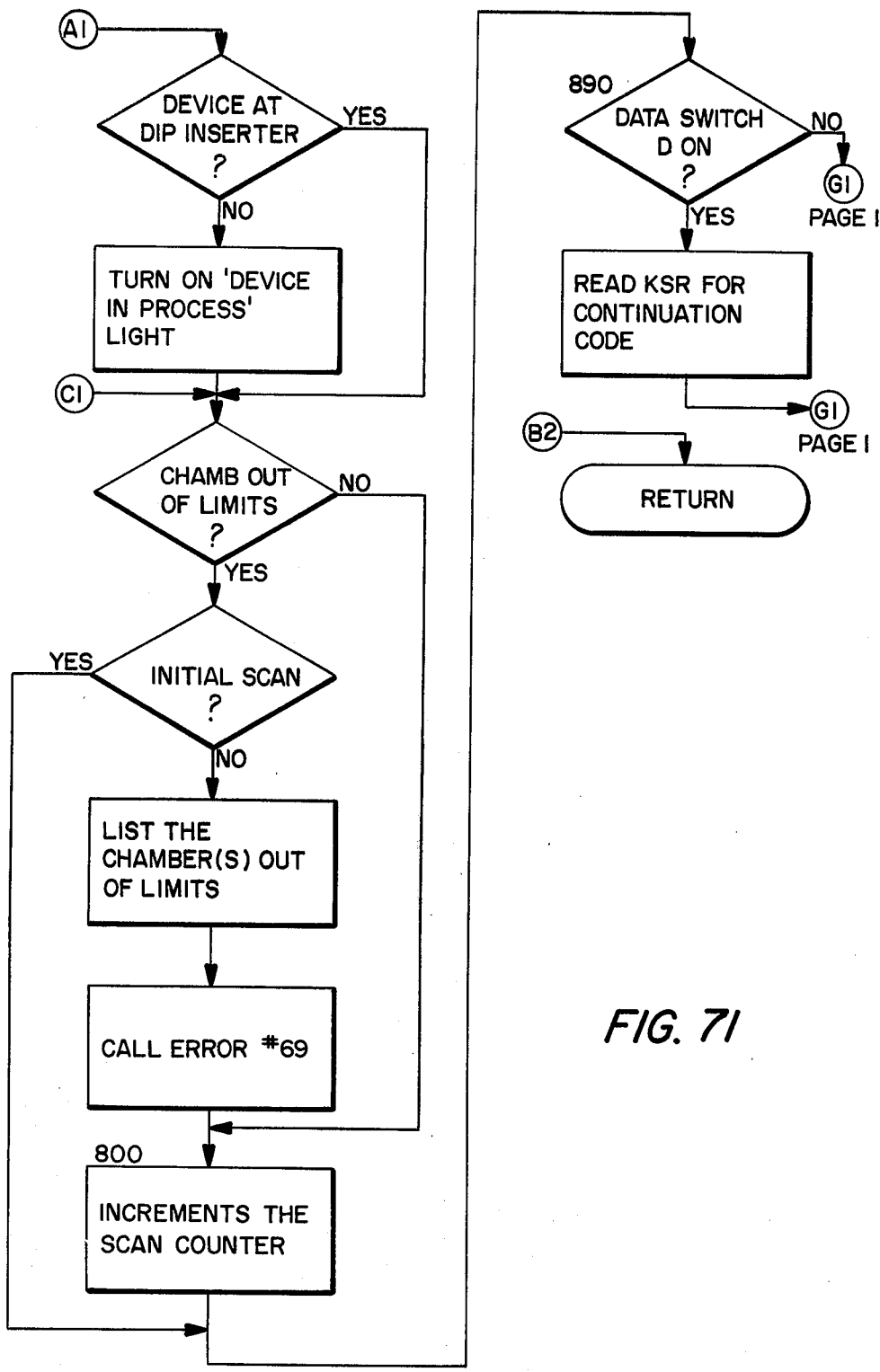

The AUTO segment of FIGS. 70 and 71 is the basic system program and shows how the computer program interacts with the PROM Handling System hardware to control the various operations. All of the PROM patterns required for the mission are read from the main data base and stored on the working data base for use by AUTO. The WDB flowchart shown in FIGS. 68 and 69 are the processing of these patterns.

When AUTO in FIG. 70 is called a flag is set to initiate the programming task. Then the temperature control settings are determined and listed. Finally, the program checks that a device is at the input chute before actually calling the programming task. If no device is available the program will wait in this loop until a device is ready to be programmed. There follows a series of error checks, and the detection of an error results in the execution of the error subroutine. The result is usually an error message typed out on the Computer Output Printer so that the system operator may take corrective action. If the error routine is called, as shown in FIG. 62, the error routine will be overlayed in the AUTO section of memory until the error message has been printed and corrective action taken. Then AUTO will be reloaded.

Figure 72A:
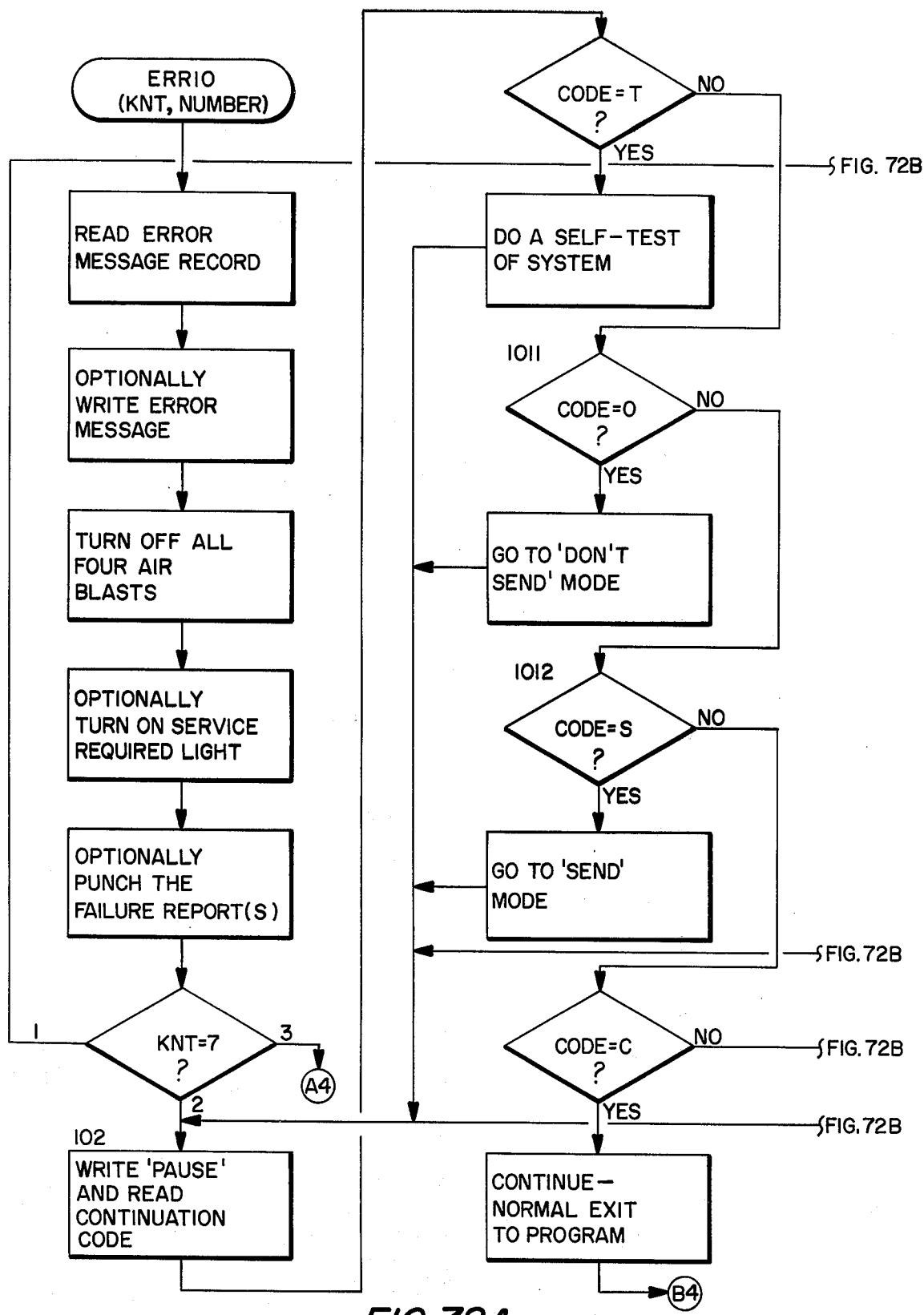
Figure 72B:
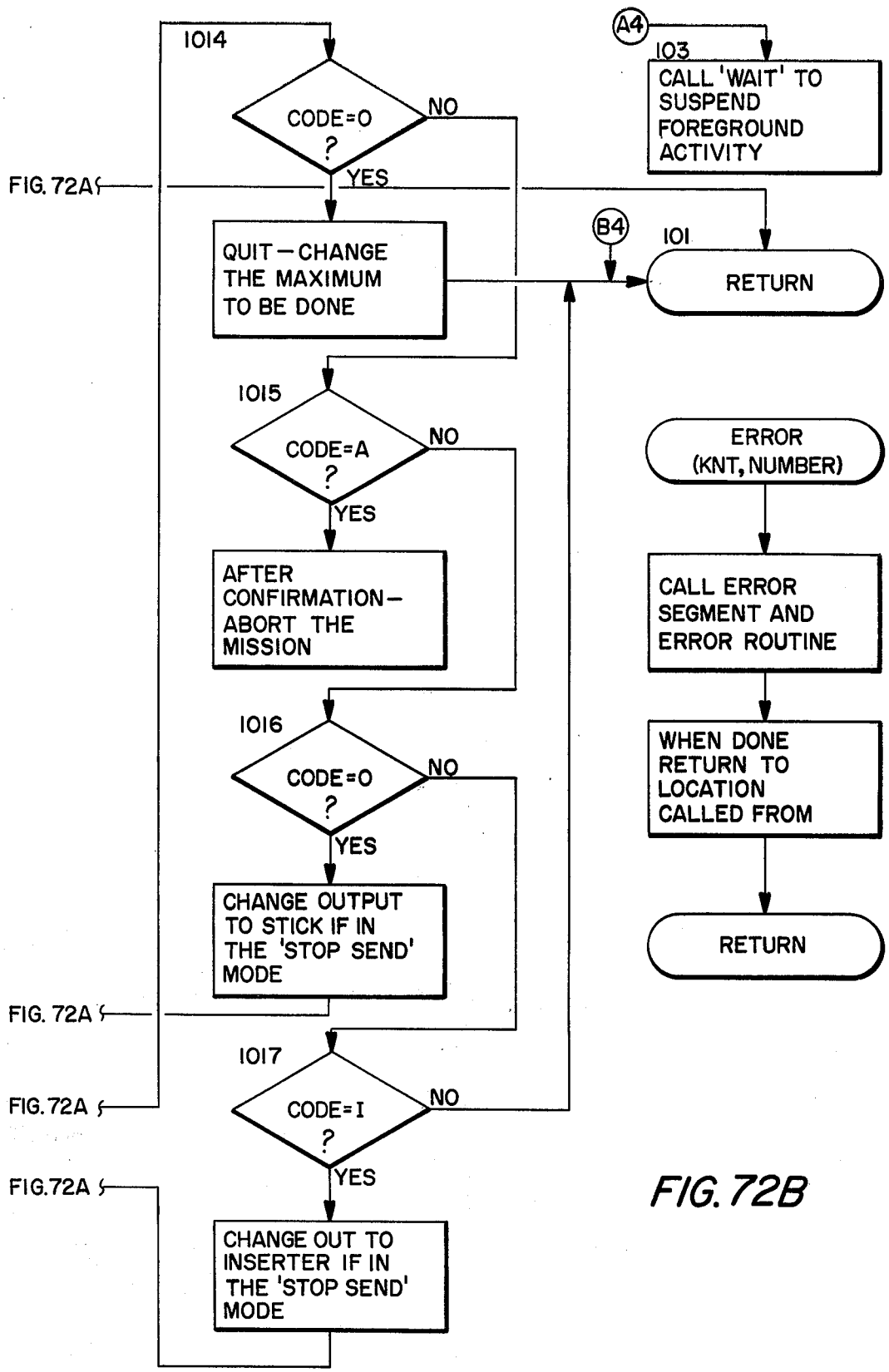

A flowchart of this error processor is shown in FIG. 72. The error routine will decode the error number, read a particular message corresponding to that number from the disk, and print out that message for the operator. After a message is typed out, the system goes into a pause state, at which point the operator should take corrective action, and then type a continuation code on the Computer Output Printer. There is a variety of continuation codes, and if the appropriate code is typed in for the error originally detected, the Computer will recognize the code and return to AUTO. In actual operation, for example, if the message was "Input Stick Empty", the operator would replace the empty input stick with a full input stick and type a continuation code of "C" in on the Printer. At this point the Computer would be informed through the operation of a phtoelectric cell below the input stick that PROMs are now available, the Computer would reload the AUTO segment and resume execution at the instruction after the cell to the error routine.

Figure 73:
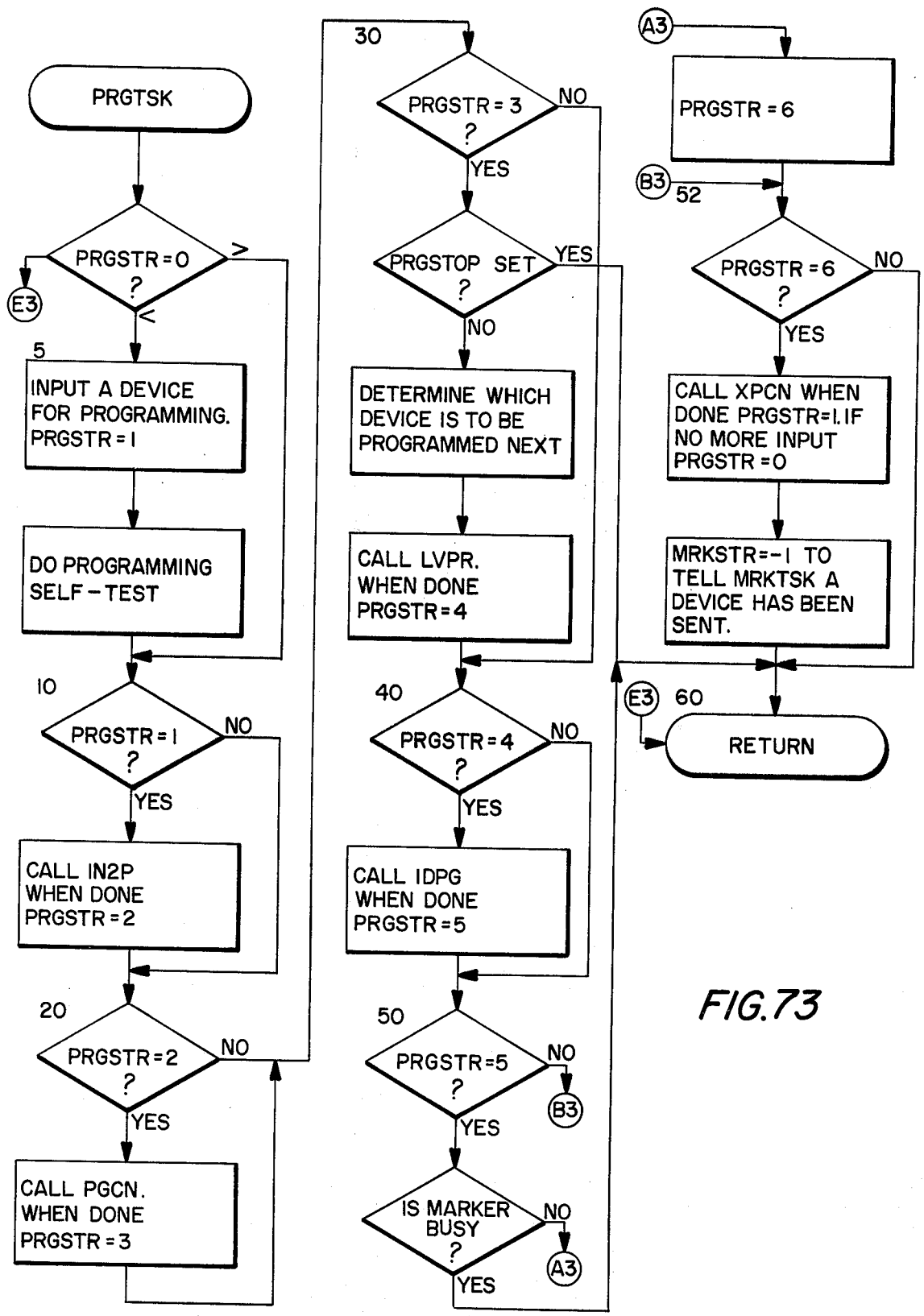

From the AUTO mode the program branches to the programming task shown in FIG. 73. The programming task checks to see if the programming start flag has been set by AUTO. If it has, the program commands a device to be loaded into the programming section of the PROM Handling System. In the time it takes for the device to drop into the programmer the program will do a self test on the programming station. There is an error message associated within errors discovered during this test. If the self test passes, the program start task flag is set to 1. As will be seen, a complete system of flags is provided so that the AUTO program may be simultaneously working on a variety of tasks, and by examining these flags, can return to the same point in the task that it exited from.

The program steps to make these incremental moves are collectively called a sub-sequence. The program steps involved in calling the sub-sequences for a particular section of the PROM Handler (e.g. programming, marking, etc.) is called a task. There are 36 subsequences and they are grouped into eight tasks (FIGS. 73, 75, 76, 77, 78, 79, 80 and 81.

Figure 74A:
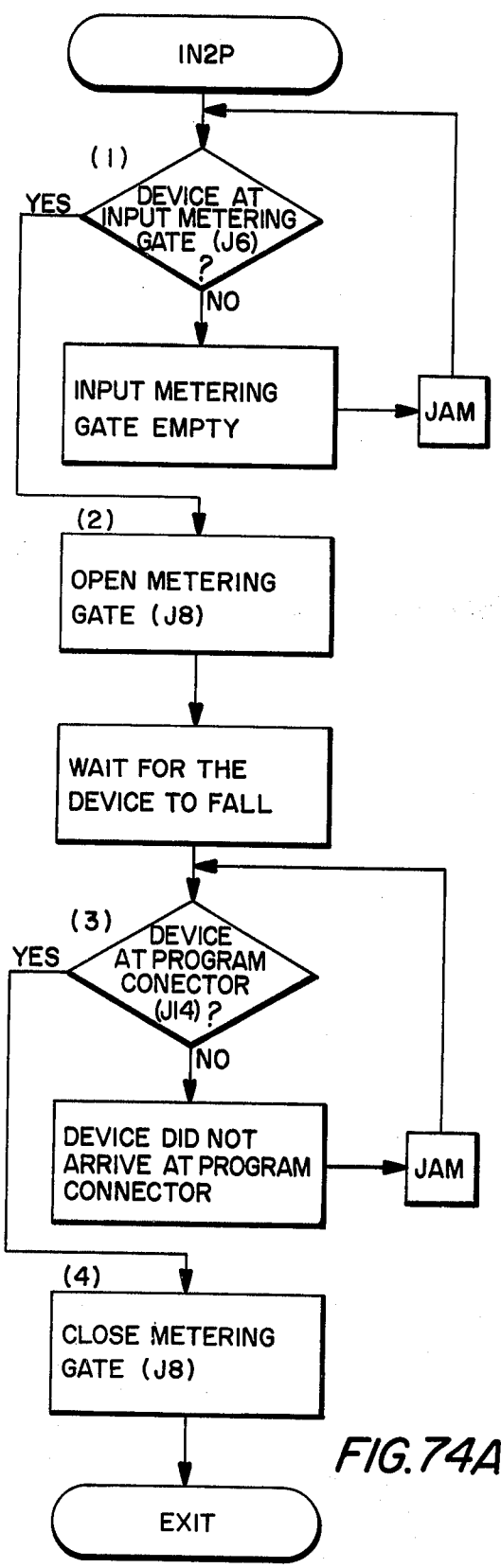
Figure 74B:
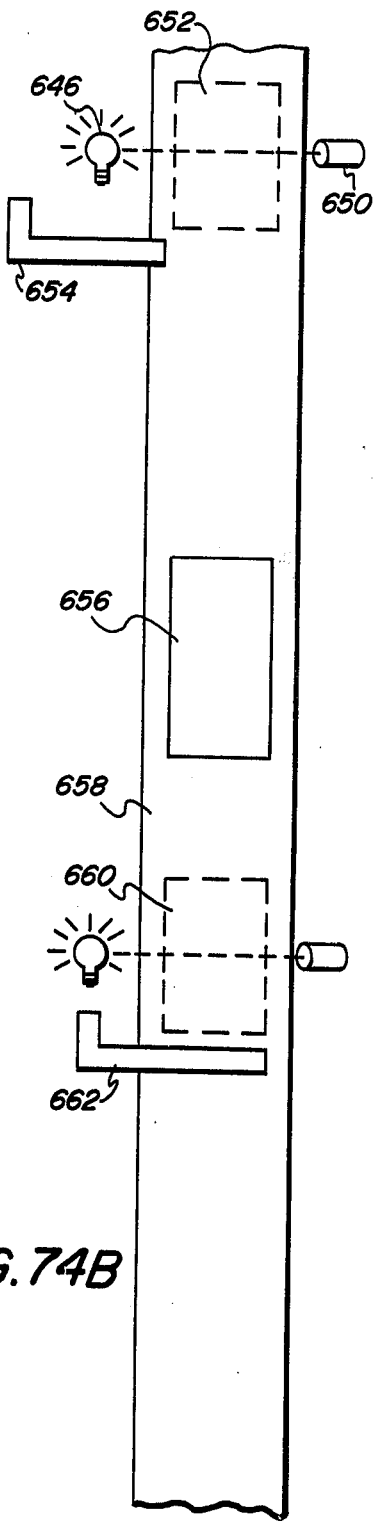

FIGS. 74b and 74d are a simplified mechanical schematic and a corresponding flowchart showing how a typical subsequence is scheduled. A Photo Emitter 646 and a Photo Receptor 650 are shown. The PROM starts at Point 652 and as it falls past the Photo Receptor 650, a signal is generated informing the Computer that a device has been received from the input stick. Metering Gate 654, under control of the Computer, allows one PROM to drop and it is shown at Point 656 on its way down the Track 658. The PROM will stop at Point 660. Metering Gate 662 will not open until the programming sequence has been completed. The corresponding flowchart of FIG. 74a shows that the program receives information that a device has been received from the input stick and opens the Metering Gate 654 for the PROM to pass. If the input Metering Gate 654 is empty in spite of the fact that a PROM is available at the input stick, the Computer will assume that a jam has occured. Likewise, if, after a waiting period long enough for the PROM to reach the programming section, there is no PROM at the program contactor, the Computer will again assume a jam. If a PROM reaches the program contactor at Point 660 the Computer will close the Metering Gate 654. At this point the programming sequence may begin. By this process of monitoring devices through Metering Gates and photosensors, the Computer is able to keep track of every individual PROM in the PROM Handling System.

Returning to FIG. 73, a flag is set when the programmer has completed the programming of a PROM. In this case, this flag is set to 2 to indicate that the programming sub-sequence is completed. The programming stop flag is used if the program realizes that there is an insufficient amount of storage space in the Storage Tubes to continue normal processing. This occurs, as has been explained, when a replacement part is found to be defective and a replacement of a replacement must be programmed. In this situation, except for the replacement of the replacement, no other PROMs are programmed until this second replacement is available at the Bypass Tube. In either case, when the programming task is finished it will set a flag for the mark task to start and return control to the AUTO program.

Figure 75:
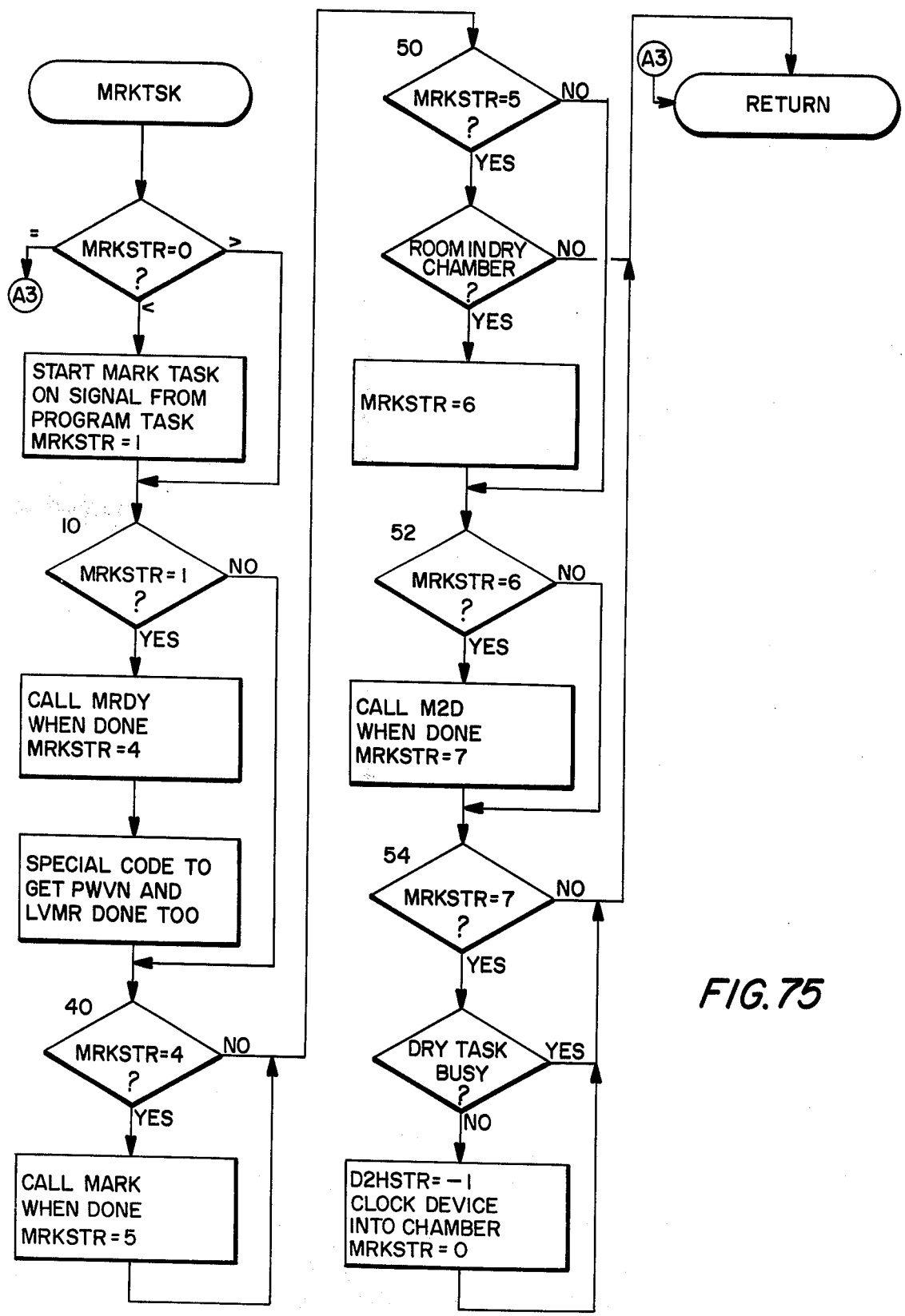

The next task is the marking task as shown in FIG. 75. The marking task, and all other tasks, are constantly being called but if the corresponding "start" flag is not set, the control of the program will immediately return to AUTO. If the marking flag is set, the marking task will be started. After setting the MRKSTR flag to indicate that the marking task has been started the subsequences are called to command the programmable marking unit to mark the part appropriately and monitor the device's passage into the dry chamber.

When the marking task is finished the PROM is sent to the Dry Chamber and the time of entering the Dry Chamber is recorded before control is passed to the dry task.

Figure 76:
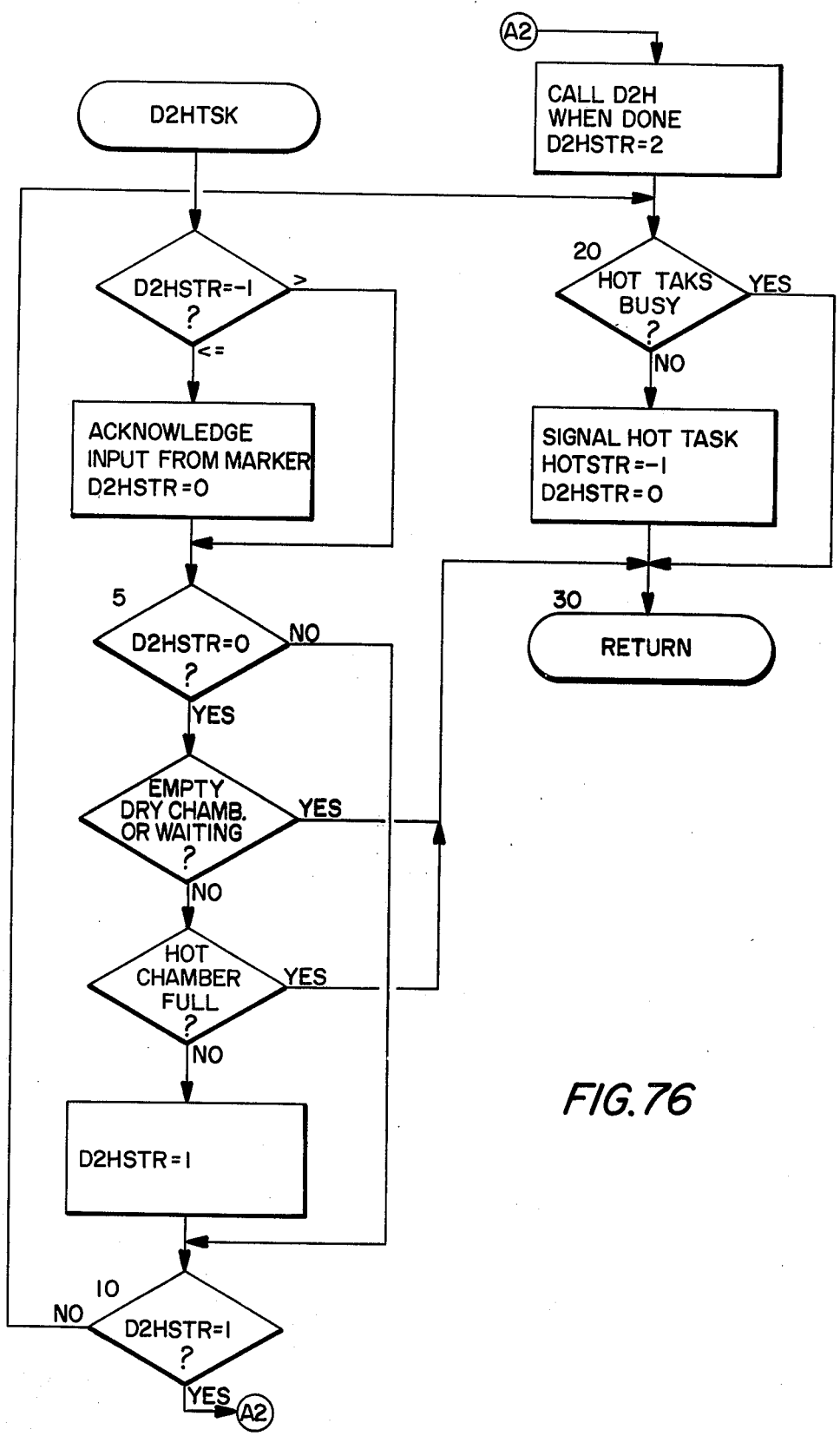

The dry task flowchart is shown in FIG. 76. The dry task basically acknowledges the receipt of a PROM from the marking station, monitors the devices entry into the Dry Chamber and waits for a 1½ minute time delay to expire. This task also keeps a count of the number of PROMs in the chamber to keep the marking task from overfilling the chamber. When the bottom PROM in the Drying Chamber has been in for the required amount of time the program calls subsequences to transfer the PROM to the Hot Test Chamber.

Figure 77:
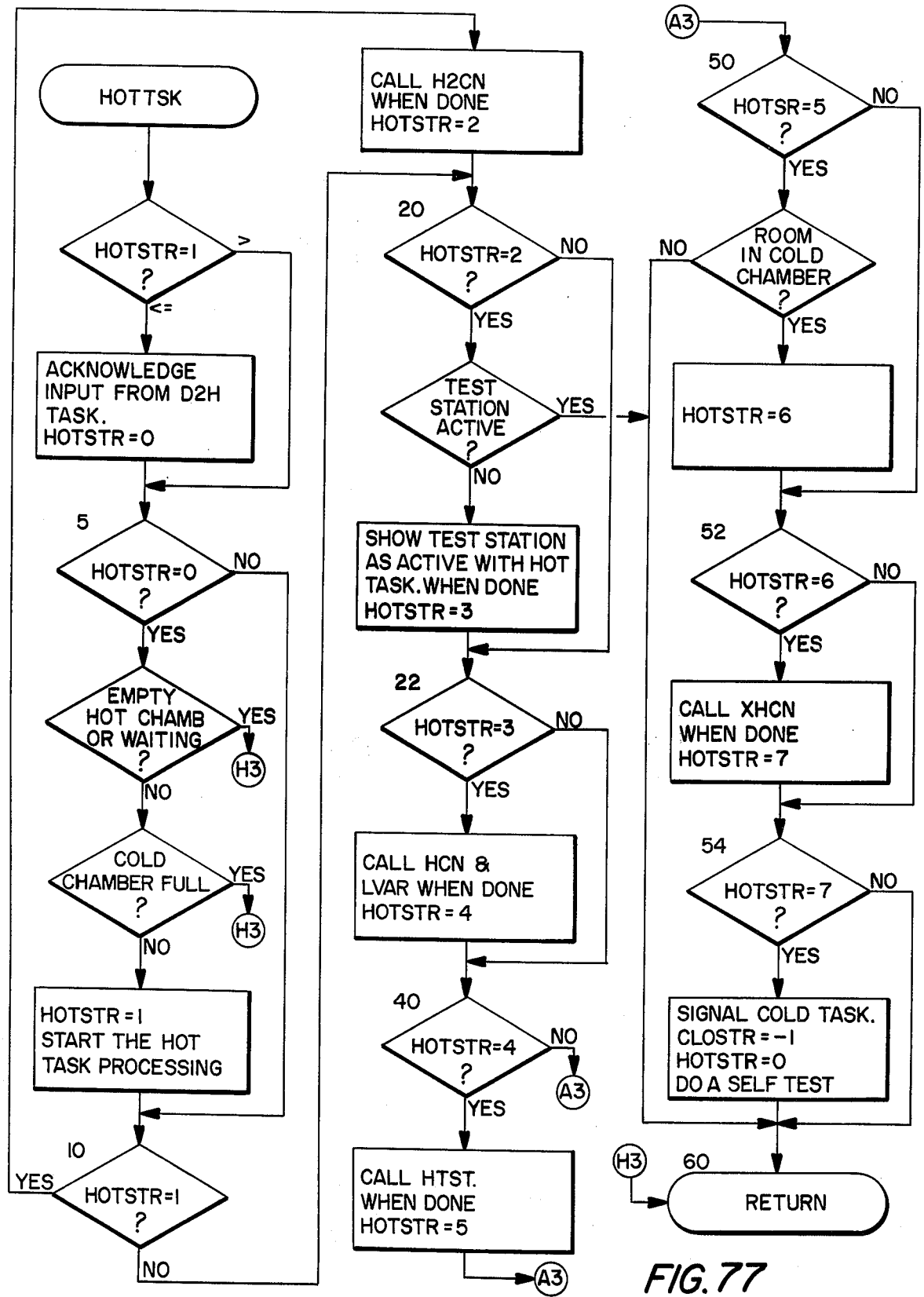
Figure 78A:
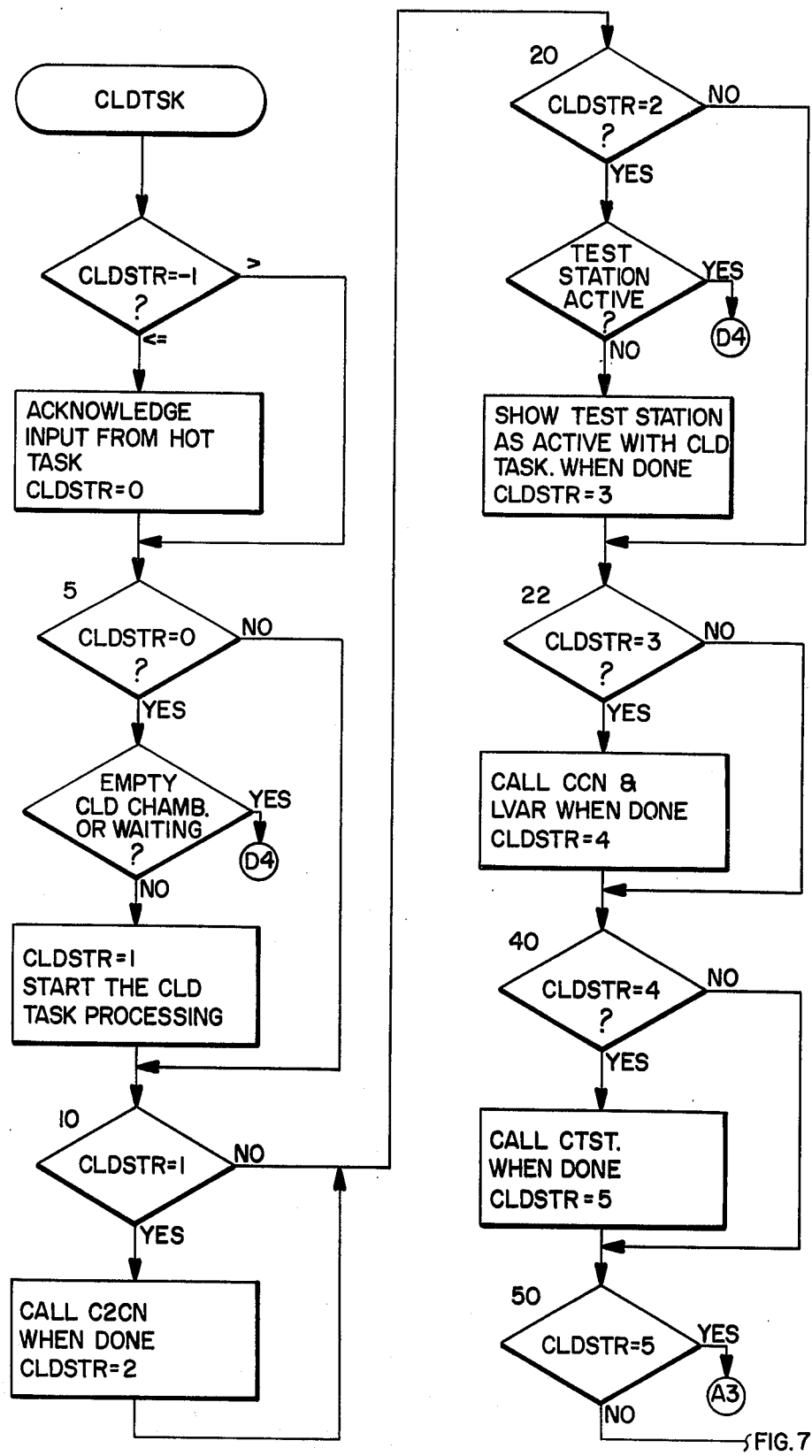
Figure 78B:
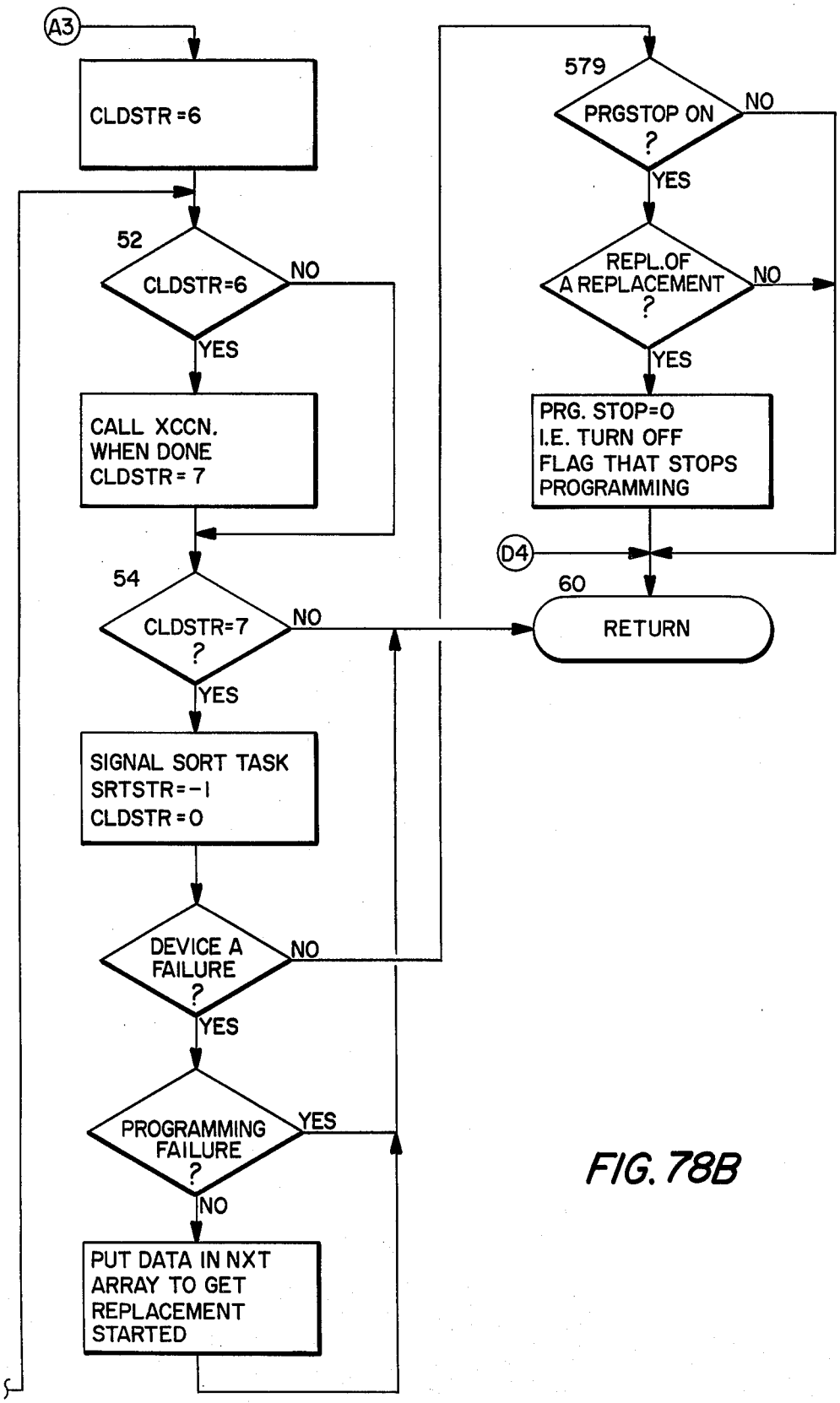

The hot task in FIG. 77 acknowleges the input of the PROM from the Drying Chamber, makes sure that there is space in the Hot Chamber for this PROM, and starts a clock on this PROM. When the timer for this particular PROM shows that it has been in the Chamber for 2 minutes, the program initiates a performance test. It should be remembered that the test itself is not controlled by the Computer but is completely controlled by the Test Station Electronics, all the Computer does in relation to this test is initiate it. When the test has been completed, control is passed to the cold task of FIG. 78. The hot and cold tasks are identical except that at the end of the cold task, testing of the device is completed and a flag will be set if this particular device has failed either hot test or cold test or failed to program properly. At this point, if the PROM has failed either the hot test or the cold test, a command will be initiated to program a replacement PROM. A replacement PROM is not programmed at this point for programming failures since programming failures are immediately replaced at the Programming Station. Whether the part is good or bad, a flag is set which indicates that the next task will be a sort.

Figure 79:
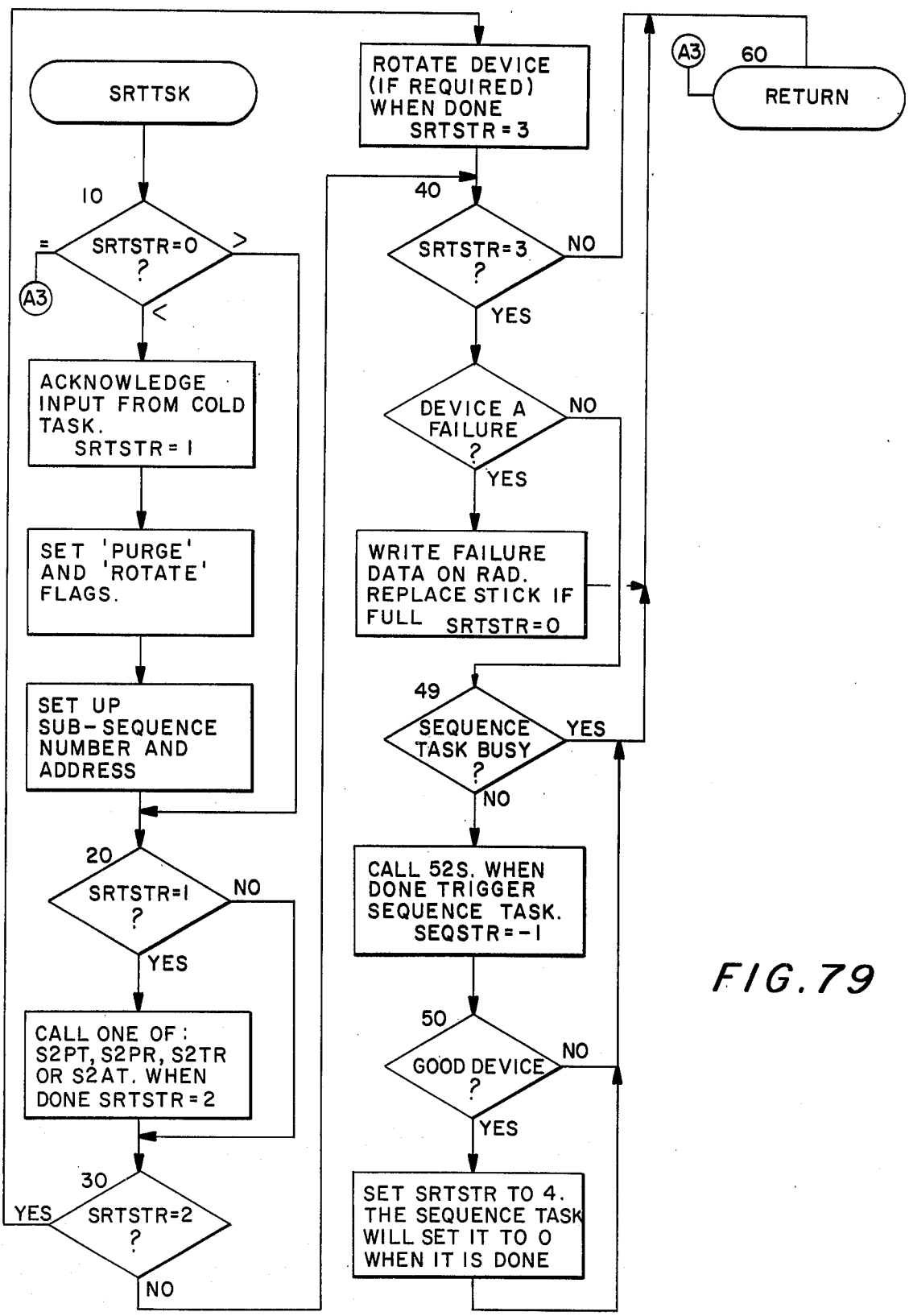

The sort task in FIG. 79 decides whether the part should be placed in the Purge Tube, the Reject Tube, or the Good Tube, based on the flags that have been set in relation to this particular PROM. Good parts are sent to the next station, the program simply indicates that the PROM has been seen and the Carrousel is rotated so that the PROM will be carried to the next Station which is the Sequencer. Parts that have failed a programming or performance test are placed in their respective Reject Tubes and parts that have not been fully tested are placed in the Purge Tube. As always, when this task is finished, the program returns to AUTO, which will in turn call the Sequencer.

Figure 80:
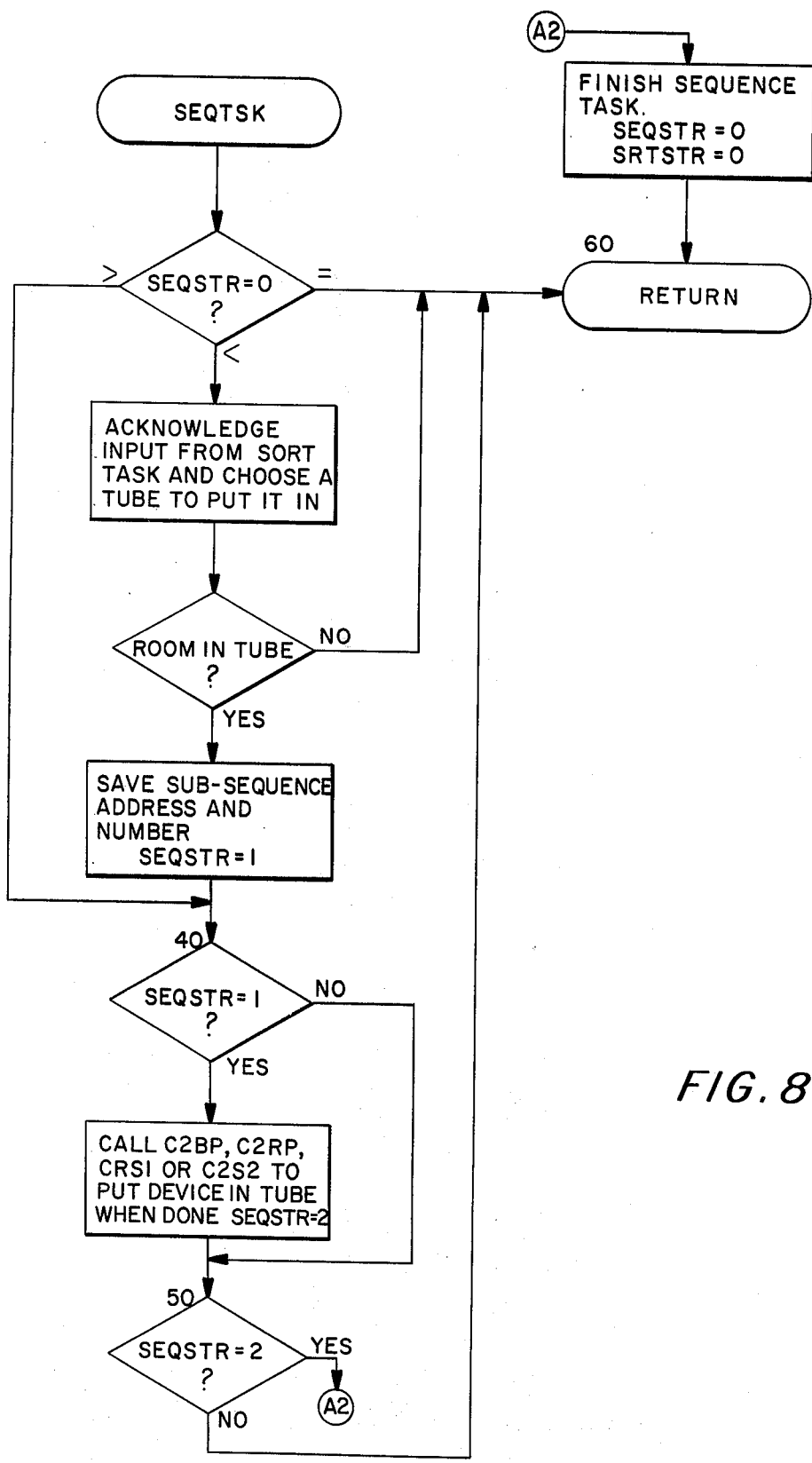

The Sequencer task in FIG. 80 has four choices as to where to put the device. It can be put in either one of two Storage Tubes, the Bypass Tube or the Replacement Tube. The algorithm places single replacement parts in the replacement tube, good parts in the bypass tube if there are no missing parts, and good parts in the storage tube if there are missing parts. PROMs that are replacements for replacements are also put into the Bypass Tube. This task also counts and keeps track of all the parts as they are transferred into and out of the sequence apparatus.

Figure 81:
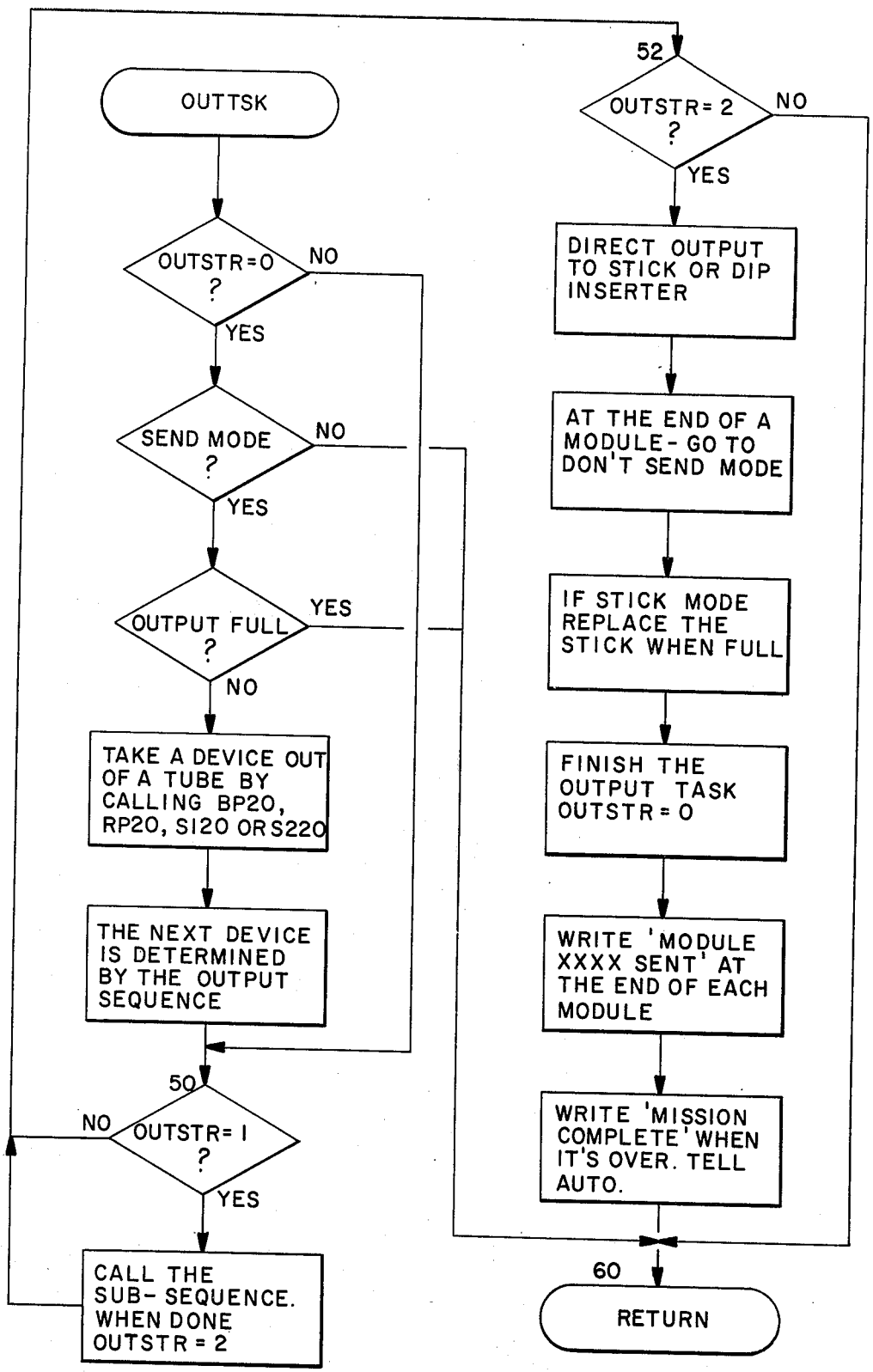

The output task of FIG. 81 decides whether the next device to be output will be one from the Bypass Tube, a Storage Tube or the Replacement Tube. Data is retained for the PROMs in every Tube so that the sequence of parts in the Output Stick will be correct regardless of the sequence in which they were actually tested or programmed. A determination is also made here as to whether the devices will be loaded into an Output Stick or sent directly to the DIP Insertion Machine. The parts are counted as they are output to ensure there is room at the designated output device. In the case of stick output, the operator is advised when the stick becomes full.

FIG. 70, the AUTO task flowchart, will show that all the tasks described above are subroutines called by the AUTO program. The subroutines are called sequentially and exercised only if the appropriate flags are set. The last test in AUTO is whether the mission has been completed. If the output task in FIG. 81 issues an indication that the last PROM to be programmed has successfully passed its AC tests and has been delivered to an Output Stick or to the DIP Inserter then the entire mission is accomplished and the PROM Handling System will reinitialize itself to begin processing a new sequence of PROMs.

In the center of FIG. 70, column two, is a decision on whether the system should pause. This decision is based on a switch position which the operator may depress if the system should be interrupted from its normal operation for any reason. When this option is exercised the system goes into a condition resembling a jam in that all tasks that have been started are continued until a prescribed state is reached. When all eight functions reach a steady state position, then the PROM Handling System pauses. Thus, when the pause switch is depressed again the system can continue its normal processing.

The Pause feature is used by the operator when system quiescence is required. The Reset feature, which is similar to Pause is used to reach system quiescence with all hardware actions (Solenoids) in the rest (off) position. Reset would be typically used to abort a mission after it had started. Pause would be used to make minor adjustments to the system hardware.

It is to be understood that the above described arrangement is merely illustrative of the principals of the invention. While a particular embodiment of the present invention has been described and illustrated, it will be apparent to those skilled in the art that changes and modifications may be made therein without departure from the spirit and scope of the invention as claimed.

What is claimed is:

1. Apparatus for automatically programming and testing a programmable read-only memory (PROM) device of the type having a fuse corresponding to every bit in memory, the selective blowing of said fuses by the application of electrical pulses constituting the programming of said PROM, comprising:
   means electrically coupled to said PROM for programming said PROM with a predetermined bit pattern by the selective blowing of said fuses,
   means electrically coupled to said PROM for testing the access time required for said PROM to output said bit pattern contained within said PROM after completion of said programming, and
   means for transporting said PROM to said means for programming and to said means for testing.

2. The apparatus of claim 1 wherein said means for programming further comprises means for inspecting said PROM prior to programming to determine said PROM contains a bit pattern corresponding to an unprogrammed PROM.

3. The apparatus of claim 2 wherein said means for transporting further comprises means for supplying a pluraity of PROMs to said means for programming and said means for testing to provide a sequence of PROMs being transported through said apparatus.

4. The apparatus of claim 3 wherein said means for programming further comprises means for marking each of said plurality of PROMs with an individual part number corresponding to the pattern programmed into said PROM.

5. The apparatus of claim 4 wherein said means for testing includes means for ejecting from said apparatus a PROM which has not been successfully inspected, programmed and tested.

6. The apparatus of claim 5 wherein said means for testing further comprises means for controlling the temperature of said PROM being tested.

7. The apparatus of claim 6 wherein said means for programming comprises means, responsive to the ejection of a PROM by said means for testing, for replacing said ejected PROM by initiating the inspecting, programming and marking of a replacement PROM.

8. The apparatus of claim 7 including means responsive to said means for programming for receiving said PROMs from said means for testing and for ordering said PROMs into that sequence that would have prevailed if no PROM had been ejected.

9. A system for programming and testing programmable read-only memory (PROM) devices of the type programmable by electrical pulses, comprising:
   programming means for programming said PROM and for subsequently verifying that said PROM contains the bit pattern programmed into it,
   means for testing the access time and output state of each memory bit of said PROM,
   a computer for transmitting a bit pattern to said programming means for programming said PROM and for providing an identical bit pattern to said means for testing to test said PROM, and
   means for transporting said PROM to said programming means, and responsive to the completion of operation upon said PROM by said programming means for transporting said PROM to said means for testing.

10. The apparatus of claim 9 wherein said programming means comprises:
    a first random access memory (RAM) for receiving from said computer the bit pattern to be loaded into said PROM,
    programming contacts for making electrical contact with the leads of said PROM, and
    programming circuits for generating and applying electrical pulses to said PROM through said programming contacts for programming said bit pattern into said PROM.

11. The apparatus of claim 10 wherein said means for testing comprises
    a second RAM for receiving said bit pattern from said computer,
    testing contacts for making electrical contact with the leads of said PROM, and
    testing circuits for comparing the bit pattern received from said computer with said bit pattern programmed into said PROM and received from said PROM through testing contacts, and for testing the access time of each bit of said PROM.

12. The apparatus of claim 10 wherein said means for transporting comprises means for supplying a sequence of PROMs to said programming means.

13. The apparatus of claim 12 wherein said means for testing comprises means for controlling the temperature of said PROM during said testing.

14. The system of claim 13 wherein said means for transporting further comprises first sorting means for receiving PROMs from said means for testing and for ejecting those PROMs that could not be successfully contacted, verified, programmed or tested.

15. The apparatus of claim 14 wherein said computer comprises means responsive to the ejection of a PROM by said first sorting means for transmitting a second bit pattern to said programming means identical to the bit pattern contained in said first RAM during the programming of said ejected PROM.

16. The system of claim 15 wherein said means for transporting comprises second sorting means for receiving PROMs from said first sorting means, for temporarily storing said PROMs and for discharging said PROMs in the order that would have prevailed if no PROM had been ejected.

17. The apparatus of claim 16 wherein said programming means comprises means for marking each PROM with a part number corresponding to the bit pattern programmed into said PROM.

18. The apparatus of claim 9 wherein said means for transporting comprises:
   a track for transporting a PROM,
   a source of compressed air for propelling a PROM along said track, and
   a positioning pin for blocking said track to stop said PROM at said programming means and at said means for testing.

19. A computer controlled method of automatically programming and testing a programmable read-only memory (PROM) comprising the steps of:
   first transporting said PROM to a programming station for making electrical contact between all leads of said PROM and said programming station,
   programming said PROM according to a pattern provided by said computer to said programming station,
   second transporting said PROM to a test station, and
   testing said PROM by comparing its contents with a pattern provided by said computer, which pattern is identical to the one used in said programming step, said testing to be performed to test that said PROM is capable of accessing data at a predetermined speed.

20. The method of claim 19 including the step of inspecting said PROM to determine that the contents of said PROM conforms to the specification for an unprogrammed PROM prior to the programming step.

21. The method of claim 20 wherein said transporting step includes transporting an additional device to said programming station upon completion of the programming of a prior PROM to produce a flow of PROMs through said programming and test stations, and
   wherein said programming step includes the transmission of an ordered sequence of patterns to said programming station to program said series of PROMs in the order in which they are required to be produced.

22. The method of claim 21 including:
   ejecting parts that have not successfully completed said testing step, or have not been successfully verified in said verifying step, and
   performing said programming step to program a replacement PROM for each one ejected.

23. The method of claim 22 including the step of sorting said PROM's after said ejecting step to order said PROMs into that sequence that would have obtained if no PROMs had been ejected.

24. The method of claim 23 including the step of marking each PROM upon completion of said programming step with a part number identifying said pattern provided by said computer.

25. The method of claim 24 including the step of controlling the temperature of said PROM during said testing step.

* * * * *

UNITED STATES PATENT AND TRADEMARK OFFICE
CERTIFICATE OF CORRECTION

PATENT NO. : 3,969,618

DATED : July 13, 1976

INVENTOR(S) : John Michael Strubel et al

It is certified that error appears in the above–identified patent and that said Letters Patent are hereby corrected as shown below:

Column 39, indicated line 52, after "determine", add --that--.

Column 39, indicated line 57, delete "pluraity" and insert --plurality--.

Column 42, line 7, after "said" insert --first--.

Signed and Sealed this

Nineteenth Day of October 1976

[SEAL]

*Attest:*

RUTH C. MASON
*Attesting Officer*

C. MARSHALL DANN
*Commissioner of Patents and Trademarks*